United States Patent
Fujii et al.

(10) Patent No.: US 8,795,945 B2
(45) Date of Patent: Aug. 5, 2014

(54) ACTINIC RAY-SENSITIVE OR RADIATION-SENSITIVE RESIN COMPOSITION, AND RESIST FILM AND PATTERN FORMING METHOD USING THE SAME

(75) Inventors: Kana Fujii, Shizuoka (JP); Takamitsu Tomiga, Shizuoka (JP); Toru Fujimori, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 13/521,332

(22) PCT Filed: Mar. 4, 2011

(86) PCT No.: PCT/JP2011/055717
§ 371 (c)(1),
(2), (4) Date: Jul. 10, 2012

(87) PCT Pub. No.: WO2011/111805
PCT Pub. Date: Sep. 15, 2011

(65) Prior Publication Data
US 2012/0301831 A1    Nov. 29, 2012

(30) Foreign Application Priority Data
Mar. 10, 2010    (JP) ................. 2010-053844

(51) Int. Cl.
*G03F 7/039*    (2006.01)
*G03F 7/20*     (2006.01)
*G03F 7/30*     (2006.01)

(52) U.S. Cl.
USPC ........ 430/270.1; 430/311; 430/326; 430/905; 430/921; 430/925

(58) Field of Classification Search
None
See application file for complete search history.

(56) References Cited

U.S. PATENT DOCUMENTS

| 6,656,660 B1 * | 12/2003 | Urano et al. ............ 430/270.1 |
| 2003/0134225 A1 | 7/2003 | Fujimori et al. |
| 2004/0053161 A1 | 3/2004 | Kanna et al. |
| 2004/0091817 A1 | 5/2004 | Komatsu et al. |
| 2007/0128547 A1 * | 6/2007 | Mizutani et al. ........ 430/281.1 |

FOREIGN PATENT DOCUMENTS

| JP | 10120628 A | 5/1998 |
| JP | 2000047388 A | 2/2000 |
| JP | 2000298349 A | 10/2000 |
| JP | 2003167333 A | 6/2003 |
| JP | 2004-102264 A | 4/2004 |
| JP | 2004158287 A | 6/2004 |
| JP | 2008162101 A | 7/2008 |
| JP | 2009288344 A | 12/2009 |

OTHER PUBLICATIONS

Machine-assisted English translation of JP2009288344 as provided by JPO (2009).*
International Search Report dated Apr. 14, 2011 issued in International Application No. PCT/JP2011/055717 (PCT/ISA/210).
Written Opinion dated Apr. 14, 2011 issued in International Application No. PCT/JP/055717 (PCT/ISA/237).
Office Action issued by the Japanese Patent Office dated Jul. 2, 2013 in corresponding Japanese Application No. 2010-053844.
Extended European Search Report dated Oct. 15, 2013, issued by the European Patent Office in counterpart European Patent Application No. 11753463.6.

* cited by examiner

*Primary Examiner* — Sin J. Lee
(74) *Attorney, Agent, or Firm* — Sughrue Mion, PLLC

(57) ABSTRACT

An actinic ray-sensitive or radiation-sensitive resin composition, and a resist film and a pattern forming method using the composition are provided, the composition including (A) a compound capable of decomposing by the action of an acid to increase the solubility of the resin (A) in an alkali developer; (B) a compound capable of generating an acid upon irradiation with an actinic ray or radiation; (C) a basic compound; and (D) a specific compound containing at least two specific alicyclic hydrocarbon groups each substituted with a hydroxyl group.

16 Claims, 1 Drawing Sheet

ACTINIC RAY-SENSITIVE OR RADIATION-SENSITIVE RESIN COMPOSITION, AND RESIST FILM AND PATTERN FORMING METHOD USING THE SAME

TECHNICAL FIELD

The present invention relates to an actinic ray-sensitive or radiation-sensitive resin composition, and a resist film and a pattern forming method each using the same. More specifically, the present invention relates to a composition suitably usable in the ultra-microlithography process such as production process of VLSI and a high-capacity microchip, preparation process of a nanoimprint mold, and production process of a high-density information recording medium, and in other photofabrication processes, and a resist film and a pattern forming method each using the same.

BACKGROUND ART

The photosensitive composition for pattern formation typically contains a compound capable of generating an acid upon irradiation with light and a resin capable of changing its solubility in a developer by the action of an acid. When such a configuration is employed, the solubility of the composition in a developer can be differentiated between the exposed area and the unexposed area. That is, a fine pattern according to the profile of exposed area or unexposed area can be relatively easily formed.

In this photosensitive composition, an alicyclic alcohol is sometimes further contained. For example, in JP-A-2003-167333, a cyclic sugar derivative having three or more hydroxyl groups is used as an alicyclic alcohol. Also, in JP-A-2000-298349, an aliphatic polyhydric alcohol and a resin having an acetal protective group are combined.

In recent years, development of lithography using electron beam, X-ray or EUV light, other than excimer laser light, is proceeding. Furthermore, microfabrication by a resist composition is not only used directly in the production of an integrated circuit but also recently applied to the production or the like of a so-called mold structure for imprint (see, for example, JP-A-2004-158287, JP-A-2008-162101 and Nanoimprint no Kiso to Gijutsu Kaihatsu•Oyo Tenkai-Nanoimprint no Kiban Gijutsu to Saishin no Gijutsu Tenkai (Basic and Technology Expansion•Application Development of Nanoimprint-Fundamental Technology of Nanoimprint and Latest Technology Expansion), edited by Yoshihiko Hirai, Frontier Shuppan (issued June, 2006)). Therefore, also in the case of using X-ray, soft X-ray or electron beam for the exposure light source, it is an important task to satisfy all of high sensitivity, good exposure dose dependency, good resolution, good roughness characteristics, good focus latitude, reduction of scum, and good pattern profile at the same time, and this task needs to be solved.

SUMMARY OF INVENTION

An object of the present invention is to provide an actinic ray-sensitive or radiation-sensitive resin composition capable of forming a pattern excellent in the sensitivity, exposure dose dependency, resolution, roughness characteristics and focus latitude and succeeded in reducing scum and having good profile, and a resist film and a pattern forming method each using the composition.

The present inventors have found that the above-described object can be attained by using a specific compound having at least two specific alicyclic hydrocarbon groups each substituted with a hydroxyl group, in the actinic ray-sensitive or radiation-sensitive resin composition.

The present invention is as follows.

(1) An actinic ray-sensitive or radiation-sensitive resin composition, including:
(A) a resin capable of decomposing by an action of an acid to increase a solubility of the resin (A) in an alkali developer;
(B) a compound capable of generating an acid upon irradiation with an actinic ray or radiation;
(C) a basic compound; and
(D) a compound represented by formula (D1):

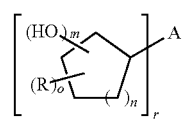

Formula (D1)

wherein A represents an r-valent hydrocarbon group;
R represents a hydrocarbon group and when a plurality of R's are present, the plurality of R's may be the same or different;
n represents an integer of 1 to 3;
m represents 1 or 2;
r represents an integer of 2 to 4; and
o represents an integer of 0 to 2.

(2) The actinic ray-sensitive or radiation-sensitive resin composition as described in (1) above,
wherein, in formula (D1), A represents an r-valent saturated hydrocarbon group.

(3) The actinic ray-sensitive or radiation-sensitive resin composition as described in (1) or (2) above,
wherein, in formula (D1), R represents an alkyl group and o is 0 or 1.

(4) The actinic ray-sensitive or radiation-sensitive resin composition as described in any one of (1) to (3) above,
wherein, in formula (D1), n is 1 or 2.

(5) The actinic ray-sensitive or radiation-sensitive resin composition as described in any one of (1) to (4) above,
wherein, in formula (D1), m is 1.

(6) The actinic ray-sensitive or radiation-sensitive resin composition as described in any one of (1) to (5) above,
wherein, in formula (D1), r is 2.

(7) The actinic ray-sensitive or radiation-sensitive resin composition as described in any one of (1) to (6) above,
wherein a content of the compound represented by formula (D1) is from 0.1 to 10 mass % based on the entire solid content of the composition.

(8) The actinic ray-sensitive or radiation-sensitive resin composition as described in any one of (1) to (7) above,
wherein the compound (B) contains a sulfonium salt or an iodonium salt.

(9) The actinic ray-sensitive or radiation-sensitive resin composition as described in any one of (1) to (8) above, which further includes:
an additive having absorption in the far-ultraviolet region.

(10) The actinic ray-sensitive or radiation-sensitive resin composition as described in any one of (1) to (9) above,
wherein the resin (A) contains a repeating unit having absorption in the far-ultraviolet region.

(11) A resist film, which is formed from the actinic ray-sensitive or radiation-sensitive resin composition as described in any one of (1) to (10) above.

(12) A pattern forming method, including steps of exposing and developing the resist film as described in (11) above.

(13) The pattern forming method as described (12) above, wherein the exposure in the step of exposing the resist film is an immersion exposure.

The present invention preferably further includes the following configurations.

(14) The actinic ray-sensitive or radiation-sensitive resin composition as described in (9) or (10) above,
wherein the additive having absorption in the far-ultraviolet region is a compound represented by formula (EI):

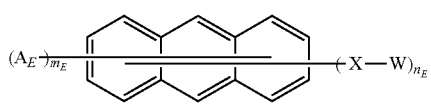

Formula (EI)

wherein $A_E$ represents a monovalent substituent;

X represents a single bond or a divalent linking group;

W represents a lactone ring-containing group or a group represented by any one of formulae (V1) to (V4);

$m_E$ represents an integer of 0 or more;

$n_E$ represents an integer of 1 or more;

when a plurality of $A_E$'s, X's or W's are present, each $A_E$, X or W may be the same as or different from every other $A_E$, X or W; and when a plurality of compounds represented by formula (EI) are present, the plurality of compounds represented by formula (EI) may combine through at least any one of a single bond, $A_E$ and W:

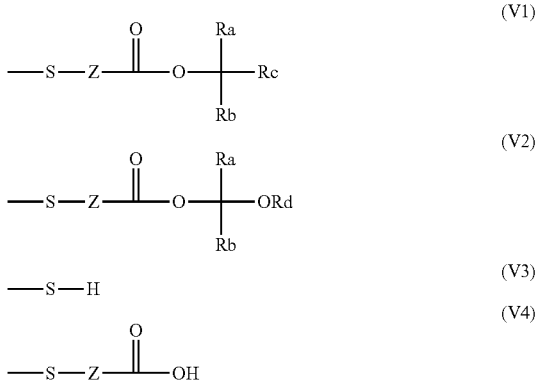

wherein Z represents a single bond or a divalent linking group;

each of Ra, Rb and Rc independently represents a hydrogen atom, an alkyl group, a cycloalkyl group or an alkenyl group;

Rd represents an alkyl group, a cycloalkyl group or an alkenyl group; and two groups out of Ra, Rb and Rc or two groups out of Ra, Rb and Rd may combine to form a ring structure.

(15) The actinic ray-sensitive or radiation-sensitive resin composition as described in (10) or (14) above,
wherein the repeating unit having absorption in the far-ultraviolet region is a repeating unit represented by formula (I):

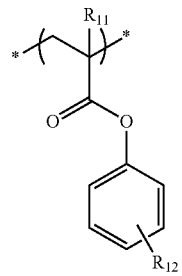

Formula (I)

wherein $R_{11}$ represents a hydrogen atom or an alkyl group; and $R_{12}$ represents a phenyl group.

(16) The actinic ray-sensitive or radiation-sensitive resin composition as described in any one of (1) to (10), (14) and (15) above,
wherein the resin (A) contains a repeating unit having an aromatic group.

(17) The actinic ray-sensitive or radiation-sensitive resin composition as described in (16) above,
wherein the resin (A) contains a hydroxystyrene as a repeating unit.

(18) The actinic ray-sensitive or radiation-sensitive resin composition as described in any one of (1) to (10) and (14) to (17) above, which is used for exposure to a KrF excimer laser, an X-ray, an extreme-ultraviolet ray or an electron beam.

(19) The actinic ray-sensitive or radiation-sensitive resin composition as described in any one of (1) to (10), (14) and (15) above,
wherein the resin (A) contains substantially no aromatic group.

(20) The actinic ray-sensitive or radiation-sensitive resin composition as described in any one of (1) to (10), (14), (15) and (19) above, which is used for ArF exposure.

(21) The actinic ray-sensitive or radiation-sensitive resin composition as described in any one of (1) to (10) and (14) to (20) above, which further includes:
a hydrophobic resin (HR).

(22) The actinic ray-sensitive or radiation-sensitive resin composition as described in (21) above,
wherein the hydrophobic resin (HR) contains at least one of a fluorine atom and a silicon atom.

DESCRIPTION OF EMBODIMENTS

Figure 1:
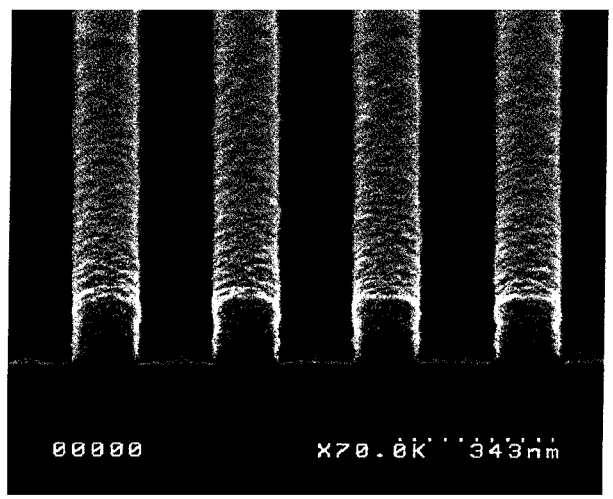
FIG. 1 is a cross-sectional photographic view of a pattern observed through a scanning electron microscope, showing one example of the pattern profile receiving a rating of 5, in Evaluation of Scum and Pattern Profile in Examples.

The mode for carrying out the present invention is described below.

Incidentally, in the present invention, when a group (atomic group) is denoted without specifying whether substituted or unsubstituted, the group includes both a group having no substituent and a group having a substituent. For example, "an alkyl group" includes not only an alkyl group having no substituent (unsubstituted alkyl group) but also an alkyl group having a substituent (substituted alkyl group).

In the present invention, the term "actinic ray" or "radiation" indicates, for example, a bright line spectrum of mercury lamp, a far-ultraviolet ray typified by excimer laser, an extreme-ultraviolet ray (EUV light), an X-ray or an electron beam (EB). Also, in the present invention, the "light" means an actinic ray or radiation. In the present invention, unless otherwise indicated, the "exposure" includes not only exposure to a mercury lamp, a far-ultraviolet ray typified by excimer laser, an X-ray, EUV light or the like but also lithography with a particle beam such as electron beam and ion beam.

The actinic ray-sensitive or radiation-sensitive resin composition of the present invention includes:

(A) a resin capable of decomposing by the action of an acid to increase the solubility in an alkali developer, (B) a compound capable of generating an acid upon irradiation with an actinic ray or radiation, (C) a basic compound, and (D) a compound represented by the following formula (D1).

The actinic ray-sensitive or radiation-sensitive resin composition of the present invention is, for example, a positive composition and is typically a positive resist composition. The configuration of this composition is described below.

[1] Additive (D)

The actinic ray-sensitive or radiation-sensitive resin composition of the present invention contains an additive represented by the following formula (D1) (hereinafter sometimes referred to as an "additive (D)"). The actinic ray-sensitive or radiation-sensitive resin composition contains the additive (D), and this is expected to produce an effect of inhibiting an interaction between the resin and the substrate (for example, an interaction between a hydrophilic group such as hydroxyl group contained in the resin and a hydrophilic group such as hydroxyl group disposed on the substrate surface) and reducing scum.

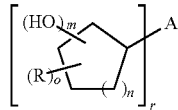

Formula (D1)

In formula (D1), A represents an r-valent hydrocarbon group;

R represents a hydrocarbon group and when a plurality of R's are present, the plurality of R's may be the same or different;

n represents an integer of 1 to 3;

m represents 1 or 2;

r represents an integer of 2 to 4; and o represents an integer of 0 to 2.

The r-valent hydrocarbon group represented by A is preferably an r-valent linear or branched hydrocarbon group, and the carbon number thereof is preferably from 1 to 6, more preferably from 1 to 3. The r-valent hydrocarbon group is preferably an r-valent saturated hydrocarbon group. Specific examples of A include $(CH_2)(-*)_2$, $(CH)(-*)_3$, $(C)(-*)_4$, $*-(CH_2)_2-*$, $*-HC=H-*$, $*-(CH_2)_3-*$, $*-C(CH_3)_2-*$, and $*-HC=CH-CH_2-*$, wherein $*$ represents a bonding site to the alicyclic hydrocarbon group substituted with a hydroxyl group in formula (D1).

A is more preferably an r-valent linear hydrocarbon group having a carbon number of 1 to 3, still more preferably an r-valent linear saturated hydrocarbon group having a carbon number of 1 to 3, and it is most preferred that the carbon number is 1.

The hydrocarbon group represented by R is preferably a linear, branched or cyclic hydrocarbon group which may have a substituent, more preferably a linear hydrocarbon group which may have a substituent. The carbon number of the hydrocarbon group represented by R is preferably from 1 to 6, more preferably 1 to 3. The hydrocarbon group represented by R is preferably an alkyl group. The substituent which R may have includes a halogen atom such as chlorine atom, bromine atom, fluorine atom and iodine atom, but R preferably has no substituent. R is more preferably a methyl group or an ethyl group.

The hydroxyl group substituted on the alicyclic hydrocarbon group in formula (D1) is preferably substituted, out of carbon atoms forming the ring of the alicyclic hydrocarbon group, on a carbon atom except for the carbon atom bonded to A, more preferably substituted on a carbon atom except for the carbon atom bonded to A and a carbon atom adjacent to the carbon atom bonded to A. In other words, the hydroxyl group in formula (D1) is preferably substituted on any one of the 2- to (4+n)-positions with respect to the bonding site of A on the alicyclic hydrocarbon group, more preferably substituted on any one of the 3- to (3+n)-positions. Here, n has the same meaning as n in formula (D1). Thanks to this configuration, steric hindrance in the periphery of the hydroxyl group substituted on the alicyclic hydrocarbon group is reduced to allow for easy occurrence of an interaction between the hydroxyl group of the additive (D) and the substrate, and this is presumed to increase the effect of inhibiting an interaction between the resin and the substrate by the additive (D).

n is preferably 1 or 2, more preferably 2.

m is preferably 1.

r is preferably 2.

o is preferably 0 or 1, more preferably 0.

The molecular weight of the additive (D) is generally from 100 to 600, preferably from 150 to 370.

As for the additive (D), single species may be used, or two or more species may be used in combination.

The content of the additive (D) is preferably from 0.1 to 10 mass %, more preferably from 0.5 to 8 mass %, based on the entire solid content of the actinic ray-sensitive or radiation-sensitive resin composition. (In this specification, mass ratio is equal to weight ratio.)

Specific examples of the additive (D) for use in the present invention are illustrated below, but the present invention is not limited thereto.

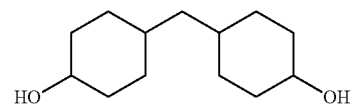

(D-1)

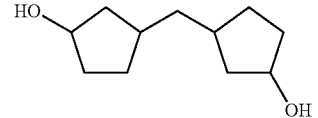

(D-2)

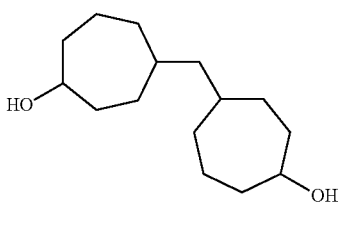
(D-3)

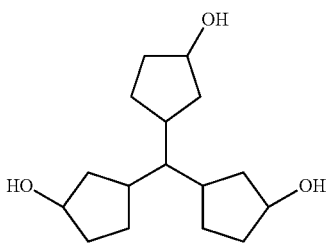
(D-4)

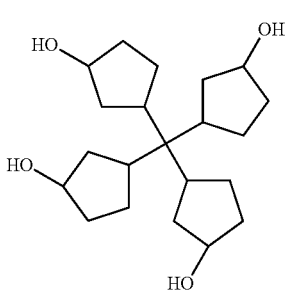
(D-5)

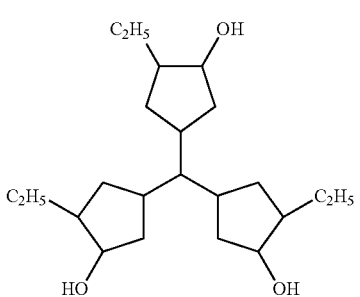
(D-6)

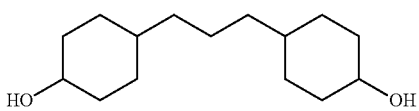
(D-7)

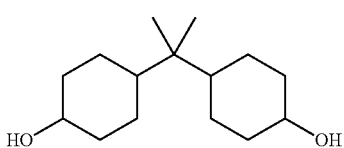
(D-8)

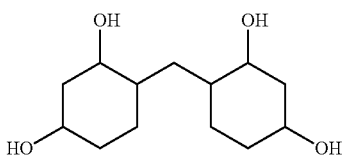
(D-9)

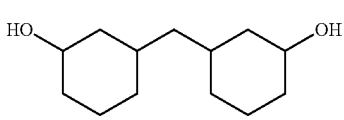
(D-10)

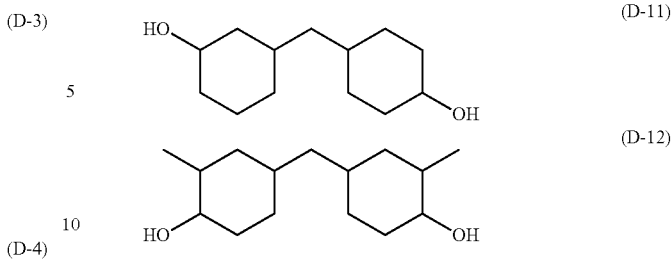

The additive (D) can be obtained by reacting a corresponding Grignard reagent with a halogenated hydrocarbon. For example, Compound (D-1) can be synthesized by preparing a Grignard reagent of 4-bromocyclohexanol and reacting it with dibromomethane. Compounds (D-2) to (D-12) can be synthesized by the same synthesis method. As the additive (D), a commercial product such as bis(4-hydroxycyclohexyl) methane (produced by New Japan Chemical Co., Ltd.) may also be used.

[2] (A) Resin Capable of Decomposing by the Action of an Acid to Increase Solubility in an Alkali Developer The actinic ray-sensitive or radiation-sensitive resin composition of the present invention contains a resin capable of decomposing by the action of an acid to increase the solubility in an alkali developer (hereinafter, sometimes referred to as an "acid-decomposable resin (A)" or a "resin (A)"). The acid-decomposable resin (A) is a resin that decomposes by the action of an acid to increase its solubility in an alkali developer.

The acid-decomposable resin (A) typically has a group capable of decomposing by the action of an acid to produce an alkali-soluble group (hereinafter, sometimes referred to as an "acid-decomposable group"). This resin may have an acid-decomposable group in either one or both of the main and side chains. The resin preferably has an acid-decomposable group in the side chain (more specifically, contains a repeating unit having an acid-decomposable group).

The acid-decomposable group is preferably a group where a hydrogen atom of an alkali-soluble group such as —COOH group and —OH group is replaced by a group capable of leaving by the action of an acid.

Examples of the group capable of leaving by the action of an acid include —C($R^{36}$)($R^{37}$)($R^{38}$), —C(=O)—O—C($R^{36}$)($R^{37}$)($R^{38}$), —C($R^{01}$)($R^{02}$)(O$R^{39}$), —C($R^{01}$)($R^{02}$)—C(=O)—O—C($R^{36}$)($R^{37}$)($R^{38}$) and —CH($R^{36}$)(Ar$^{01}$).

In the formulae, each of $R^{36}$ to $R^{39}$ independently represents an alkyl group, a cycloalkyl group, an aryl group, an aralkyl group or an alkenyl group. $R^{36}$, and $R^{37}$, may combine with each other to form a ring. Each of $R^{01}$, and $R^{02}$ independently represents a hydrogen atom, an alkyl group, a cycloalkyl group, an aryl group, an aralkyl group or an alkenyl group, provided that $R^{01}$, and $R^{02}$, do not represent a hydrogen atom at the same time. $R^{01}$, and $R^{39}$, may combine with each other to form a ring. Ar$^{01}$ represents an aryl group.

The alkyl group as $R^{36}$ to $R^{39}$, $R^{01}$, and $R^{02}$, is preferably an alkyl group having a carbon number of 1 to 8, and examples thereof include a methyl group, an ethyl group, a propyl group, an n-butyl group, a sec-butyl group, a hexyl group and an octyl group.

The cycloalkyl group as $R^{36}$ to $R^{39}$, $R^{01}$, and $R^{02}$, may be a monocyclic cycloalkyl group or a polycyclic cycloalkyl group. The monocyclic cycloalkyl group is preferably a cycloalkyl group having a carbon number of 3 to 8, and examples thereof include a cyclopropyl group, a cyclobutyl group, a cyclopentyl group, a cyclohexyl group and a cyclooctyl group. The polycyclic cycloalkyl group is preferably a cycloalkyl group having a carbon number of 6 to 20, and examples thereof include an adamantyl group, a norbornyl group, an isoboronyl group, a camphanyl group, a dicyclopentyl group, an α-pinel group, a tricyclodecanyl group, a tetracyclododecyl group and an androstanyl group. Incidentally, a part of carbon atoms in the cycloalkyl group may be substituted with a heteroatom such as oxygen atom.

The aryl group as $R^{36}$ to $R^{39}$, $R^{01}$, $R^{02}$, and $Ar^{01}$, is preferably an aryl group having a carbon number of 6 to 14, and examples thereof include a phenyl group, a naphthyl group and an anthryl group.

The aralkyl group as $R^{36}$ to $R^{39}$, $R^{01}$, and $R^{02}$, is preferably an aralkyl group having a carbon number of 7 to 12, and preferred examples thereof include a benzyl group, a phenethyl group and a naphthylmethyl group.

The alkenyl group as $R^{36}$ to $R^{39}$, $R^{01}$ and $R^{02}$ is preferably an alkenyl group having a carbon number of 2 to 8, and examples thereof include a vinyl group, an allyl group, a butenyl group and a cyclohexenyl group.

The ring formed by combining $R^{36}$ and $R^{37}$ with each other may be either monocyclic or polycyclic. The monocyclic ring is preferably a cycloalkane structure having a carbon number of 3 to 8, and examples thereof include a cyclopropane structure, a cyclobutane structure, a cyclopentane structure, a cyclohexane structure, a cycloheptane structure and a cyclooctane structure. The polycyclic ring is preferably a cycloalkane structure having a carbon number of 6 to 20, and examples thereof include an adamantane structure, a norbornane structure, a dicyclopentane structure, a tricyclodecane structure and a tetracyclododecane structure. Incidentally, a part of carbon atoms in the ring structure may be substituted with a heteroatom such as oxygen atom.

Each of the groups above may have a substituent, and examples of the substituent include an alkyl group, a cycloalkyl group, an aryl group, an amino group, an amido group, a ureido group, a urethane group, a hydroxy group, a carboxy group, a halogen atom, an alkoxy group, a thioether group, an acyl group, an acyloxy group, an alkoxycarbonyl group, a cyano group and a nitro group. The carbon number of the substituent is preferably 8 or less.

The acid-decomposable resin (A) contains, for example, a repeating unit represented by the following formula (IA) as a repeating unit having an acid-decomposable group.

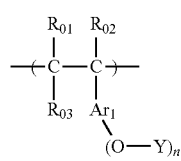

Formula (IA)

In the formula, each of $R_{01}$ and $R_{02}$ independently represents a hydrogen atom, an alkyl group, a cycloalkyl group, a halogen atom, a cyano group or an alkoxycarbonyl group. $R_{03}$ represents a hydrogen atom, an alkyl group, a cycloalkyl group, a halogen atom, a cyano group or an alkoxycarbonyl group or combines with $Ar_1$ to form a ring structure.

$Ar_1$ represents an (n+1)-valent aromatic ring group, provided that in the case of combining with $R_{03}$ to form a ring structure, $Ar_1$ represents an (n+2)-valent aromatic ring group.

Each of n Y's independently represents a hydrogen atom or a group capable of leaving by the action of an acid, provided that at least one of n Y's represents a group capable of leaving by the action of an acid.

n represents an integer of 1 to 4 and is preferably 1 or 2, more preferably 1.

The alkyl group of $R_{01}$ to $R_{03}$ is, for example, an alkyl group having a carbon number of 20 or less, such as methyl group, ethyl group, propyl group, isopropyl group, n-butyl group, sec-butyl group, hexyl group, 2-ethylhexyl group, octyl group and dodecyl group, preferably an alkyl group having a carbon number of 8 or less. These alkyl groups may have a substituent.

Examples of the alkyl group contained in the alkoxycarbonyl group of $R_{01}$ to $R_{03}$ include those described above as examples of the alkyl group of $R_{01}$ to $R_{03}$.

The cycloalkyl group as $R_{01}$ to $R_{03}$ may be either monocyclic or polycyclic. This cycloalkyl group is preferably a monocyclic cycloalkyl group having a carbon number of 3 to 8, such as cyclopropyl group, cyclopentyl group and cyclohexyl group. These cycloalkyl groups may have a substituent.

Examples of the halogen atom include a fluorine atom, a chlorine atom, a bromine atom and an iodine atom. Among these, a fluorine atom is preferred.

Examples of the ring structure which may be formed by combining $R_{03}$ and $Ar_1$ include a 5- or 6-membered ring structure.

The aromatic ring group as $Ar_1$ is preferably an aromatic ring group having a carbon number of 6 to 14 which may have a substituent, and specific examples thereof include a benzene ring group and a naphthalene ring group.

As described above, at least one of n Y's represents a group capable of leaving by the action of and acid. Examples of the group capable of leaving by the action of an acid include the above-described groups.

Each of the groups as $R_{01}$, $R_{02}$, $R_{03}$ and $Ar_1$ may have a substituent, and examples of the substituent are the same as those of the substituent which each of the groups as $R^{36}$ to $R^{39}$, $R^{01}$, $R^{02}$ and $Ar^{01}$ may have. Incidentally, when $Ar_1$ has a plurality of substituents, the plurality of substituents may combine with each other to form a 5- or 6-membered ring.

The group capable of leaving by the action of an acid is more preferably a structure represented by the following formula (IIA):

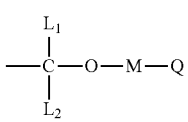

Formula (IIA)

In the formula, each of $L_1$ and $L_2$ independently represents a hydrogen atom, an alkyl group, a cycloalkyl group, an aryl group or an aralkyl group. M represents a single bond or a divalent linking group. Q represents an alkyl group, an alicyclic group, an aromatic ring group, an amino group, an ammonium group, a mercapto group, a cyano group or an aldehyde group. The alicyclic group and the aromatic ring group may contain a heteroatom. At least two members of Q, M and $L_1$ may combine with each other to form a 5- or 6-membered ring.

The alkyl group as $L_1$ and $L_2$ is, for example, an alkyl group having a carbon number of 1 to 8, and specific examples thereof include a methyl group, an ethyl group, a propyl group, an n-butyl group, a sec-butyl group, a hexyl group and an octyl group.

The cycloalkyl group as $L_1$ and $L_2$ is, for example, a cycloalkyl group having a carbon number of 3 to 15, and specific examples thereof include a cyclopentyl group, a cyclohexyl group, a norbornyl group and an adamantyl group.

The aryl group as $L_1$ and $L_2$ is, for example, an aryl group having a carbon number of 6 to 15, and specific examples thereof include a phenyl group, a tolyl group, a naphthyl group and an anthryl group.

The aralkyl group as $L_1$ and $L_2$ is, for example, an aralkyl group having a carbon number of 7 to 20, and specific examples thereof include a benzyl group and a phenethyl group.

Examples of the divalent linking group as M include an alkylene group (preferably a methylene group, an ethylene group, a propylene group, a butylene group, a hexylene group or an octylene group), a cycloalkylene group (preferably a cyclopentylene group or a cyclohexylene group), an alkenylene group (preferably an vinylene group, a propenylene group or a butenylene group), an arylene group (preferably a phenylene group, a tolylene group or a naphthylene group), —S—, —O—, —CO—, —SO$_2$—, —N(R$_0$)—, and a combination of two or more thereof. Here, $R_0$ is a hydrogen atom or an alkyl group. The alkyl group as $R_0$ is, for example, an alkyl group having a carbon number of 1 to 8, and specific examples thereof include a methyl group, an ethyl group, a propyl group, an n-butyl group, a sec-butyl group, a hexyl group and an octyl group.

Examples of the alkyl group represented by Q are the same as those described above for the group as $L_1$ and $L_2$.

Examples of the alicyclic group and aromatic ring group represented by Q include the above-described cycloalkyl group and aryl group as $L_1$ and $L_2$. The cycloalkyl group and aryl group are preferably a group having a carbon number of 3 to 15.

Examples of the heteroatom-containing alicyclic or aromatic ring group represented by Q include a group having a heterocyclic structure such as thiirane, cyclothiolane, thiophene, furan, pyrrole, benzothiophene, benzofuran, benzopyrrole, triazine, imidazole, benzimidazole, triazole, thiadiazole, thiazole and pyrrolidone, but the ring is not limited thereto as long as it is a ring composed of carbon and a heteroatom or a ring composed of only a heteroatom.

Examples of the ring structure which may be formed by combining at least two members out of Q, M and $L_1$ with each other include a 5- or 6-membered ring structure where a propylene group or a butylene group is formed by the members above.

Each of the groups represented by $L_1$, $L_2$, M and Q in formula (IIA) may have a substituent, and examples of the substituent include an alkyl group, a cycloalkyl group, an aryl group, an amino group, an amido group, a ureido group, a urethane group, a hydroxy group, a carboxy group, a halogen atom, an alkoxy group, a thioether group, an acyl group, an acyloxy group, an alkoxycarbonyl group, a cyano group and a nitro group. The carbon number of the substituent is preferably 8 or less.

The group represented by -(M-Q) is preferably a group having a carbon number of 1 to 30, more preferably a group having a carbon number of 5 to 20.

Specific examples of the repeating unit represented by formula (IA) are illustrated below, but the present invention is not limited thereto.

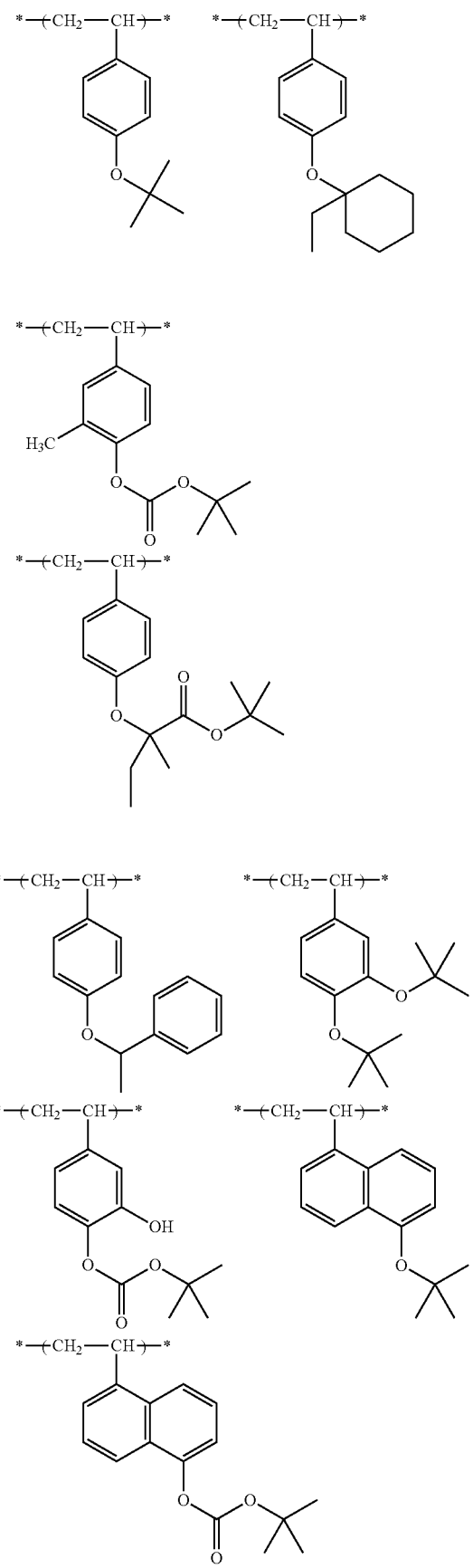

-continued
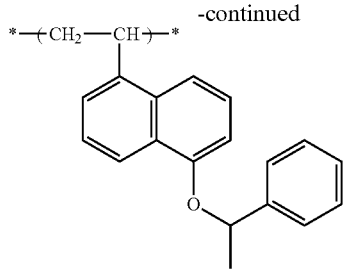
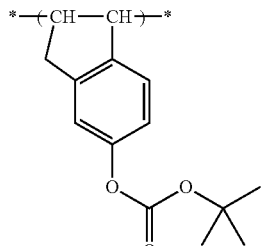
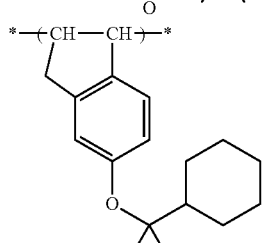
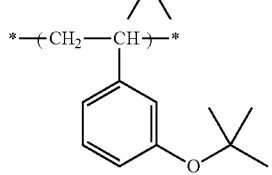
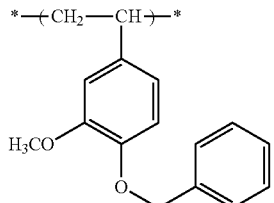
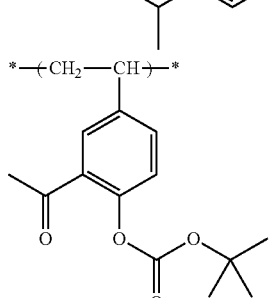
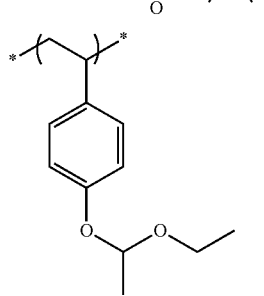
-continued
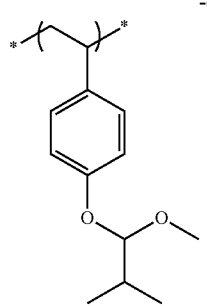
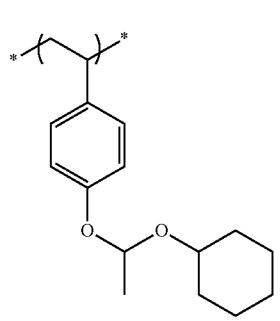
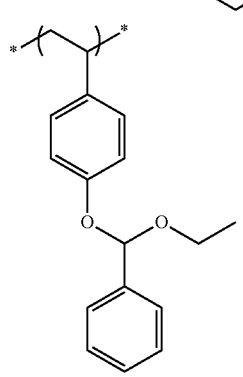
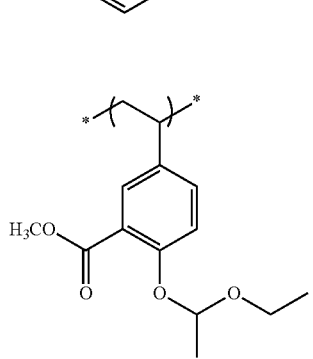
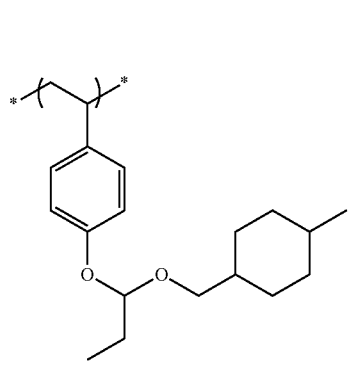

15
-continued
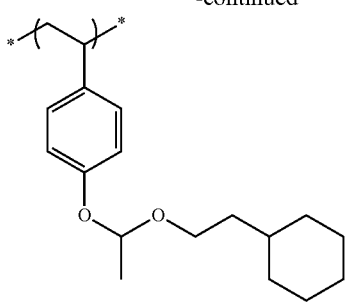
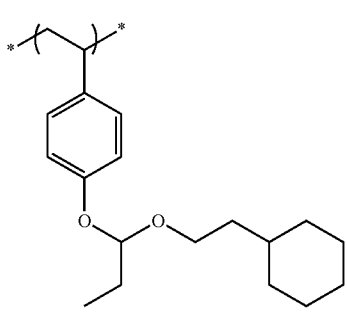
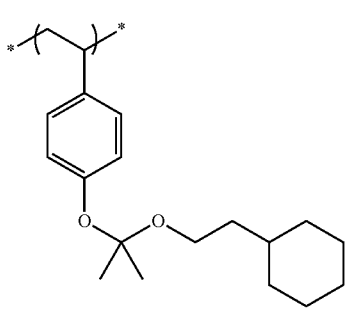
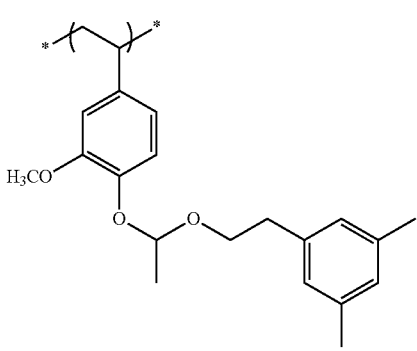
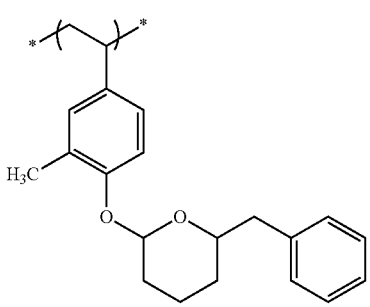
16
-continued
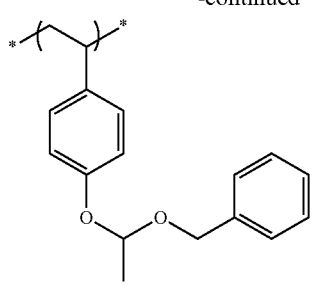
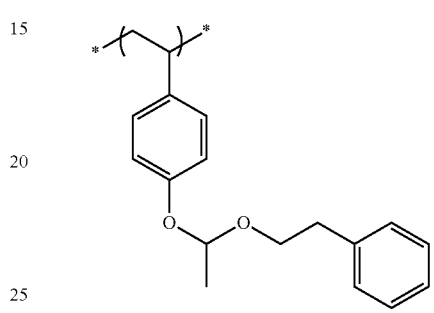
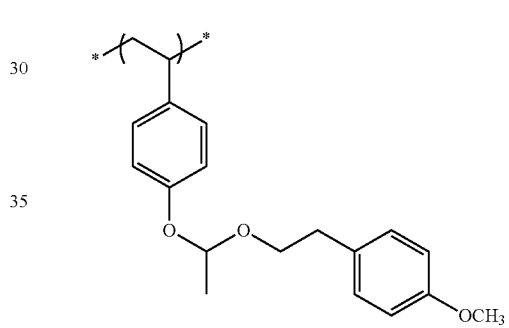
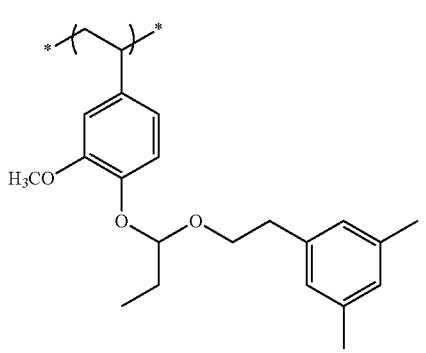
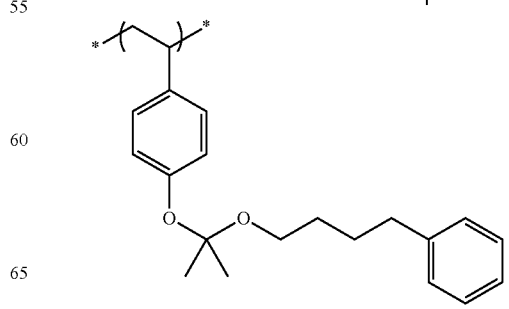

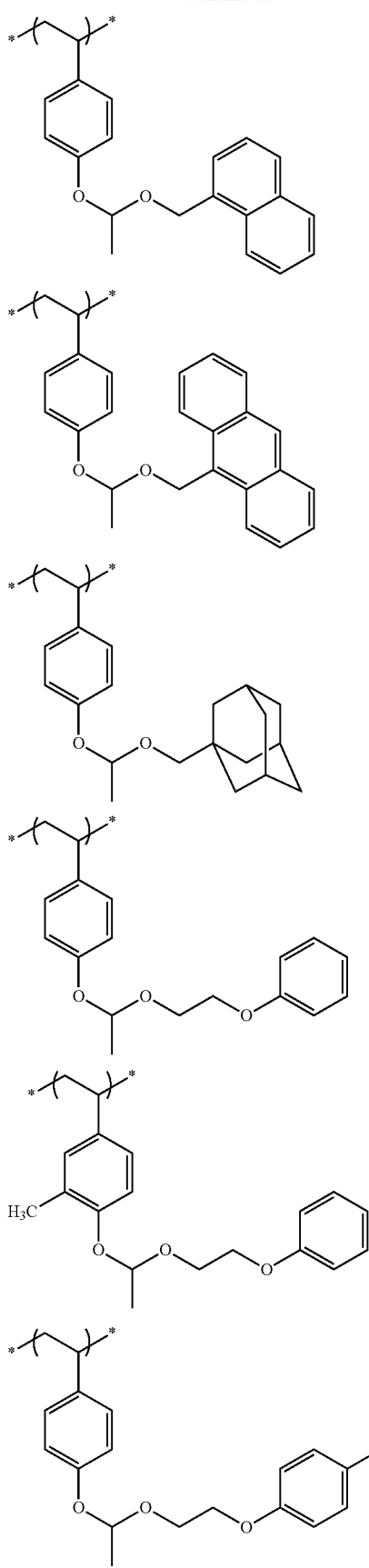
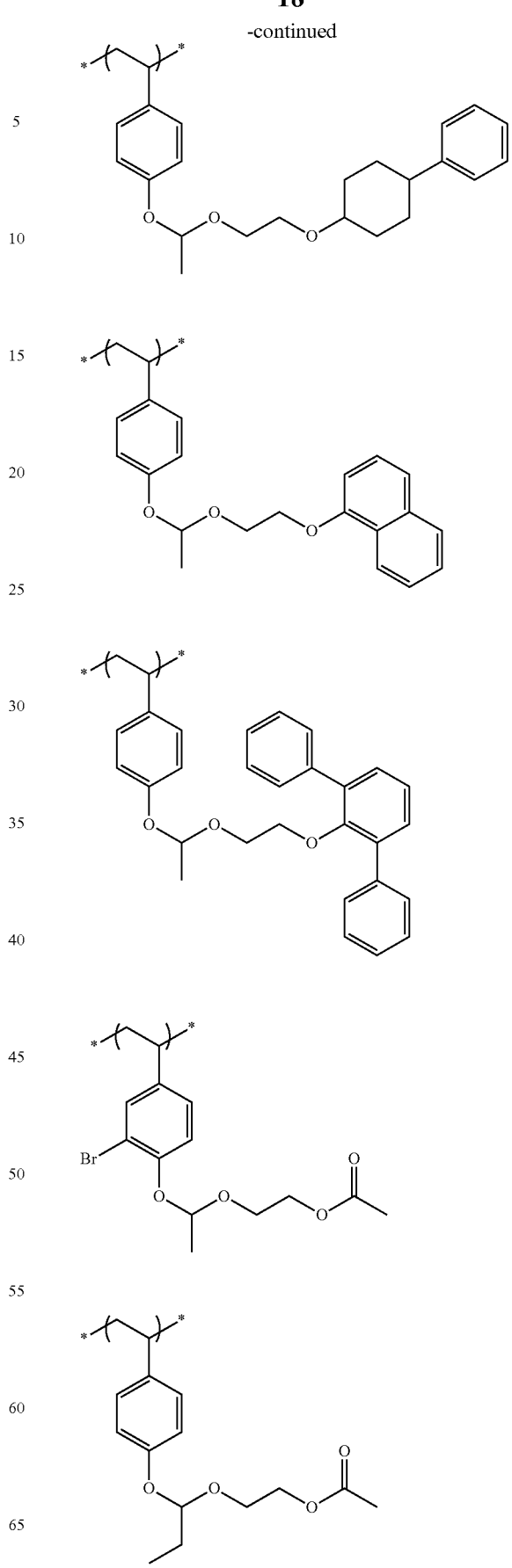

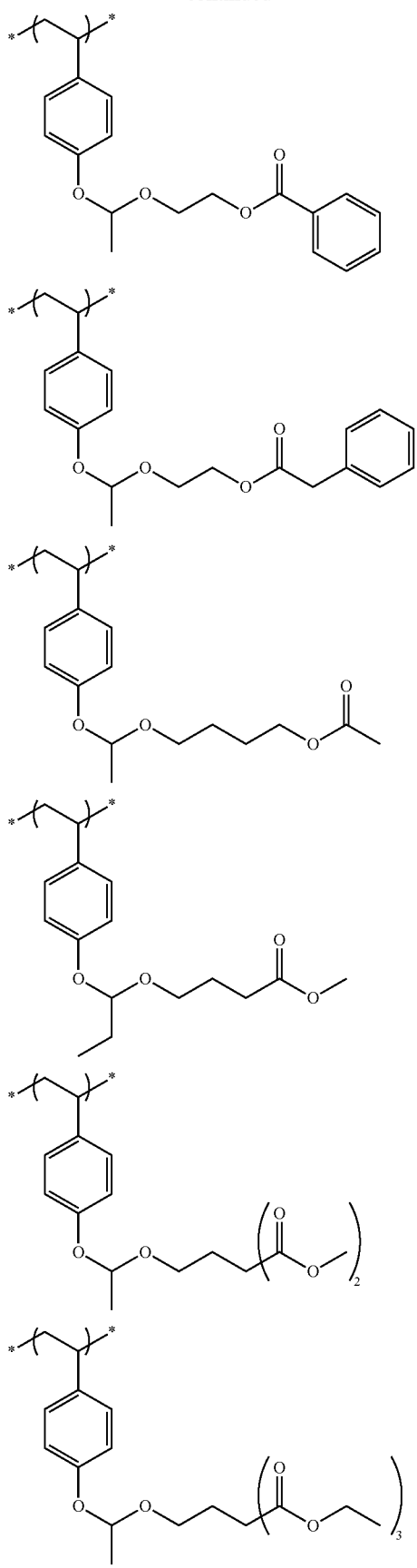
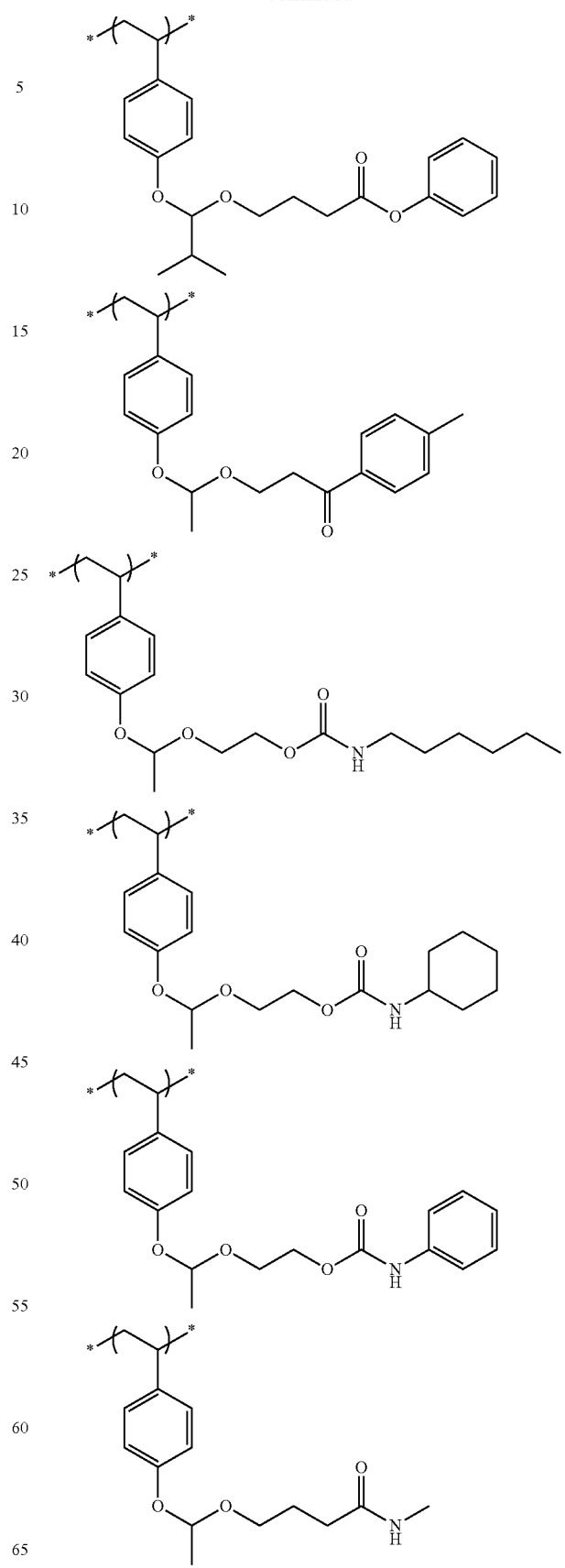

21
-continued
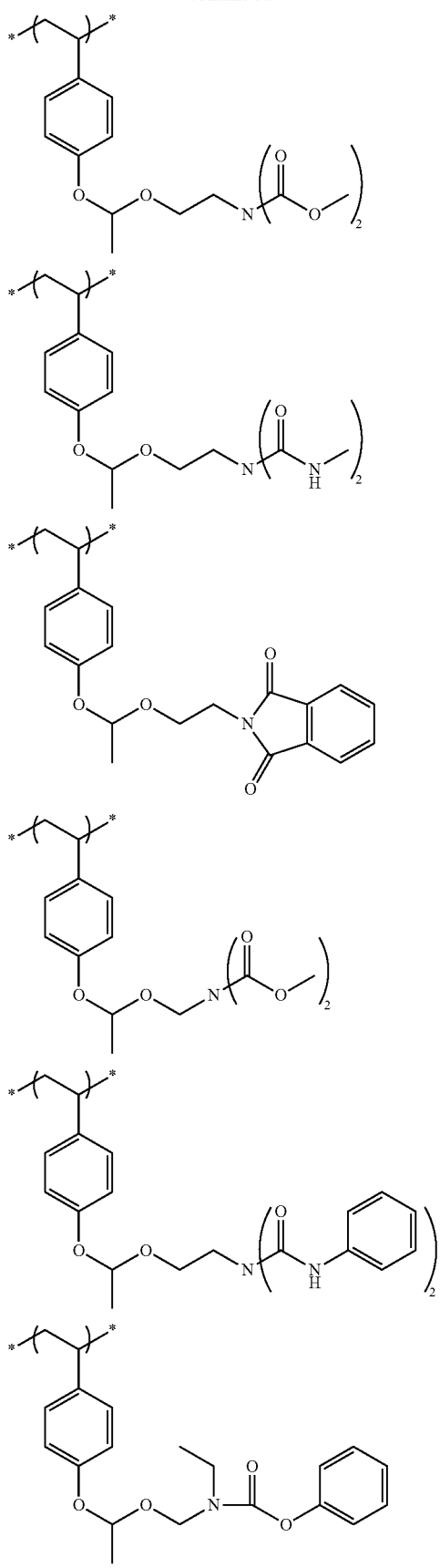
22
-continued
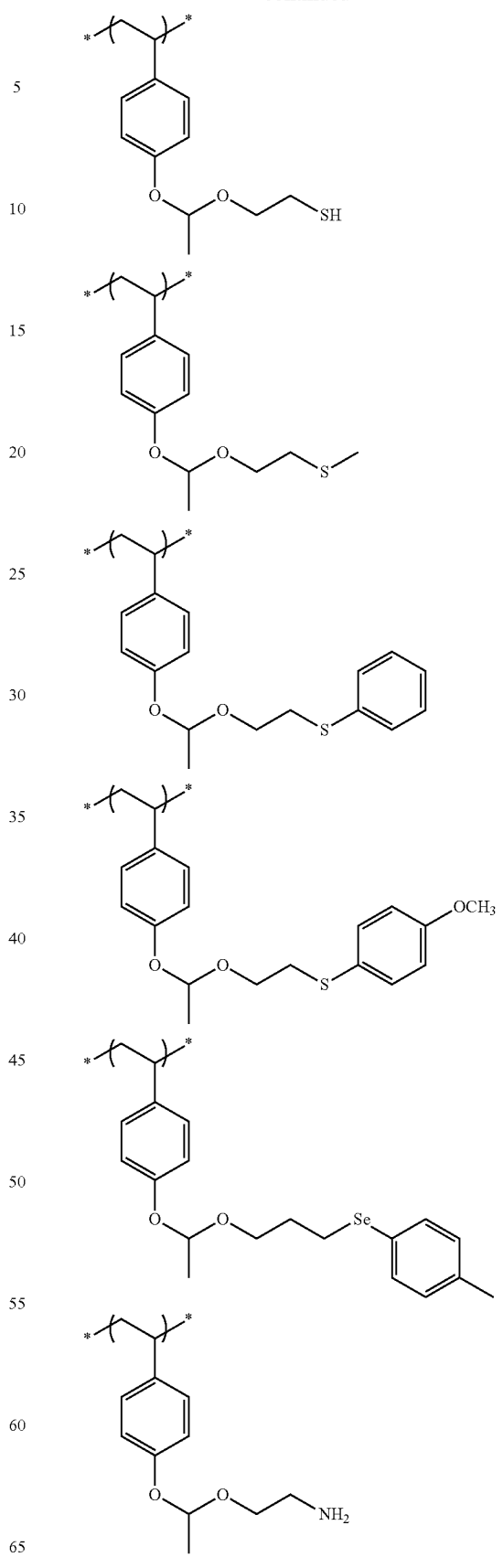

23
-continued
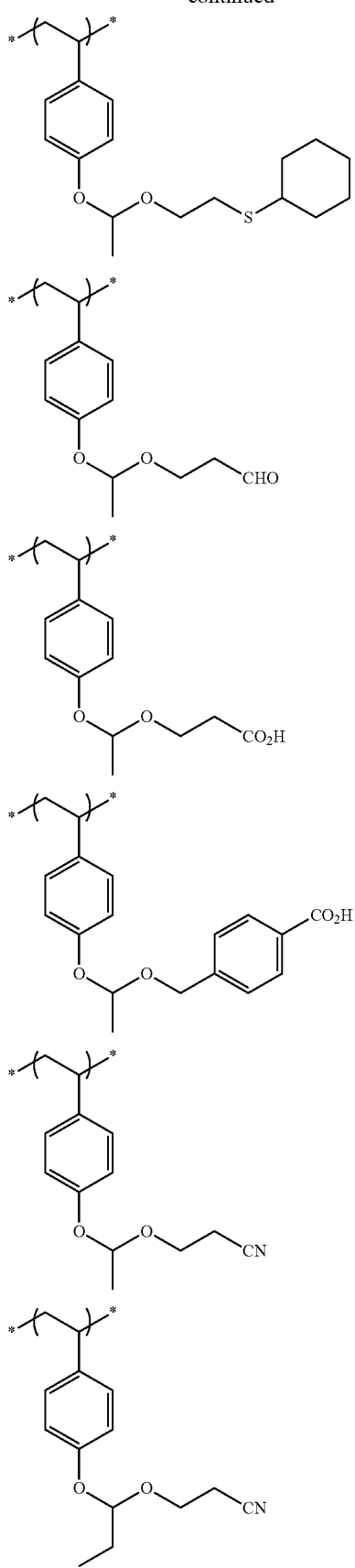
24
-continued
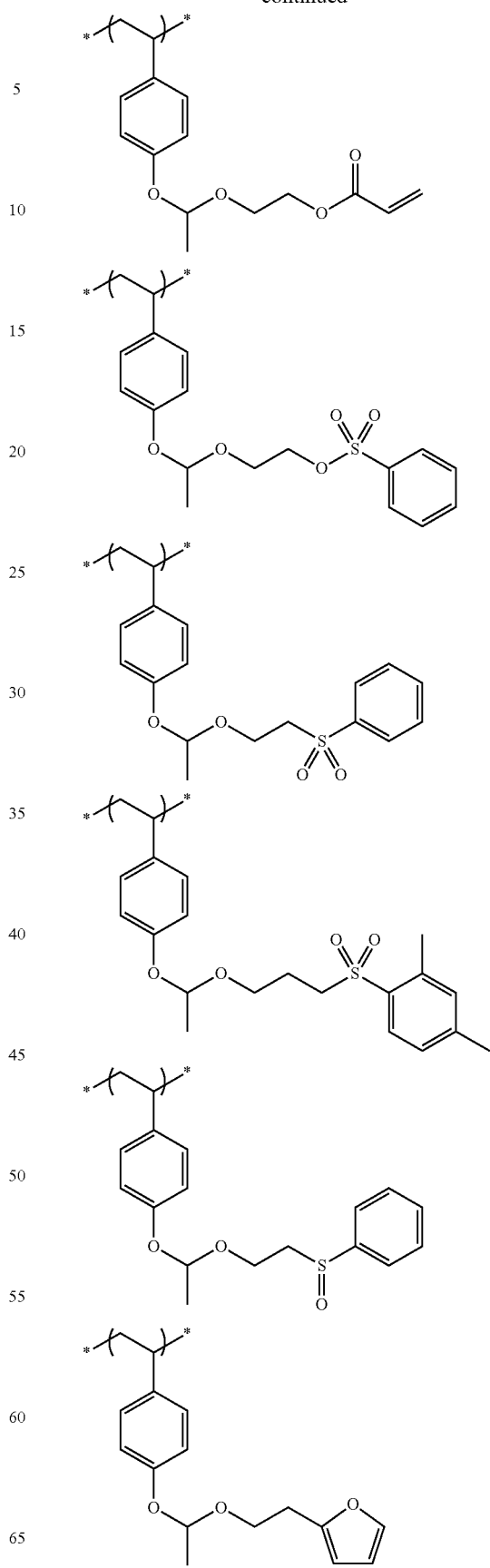

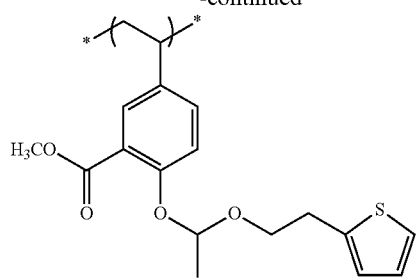
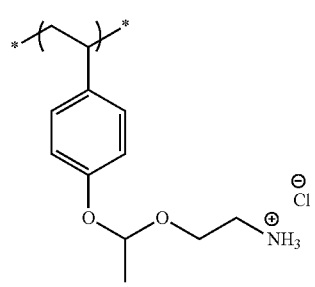
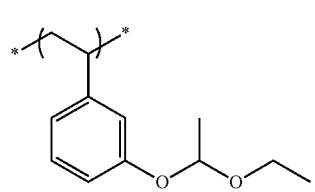
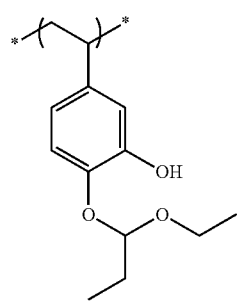
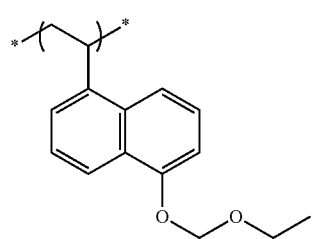
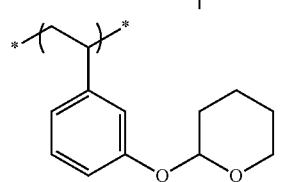
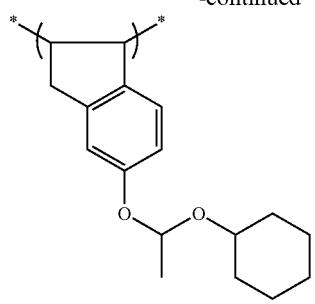
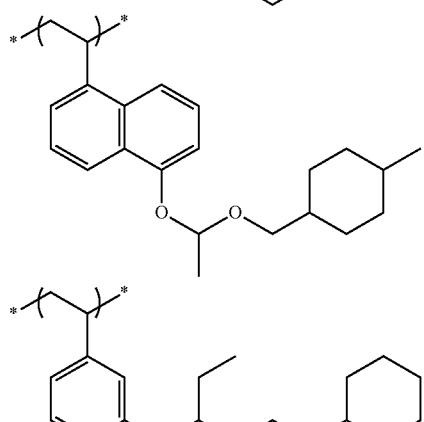
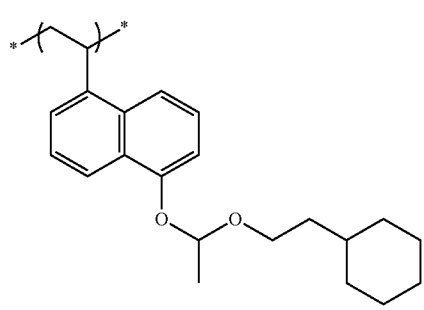
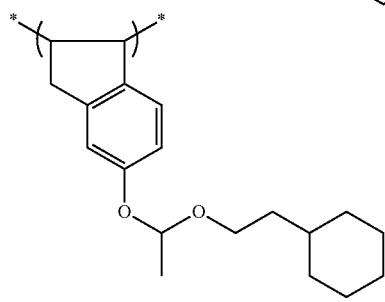
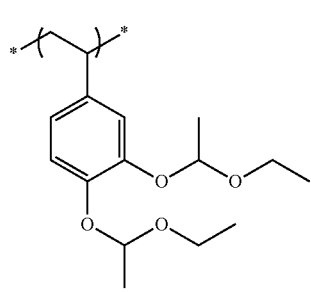

-continued
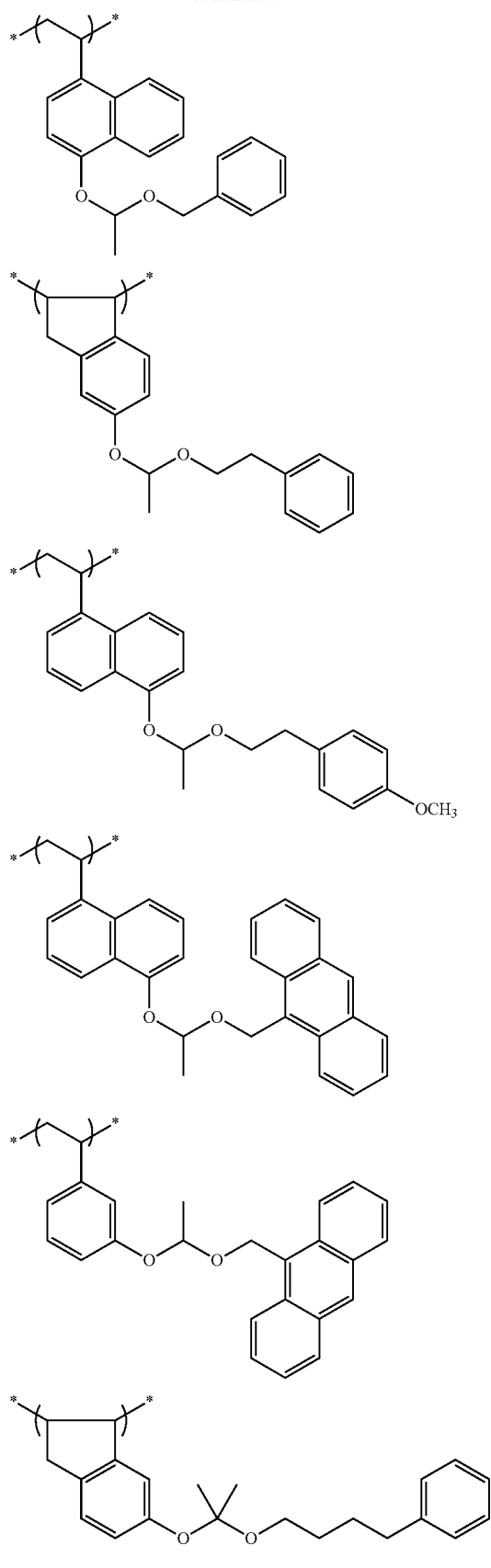
-continued
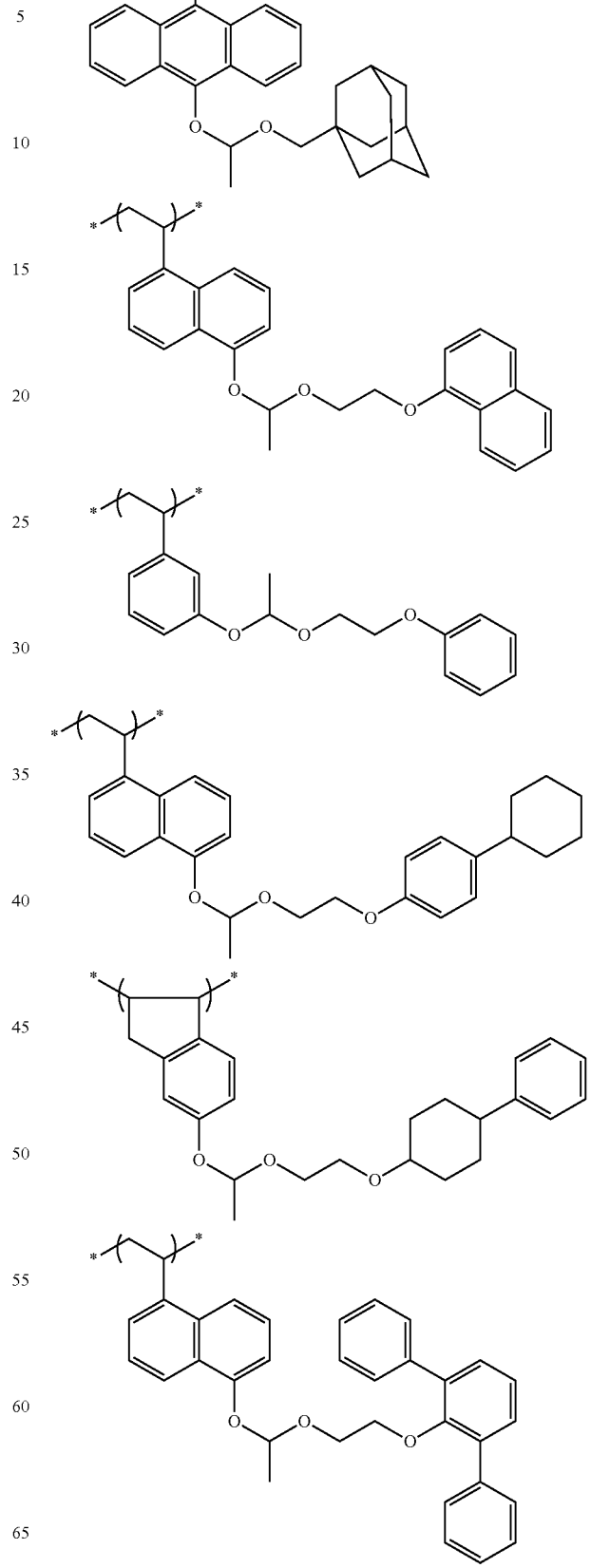

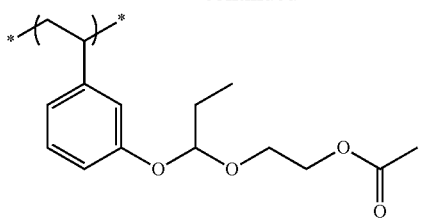

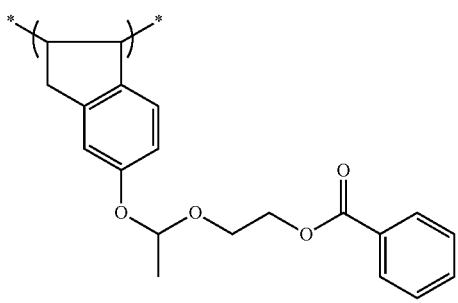

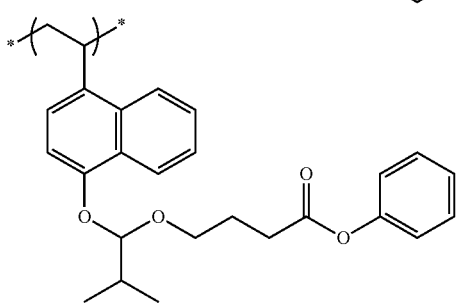

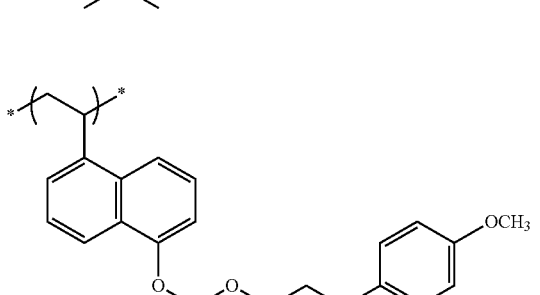

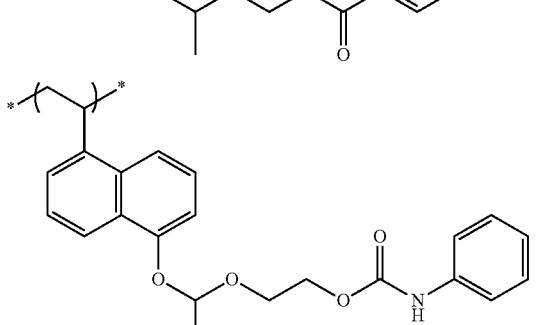

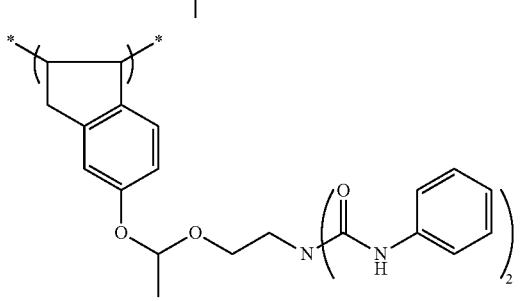

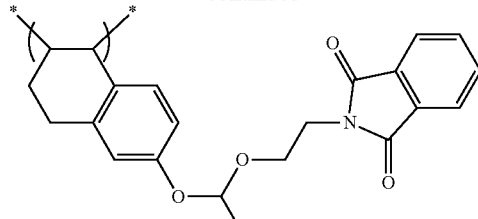

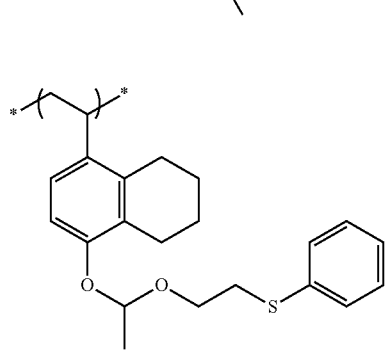

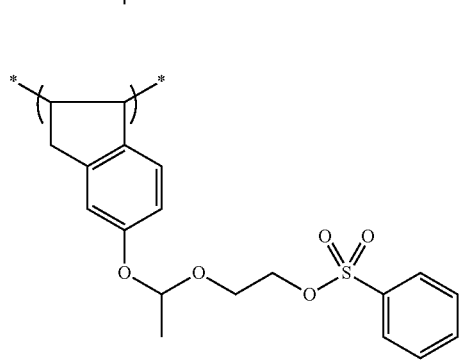

Also, the acid-decomposable resin (A) may contain a repeating unit represented by the following formula (X) as a repeating unit having an acid-decomposable group.

Formula (X)

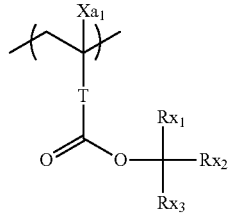

In formula (X), $Xa_1$ represents a hydrogen atom, a methyl group, a trifluoromethyl group or a hydroxymethyl group.

T represents a single bond or a divalent linking group.

Each of $Rx_1$ to $Rx_3$ independently represents a hydrogen atom, a (linear or branched) alkyl group, a (monocyclic or polycyclic) cycloalkyl group, or a monovalent aromatic ring group. Two members out of $Rx_1$ to $Rx_3$ may combine to form a (monocyclic or polycyclic) cycloalkyl group. However, two or more of $Rx_1$ to $Rx_3$ are not a hydrogen atom at the same time.

Examples of the divalent linking group of T include an alkylene group, a —COO-Rt- group, a —O-Rt- group, a divalent aromatic ring group, and a group formed by combining two or more thereof In the formulae, Rt represents an alkylene group, a cycloalkylene group, a divalent aromatic ring group, or a group formed by combining an alkylene group and a divalent aromatic ring group. The carbon number of the divalent linking group of T is preferably 1 to 20, more preferably from 1 to 15, still more preferably from 2 to 10.

The alkylene group of T and Rt may be linear or branched, and preferred examples thereof include an alkylene group having a carbon number of 1 to 8, such as methylene group, ethylene group, propylene group, butylene group, hexylene group and octylene group. An alkylene group having a carbon number of 1 to 5 is more preferred.

The cycloalkylene group of Rt may be monocyclic or polycyclic, and preferred examples thereof include a cycloalkylene group having a carbon number of 3 to 17, such as cyclobutylene group, cyclopentylene group, cyclohexylene group, norbornanylene group, adamantylene group and diamantanylene group.

Examples of the divalent aromatic ring group of T and Rt include an arylene group having a carbon number of 6 to 14, which may have a substituent, such as phenylene group, tolylene group and naphthylene group, and a divalent aromatic ring group containing a heterocyclic ring such as thiophene, furan, pyrrole, benzothiophene, benzofuran, benzopyrrole, triazine, imidazole, benzimidazole, triazole, thiadiazole and thiazole. An arylene group having a carbon number of 6 to 14, which may have a substituent, such as phenylene group and naphthylene group, is preferred.

T is preferably a single bond, a —COO-Rt- group or a divalent aromatic ring group. Rt is preferably an alkylene group having a carbon number of 1 to 5, more preferably a —CH$_2$— group, a —(CH$_2$)$_2$— group or a —(CH$_2$)$_3$— group.

The alkyl group as Rx$_1$ to Rx$_3$ is preferably an alkyl group having a carbon number of 1 to 4, such as methyl group, ethyl group, n-propyl group, isopropyl group, n-butyl group, isobutyl group and tert-butyl group.

The cycloalkyl group as Rx$_1$ to Rx$_3$ is preferably a monocyclic cycloalkyl group such as cyclopentyl group and cyclohexyl group, or a polycyclic cycloalkyl group such as norbornyl group, tetracyclodecanyl group, tetracyclododecanyl group and adamantyl group.

The cycloalkyl group formed by combining two members out of Rx$_1$ to Rx$_3$ is preferably a cycloalkyl group having a carbon number of 3 to 20 and is preferably a monocyclic cycloalkyl group such as cyclopentyl group and cyclohexyl group, or a polycyclic cycloalkyl group such as norbornyl group, tetracyclodecanyl group, tetracyclododecanyl group and adamantyl group.

The monovalent aromatic ring group of Rx$_1$ to Rx$_3$ is preferably a monovalent aromatic ring group having a carbon number of 6 to 20, and examples thereof include a phenyl group and a naphthyl group. In the case where one of Rx$_1$ to Rx$_3$ represents a hydrogen atom, at least either one of other groups is preferably a monovalent aromatic ring group. An embodiment where Rx$_1$ is a methyl group or an ethyl group and Rx$_2$ and Rx$_3$ are combined to form the above-described cycloalkyl group, or an embodiment where each of Rx$_1$ and Rx$_2$ is independently a methyl group or an ethyl group and Rx$_3$ is the above-described cycloalkyl group, is preferred.

Specific examples of the repeating unit represented by formula (X) are illustrated below, but the present invention is not limited thereto.

(In the formulae, Rx represents H, CH$_3$, CF$_3$ or CH$_2$OH, and each of Rxa and Rxb represents an alkyl group having a carbon number of 1 to 4.)

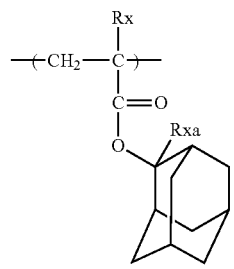

1

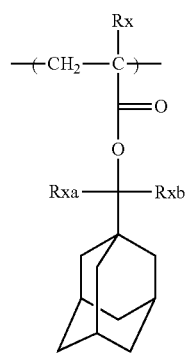

2

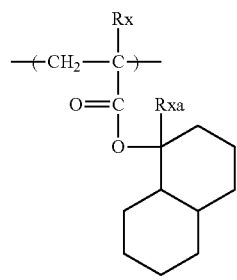

3

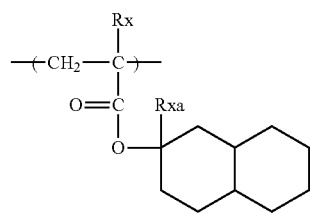

4

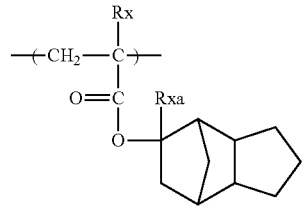

5

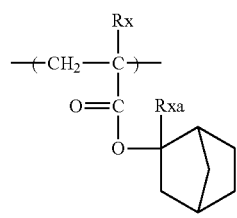

6

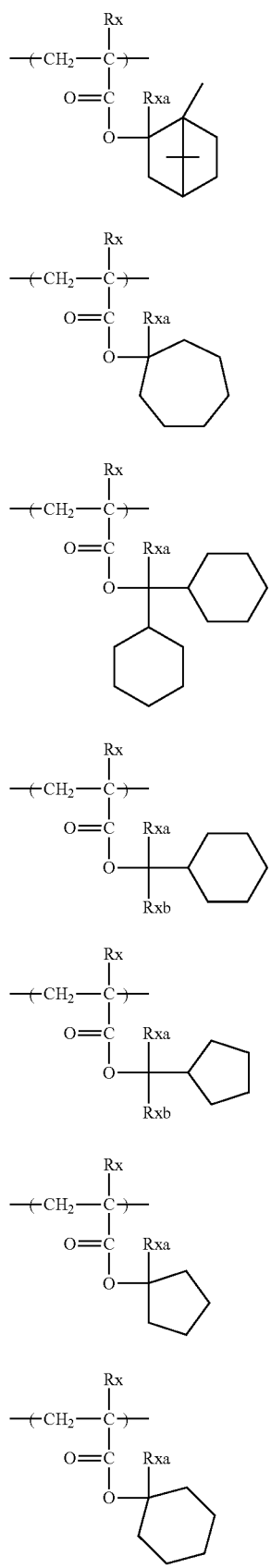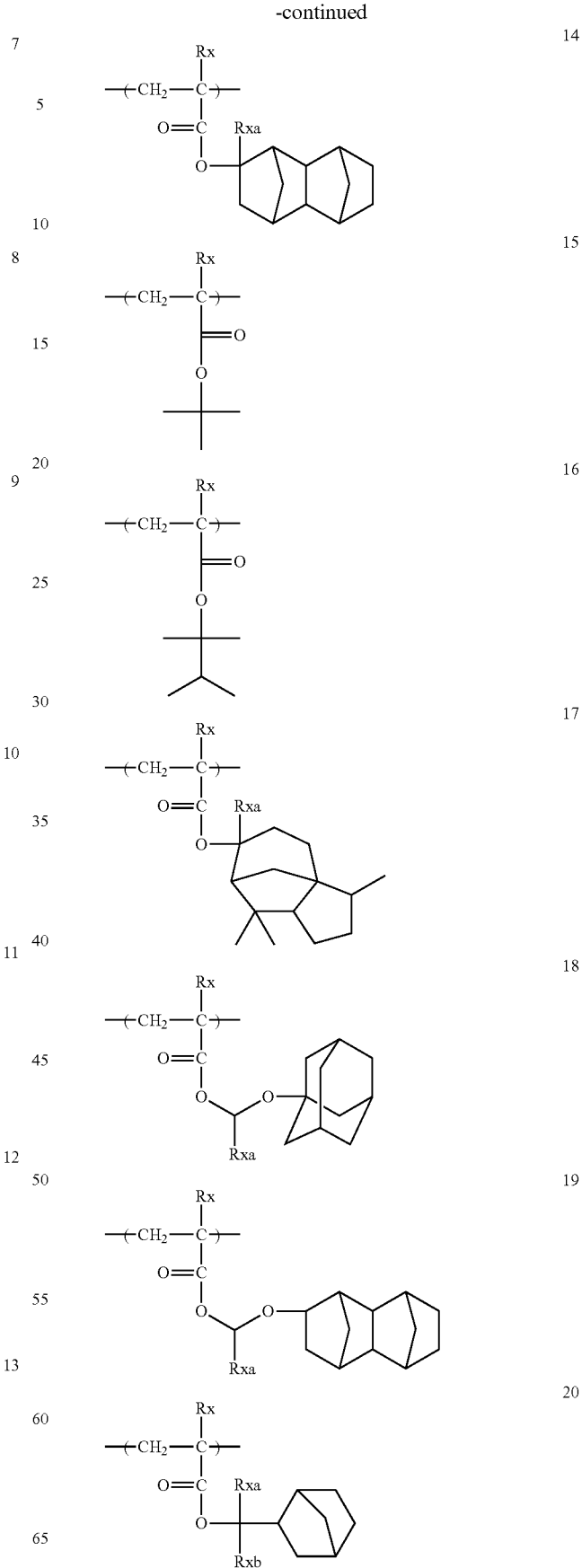

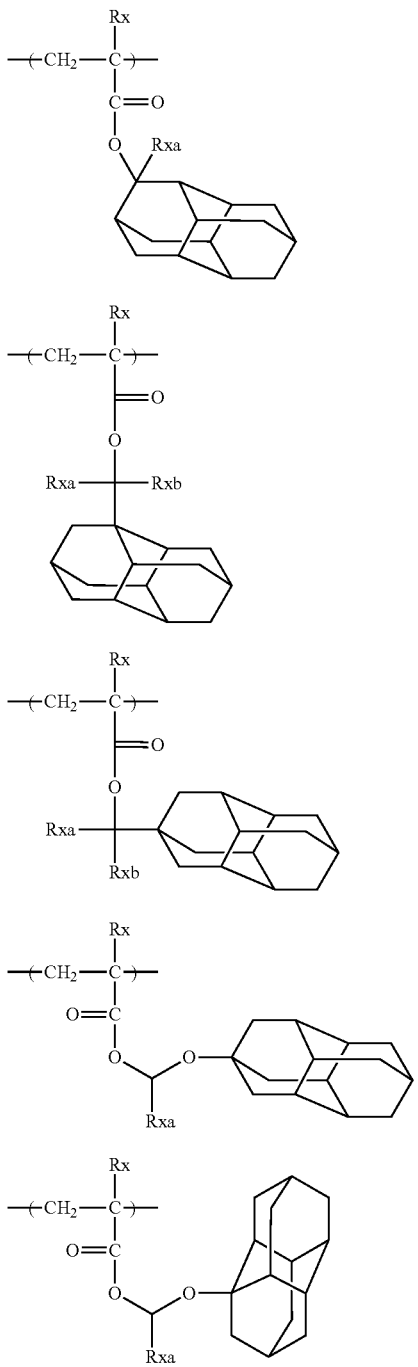

The acid-decomposable resin (A) can be obtained, as disclosed in European Patent 254853, JP-A-2-25850, JP-A-3-223860, JP-A-4-251259 and the like, for example, by reacting an alkali-soluble group-containing resin with a precursor of a group capable of leaving by the action of an acid or by copolymerizing various monomers with an alkali-soluble resin monomer having bonded to a group capable of leaving by the action of an acid.

The alkali-soluble group-containing resin above is not particularly limited, but examples thereof include a resin containing a phenolic hydroxyl group, and a resin containing a carboxyl group-containing repeating unit such as (meth) acrylic acid and norbornenecarboxylic acid.

Preferred examples of the resin containing a phenolic hydroxyl group include a resin having a hydroxystyrene structural unit, such as poly(o-hydroxystyrene), poly(m-hydroxystyrene), poly(p-hydroxystyrene), a copolymer thereof, hydrogenated poly(hydroxystyrene), poly(hydroxystyrene)s having a substituent represented by the following structures, styrene-hydroxystyrene copolymer, α-methylstyrene-hydroxystyrene copolymer and hydrogenated novolak resin.

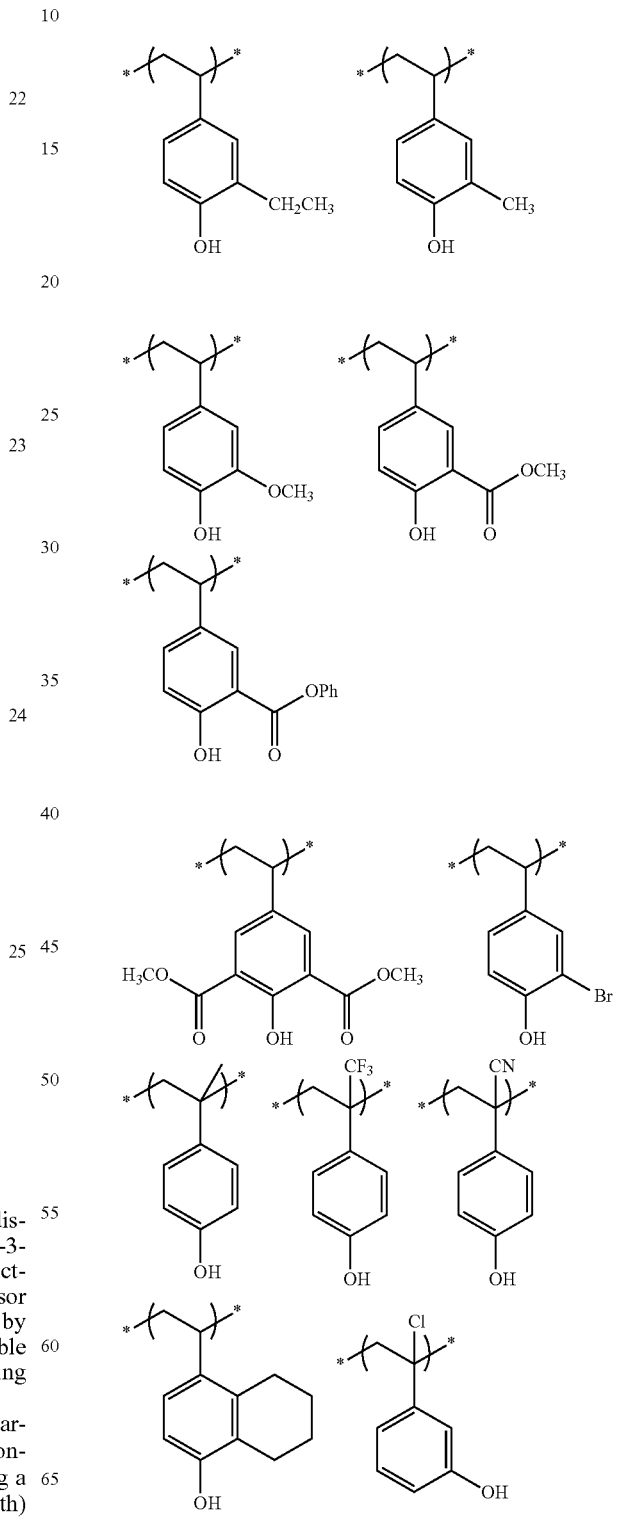

-continued

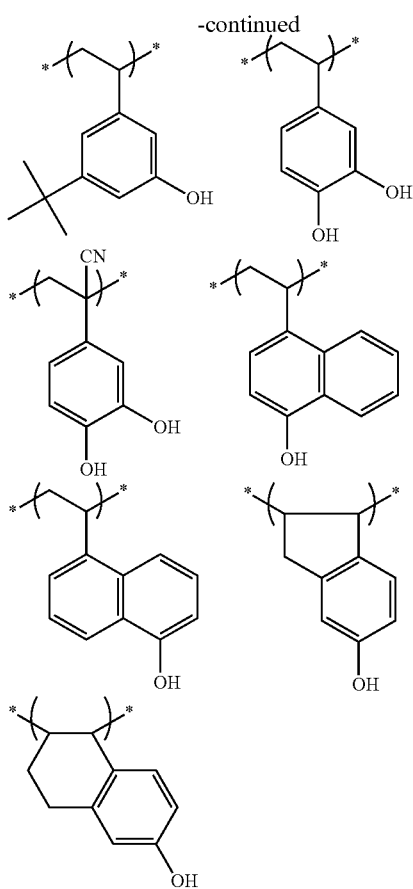

The alkali dissolution rate of these resins is preferably 170Å/sec or more, more preferably 330Å/sec or more, as measured at 23° C. by using a 2.38 mass % tetramethylammonium hydroxide (TMAH) solution.

Examples of the monomer employable as a raw material of these resins include an alkylcarbonyloxystyrene (e.g., tert-butoxycarbonyloxystyrene), an alkoxystyrene (e.g., 1-alkoxyethoxystyrene, tert-butoxystyrene) and a (meth)acrylic acid tertiary alkyl ester (e.g., tert-butyl(meth)acrylate, 2-alkyl-2-adamantyl(meth)acrylate, dialkyl(1-adamantyl)methyl(meth)acrylate).

The content of the group capable of decomposing by the action of an acid is calculated according to the formula B/(B+S) using the number (B) of groups capable of decomposing by the action of an acid and the number (S) of alkali-soluble groups not protected with a group capable of leaving by the action of an acid, in the resin. The content is preferably from 0.01 to 0.7, more preferably from 0.05 to 0.50, still more preferably from 0.05 to 0.40.

In the case where the composition of the present invention is irradiated with KrF excimer laser light, electron beam, X-ray or high-energy beam at a wavelength of 50 nm or less (e.g., EUV), particularly when the composition is irradiated with KrF excimer laser light, the acid-decomposable resin (A) preferably contains a repeating unit having an aromatic group. It is more preferred that the acid-decomposable resin (A) contains hydroxystyrene as a repeating unit. Examples of this resin include a copolymer of a hydroxystyrene and a hydroxystyrene protected with a group capable of leaving by the action of an acid, and a copolymer of a hydroxystyrene and a (meth)acrylic acid tertiary alkyl ester.

The acid-decomposable resin (A) is more preferably a resin containing both a repeating unit represented by formula (VI) and a repeating unit represented by formula (IA).

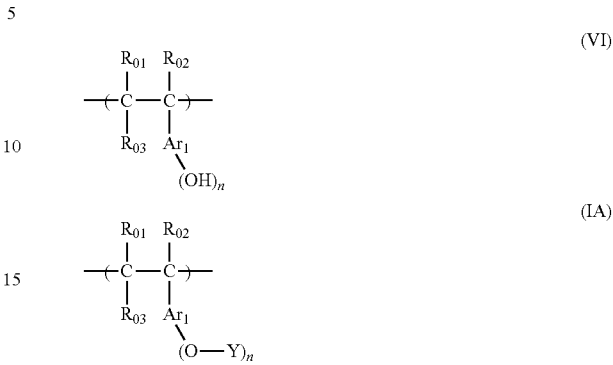

In the formulae, $R_{01}$, $R_{02}$, $R_{03}$, $Ar_1$, n and Y are the same as those described for formula (IA).

The acid-decomposable resin (A) may further contain a repeating unit stable to the action of an acid, in addition to the above-described repeating units. By further containing a repeating unit stable to the action of an acid, adjustment of the contrast, enhancement of the etching resistance, and the like can be expected. This repeating unit includes, for example, a repeating unit represented by the following formula (III):

Formula (III)

In the formula, Ra represents a hydrogen atom, an alkyl group or a cyano group. $R_5$ represents a hydrocarbon group.

The alkyl group as Ra may further have a substituent. Examples of the substituent include a halogen atom such as fluorine atom and chlorine atom, and a hydroxy group. Examples of the alkyl group of Ra include a methyl group, a chloromethyl group, a trifluoromethyl group and a hydroxymethyl group. Ra is preferably a hydrogen atom or a methyl group.

The hydrocarbon group of $R_5$ preferably contains a ring structure. In this case, specific examples include a monocyclic or polycyclic cycloalkyl group (preferably having a carbon number of 3 to 12, more preferably a carbon number of 3 to 7), a monocyclic or polycyclic cycloalkenyl group (preferably having a carbon number of 3 to 12), an aryl group (preferably having a carbon number of 6 to 20, more preferably a carbon number of 6 to 12), and an aralkyl group (preferably having a carbon number of 7 to 21, more preferably a carbon number of 7 to 13).

The cycloalkyl group above includes a ring assembly hydrocarbon group and a crosslinked cyclic hydrocarbon group. Examples of the crosslinked cyclic hydrocarbon group include a bicyclic hydrocarbon group, a tricyclic hydrocarbon group and a tetracyclic hydrocarbon group. The crosslinked cyclic hydrocarbon group also includes a condensed ring group formed by fusing, for example, a plurality of 5- to 8-membered cycloalkane rings.

Preferred examples of the crosslinked cyclic hydrocarbon group include a norbornyl group, an adamantyl group, a bicyclooctanyl group and a tricyclo[5,2,1,0$^{2,6}$]decanyl group. Of these crosslinked cyclic hydrocarbon groups, a norbornyl group and an adamantyl group are more preferred.

Preferred examples of the aryl group include a phenyl group and a naphthyl group, and preferred examples of the aralkyl group include a phenylmethyl group, a phenylethyl group and a naphthylmethyl group.

These hydrocarbon groups may further have a substituent, and preferred examples of the substituent include a halogen atom, an alkyl group, a cycloalkyl group, a hydroxyl group with a hydrogen atom being substituted for, and an amino group with a hydrogen atom being substituted for. The halogen atom is preferably bromine atom, chlorine atom or fluorine atom, and the alkyl group is preferably a methyl group, an ethyl group, a butyl group or a tert-butyl group. Preferred examples of the cycloalkyl group include a cyclopentyl group, a cyclohexyl group and a cycloheptyl group.

Examples of the substituent for a hydrogen atom include an alkyl group, a cycloalkyl group, an aralkyl group, a substituted methyl group, a substituted ethyl group, an acyl group, an alkoxycarbonyl group and an aralkyloxycarbonyl group. The alkyl group is preferably an alkyl group having a carbon number of 1 to 4; the cycloalkyl group is preferably a cycloalkyl group having a carbon number of 3 to 7; the aralkyl group is preferably an aralkyl group having a carbon number of 7 to 12; the substituted methyl group is preferably a methoxymethyl group, a methoxythiomethyl group, a benzyloxymethyl group, a tert-butoxymethyl group or a 2-methoxyethoxymethyl group; the substituted ethyl group is preferably a 1-ethoxyethyl group or a 1-methyl-1-methoxyethyl group; the acyl group is preferably an aliphatic acyl group having a carbon number of 1 to 6, such as formyl group, acetyl group, propionyl group, butyryl group, isobutyryl group, valeryl group and pivaloyl group; the alkoxycarbonyl group is preferably an alkoxycarbonyl group having a carbon number of 2 to 4; and the aralkyloxycarbonyl group is preferably an aralkyloxycarbonyl group having a carbon number of 8 to 12.

The acid-decomposable resin (A) may or may not contain a repeating unit represented by formula (III) but in the case of containing the repeating unit, the content thereof is preferably from 0.1 to 40 mol %, more preferably from 0.1 to 20 mol %, still more preferably from 1 to 15 mol %, based on all repeating units in the acid-decomposable resin (A).

Specific examples of the repeating unit represented by formula (III) are illustrated below, but the present invention is not limited thereto. In the formulae, Ra represents a hydrogen atom, an alkyl group or a cyano group.

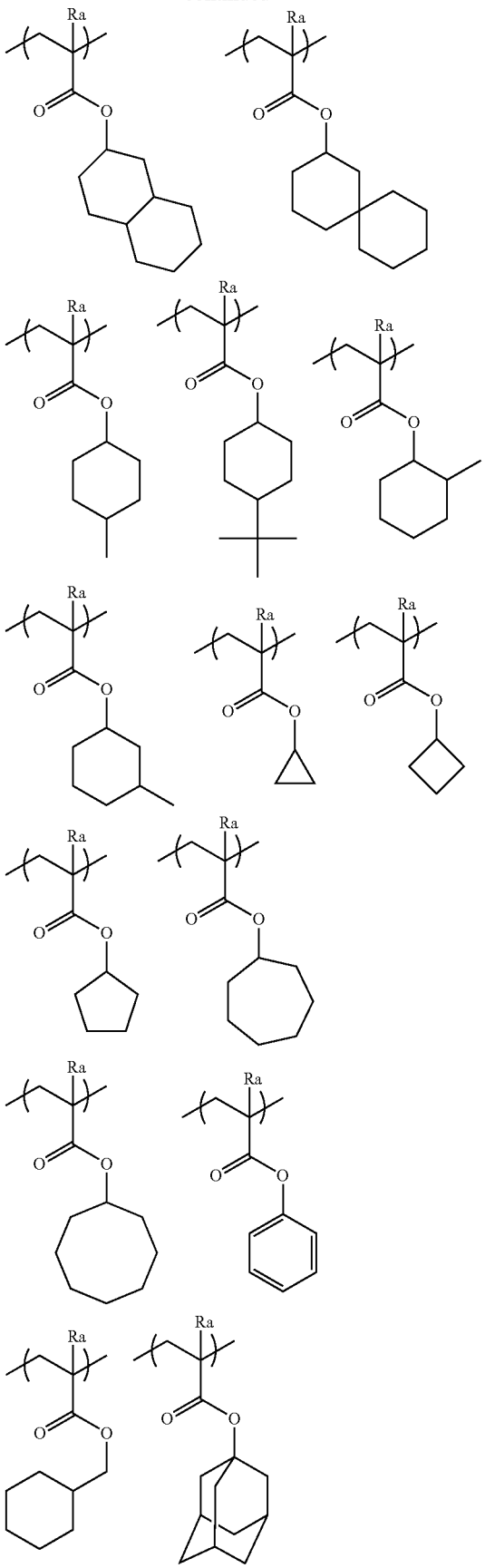

-continued

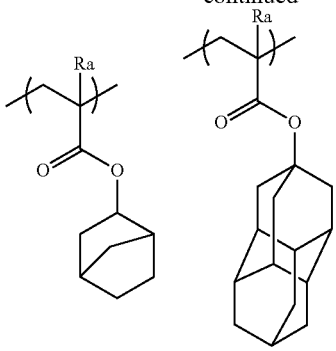

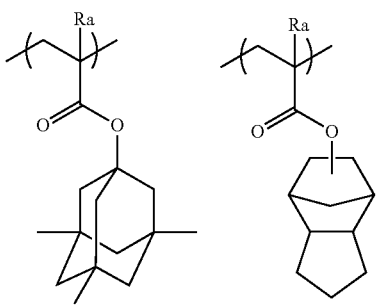

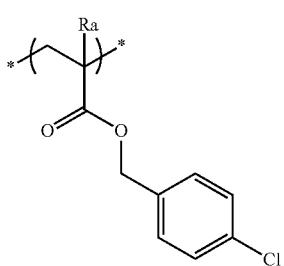

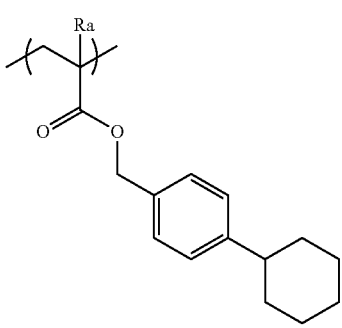

-continued

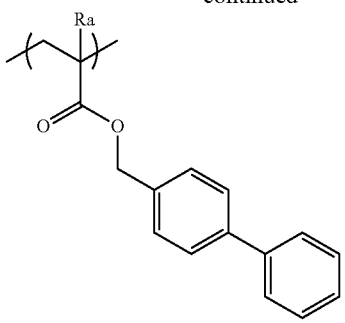

The acid-decomposable resin (A) preferably further contains a repeating unit having a development auxiliary group, that is, a group capable of decomposing by the action of an alkali developer to increase the dissolution rate in the developer. In this case, the development auxiliary group decomposes at alkali development and the dissolution rate in the alkali developer increases.

The development auxiliary group is, for example, a group that decomposes by the action of an alkali developer to produce a hydrophilic functional group. Examples of the hydrophilic functional group include an alkali-soluble group such as carboxy group and hydroxyl group.

Examples of the development auxiliary group include a lactone structure-containing group, a carboxylic acid ester group substituted with a polar group such as halogen atom, an acid anhydride structure-containing group, a cyclic amide structure-containing group, an acid amide group, a carboxylic acid thioester group, a carbonic acid ester group, a sulfuric acid ester group and a sulfonic acid ester group. A group having at least one partial structure of a lactone structure, a cyclic amide structure and a cyclic acid anhydride structure is preferred, and a lactone structure-containing group is more preferred.

Incidentally, a carboxylic acid ester group not substituted with a polar group such as halogen atom (for example, an ester group directly bonded to the main chain of a (meth) acrylate repeating unit and not substituted with a polar group such as halogen atom) is low in the rate of decomposition reaction with an alkali developer and therefore, such a carboxylic acid ester group is not included in the development auxiliary group.

As for the lactone structure-containing group, a 5- to 7-membered ring lactone structure is preferred, and a structure where another ring structure is fused to a 5- to 7-membered ring lactone structure in the form of forming a bicyclo or spiro structure is more preferred.

The repeating unit having a development auxiliary group is preferably a repeating unit having a lactone structure represented by any one of the following formulae (LC1-1) to (LC1-17). The lactone structure-containing group may be bonded directly to the main chain. Preferred lactone structures in the lactone structure-containing group are (LC1-1), (LC1-4), (LC1-5), (LC1-6), (LC1-13), (LC1-14) and (LC1-17), with (LC1-4) being more preferred. By using a specific lactone structure, the line edge roughness and development defect can be more reduced.

LC1-1 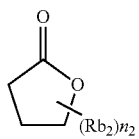
LC1-2 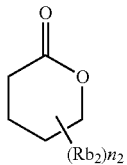
LC1-3 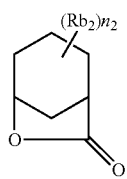
LC1-4 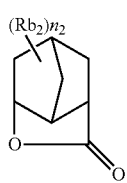
LC1-5 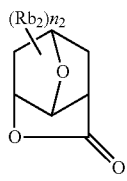
LC1-6 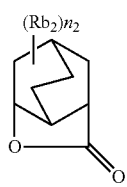
LC1-7 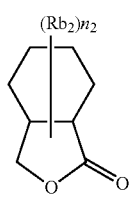
LC1-8 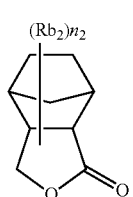
LC1-9 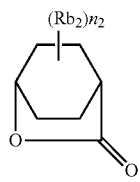
LC1-10 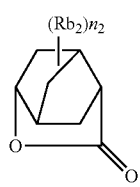
LC1-11 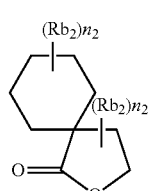
LC1-12 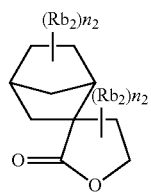
LC1-13 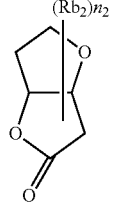
LC1-14 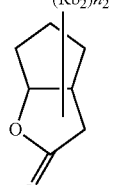
LC1-15 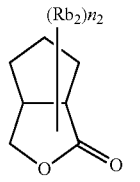
LC1-16 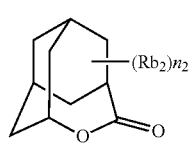

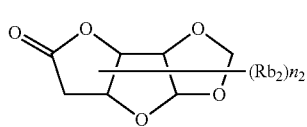
LC1-17

The lactone structure moiety may or may not have a substituent ($Rb_2$). Preferred examples of the substituent ($Rb_2$) include an alkyl group having a carbon number of 1 to 8, a cycloalkyl group having a carbon number of 3 to 7, an alkoxy group having a carbon number of 1 to 8, an alkoxycarbonyl group having a carbon number of 1 to 8, a carboxy group, a halogen atom, a hydroxyl group, a cyano group and an acid-decomposable group.

$n_2$ represents an integer of 0 to 4. When $n_2$ is an integer of 2 or more, each substituent $Rb_2$ may be the same as or different from every other substituent $Rb_2$. Also, in this case, the plurality of $Rb_2$'s may combine with each other to form a ring.

Structures where $n_2$ in (LC1-1) to (LC1-17) is 2 or less are more preferred. The lactone structure-containing group is preferably a monovalent organic group having an unsubstituted lactone structure, or a monovalent organic group having a lactone structure containing a methyl group, a cyano group or an alkoxycarbonyl group as the substituent, more preferably a monovalent organic group having a lactone structure containing a cyano group as the substituent (cyanolactone).

The repeating unit having a lactone structure represented by any one of formulae (LC1-1) to (LC1-17) includes a repeating unit represented by the following formula (AII):

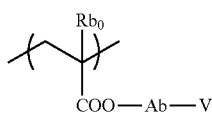
Formula (AII)

In formula (AII), $Rb_0$ represents a hydrogen atom, a halogen atom or an alkyl group (preferably having a carbon number of 1 to 4).

The alkyl group of $Rb_0$ may have a substituent, and preferred examples of the substituent which the alkyl group of $Rb_0$ may have include a hydroxyl group and a halogen atom. This halogen atom includes a fluorine atom, a chlorine atom, a bromine atom and an iodine atom.

$Rb_0$ is preferably a hydrogen atom, a methyl group, a hydroxymethyl group or a trifluoromethyl group, more preferably a hydrogen atom or a methyl group.

Ab represents an alkylene group, a divalent linking group having a monocyclic or polycyclic alicyclic hydrocarbon structure, a single bond, an ether bond, an ester bond, a carbonyl group, or a combination thereof (preferably having a total carbon number of 20 or less). Ab is preferably a single bond or a linking group represented by -$Ab_1$-$CO_2$-.

$Ab_1$ is an alkylene group (which may be linear or branched) or a monocyclic or polycyclic cycloalkylene group and is preferably a methylene group, an ethylene group, a cyclohexylene group, an adamantylene group or a norbornylene group.

V represents a group having a lactone structure represented by any one of formulae (LC1-1) to (LC1-17). The lactone structure-containing group may be a monovalent group where one arbitrary hydrogen atom in the lactone structure represented by any one of formulae (LC1-1) to (LC1-17) is replaced by a bond to Ab.

The lactone structure-containing repeating unit usually has an optical isomer, but any optical isomer may be used. One optical isomer may be used alone or a mixture of a plurality of optical isomers may be used. In the case of mainly using one optical isomer, the optical purity thereof is preferably 90% ee or more, more preferably 95% ee or more.

Particularly preferred repeating units having a group containing a lactone structure include the following repeating units. By selecting a group containing an optimal lactone structure, the pattern profile and iso/dense bias can be more improved. In the formulae, each of Rx and R represents H, $CH_3$, $CH_2OH$ or $CF_3$.

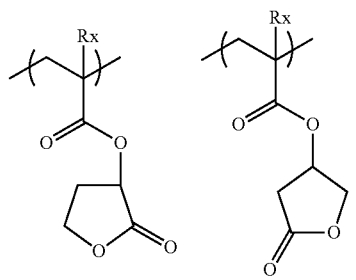

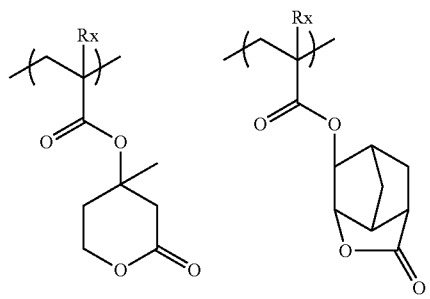

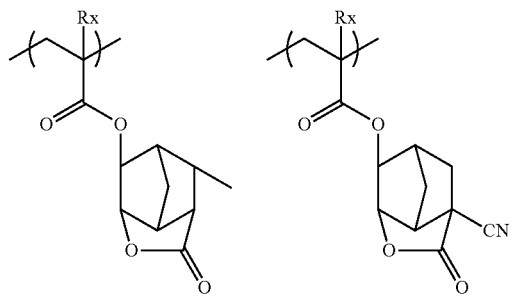

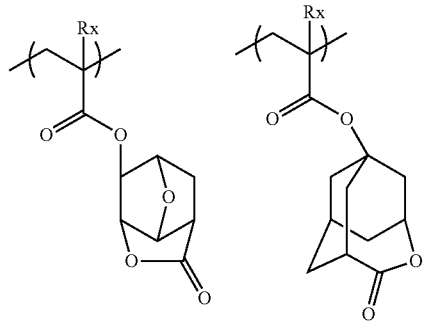

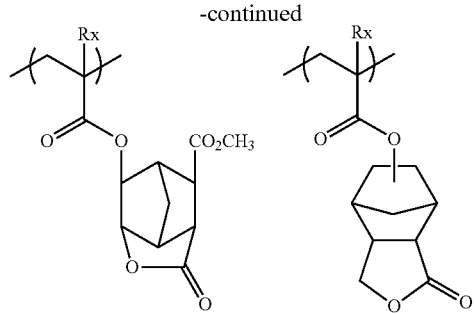
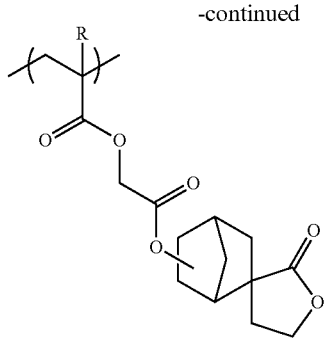
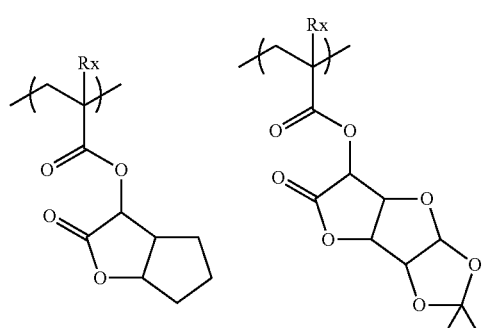
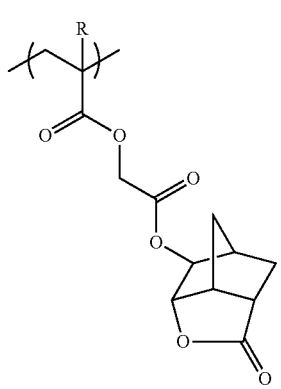
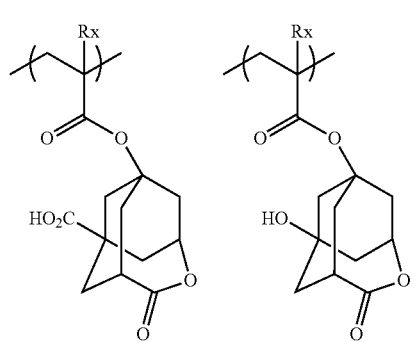
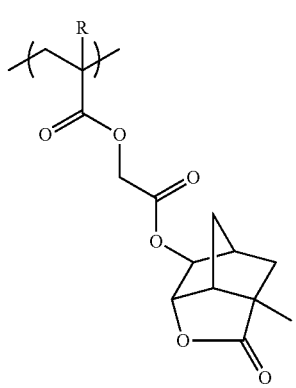
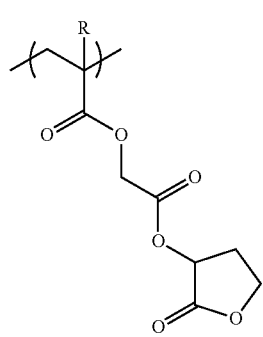
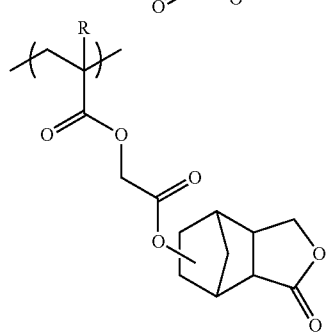
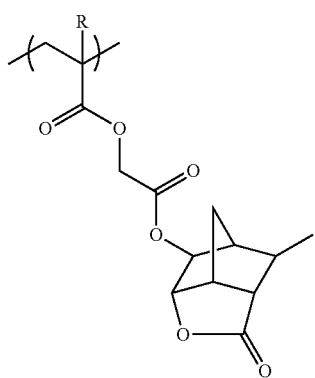

49
-continued
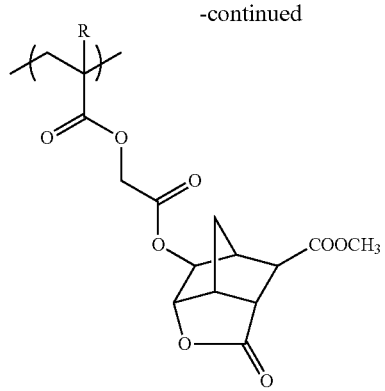
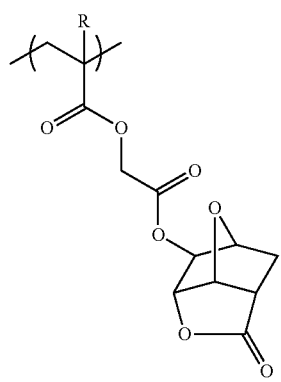
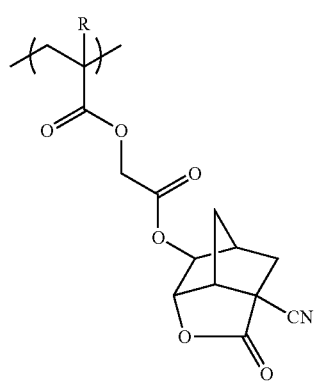
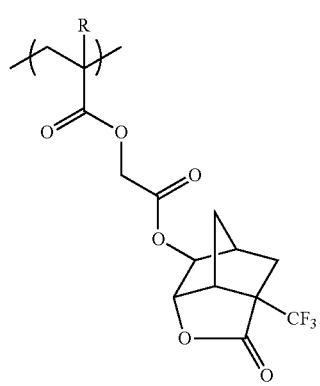
50
-continued
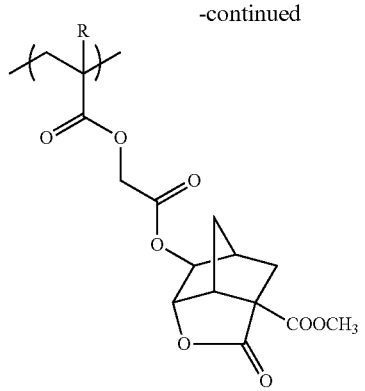
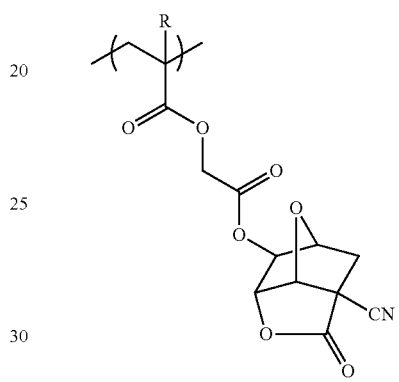
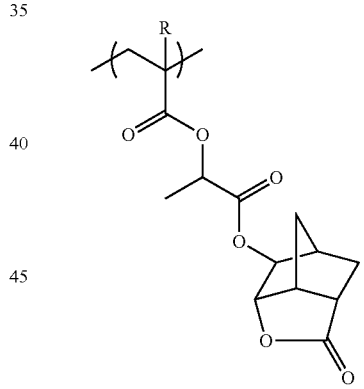
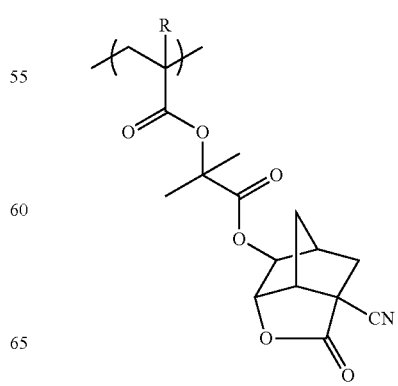

51
-continued
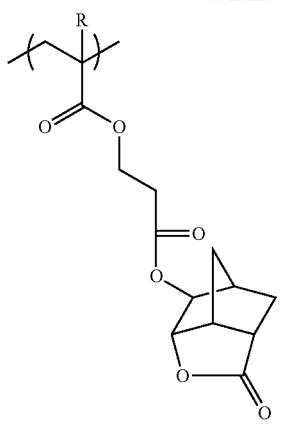
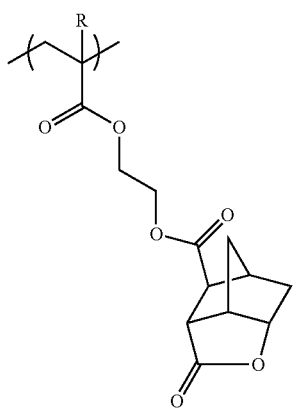
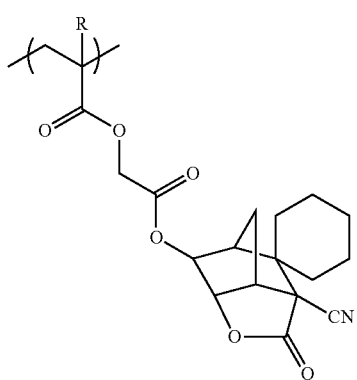
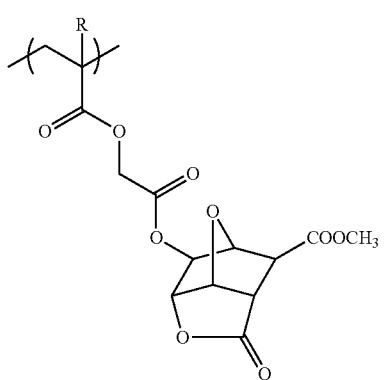
52
-continued
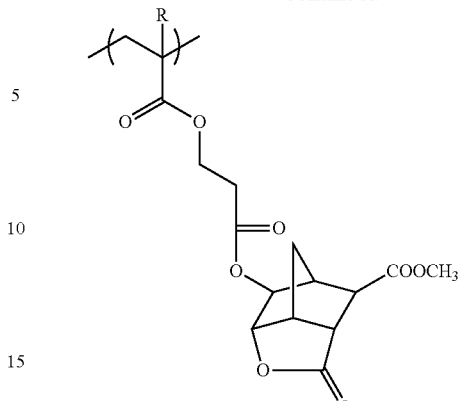
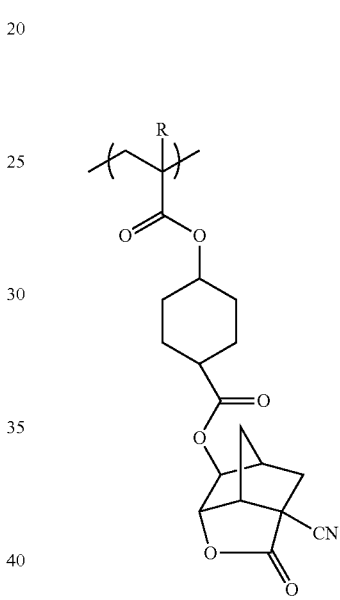
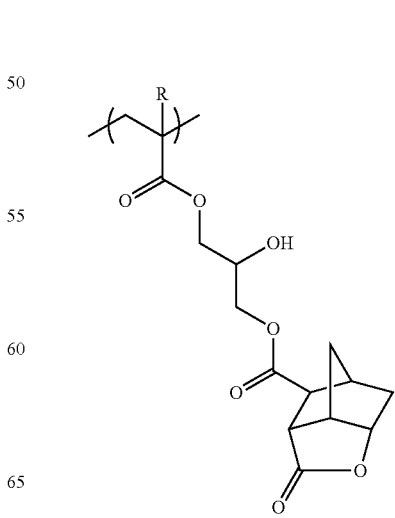

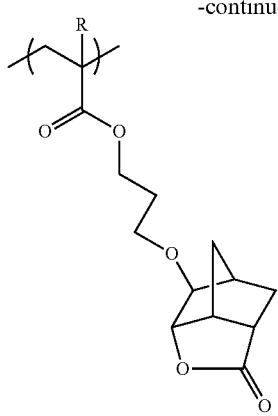

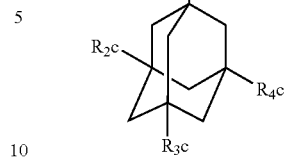

(VIIa)

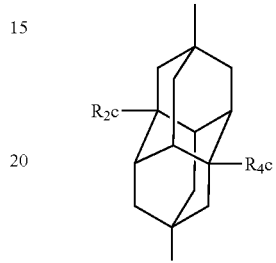

(VIIb)

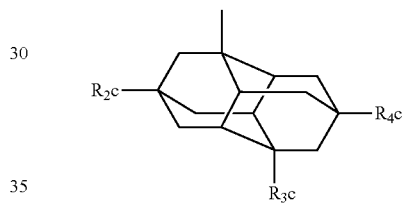

(VIIc)

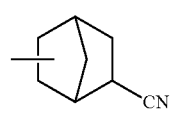

(VIId)

The repeating unit having a development auxiliary group is preferably, for example, a repeating unit where a development auxiliary group is bonded to the main chain of the resin, such as repeating unit by an acrylic acid ester or a methacrylic acid ester. Alternatively, this repeating unit may be introduced into the terminal of the resin by using a development auxiliary group-containing polymerization initiator or chain transfer agent at the polymerization.

In the case where the acid-decomposable resin (A) contains a development auxiliary group, the content of the repeating unit having a development auxiliary group in the acid-decomposable resin (A) is preferably from 1 to 60 mol %, more preferably from 3 to 50 mol %, still more preferably from 5 to 45 mol %, based on all repeating units of the acid-decomposable resin (A).

The acid-decomposable resin (A) may further contain a repeating unit having a hydroxyl group or a cyano group, other than the above-described repeating units. Thanks to this repeating unit, the adherence to substrate and the affinity for developer can be enhanced. The repeating unit having a hydroxyl group or a cyano group is preferably a repeating unit having an alicyclic hydrocarbon structure substituted with a hydroxyl group or a cyano group and preferably has no acid-decomposable group. The alicyclic hydrocarbon structure in the alicyclic hydrocarbon structure substituted with a hydroxyl group or a cyano group is preferably an adamantyl group, a diamantyl group or a norbornane group. The alicyclic hydrocarbon structure substituted with a hydroxyl group or a cyano group is preferably a partial structure represented by the following formulae (VIIa) to (VIId):

In formulae (VIIa) to (VIIc), each of $R_2c$ to $R_4c$ independently represents a hydrogen atom, a hydroxyl group or a cyano group, provided that at least one of $R_2c$ to $R_4c$ represents a hydroxyl group or a cyano group. A structure where one or two members out of $R_2c$ to $R_4c$ are a hydroxyl group with the remaining being a hydrogen atom is preferred. In formula (VIIa), it is more preferred that two members out of $R_2c$ to $R_4c$ are a hydroxyl group and the remaining is a hydrogen atom.

The repeating unit having a partial structure represented by formulae (VIIa) to (VIId) includes repeating units represented by the following formulae (AIIa) to (AIId):

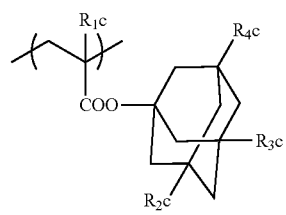

(AIIa)

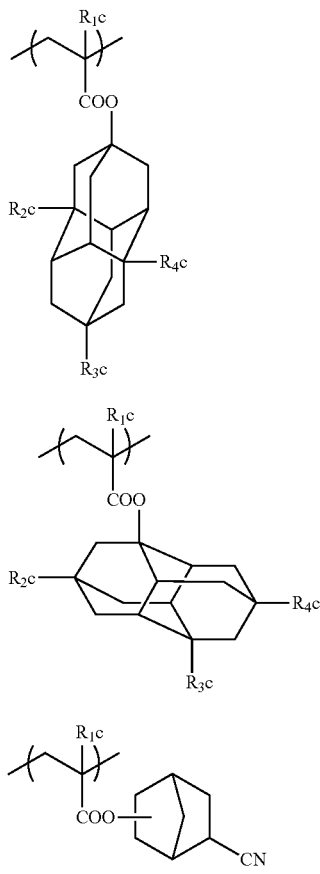

(AIIb)

(AIIc)

(AIId)

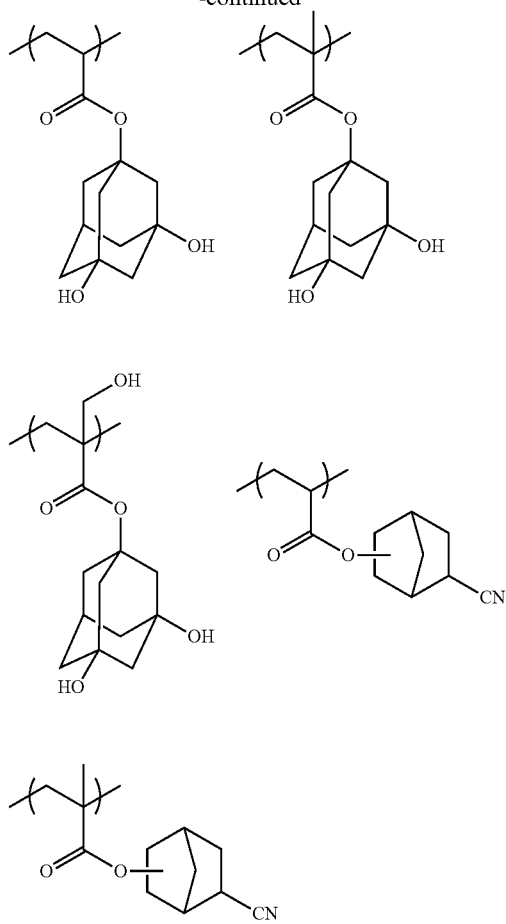

In formulae (AIIa) to (AIId), R₁c represents a hydrogen atom, a methyl group, a trifluoromethyl group or a hydroxymethyl group.

R₂c to R₄c have the same meanings as R₂c to R₄c in formulae (VIIa) to (VIIc).

In the case where the acid-decomposable resin (A) contains a repeating unit represented by formulae (AIIa) to (AIId), the content thereof is preferably from 0.5 to 80 mol %, more preferably from 1 to 60 mol %, still more preferably from 2 to 40 mol %, based on all repeating units in the acid-decomposable resin (A).

Specific examples of the repeating units represented by formulae (AIIa) to (AIId) are illustrated below, but the present invention is not limited thereto.

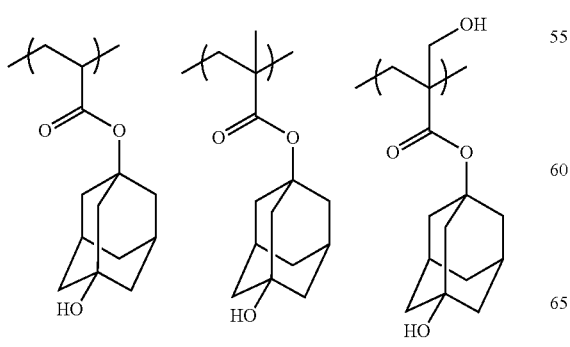

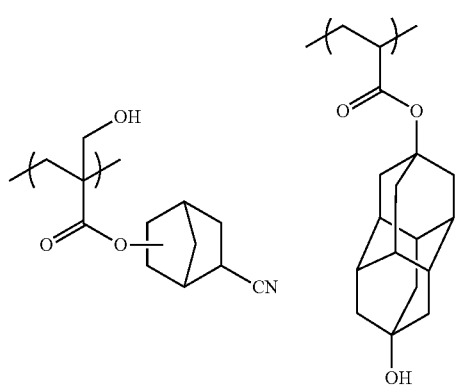

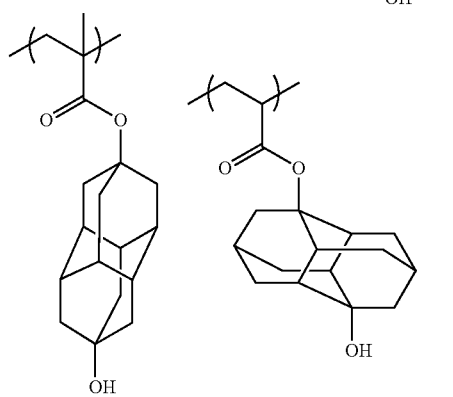

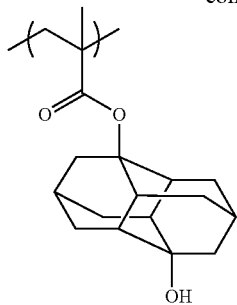

The acid-decomposable resin (A) may contain repeating units derived from other polymerizable monomers, in addition to the above-described repeating units. Examples of other polymerizable monomers include a compound having at least one addition-polymerizable unsaturated bond selected from (meth)acrylic acid esters, (meth)acrylamides, allyl compounds, vinyl ethers, vinyl esters, styrenes and crotonic acid esters. Other polymerizable monomers also include maleic anhydride, maleimide, acrylonitrile, methacrylonitrile and maleylonitrile.

Specific preferred examples of the repeating units derived from those other polymerizable monomers are illustrated below, but the present invention is not limited thereto.

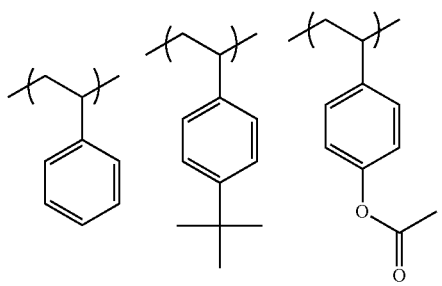

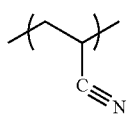

The content of the repeating unit derived from other polymerizable monomers is generally 50 mol % or less, preferably 30 mol % or less, based on all repeating units in the acid-decomposable resin (A).

The acid-decomposable resin (A) may contain a repeating unit having an alkali-soluble group such as hydroxyl group, carboxy group and sulfonic acid group, and the content of the repeating unit having an alkali-soluble group such as hydroxyl group, carboxy group and sulfonic acid group is preferably from 1 to 99 mol %, more preferably from 3 to 95 mol %, still more preferably from 5 to 90 mol %, based on all repeating units constituting the acid-decomposable resin (A).

The content of the repeating unit having an acid-decomposable group is preferably from 3 to 95 mol %, more preferably from 5 to 90 mol %, still more preferably from 10 to 85 mol %, based on all repeating units constituting the acid-decomposable resin (A).

In the case where the composition of the present invention is used for ArF exposure, in view of transparency to ArF light, the acid-decomposable resin (A) preferably has substantially no aromatic group (specifically, the ratio of an aromatic group-containing repeating unit in the resin (A) is preferably 5 mol % or less, more preferably 3 mol % or less, and ideally 0 mol %, that is, the resin does not have an aromatic group), and the acid-decomposable resin (A) preferably has a monocyclic or polycyclic alicyclic hydrocarbon structure. Incidentally, when the composition of the present invention is used for ArF exposure, the acid-decomposable resin (A) preferably contains no fluorine atom and no silicon atom in view of compatibility with the later-described hydrophobic resin (HR).

The resin (A) can be synthesized by a conventional method (for example, radical polymerization) and then purified. For details of the synthesis method and purification method, please refer to, for example, "Kobunshi Gosei (Polymer Synthesis)" of Dai 5-Han Jikken Kagaku Koza 26, Kobunshi Kagaku (Experimental Chemistry Course 26, Polymer Chemistry, 5th Edition), Chapter 2, Maruzen. The weight average molecular weight of the acid-decomposable resin (A) is preferably 50,000 or less, more preferably from 1,000 to 50,000, still more preferably from 1,000 to 25,000, in terms of polystyrene by the GPC method (solvent: THF).

The dispersity (Mw/Mn) of the acid-decomposable resin (A) is preferably from 1.0 to 3.0, more preferably from 1.05 to 2.0, still more preferably from 1.1 to 2.0.

As for the acid-decomposable resin (A), one kind of a resin may be used or two or more kinds of resins may be used in combination. The content of the acid-decomposable resin (A) is preferably from 30 to 99 mass %, more preferably from 50 to 99 mass %, still more preferably from 70 to 99 mass %, based on the entire solid content in the actinic ray-sensitive or radiation-sensitive resin composition of the present invention.

Specific preferred examples of the acid-decomposable resin (A) are illustrated below, but the present invention is not limited thereto.

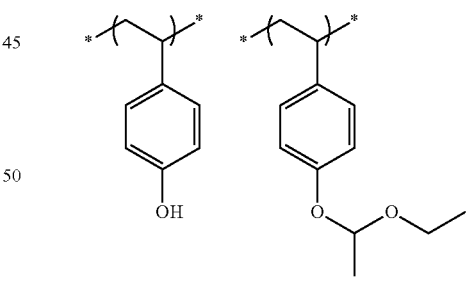

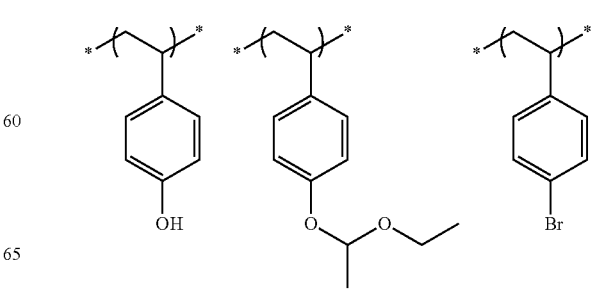

59
-continued
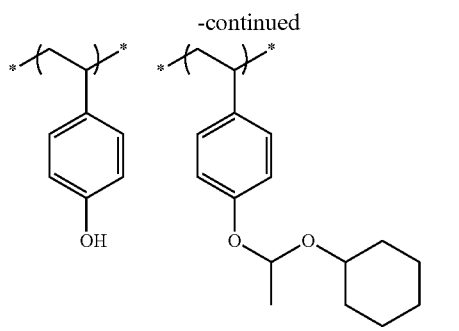
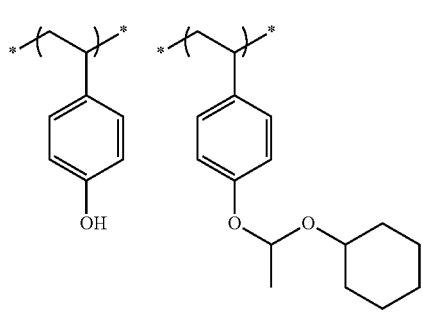
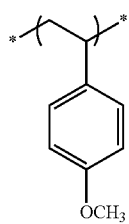
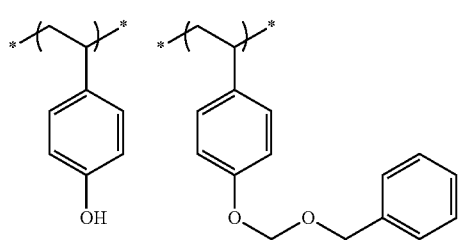
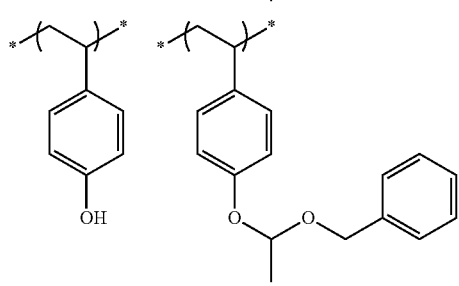
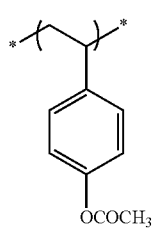
60
-continued
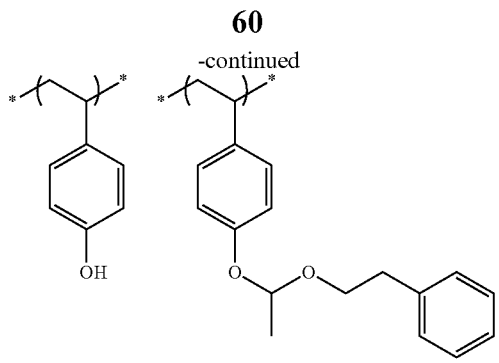
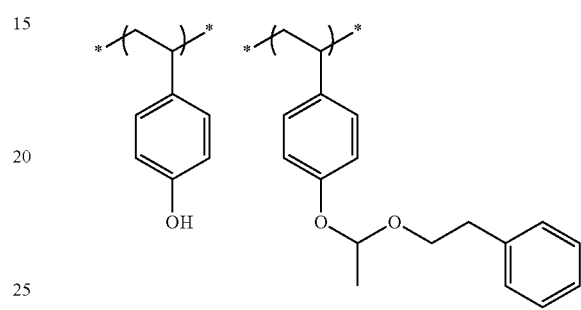
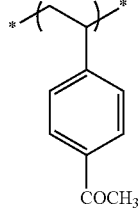
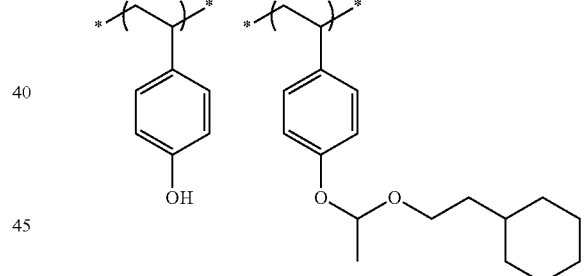
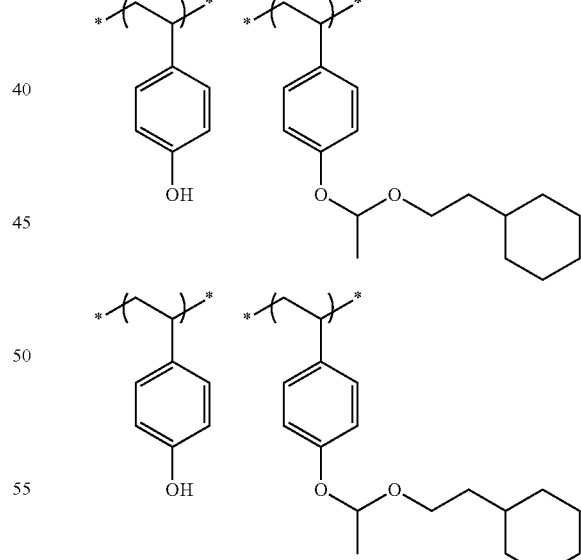
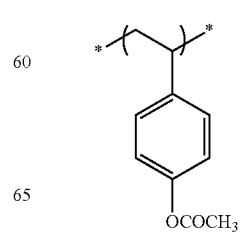

61
-continued
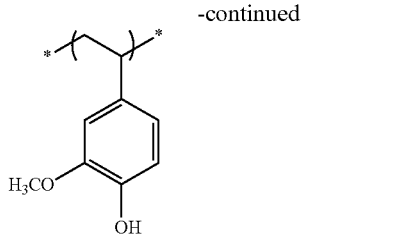
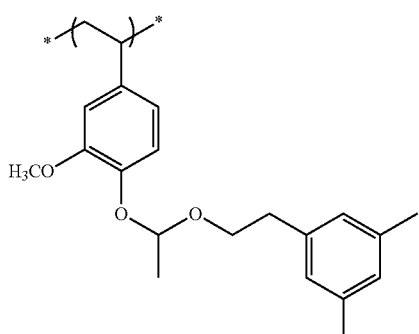
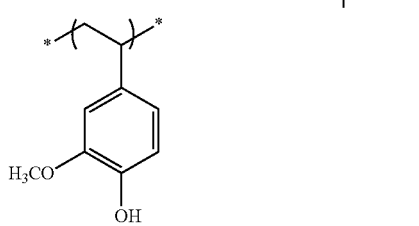
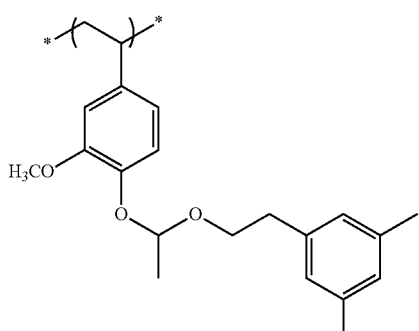
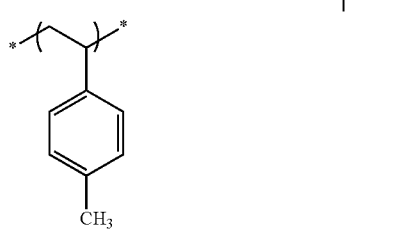
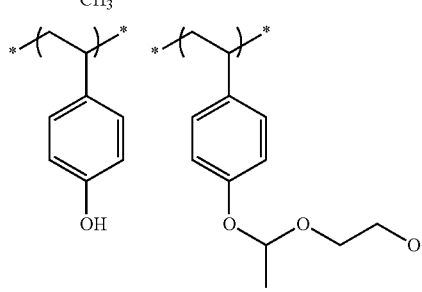
62
-continued
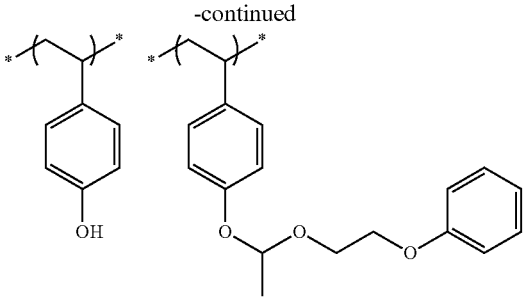
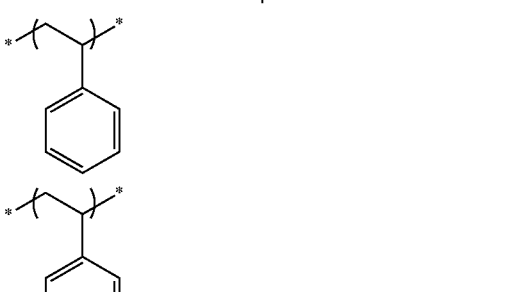
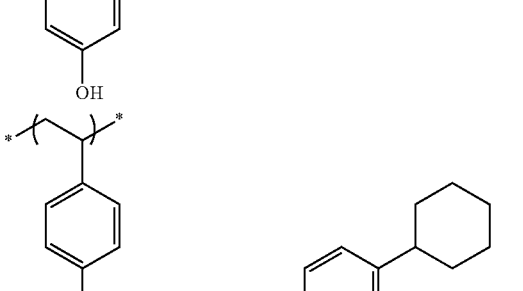
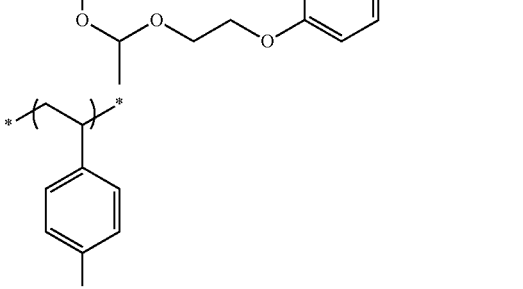
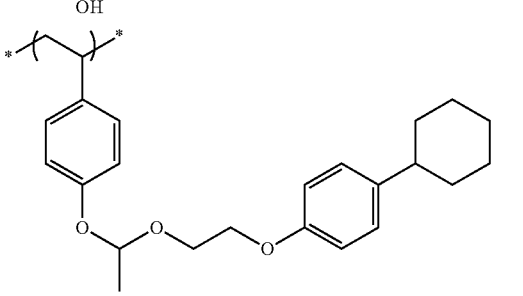
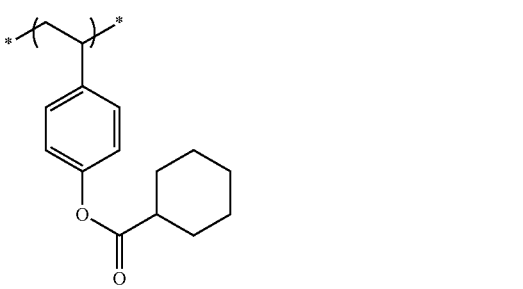

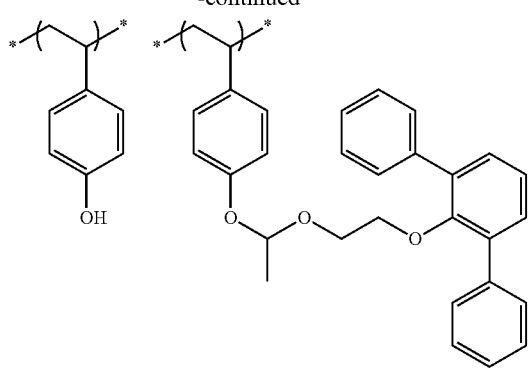
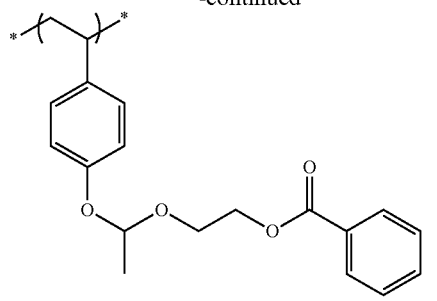
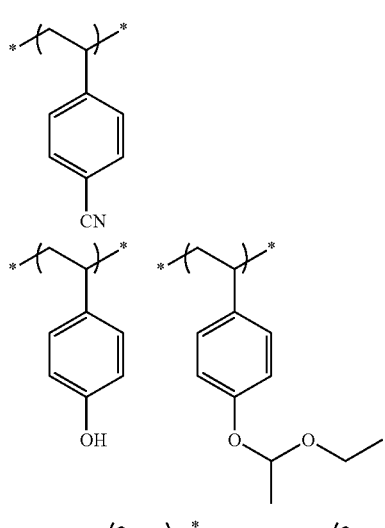
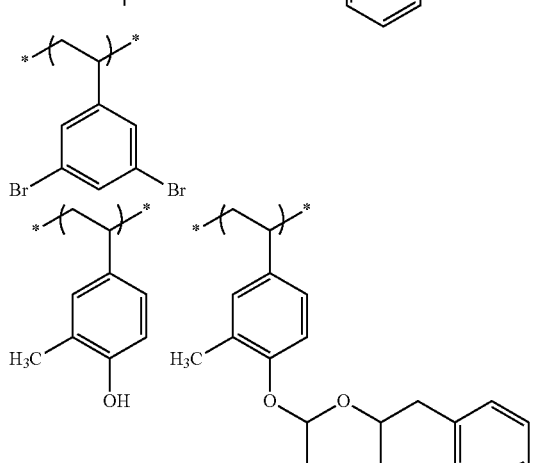
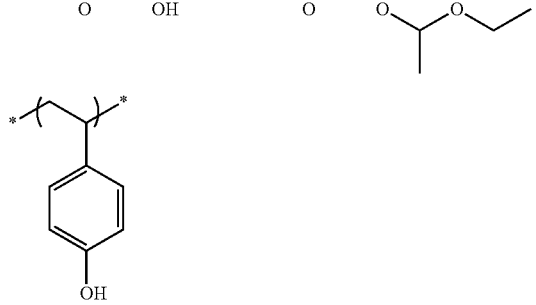
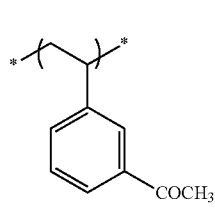

65
-continued
66
-continued
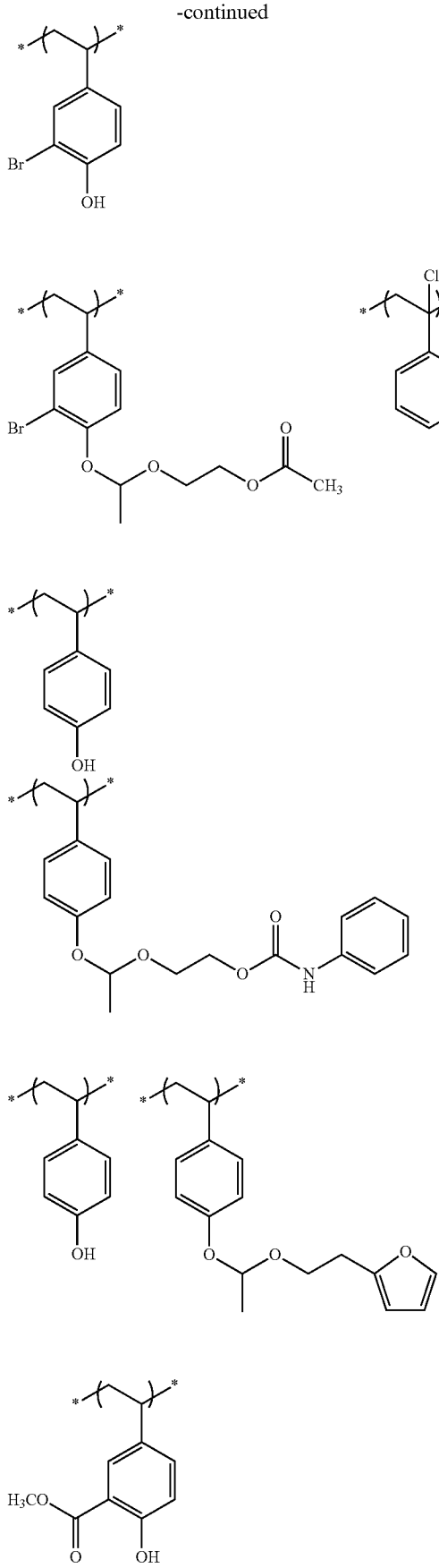
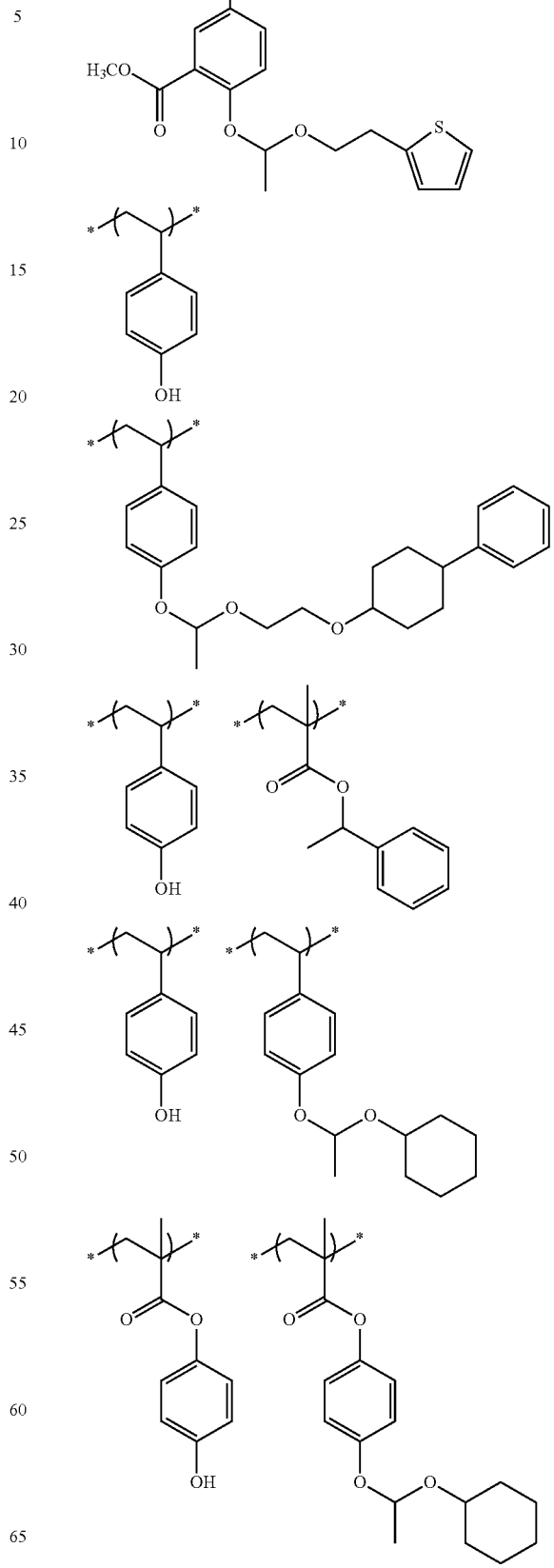

-continued
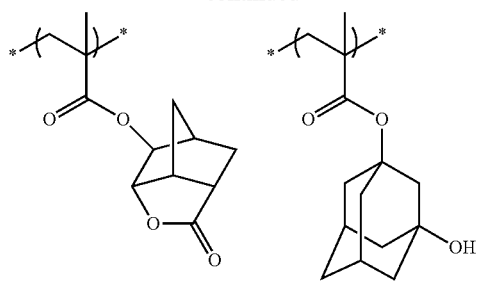
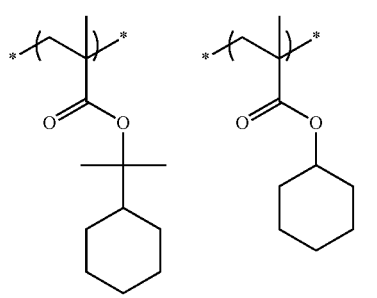
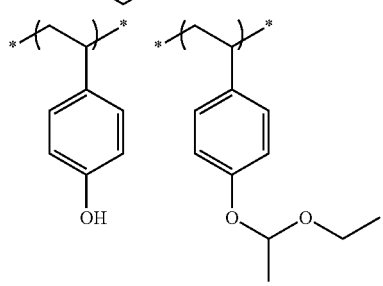
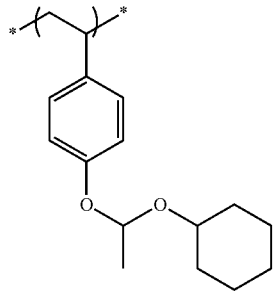
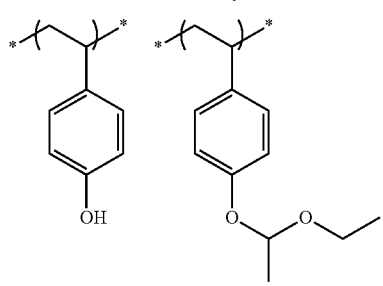
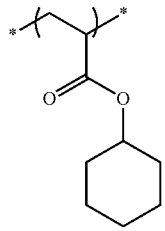
-continued
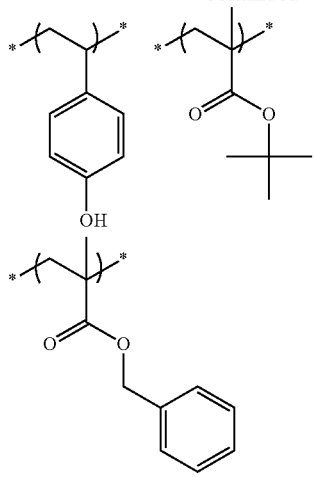
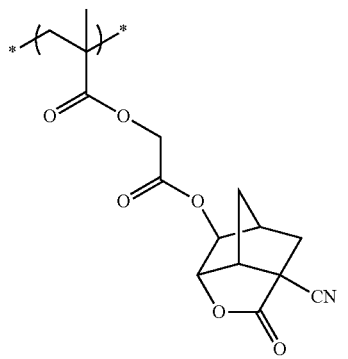
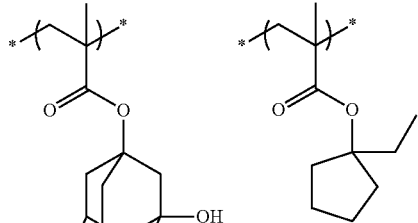
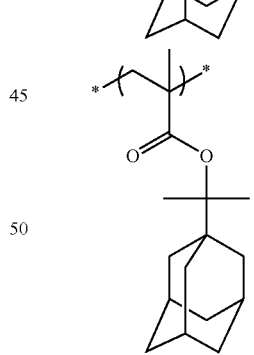
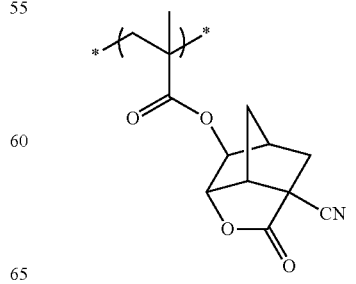
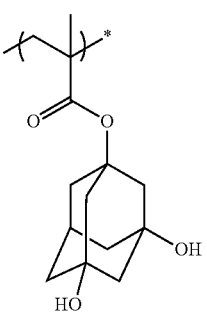

-continued

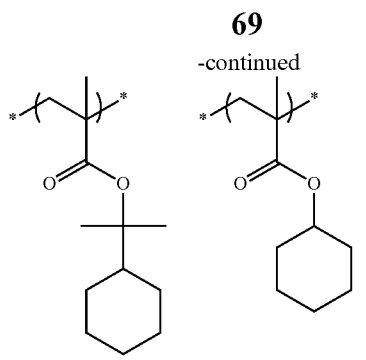

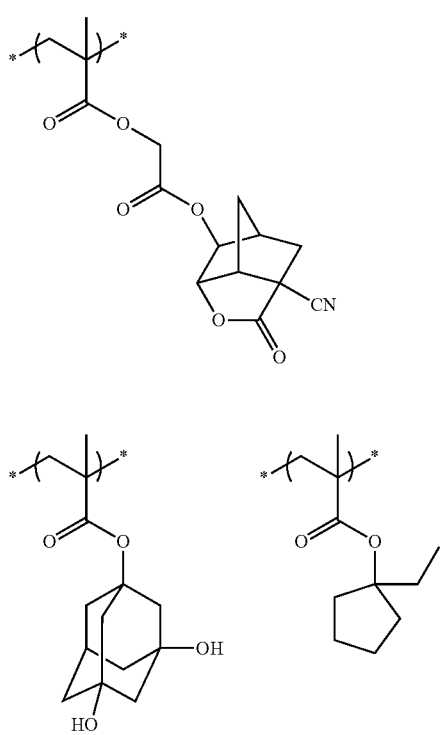

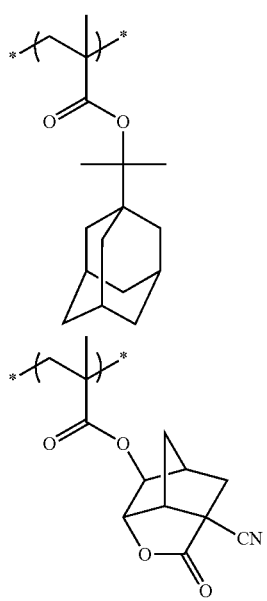

-continued

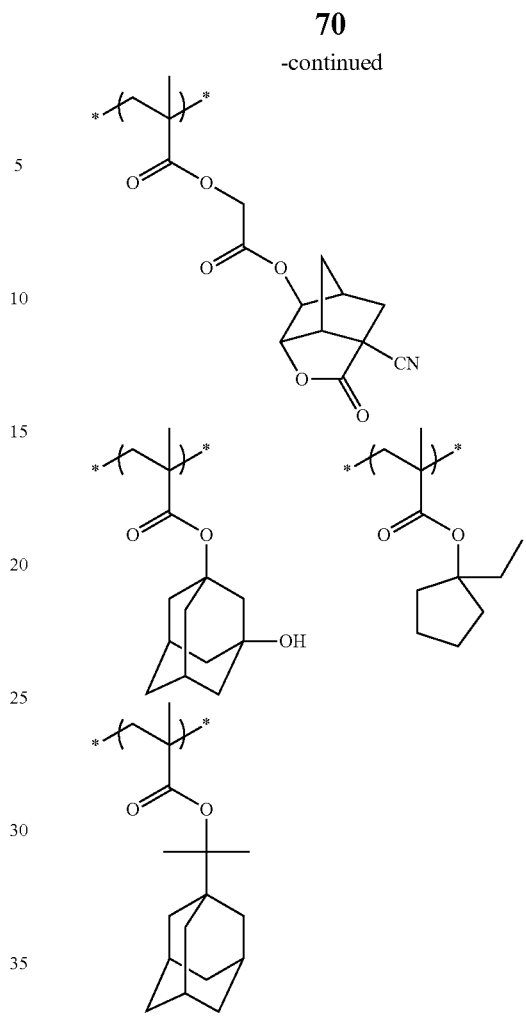

<Resin (A') Containing Repeating Unit Having Absorption in the Far-Ultraviolet Region>

The acid-decomposable resin (A) for use in the present invention may be a resin further containing a repeating unit represented by the following formula (I) (hereinafter sometimes referred to as an "acid-decomposable resin (A')" or a "resin (A')"). The repeating unit represented by formula (I) is a repeating unit having absorption in the far-ultraviolet region.

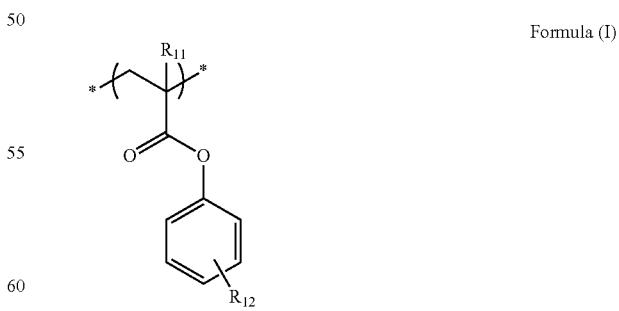

Formula (I)

In formula (I), $R_{11}$ represents a hydrogen atom or an alkyl group, and
$R_{12}$ represents a phenyl group.
The alkyl group as $R_{11}$ may have a substituent and may be linear or branched. The linear alkyl group is preferably an alkyl group having a carbon number of 1 to 30, more preferably a carbon number of 1 to 20, and examples thereof include a methyl group, an ethyl group, an n-propyl group, an n-butyl group, a sec-butyl group, a tert-butyl group, an n-pentyl group, an n-hexyl group, an n-heptyl group, an n-octyl group, an n-nonyl group and an n-decanyl group. The branched alkyl group is preferably an alkyl group having a carbon number of 3 to 30, more preferably a carbon number of 3 to 20and examples thereof include an i-propyl group, an i-butyl group, a tert-butyl group, an i-pentyl group, a tert-pentyl group, an i-hexyl group, a tert-hexyl group, an i-heptyl group, a tert-heptyl group, an i-octyl group, a tert-octyl group, an i-nonyl group and a tert-decanoyl group.

The alkyl group as $R_{11}$ is preferably a linear alkyl group, more preferably a methyl group.

Examples of the further substituent which the alkyl group above may have include a hydroxyl group, a halogen atom (e.g., fluorine, chlorine, bromine, iodine), a nitro group, a cyano group, an alkoxy group such as methoxy group, ethoxy group, hydroxyethoxy group, propoxy group, hydroxypropoxy group, n-butoxy group, isobutoxy group, sec-butoxy group and tert-butoxy group, an alkoxycarbonyl group such as methoxycarbonyl group and ethoxycarbonyl group, an aralkyl group such as benzyl group, phenethyl group and cumyl group, an aralkyloxy group, an acyl group such as formyl group, acetyl group, butyryl group, benzoyl group, cianamyl group and valeryl group, an acyloxy group such as butyryloxy group, an alkenyl group such as vinyl group and propenyl group, an alkenyloxy group such as vinyloxy group, propenyloxy group, allyloxy group and butenyloxy group, an aryl group such as phenyl group, an aryloxy group such as phenoxy group, and an aryloxycarbonyloxy group such as benzoyloxy group.

The phenyl group as $R_{12}$ may have one substituent or two or more substituents. Specific examples of the substituent include an alkyl group and the groups described for the substituent which the alkyl group above may have, and among these, an alkyl group having a carbon number of 1 to 4 and a halogen atom are preferred.

However, $R_{12}$ is preferably a phenyl group having no substituent.

Specific examples of the repeating unit represented by formula (I) are illustrated below, but the present invention is not limited thereto. In specific examples, Ra represents a hydrogen atom or a methyl group.

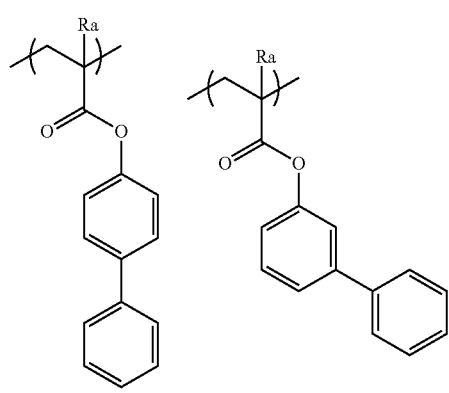

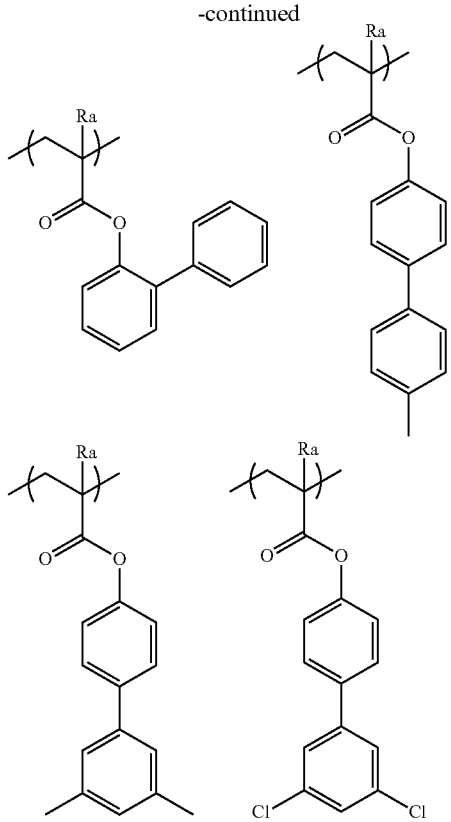

The content of the repeating unit represented by formula (I) in the acid-decomposable resin (A') is preferably from 1 to 60 mol %, more preferably from 1 to 50 mol %, based on all repeating units of the resin (A'). Within this range, an actinic ray-sensitive or radiation-sensitive resin composition capable of more suppressing an increase in swing width and the generation of a standing wave and at the same time, ensuring higher resolution and less film loss can be obtained.

The (meth)acrylic acid ester monomer corresponding to the repeating unit represented by formula (I) can be synthesized by esterifying a (meth)acrylic acid chloride and an alcohol compound in a solvent such as THF, acetone and methylene chloride in the presence of a basic catalyst such as triethylamine, pyridine and DBU. A commercially available product may also be used.

The acid-decomposable resin (A') can be synthesized and purified in the same manner as the acid-decomposable resin (A).

The weight average molecular weight (Mw) of the acid-decomposable resin (A') is preferably from 3,000 to 100,000, more preferably from 5,000 to 50,000. The weight average molecular weight is preferably 100,000 or less in view of dissolution rate of the resin itself in an alkali developer and sensitivity.

The dispersity (Mw/Mn) of the acid-decomposable resin (A') is preferably from 1.0 to 3.0, more preferably from 1.0 to 2.0.

Here, the weight average molecular weight (Mw) and the dispersity (Mw/Mn) are determined by GPC (gel permeation chromatography) with a polystyrene standard.

As for the acid-decomposable resin (A'), one kind of a resin may be used or two or more kinds of resins may be used in combination. The content of the acid-decomposable resin (A') is not particularly limited but is preferably, in terms of the total amount, from 3 to 99 mass %, more preferably from 5 to 99 mass %, based on the entire solid content of the actinic ray-sensitive or radiation-sensitive resin composition.

Also, the acid-decomposable resin (A') may be used in combination with the acid-decomposable resin (A). In this case, the resin (A) is preferably present to account for 50 mass % or more in the resin (A) and the resin (A').

Specific examples of the acid-decomposable resin (A') containing a repeating unit represented by formula (I) are illustrated below, but the present invention is not limited thereto.

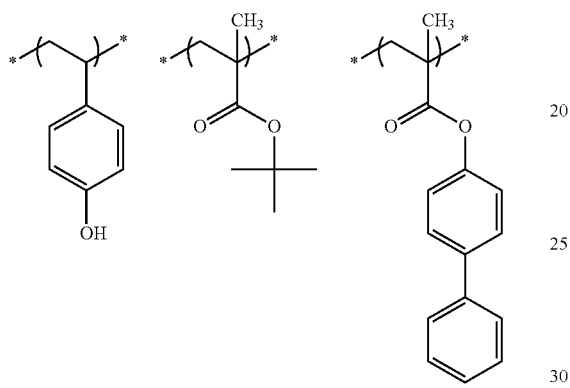
(A'-1)

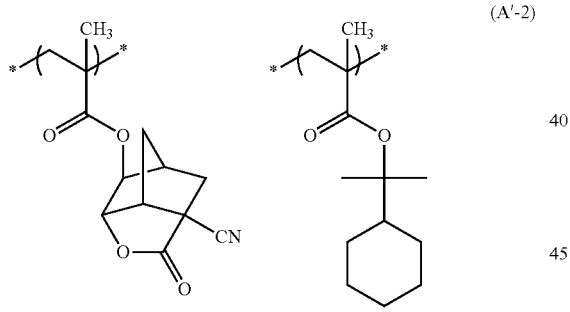
(A'-2)

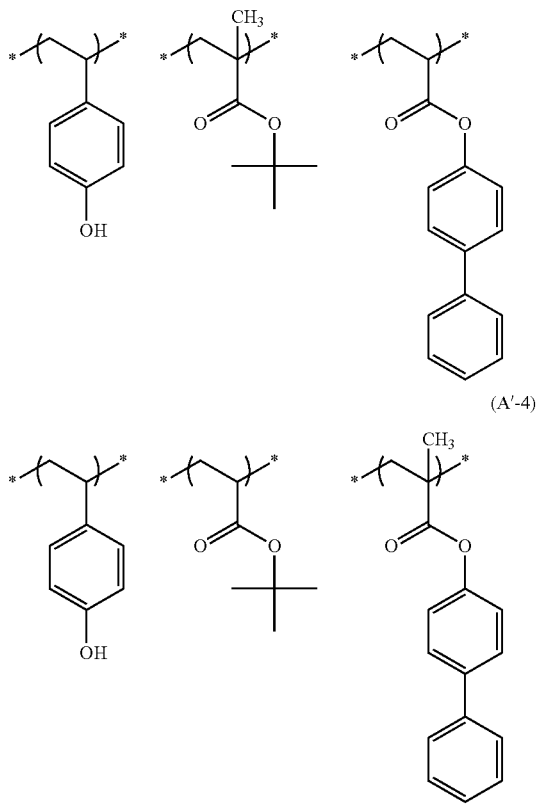
(A'-3)

(A'-4)

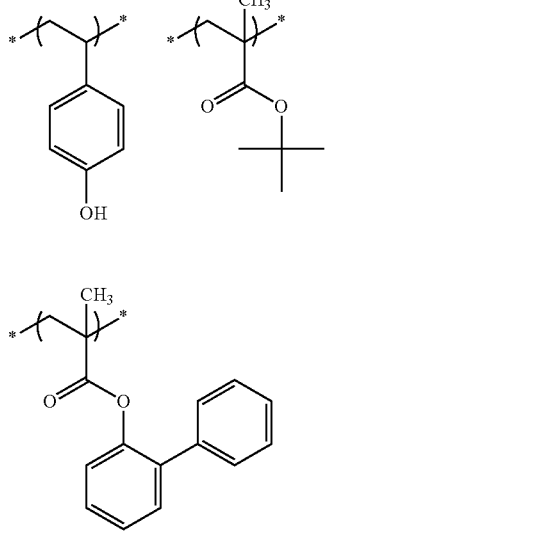
(A'-5)

(A'-6)

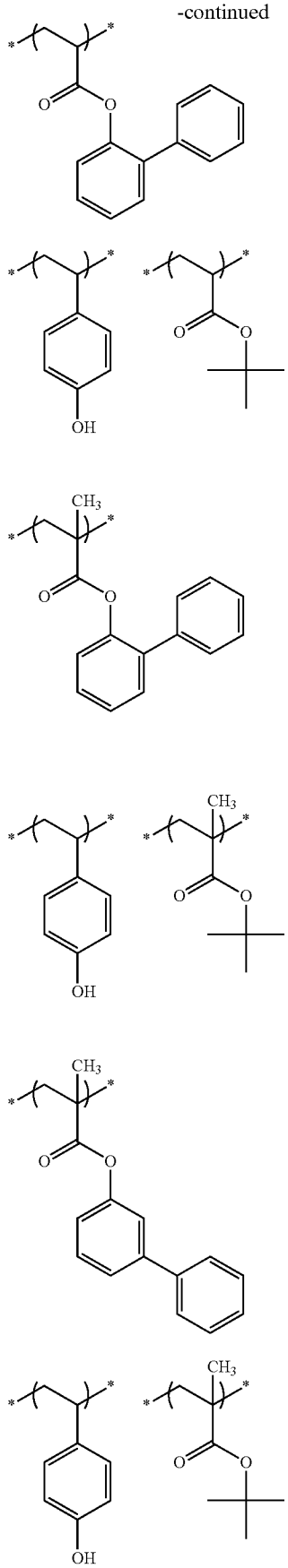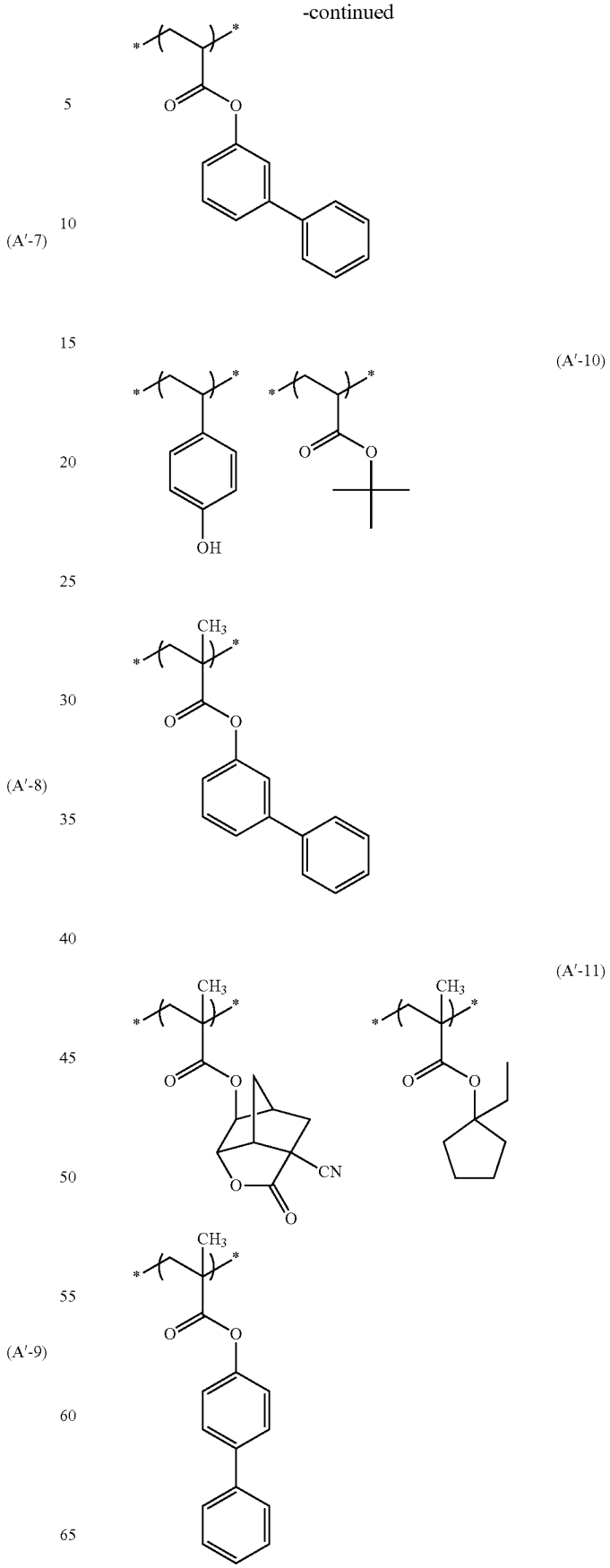

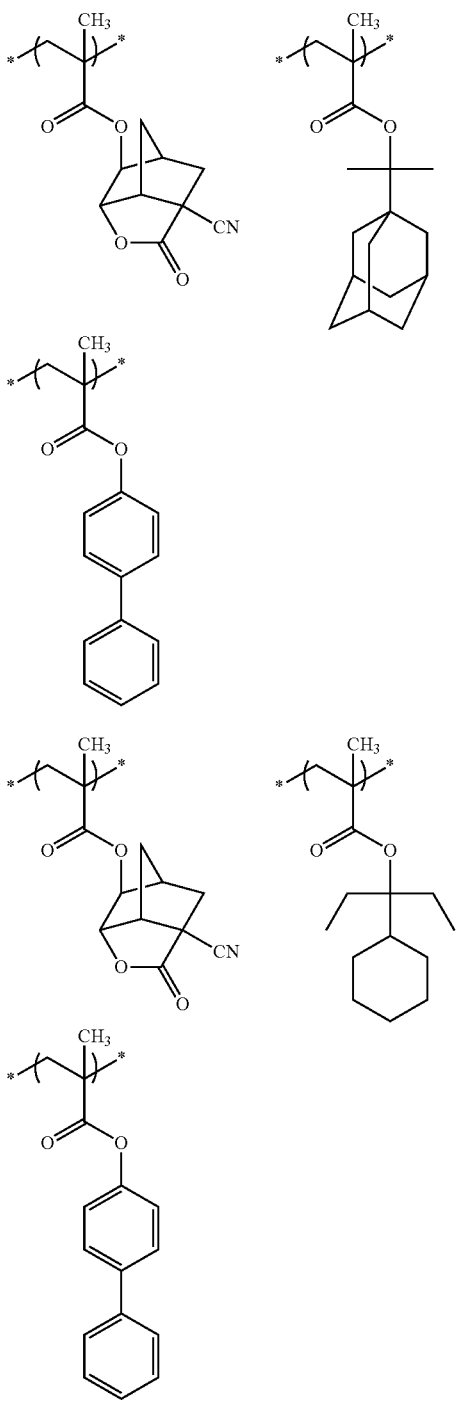

(A'-12)

(A'-13)

[3] (B) Compound Capable of Generating an Acid Upon Irradiation with an Actinic Ray or Radiation The actinic ray-sensitive or radiation-sensitive resin composition of the present invention contains (B) a compound capable of generating an acid upon irradiation with an actinic ray or radiation (hereinafter sometimes referred to as an "acid generator (B)"). As for the acid generator (B), a photo-initiator for cationic photopolymerization, a photo-initiator for radical photopolymerization, a photodecoloring agent for dyes, a photodiscoloring agent, a known compound that generates an acid upon irradiation with an actinic ray or radiation and is used for microresist or the like, or a mixture thereof may be appropriately selected and used.

Examples thereof include a diazonium salt, a phosphonium salt, a sulfonium salt, an iodonium salt, imidosulfonate, oxime sulfonate, diazodisulfone, disulfone and o-nitrobenzyl sulfonate. The acid generator (B) preferably contains a sulfonium salt or an iodonium salt.

Also, a compound where a group or compound capable of generating an acid upon irradiation with an actinic ray or radiation is introduced into the main or side chain of a polymer, for example, compounds described in U.S. Pat. No. 3,849,137, German Patent 3,914,407, JP-A-63-26653, JP-A-55-164824, JP-A-62-69263, JP-A-63-146038, JP-A-63-163452, JP-A-62-153853 and JP-A-63-146029, may be used.

Furthermore, compounds capable of generating an acid by the effect of light described, for example, in U.S. Pat. No. 3,779,778 and European Patent 126,712 may also be used.

Out of the compounds capable of decomposing upon irradiation with an actinic ray or radiation to generate an acid, the compound preferred as the acid generator (B) includes compounds represented by the following formulae (ZI), (ZII) and (ZIII):

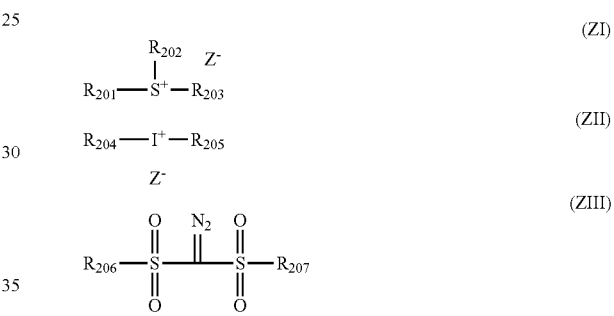

In formula (ZI), each of $R_{201}$, $R_{202}$ and $R_{203}$ independently represents an organic group.

$Z^-$ represents a non-nucleophilic anion, and preferred examples thereof include a sulfonate anion, a bis(alkylsulfonyl)amide anion, a tris(alkylsulfonyl)methide anion, $BF_4^-$, $PF_6^-$ and $SbF_6^-$. The anion is preferably an organic anion containing a carbon atom. Preferred organic anions include organic anions represented by the following formulae AN1 to AN3:

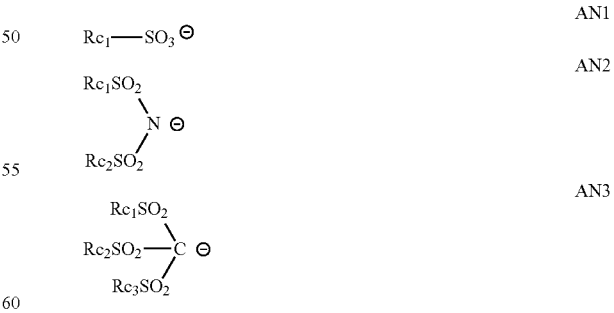

In formulae AN1 to AN3, each of $Rc_1$ to $Rc_3$ independently represents an organic group. The organic group in $Rc_1$ to $Rc_3$ includes an organic group having a carbon number of 1 to 30 and is preferably an alkyl group which may have a substituent, an aryl group which may have a substituent, or a group where a plurality of these groups are connected through a single bond or a linking group such as —O—, —CO$_2$—, —S—, —SO$_3$— and —SO$_2$N(Rd$_1$)-. Furthermore, the organic group may form a ring structure together with another alkyl or aryl group bonded.

Rd$_1$ represents a hydrogen atom or an alkyl group and may form a ring structure together with an alkyl or aryl group bonded.

The organic group of Rc$_1$ to Rc$_3$ may be an alkyl group substituted with a fluorine atom or a fluoroalkyl group at the 1-position, or a phenyl group substituted with a fluorine atom or a fluoroalkyl group. By virtue of having a fluorine atom or a fluoroalkyl group, the acidity of the acid generated upon irradiation with light is increased and in turn, the sensitivity is enhanced. When each of Rc$_1$ to Rc$_3$ has 5 or more carbon atoms, at least one carbon atom is preferably substituted with a hydrogen atom, and it is more preferred that the number of hydrogen atoms is larger than the number of fluorine atoms. The absence of a perfluoroalkyl group having a carbon number of 5 or more enables reduction in the toxicity to ecology.

The carbon number of the organic group as $R_{201}$, $R_{202}$ and $R_{203}$ is generally from 1 to 30, preferably from 1 to 20.

Two members out of $R_{201}$ to $R_{203}$ may combine to form a ring structure, and the ring may contain an oxygen atom, a sulfur atom, an ester bond, an amide bond or a carbonyl group.

The group formed by combining two members out of $R_{201}$ to $R_{203}$ includes an alkylene group (e.g., butylene, pentylene).

Specific examples of the organic group as $R_{201}$, $R_{202}$ and $R_{203}$ include the corresponding groups in the later-described compounds (ZI-1), (ZI-2) and (ZI-3).

The compound may be a compound having a plurality of structures represented by formula (ZI). For example, the compound may be a compound having a structure where at least one of $R_{201}$ to $R_{203}$ in a compound represented by formula (ZI) is bonded to at least one of $R_{201}$ to $R_{203}$ in another compound represented by formula (ZI).

Compounds (ZI-1), (ZI-2) and (ZI-3) described below are more preferred as the component (ZI).

The compound (ZI-1) is an arylsulfonium compound where at least one of $R_{201}$ to $R_{203}$ in formula (ZI) is an aryl group, that is, a compound having an arylsulfonium as the cation.

In the arylsulfonium compound, all of $R_{201}$ to $R_{203}$ may be an aryl group or a part of $R_{201}$ to $R_{203}$ may be an aryl group, with the remaining being an alkyl group.

Examples of the arylsulfonium compound include a triarylsulfonium compound, a diarylalkylsulfonium compound and an aryldialkylsulfonium compound.

The aryl group in the arylsulfonium compound is preferably an aryl group such as phenyl group and naphthyl group, or a heteroaryl group such as indole residue and pyrrole residue, more preferably a phenyl group or an indole residue. In the case where the arylsulfonium compound has two or more aryl groups, these two or more aryl groups may be the same or different.

The alkyl group which is present, if desired, in the arylsulfonium compound is preferably a linear, branched or cyclic alkyl group having a carbon number of 1 to 15, and examples thereof include a methyl group, an ethyl group, a propyl group, an n-butyl group, a sec-butyl group, a tert-butyl group, a cyclopropyl group, a cyclobutyl group and a cyclohexyl group.

The aryl group and alkyl group as $R_{201}$ to $R_{203}$ may have, as the substituent, an alkyl group (for example, having a carbon number of 1 to 15), an aryl group (for example, having a carbon number of 6 to 14), an alkoxy group (for example, having a carbon number of 1 to 15), a halogen atom, a hydroxyl group or a phenylthio group. The substituent is preferably a linear, branched or cyclic alkyl group having a carbon number of 1 to 12, or a linear, branched or cyclic alkoxy group having a carbon number of 1 to 12, and most preferably an alkyl group having a carbon number of 1 to 4 or an alkoxy group having a carbon number of 1 to 4. The substituent may be substituted on any one of three members $R_{201}$ to $R_{203}$ or may be substituted on all of these three members. In the case where $R_{201}$ to $R_{203}$ are an aryl group, the substituent is preferably substituted on the p-position of the aryl group.

The compound (ZI-2) is described below.

The compound (ZI-2) is a compound where each of $R_{201}$ to $R_{203}$ in formula (ZI) independently represents an aromatic ring-free organic group. The aromatic ring as used herein includes an aromatic ring containing a heteroatom.

The aromatic ring-free organic group as $R_{201}$ to $R_{203}$ has a carbon number of generally from 1 to 30, preferably from 1 to 20.

Each of $R_{201}$ to $R_{203}$ is independently, preferably an alkyl group, a cycloalkyl group, a 2-oxoalkyl group, a 2-oxocycloalkyl group, an alkoxycarbonylmethyl group, an allyl group or a vinyl group, more preferably a linear or branched 2-oxoalkyl group, a 2-oxocycloalkyl group or an alkoxycarbonylmethyl group, and most preferably a linear or branched 2-oxoalkyl group.

The alkyl group and cycloalkyl group as $R_{201}$ to $R_{203}$ are preferably a linear or branched alkyl group having a carbon number of 1 to 10, (e.g., methyl, ethyl, propyl, butyl, pentyl), and a cycloalkyl group having a carbon number of 3 to 10, (e.g., cyclopentyl, cyclohexyl, norbornyl).

The 2-oxoalkyl group as $R_{201}$ to $R_{203}$ may be either linear or branched and is preferably a group having >C=O at the 2-position of the above-described alkyl group.

The 2-oxocycloalkyl group as $R_{201}$ to $R_{203}$ is preferably a group having >C=O at the 2-position of the above-described cycloalkyl group.

The alkoxy group in the alkoxycarbonylmethyl group as $R_{201}$ to $R_{203}$ is preferably an alkoxy group having a carbon number of 1 to 5, (e.g., methoxy, ethoxy, propoxy, butoxy, pentoxy).

$R_{201}$ to $R_{203}$ may be further substituted with a halogen atom, an alkoxy group (for example, having a carbon number of 1 to 5), a hydroxyl group, a cyano group or a nitro group.

Two members out of $R_{201}$ to $R_{203}$ may combine to form a ring structure, and the ring may contain an oxygen atom, a sulfur atom, an ester bond, an amide bond or a carbonyl group. The group formed by combining two members out of $R_{201}$ to $R_{203}$ includes an alkylene group (e.g., butylene, pentylene).

The compound (ZI-3) is described below.

The compound (ZI-3) is a compound represented by the following formula (ZI-3), and this is a compound having a phenacylsulfonium salt structure.

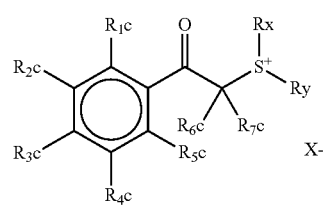

Formula (ZI-3)

Each of $R_{1c}$ to $R_{5c}$ independently represents a hydrogen atom, an alkyl group, a cycloalkyl group, an alkoxy group or a halogen atom.

Each of $R_{6c}$, and $R_{7c}$ represents a hydrogen atom, an alkyl group or a cycloalkyl group.

Each of $R_x$, and $R_y$, independently represents an alkyl group, a cycloalkyl group, a 2-oxoalkyl group, a 2-oxocycloalkyl group, an alkoxycarbonylmethyl group, an allyl group or a vinyl group.

Any two or more members of $R_{1c}$ to $R_{7c}$, may combine to form a ring structure. Also, $R_x$, and $R_y$, may combine to form a ring structure. These ring structures may contain an oxygen atom, a sulfur atom, an ester bond or an amide bond.

$X^-$, has the same meaning as Z in formula (ZI).

Specific examples of the compound (ZI-3) include compounds illustrated in paragraphs 0046, and 0047, of JP-A-2004-233661, and paragraphs 0040 to 0046, of JP-A-2003-35948.

Formulae (ZII) and (ZIII) are described below.

In formulae (ZII) and (ZIII), each of $R_{204}$ to $R_{207}$ independently represents an aryl group which may have a substituent, an alkyl group which may have a substituent, or a cycloalkyl group which may have a substituent.

Specific examples and preferred examples of the aryl group of $R_{204}$ to $R_{207}$ are the same as those described for the aryl group of $R_{201}$ to $R_{203}$ in the compound (ZI-1).

Specific examples and preferred examples of the alkyl group and cycloalkyl group of $R_{204}$ to $R_{207}$, are the same as those described for the linear, branched or cyclic alkyl group of $R_{201}$ to $R_{203}$ in the compound (ZI-2).

$Z^-$ has the same meaning as $Z^-$ in formula (ZI).

Out of the compounds capable of generating an acid upon irradiation with an actinic ray or radiation, the compound preferred as the acid generator (B) further includes compounds represented by the following formulae (ZIV), (ZV) and (ZVI):

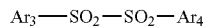

ZIV

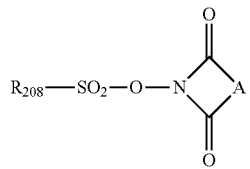

ZV

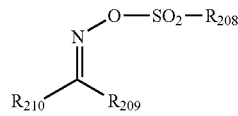

ZVI

In formulae (ZIV) to (ZVI), each of $Ar_3$ and $Ar_4$ independently represents a substituted or unsubstituted aryl group.

Each $R_{208}$ in formulae (ZV) and (ZVI) independently represents a substituted or unsubstituted alkyl group, a substituted or unsubstituted cycloalkyl group, or a substituted or unsubstituted aryl group. In view of increasing the strength of the acid generated, $R_{208}$ is preferably substituted with a fluorine atom.

Each of $R_{209}$ and $R_{210}$ independently represents a substituted or unsubstituted alkyl group, a substituted or unsubstituted cycloalkyl group, a substituted or unsubstituted aryl group, or an electron-withdrawing group. $R_{209}$ is preferably a substituted or unsubstituted aryl group. $R_{210}$ is preferably an electron-withdrawing group, more preferably a cyano group or a fluoroalkyl group.

A represents a substituted or unsubstituted alkylene group, a substituted or unsubstituted alkenylene group, or a substituted or unsubstituted arylene group.

Specific examples of the aryl group of $Ar_3$, $Ar_4$, $R_{208}$, $R_{209}$ and $R_{210}$ are the same as specific examples of the aryl group as $R_{201}$ to $R_{203}$ in formula (ZI-1). Specific examples of the alkyl group and cycloalkyl group of $R_{208}$, $R_{209}$ and $R_{210}$ are the same as specific examples of the alkyl group and cycloalkyl group of $R_{201}$ to $R_{203}$ in formula (ZI-2).

The alkylene group of A includes an alkylene group having a carbon number of 1 to 12 (e.g., methylene, ethylene, propylene, isopropylene, butylene, isobutylene); the alkenylene group of A includes an alkenylene group having a carbon number of 2 to 12 (e.g., ethynylene, propenylene, butenylene); and the arylene group of A includes an arylene group having a carbon number of 6 to 10 (e.g., phenylene, tolylene, naphthylene).

In the present invention, a compound having a plurality of structures represented by formula (ZVI) is also preferred. For example, the compound may be a compound having a structure where either $R_{209}$ or $R_{210}$ in a compound represented by formula (ZVI) is bonded to either $R_{209}$ or $R_{210}$ in another compound represented by formula (ZVI).

Among the compounds capable of decomposing upon irradiation with an actinic ray or radiation to generate an acid, the compound as the acid generator (B) is preferably a compound represented by formulae (ZI) to (ZIII), more preferably a compound represented by formula (ZI), and most preferably a compound represented by (ZI-1) to (ZI-3).

Specific examples of the acid generator (B) are illustrated below, but the present invention is not limited thereto.

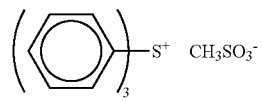
(B1)

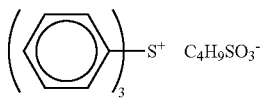
(B2)

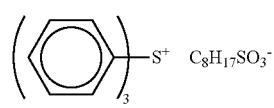
(B3)

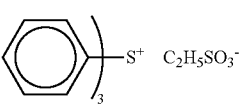
(B4)

-continued
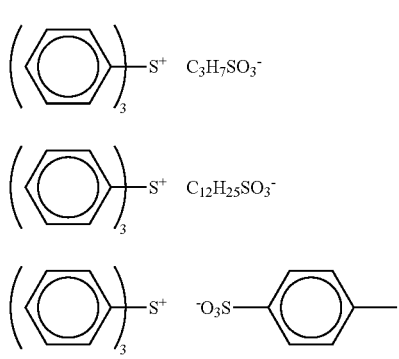
(B5) (B6) (B7) (B8)
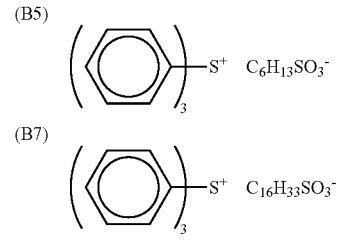
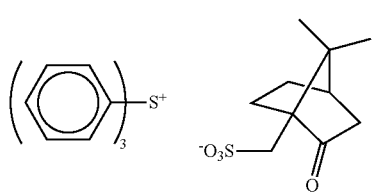
(B9) (B10)
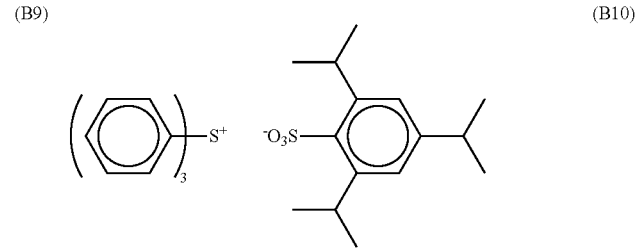
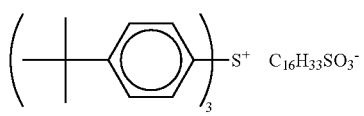
(B11) (B12)
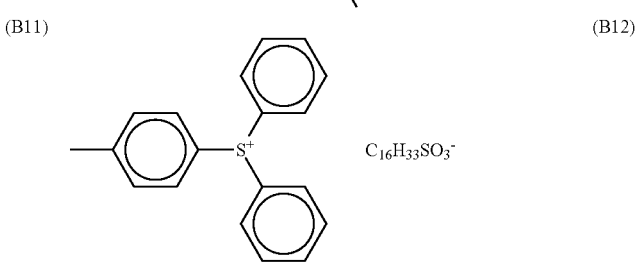
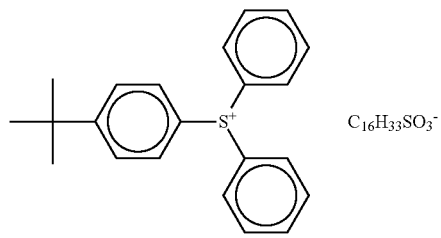
(B13) (B14)
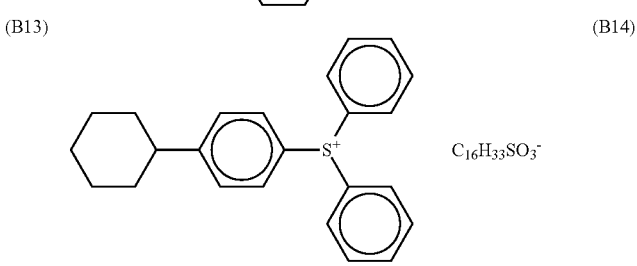
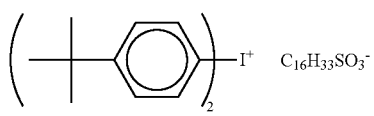
(B15) (B16)
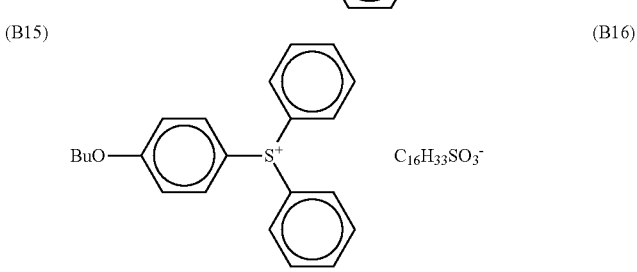
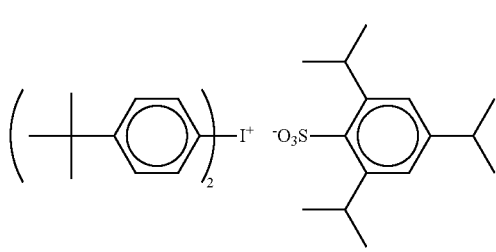
(B17) (B18)
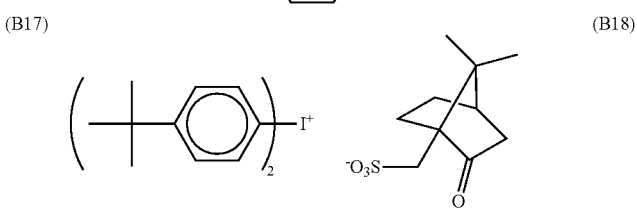
(B19) (B20)
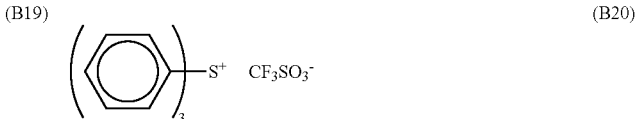

-continued
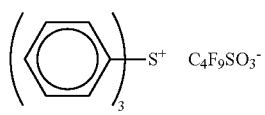
(B21)
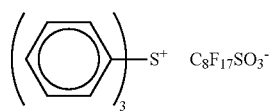
(B22)
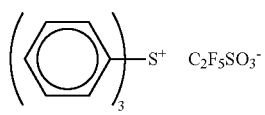
(B23)
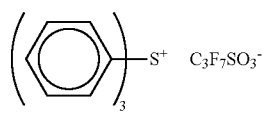
(B24)
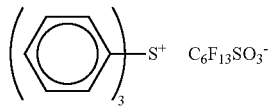
(B25)
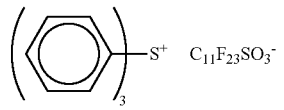
(B26)
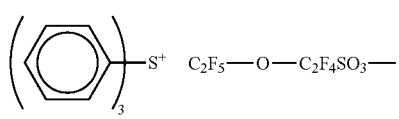
(B27)
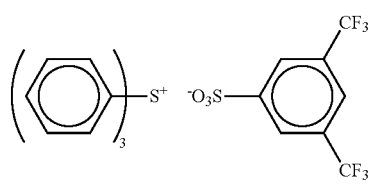
(B28)
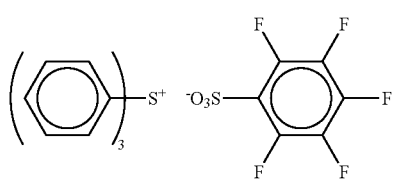
(B29)
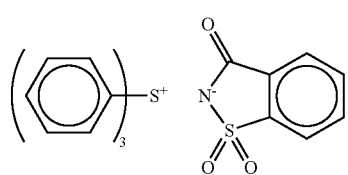
(B30)
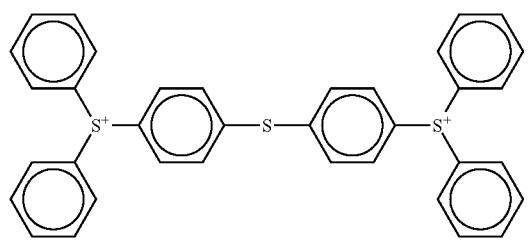
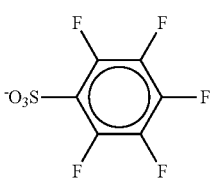
(B31)
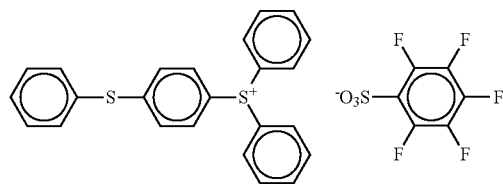
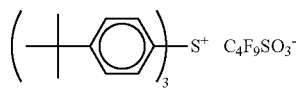
(B32)
(B33)
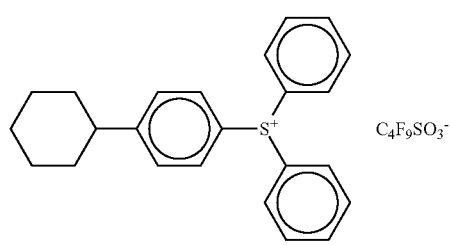
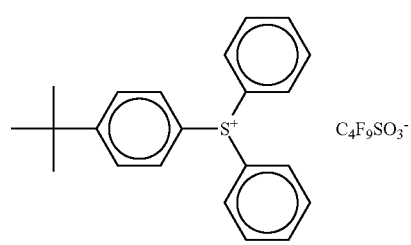
(B34)
(B35)

-continued
(B36)
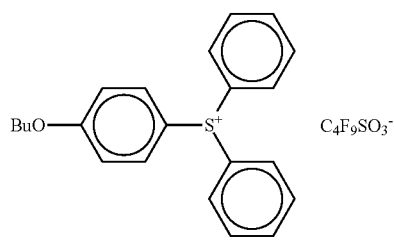
(B37)
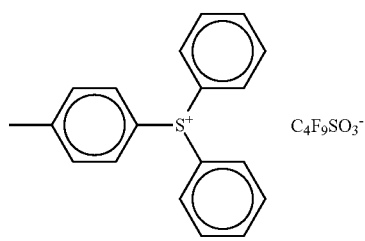
(B38)
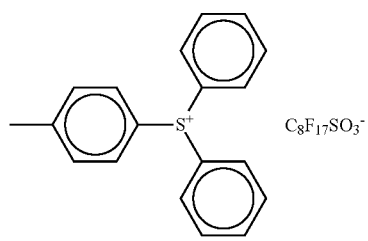
(B39)
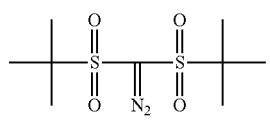
(B40)
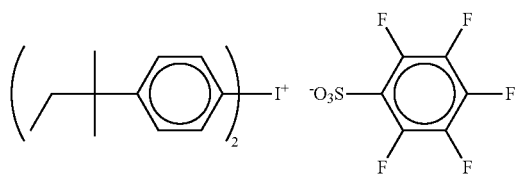
(B41)
(B42)
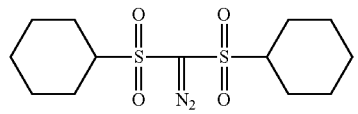
(B43)
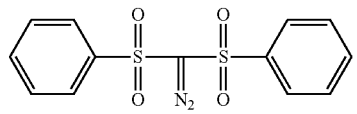
(B44)
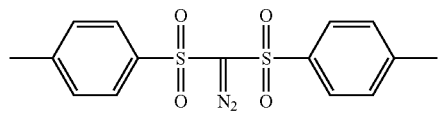
(B45)
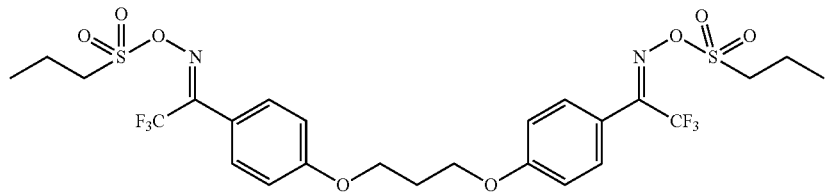
(B46)
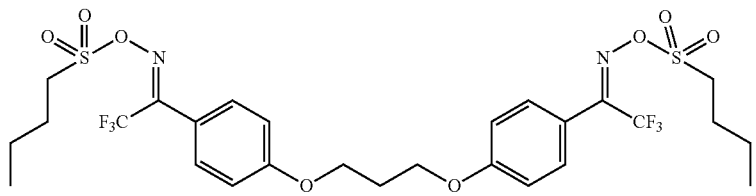

-continued
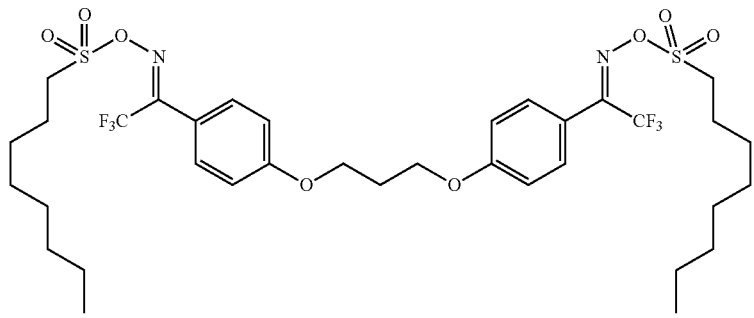
(B47)
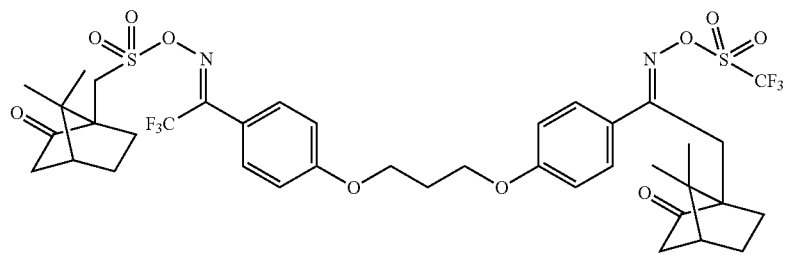
(B48)
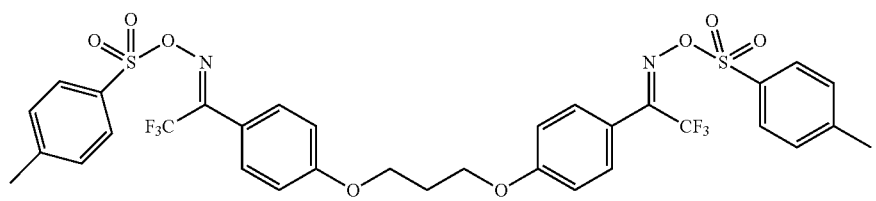
(B49)
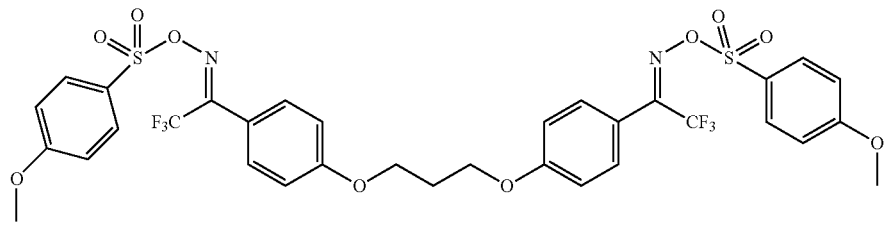
(B50)
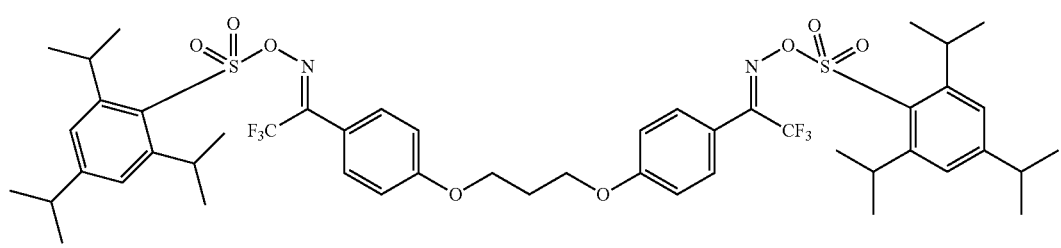
(B51)
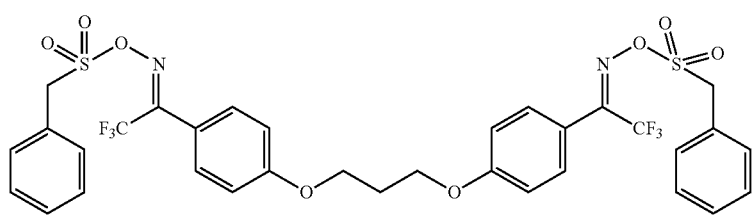
(B52)

-continued
(B53)
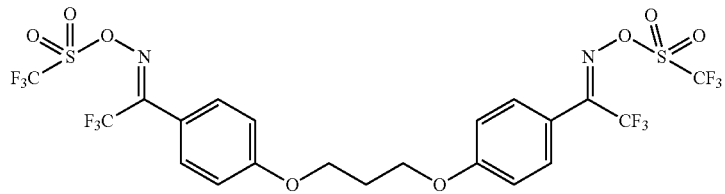
(B54)
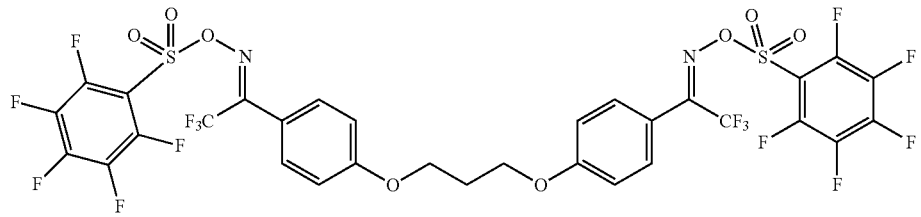
(B55)
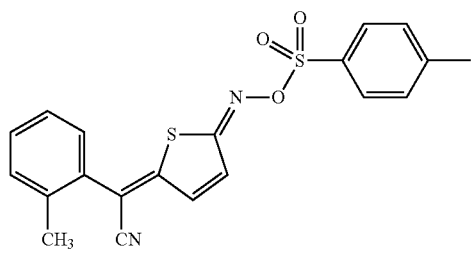
(B56)
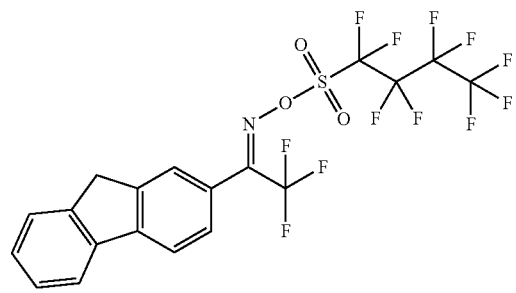
(B57)
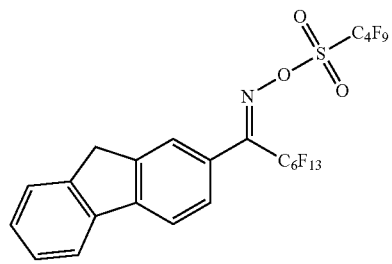
(B58)
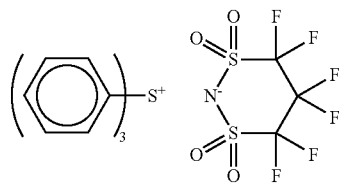
(B59)
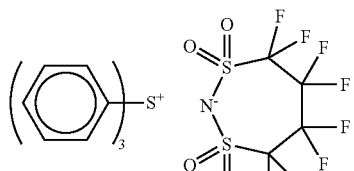
(B60)
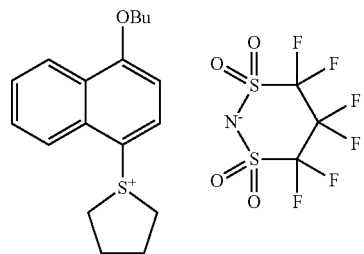
(B61)
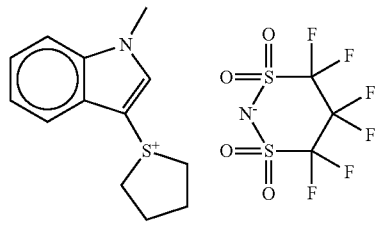
(B62)
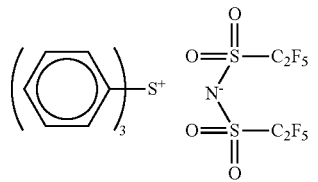

(B63) 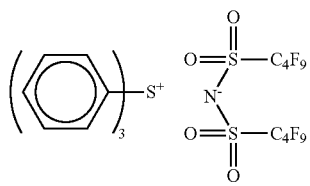

(B64) 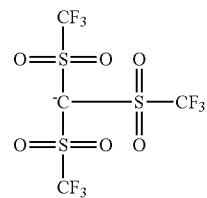

(B65) 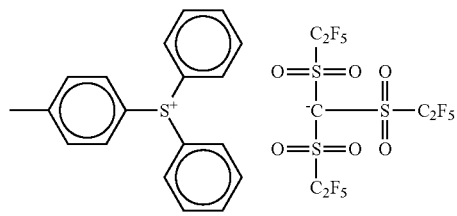

(B66) 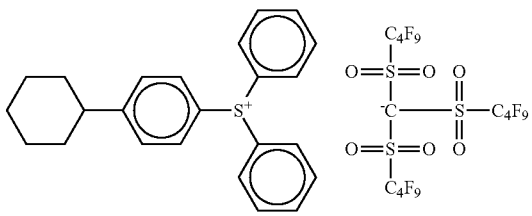

(B67) 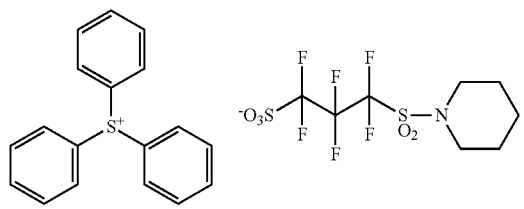

(B68) 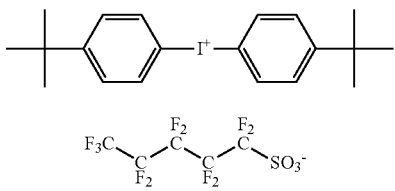

As for the acid generator (B), single species may be used alone, or two or more species may be used in combination. In using two or more kinds of acid generators in combination, compounds capable of generating two kinds of organic acids differing in the number of all atoms excluding hydrogen atom by 2 or more are preferably combined.

The content of the acid generator (B) in the composition is preferably from 0.1 to 20 mass %, more preferably from 0.5 to 15 mass %, still more preferably from 1 to 10 mass %, based on the entire solid content of the actinic ray-sensitive or radiation-sensitive resin composition.

[4] (C) Basic Compound

The actinic ray-sensitive or radiation-sensitive resin composition of the present invention contains a basic compound. The basic compound is preferably an organic basic compound. The organic basic compound is a compound having basicity stronger than that of phenol. The molecular weight of the organic basic compound is usually from 100 to 900, preferably from 150 to 800, more preferably from 200 to 700. In particular, a nitrogen-containing basic compound is preferred.

The nitrogen-containing basic compound is preferably, in terms of the chemical environment, a compound having a structure of the following formulae (CI) to (CV). Formulae (CII) to (CV) may be a part of a ring structure.

(CI) 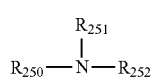

(CII) 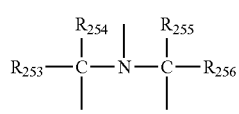

(CIII) 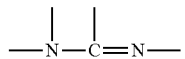

(CIV) 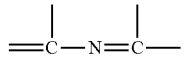

(CV) 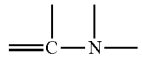

In these formulae, $R_{250}$, $R_{251}$ and $R_{252}$, which may be the same or different, each represents a hydrogen atom, an alkyl group (preferably having a carbon number of 1 to 20), a cycloalkyl group (preferably having a carbon number of 3 to 20), or an aryl group (preferably having a carbon number of 6 to 20). Here, $R_{251}$ and $R_{252}$ may combine with each other to form a ring.

The alkyl group above may be unsubstituted or may have a substituent, and the alkyl group having a substituent is preferably an aminoalkyl group having a carbon number of 1 to 6 or a hydroxyalkyl group having a carbon number of 1 to 6.

$R_{253}$, $R_{254}$, $R_{255}$ and $R_{256}$, which may be the same or different, each represents an alkyl group having a carbon number of 1 to 6.

The compound is more preferably a nitrogen-containing basic compound having two or more nitrogen atoms differing in the chemical environment within one molecule, still more preferably a compound containing both a substituted or unsubstituted amino group and a nitrogen-containing ring structure, or a compound having an alkylamino group.

The organic basic compound may also be at least one kind of a nitrogen-containing compound selected from an amine compound having a phenoxy group, an ammonium salt compound having a phenoxy group, an amine compound having a sulfonic acid ester group, and an ammonium salt compound having a sulfonic acid ester group.

As for the amine compound, a primary, secondary or tertiary amine compound can be used, and an amine compound where at least one alkyl group is bonded to the nitrogen atom is preferred. The amine compound is more preferably a tertiary amine compound. In the amine compound, as long as at least one alkyl group (preferably having a carbon number of 1 to 20) is bonded to the nitrogen atom, a cycloalkyl group (preferably having a carbon number of 3 to 20) or an aryl group (preferably having a carbon number of 6 to 12) may be bonded to the nitrogen atom in addition to the alkyl group. The amine compound preferably has an oxygen atom in the alkyl chain to form an oxyalkylene group. The number of oxyalkylene groups within the molecule is 1 or more, preferably from 3 to 9, more preferably from 4 to 6. Among oxyalkylene groups, an oxyethylene group (—$CH_2CH_2O$—) and an oxypropylene group (—$CH(CH_3)CH_2O$— or —$CH_2CH_2CH_2O$—) are preferred, and an oxyethylene group is more preferred.

As for the ammonium salt compound, a primary, secondary, tertiary or quaternary ammonium salt compound can be used, and an ammonium salt compound where at least one alkyl group is bonded to the nitrogen atom is preferred. In the ammonium salt compound, as long as at least one alkyl group (preferably having a carbon number of 1 to 20) is bonded to the nitrogen atom, a cycloalkyl group (preferably having a carbon number of 3 to 20) or an aryl group (preferably having a carbon number of 6 to 12) may be bonded to the nitrogen atom in addition to the alkyl group. The ammonium salt compound preferably has an oxygen atom in the alkyl chain to form an oxyalkylene group. The number of oxyalkylene groups within the molecule is 1 or more, preferably from 3 to 9, more preferably from 4 to 6. Among oxyalkylene groups, an oxyethylene group (—$CH_2CH_2O$—) and an oxypropylene group (—$CH(CH_3)CH_2O$— or —$CH_2CH_2CH_2O$—) are preferred, and an oxyethylene group is more preferred.

Examples of the anion of the ammonium salt compound include a halogen atom, a sulfonate, a borate and a phosphate, with a halogen atom and a sulfonate being preferred. The halogen atom is preferably chloride, bromide or iodide, and the sulfonate is preferably an organic sulfonate having a carbon number of 1 to 20. Examples of the organic sulfonate include an alkylsulfonate having a carbon number of 1 to 20, and an arylsulfonate. The alkyl group of the alkylsulfonate may have a substituent, and examples of the substituent include fluorine, chlorine, bromine, an alkoxy group, an acyl group and an aryl group. Specific examples of the alkylsulfonate include methanesulfonate, ethanesulfonate, butanesulfonate, hexanesulfonate, octanesulfonate, benzylsulfonate, trifluoromethanesulfonate, pentafluoroethanesulfonate and nonafluorobutanesulfonate. The aryl group of the arylsulfonate includes a benzene ring, a naphthalene ring and an anthracene ring. The benzene ring, naphthalene ring and anthracene ring may have a substituent, and the substituent is preferably a linear or branched alkyl group having a carbon number of 1 to 6 or a cycloalkyl group having a carbon number of 3 to 6. Specific examples of the linear or branched alkyl group and cycloalkyl group include methyl, ethyl, n-propyl, isopropyl, n-butyl, i-butyl, tert-butyl, n-hexyl and cyclohexyl. Other examples of the substituent include an alkoxy group having a carbon number of 1 to 6, a halogen atom, cyano, nitro, an acyl group and an acyloxy group.

The amine compound having a phenoxy group and the ammonium salt compound having a phenoxy group are an amine compound or ammonium salt compound having a phenoxy group at the terminal opposite the nitrogen atom of the alkyl group. The phenoxy group may have a substituent. Examples of the substituent of the phenoxy group include an alkyl group, an alkoxy group, a halogen atom, a cyano group, a nitro group, a carboxyl group, a carboxylic acid ester group, a sulfonic acid ester group, an aryl group, an aralkyl group, an acyloxy group and an aryloxy group. The substitution site of the substituent may be any of 2- to 6-positions, and the number of substituents may be any in the range of 1 to 5.

The compound preferably has at least one oxyalkylene group between the phenoxy group and the nitrogen atom. The number of oxyalkylene groups within the molecule is 1 or more, preferably from 3 to 9, more preferably from 4 to 6. Among oxyalkylene groups, an oxyethylene group (—$CH_2CH_2O$—) and an oxypropylene group (—$CH(CH_3)CH_2O$— or —$CH_2CH_2CH_2O$—) are preferred, and an oxyethylene group is more preferred. Specific examples thereof include 2-[2-{2-(2,2-dimethoxy-phenoxyethoxy)ethyl}-bis-(2-methoxyethyl)]-amine and Compounds (C1-1) to (C3-3) illustrated in paragraph [0066] of U.S. Patent Application Publication No. 2007/0224539A1.

Preferred examples of the organic basic compound include a tertiary amine compound, guanidine, aminopyridine, aminoalkylpyridine, aminopyrrolidine, indazole, imidazole, pyrazole, pyrazine, pyrimidine, purine, imidazoline, pyrazoline, piperazine, aminomorpholine and aminoalkylmorpholine. These compounds each may have a substituent, and preferred examples of the substituent include an amino group, an aminoalkyl group, an alkylamino group, an aminoaryl group, an arylamino group, an alkyl group, an alkoxy group, an acyl group, an acyloxy group, an aryl group, an aryloxy group, a nitro group, a hydroxyl group and a cyano group.

Particularly preferred examples of the organic basic compound include, but are not limited to, dicyclohexylmethylamine, guanidine, 1,1-dimethylguanidine, 1,1,3,3-tetramethylguanidine, imidazole, 2-methylimidazole, 4-methylimidazole, N-methylimidazole, 2-phenylimidazole, 4,5-diphenylimidazole, 2,4,5-triphenylimidazole, 2-aminopyridine, 3-aminopyridine, 4-aminopyridine, 2-dimethylaminopyridine, 4-dimethylaminopyridine, 2-diethylaminopyridine, 2-(aminomethyl)pyridine, 2-amino-3-methylpyridine, 2-amino-4-methylpyridine, 2-amino-5-methylpyridine, 2-amino-6-methylpyridine, 3-aminoethylpyridine, 4-aminoethylpyridine, 3-aminopyrrolidine, piperazine, N-(2-aminoethyl)piperazine, N-(2-aminoethyl)piperidine, 4-amino-2,2,6,6-tetramethylpiperidine, 4-piperidinopiperidine, 2-iminopiperidine, 1-(2-aminoethyl)pyrrolidine, pyrazole, 3-amino-5-methylpyrazole, 5-amino-3-methyl-1-p-tolylpyrazole, pyrazine, 2-(aminomethyl)-5-methylpyrazine, pyrimidine, 2,4-diaminopyrimidine, 4,6-dihydroxypyrimidine, 2-pyrazoline, 3-pyrazoline, N-aminomorpholine and N-(2-aminoethyl)morpholine.

A tetraalkylammonium salt-type nitrogen-containing basic compound can also be used. Among these compounds, a tetraalkylammonium hydroxide having a carbon number of 1 to 8 (e.g., tetramethylammonium hydroxide, tetraethylammonium hydroxide, tetra-(n-butyl)ammonium hydroxide) is preferred.

One of these nitrogen-containing basic compounds is used alone, or two or more thereof are used in combination.

The content of the basic compound (C) in the composition is usually from 0.001 to 10 mass %, preferably from 0.01 to 5 mass %, based on the entire solid content of the actinic ray-sensitive or radiation-sensitive resin composition.

The ratio between the compound (B) capable of generating an acid upon irradiation with an actinic ray or radiation and the basic compound (C) used in the composition is preferably basic compound/acid generator (by mol)=0.01 to 10. That is, the molar ratio is preferably 10 or less in view of sensitivity and resolution and is preferably 0.01 or more from the standpoint of suppressing reduction in the resolution due to thickening of the pattern with aging after exposure until heat treatment. The ratio of basic compound/acid generator (by mol) is more preferably from 0.05 to 5, still more preferably from 0.1 to 3.

[5] (E) Light-Absorbing Additive

The actinic ray-sensitive or radiation-sensitive resin composition of the present invention may further contain (E) a light-absorbing additive having absorption in the far-ultraviolet region. Thanks to this additive, generation of a standing wave can be more suppressed. The light-absorbing additive (E) is not particularly limited as long as it has absorption in the far-ultraviolet region, but a compound represented by the following formula (EI) (hereinafter sometimes referred to as a "compound (E)") is preferred.

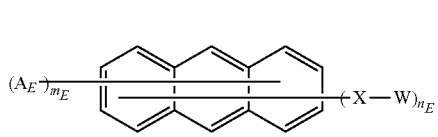

Formula (EI)

In formula (EI), AE represents a monovalent substituent.

X represents a single bond or a divalent linking group.

W represents a lactone ring-containing group or a group represented by any one of formulae (V1) to (V4).

$m_E$ represents an integer of 0 or more.

$n_E$ represents an integer of 1 or more.

When a plurality of $A_E$'s, X's or W's are present, each $A_E$, X or W may be the same as or different from every other $A_E$, X or W.

Incidentally, a plurality of compounds represented by formula (EI) may combine through at least any one of a single bond, $A_E$, and W, that is, a plurality of compounds represented by formula (EI) may combine in the form of sharing the group represented by $A_E$ or W.

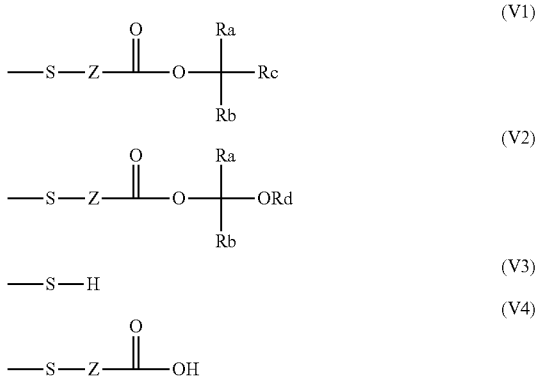

In formulae (V1) to (V4), Z represents a single bond or a divalent linking group, and the divalent linking group of Z has the same meaning as X in formula (EI). Z is preferably a single bond or an alkylene group.

Each of Ra, Rb and Rc independently represents a hydrogen atom, an alkyl group, a cycloalkyl group or an alkenyl group.

Rd represents an alkyl group, a cycloalkyl group or an alkenyl group.

Two groups out of Ra, Rb and Rc or two groups out of Ra, Rb and Rd may combine to form a ring structure. The ring structure is preferably composed of 3 to 8 carbon atoms and may be a ring structure further containing a heteroatom in addition to the carbon atoms.

In formula (EI), $A_E$ represents a monovalent substituent. Examples of the monovalent substituent of $A_E$, include a halogen atom such as fluorine atom, chlorine atom, bromine atom and iodine atom; an alkoxy group such as methoxy group, ethoxy group and tert-butoxy group; an aryloxy group such as phenoxy group and p-tolyloxy group; an alkoxycarbonyl group such as methoxycarbonyl group, butoxycarbonyl group and phenoxycarbonyl group; an acyloxy group such as acetoxy group, propionyloxy group and benzoyloxy group; an acyl group such as acetyl group, benzoyl group, isobutyryl group, acryloyl group, methacryloyl group and methoxalyl group; an alkylsulfanyl group such as methylsulfanyl group and tert-butylsulfanyl group; an arylsulfanyl group such as phenylsulfanyl group and p-tolylsulfanyl group; an alkylamino group such as methylamino group and cyclohexylamino group; a dialkylamino group such as dimethylamino group, diethylamino group, morpholino group and piperidino group; an arylamino group such as phenylamino group and p-tolylamino group; an alkyl group such as methyl group, ethyl group, tert-butyl group and dodecyl group; a cycloalkyl group such as cyclopentyl group and cyclohexyl group; an aryl group such as phenyl group, p-tolyl group, xylyl group, cumenyl group, naphthyl group, anthryl group and phenanthryl group; an alkynyl group such as ethynyl group and propargyl group; a hydroxy group; a carboxy group; a formyl group; a mercapto group; a sulfo group; a mesyl group; a p-toluenesulfonyl group; an amino group; a nitro group; a cyano group; a trifluoromethyl group; a trichloromethyl group; a trimethylsilyl group; a phosphinico group; a phosphono group; a trimethylammoniumyl group; a dimethylsulfoniumyl group; and a triphenylphenacylphosphoniumyl group.

X is preferably a single bond, an alkylene group, an arylene group, a carbonyl group, a sulfide group, —O—, a sulfonyl group, —C(=O)O—, —CONH—, —SO₂NH—, —SS—, —COCO—, —OCOO—, —SO₂O—, or a divalent linking group formed by combining these groups, more preferably a single bond, an alkylene group, an arylene group, a carbonyl group, a sulfonyl group, —COO—, —CONH—, —SO₂NH—, a sulfide group or —O—.

Preferred examples of the combination include a combination of an alkylene group and a carbonyl group, a sulfonyl group, —COO—, —CONH—, —SO₂NH—, a sulfide group or —O—.

The number of atoms in the linking group as X is preferably from 1 to 10.

Specific examples of X are illustrated below, but the present invention is not limited thereto.

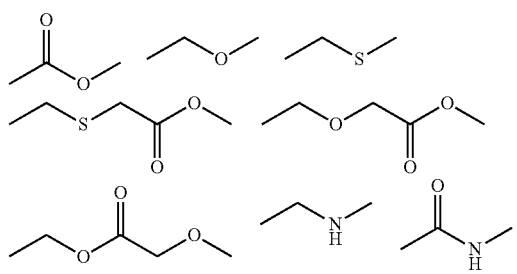

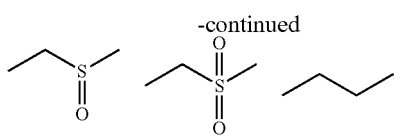

W represents a lactone ring-containing group or a group represented by any one of formulae (V1) to (V4).

In the case where W is a lactone ring-containing group, the compound is hydrolyzed at the development to produce a carboxyl group (alkali-soluble group) and this contributes particularly to reduction in the development defect.

In the case of a group represented by formula (V1) where each of Ra, Rb and Rc represents an alkyl group, a cycloalkyl group or an alkenyl group or in the case of a group represented by formula (V2), W is a group having an acid-decomposable group and by the action of an acid generated from the acid generator upon exposure, a deprotection reaction proceeds to produce an alkali-soluble group, which contributes particularly to reduction in the development defect.

The group represented by formula (V3) or (V4) is a group having an acid group such as thiol group or carboxyl group and is an alkali-soluble group, and this contributes particularly to more reduction in the development defect.

The group represented by —X—W is preferably bonded to the benzene ring in the center of the anthracene ring.

$m_E$ represents an integer of 0 or more and is preferably an integer of 0 to 3, more preferably 0.

$n_E$ represents an integer of 1 or more and is preferably an integer of 1 to 3, more preferably 1.

The compound where W is a lactone ring-containing group is described below.

The lactone ring in the lactone ring-containing group as W is preferably a 4- to 8-membered ring, more preferably a 5- to 7-membered ring. The lactone ring may contain a double bond therein.

Examples of the substituent which the lactone ring may have include an alkyl group, an alkoxy group, an acyl group, an oxy group (>C=O), a hydroxyl group and those described for the substituent as $A_E$, and the substituent may be a group substituted with another substituent.

Specific examples of the lactone ring include, but are not limited to, structures of formulae (LC1-1) to (LC1-17) in the above-described acid-decomposable resin (A).

More specifically, the lactone ring includes, for example, the following lactone structures.

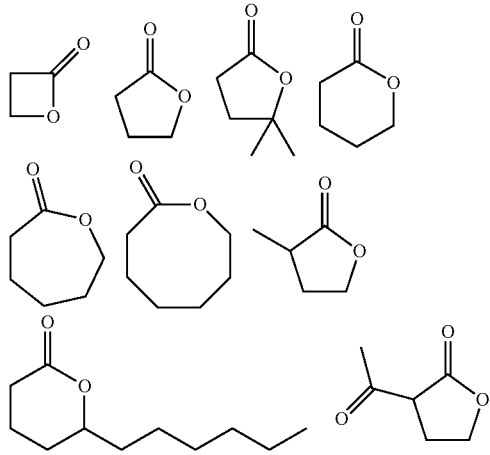

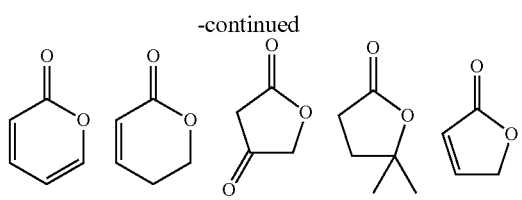

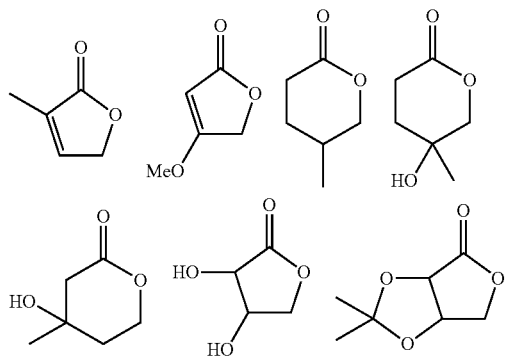

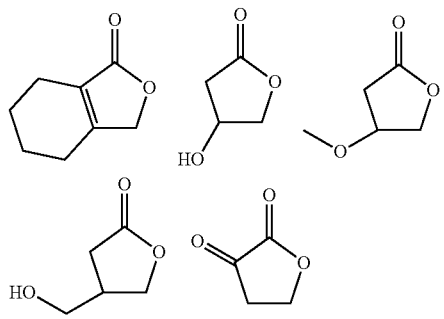

Examples of the compound represented by formula (EI) where W is a lactone ring-containing group are illustrated below, but the present invention is not limited thereto.

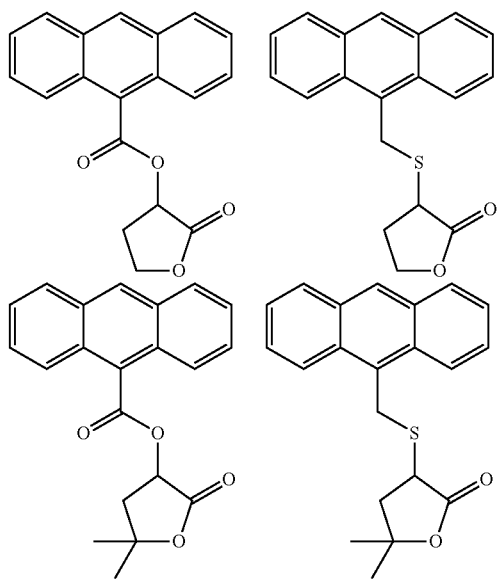

101
-continued
102
-continued
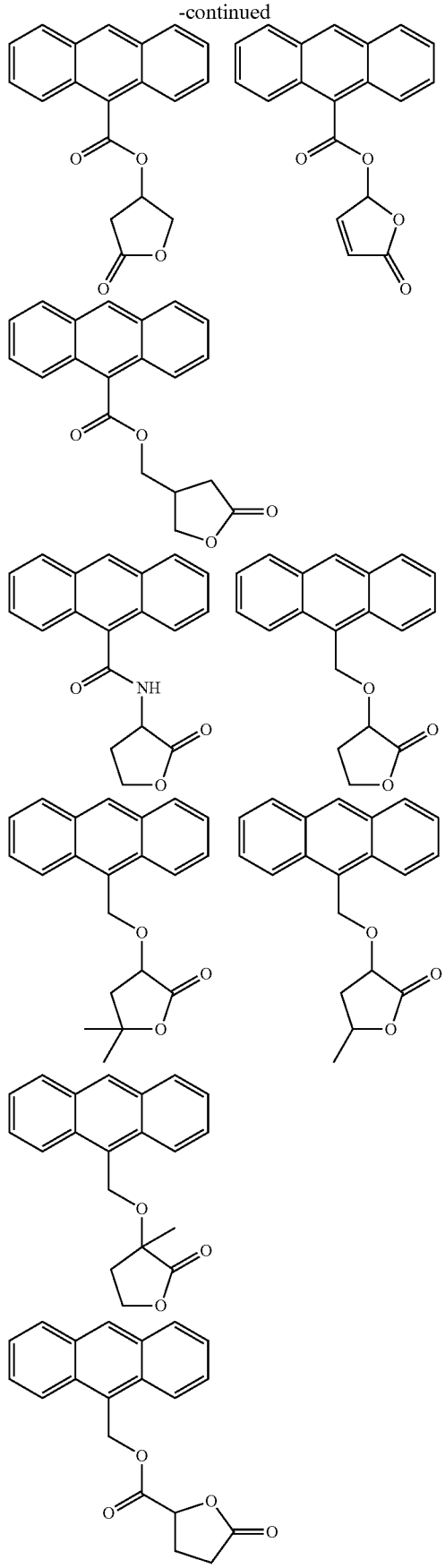
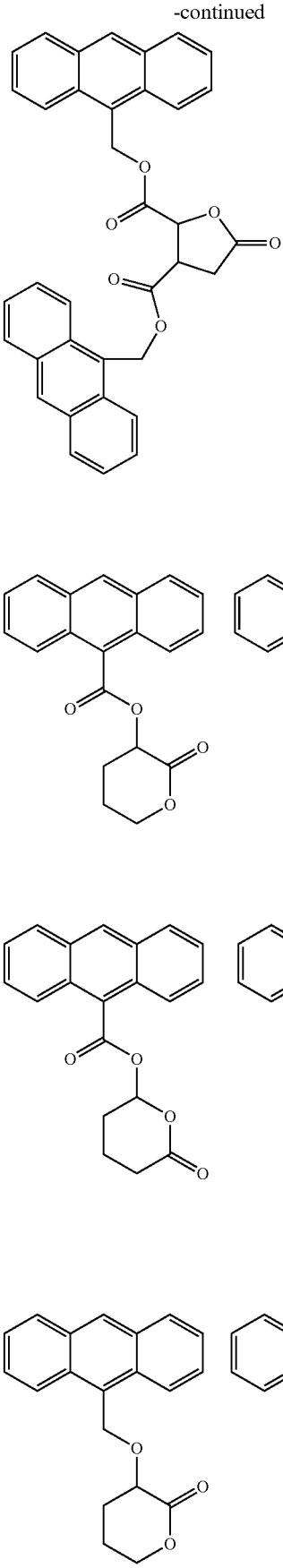

103
-continued
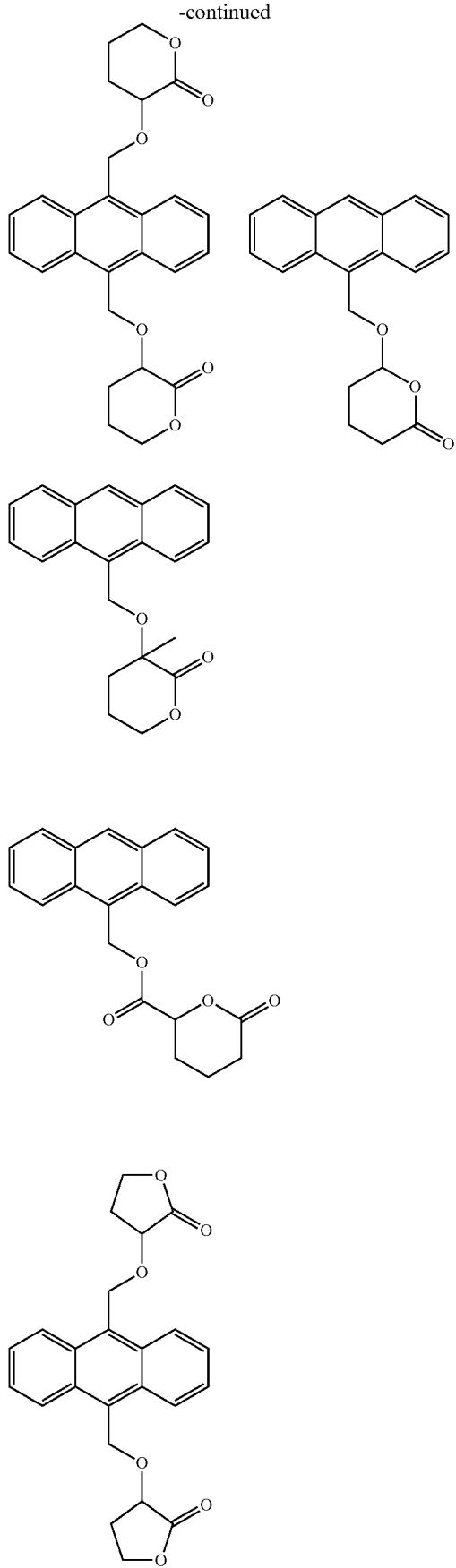
104
-continued
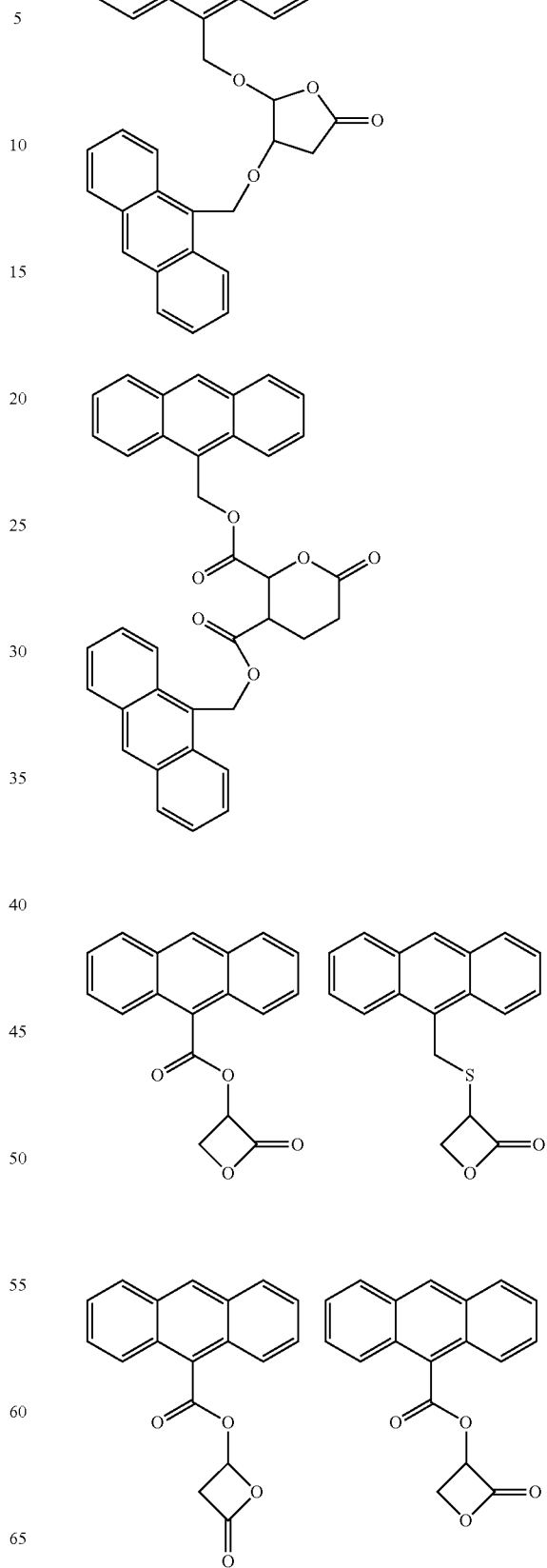

105
-continued
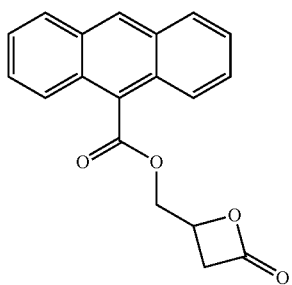
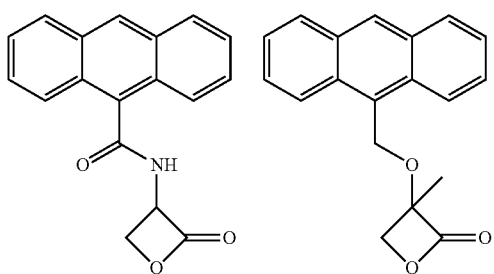
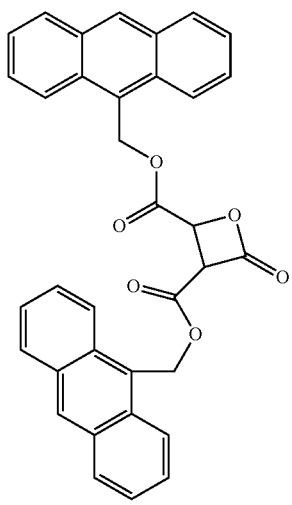
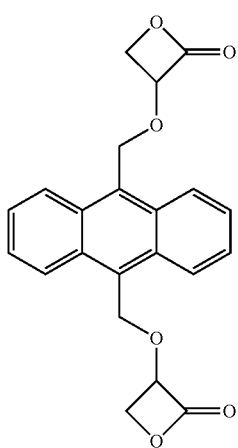
106
-continued
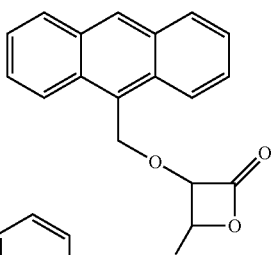
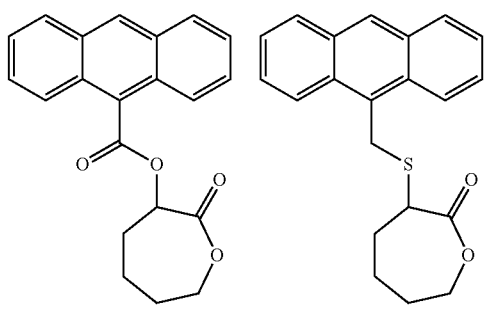
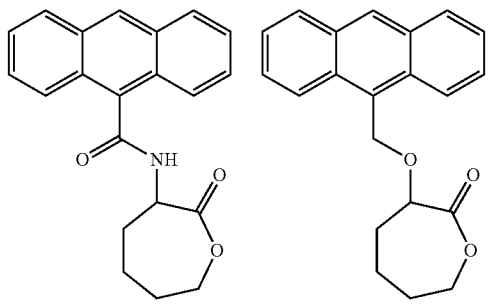
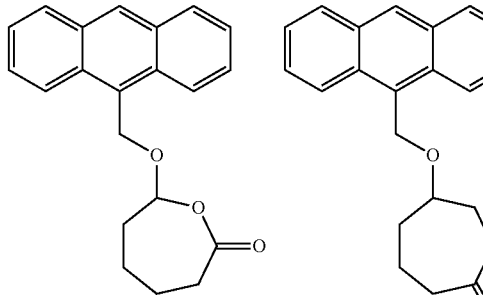
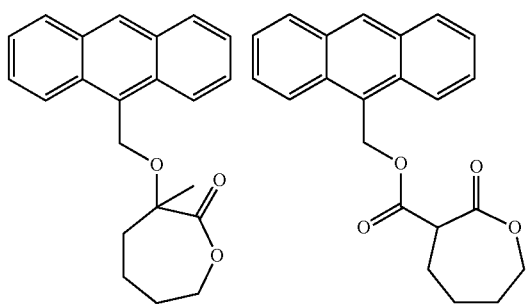

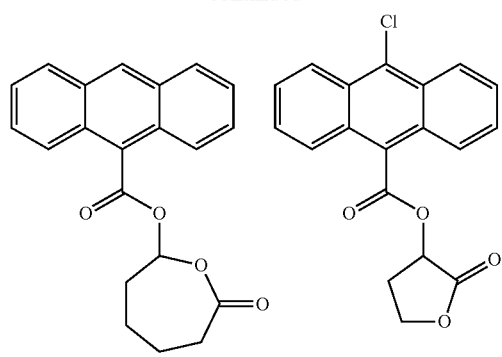
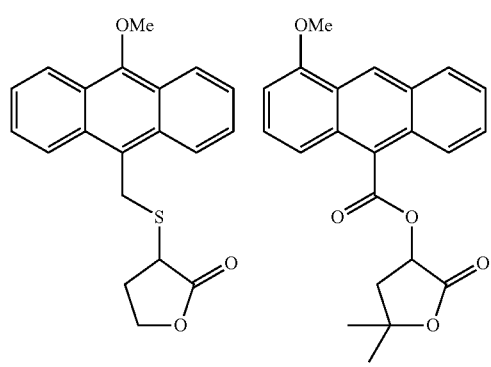
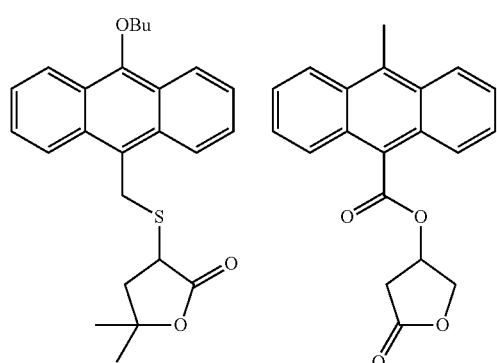
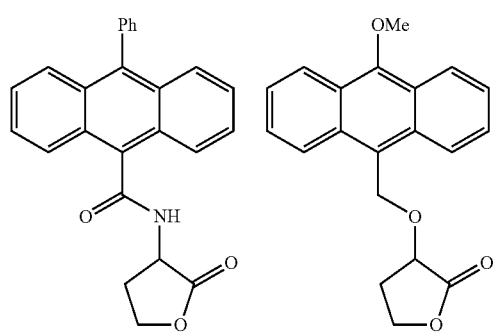
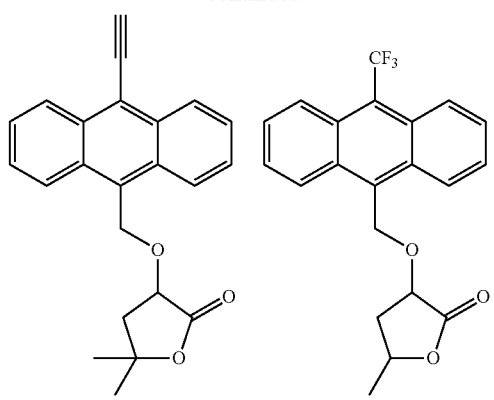
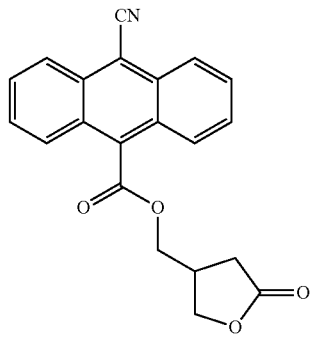
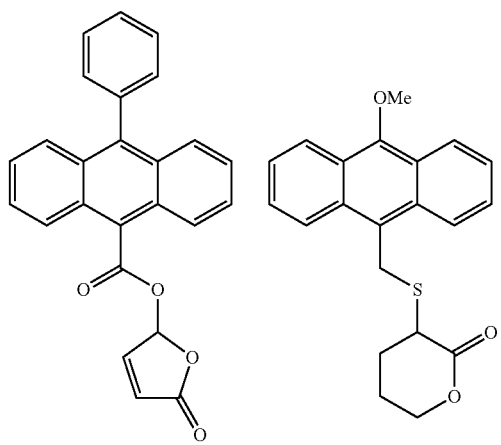
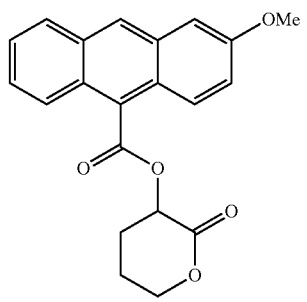

109
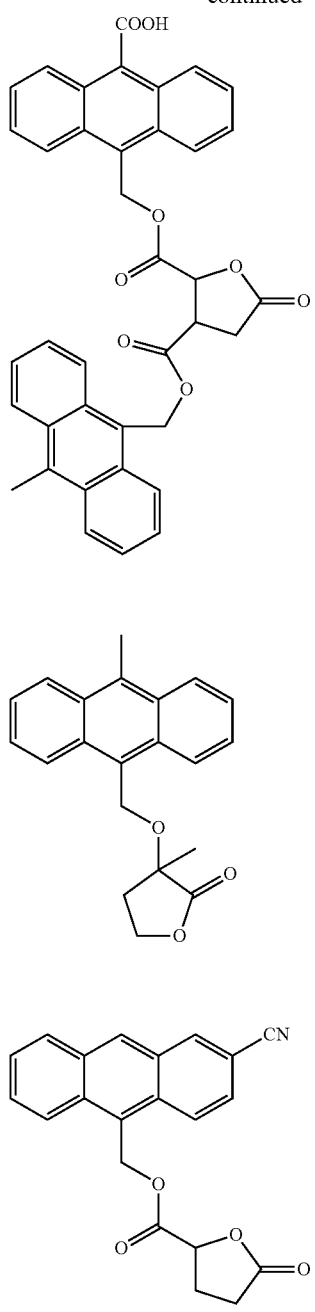
110
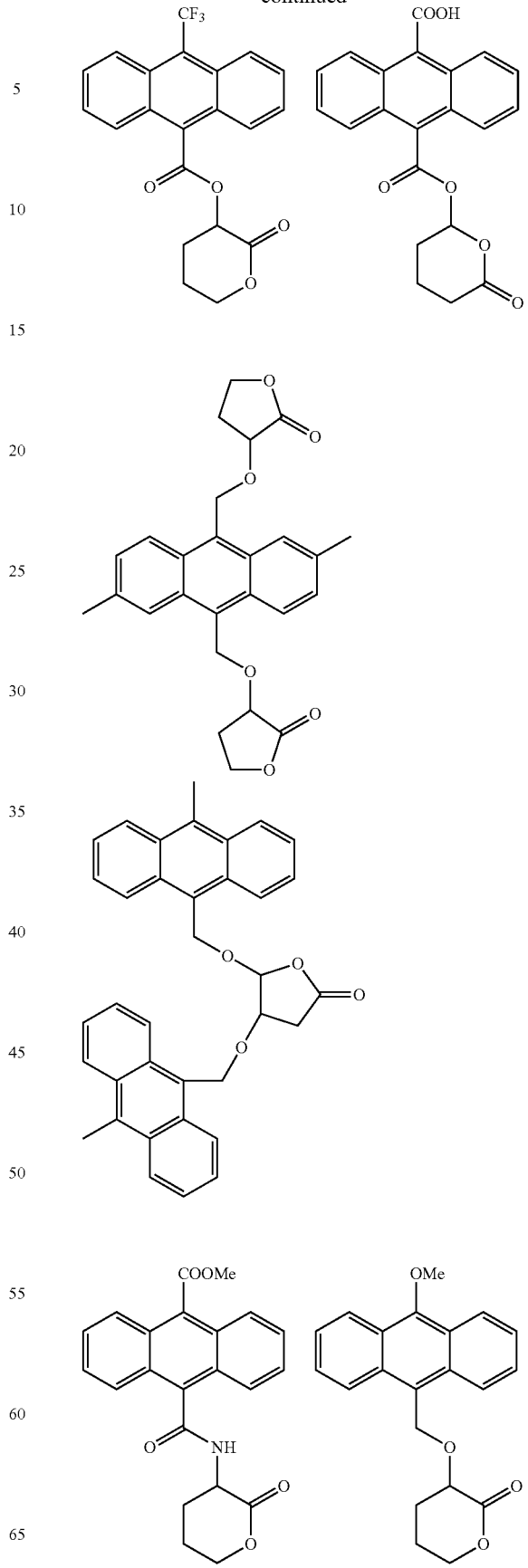

111
-continued
112
-continued
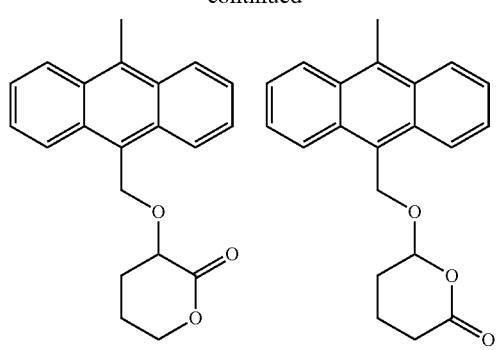
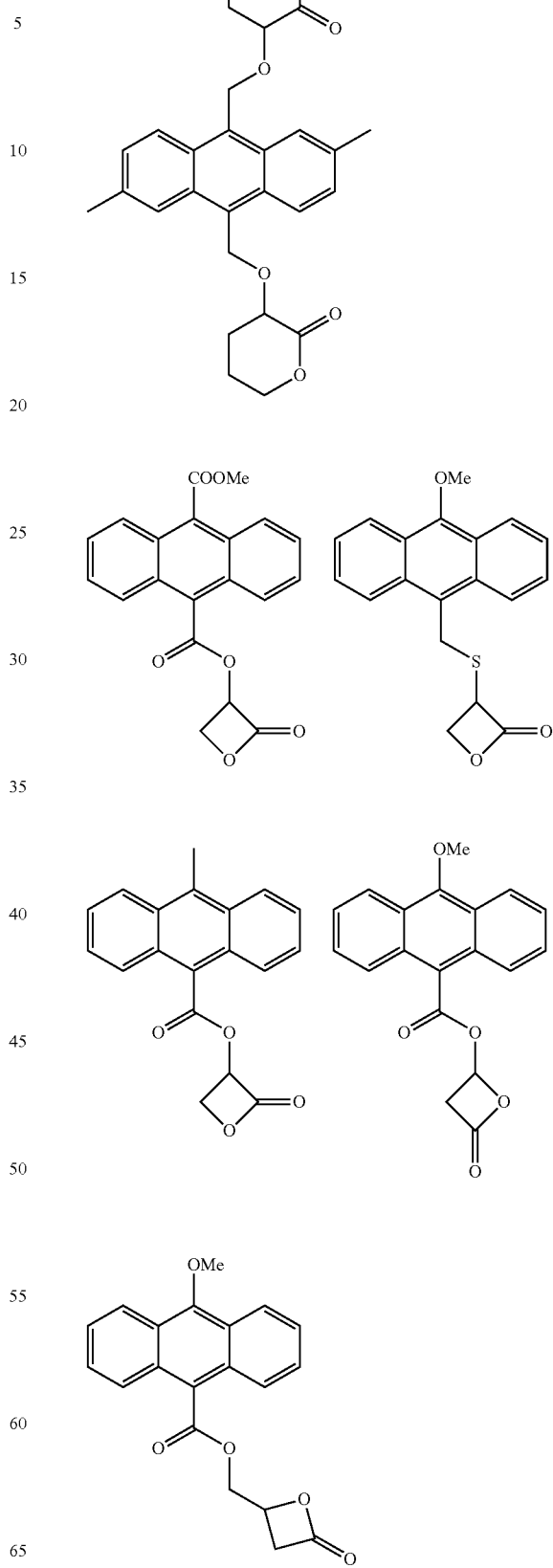

113
-continued
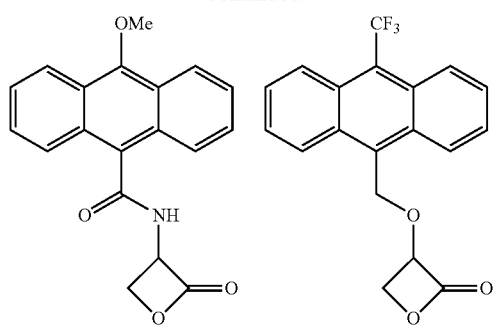
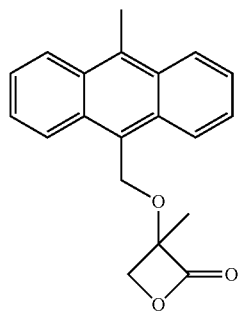
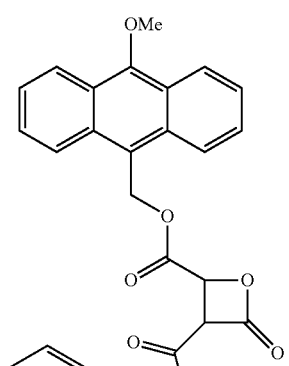
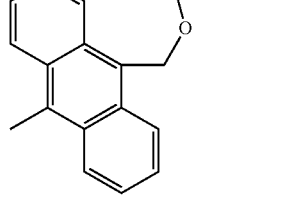
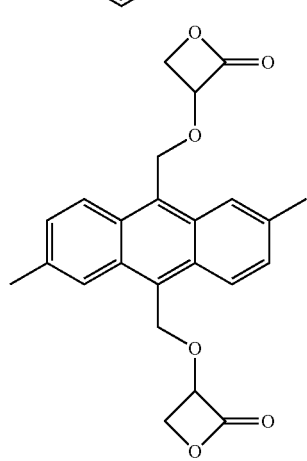
114
-continued
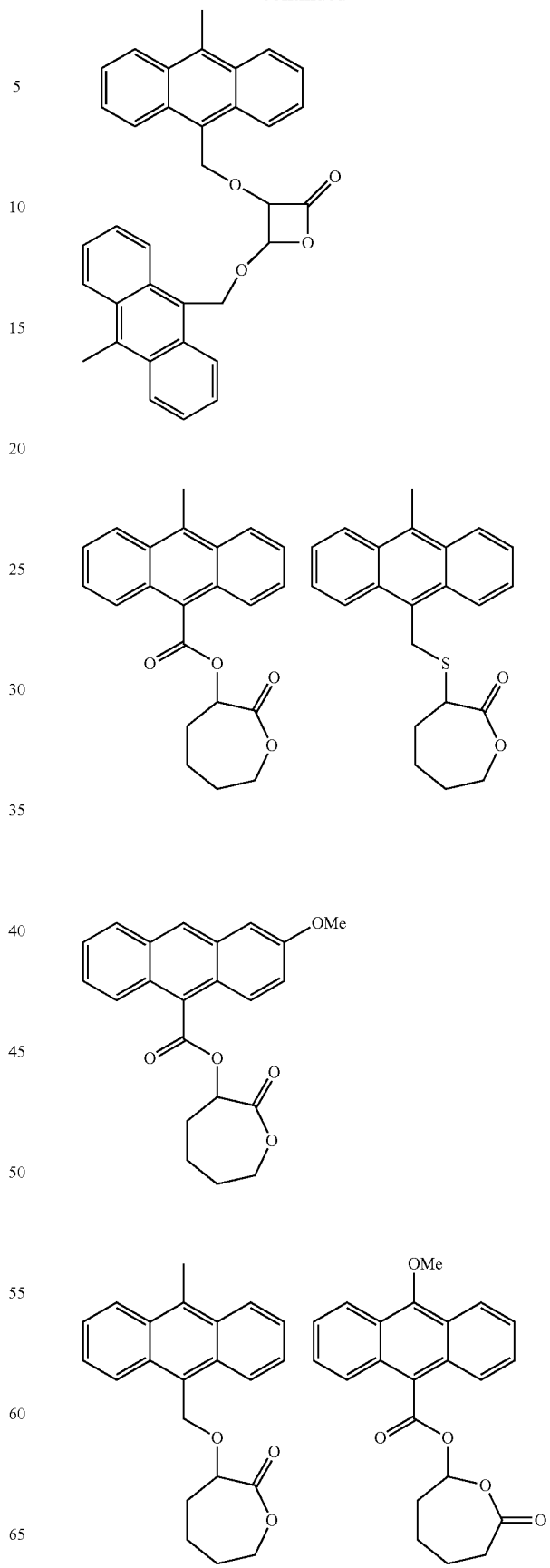

115
-continued
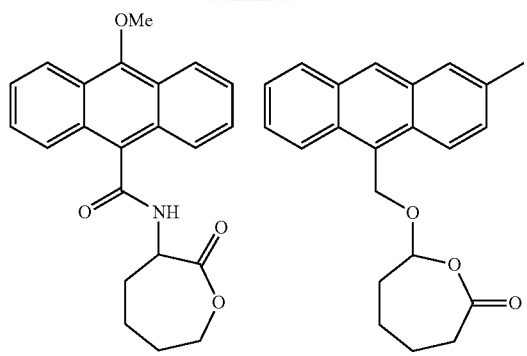
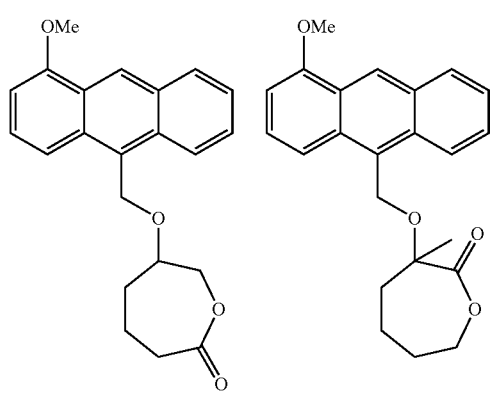
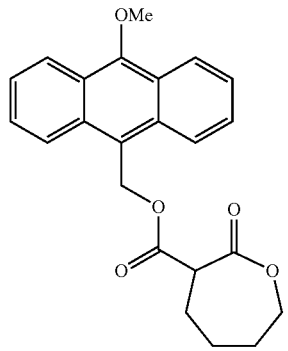
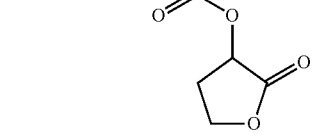
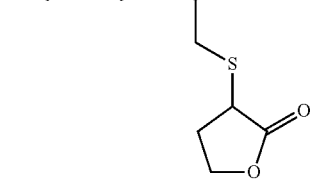
116
-continued
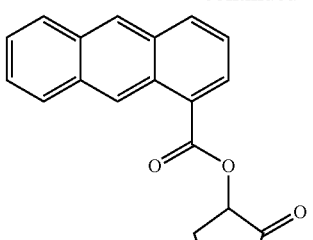
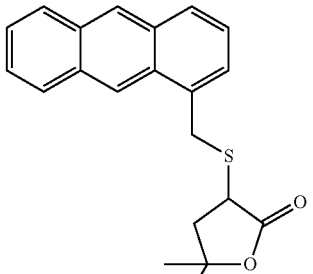
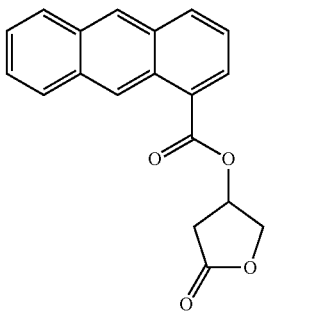
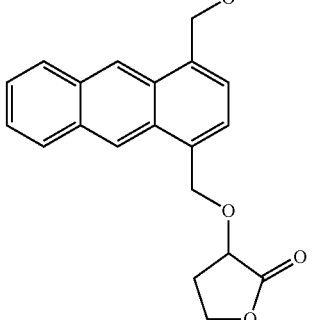
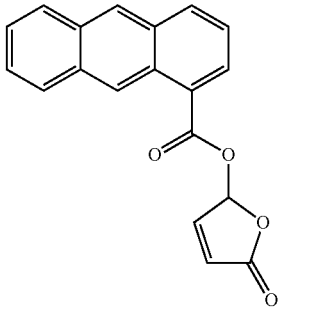

117
-continued
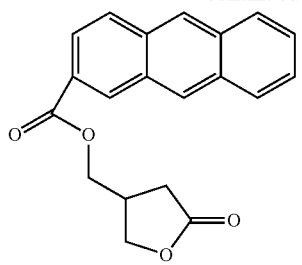
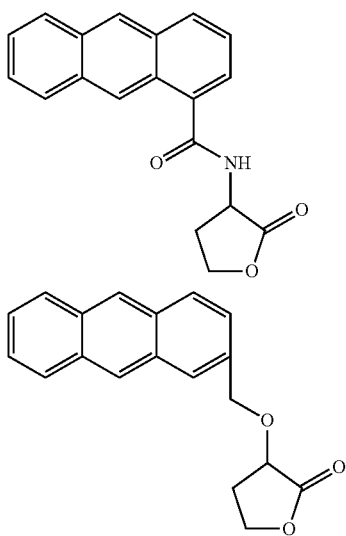
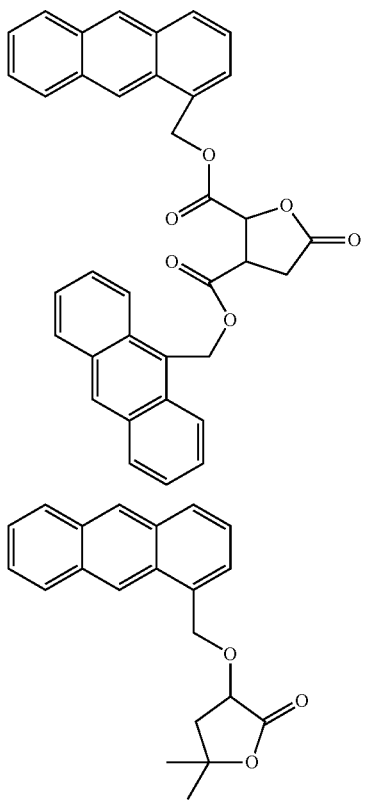
118
-continued
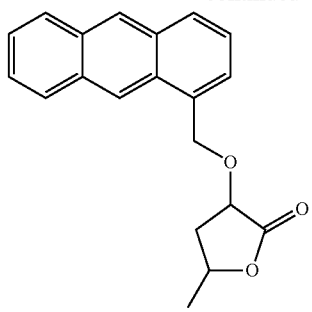
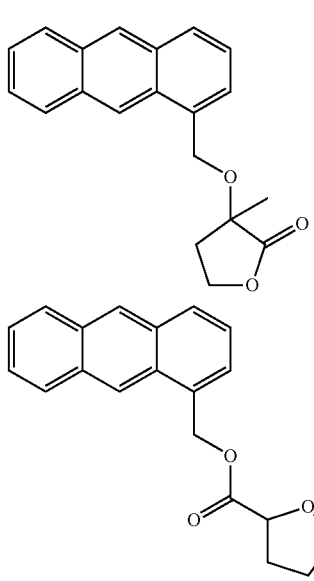
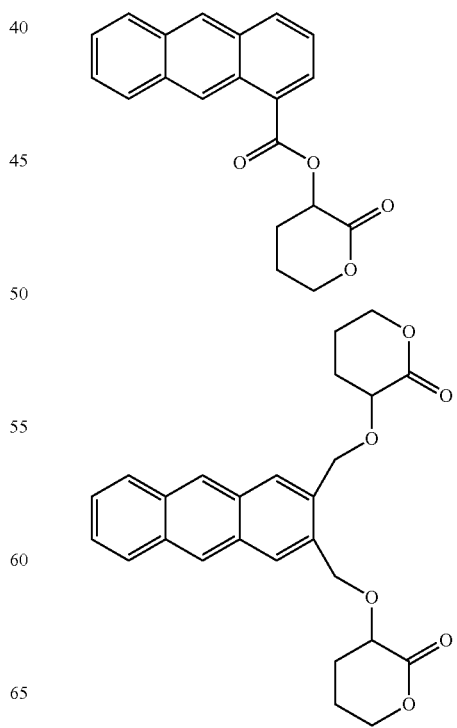

119
-continued
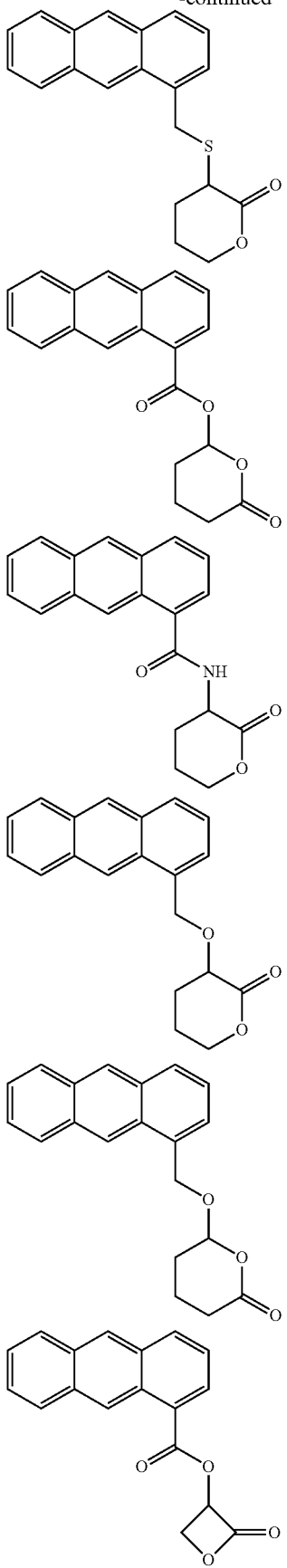
120
-continued
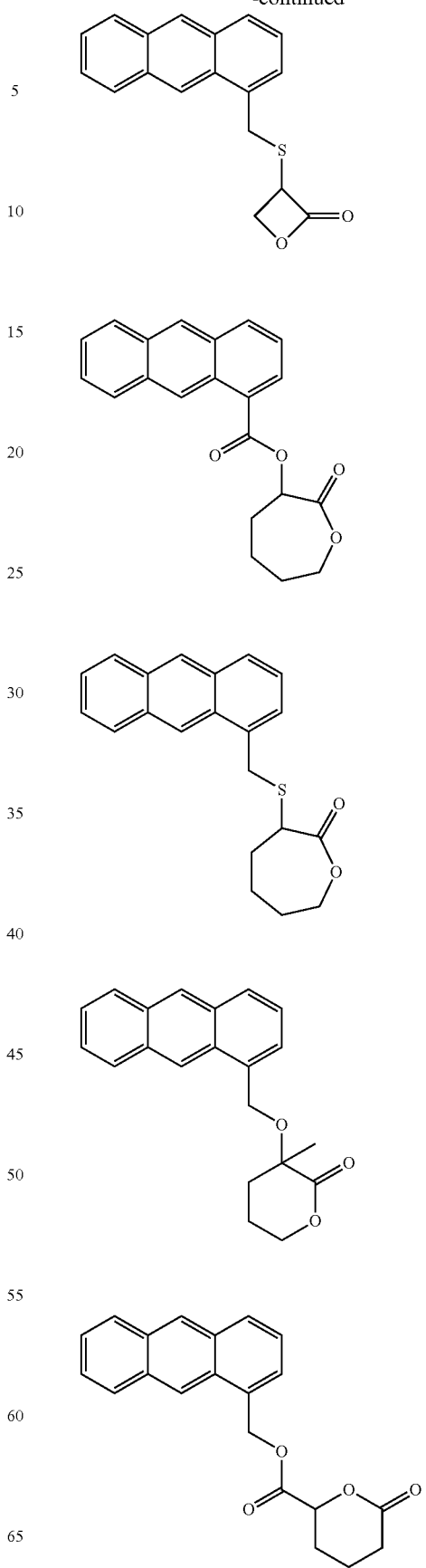

121
-continued
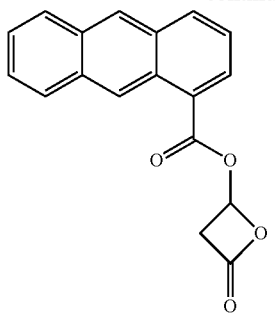
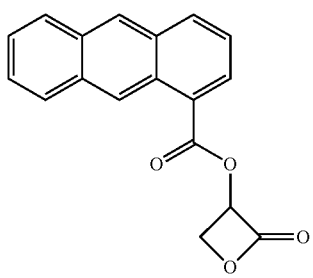
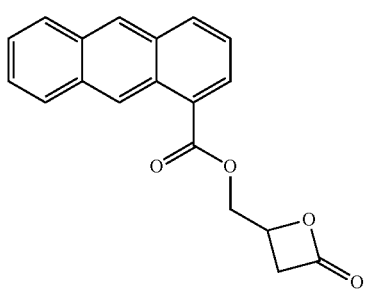
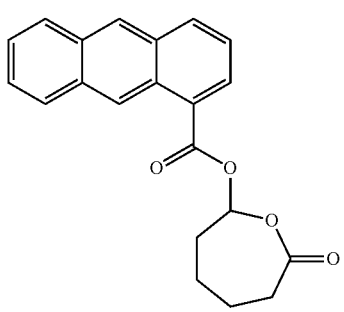
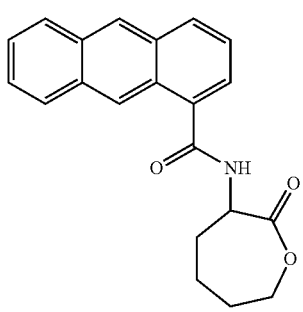
122
-continued
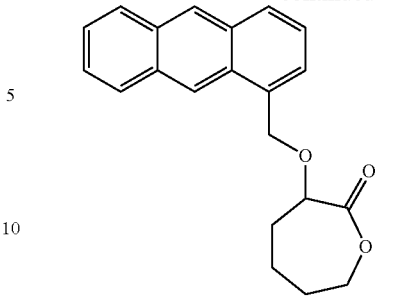
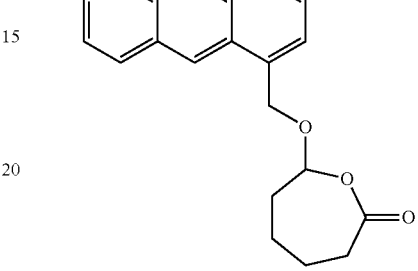
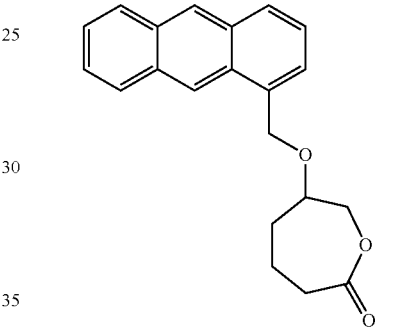
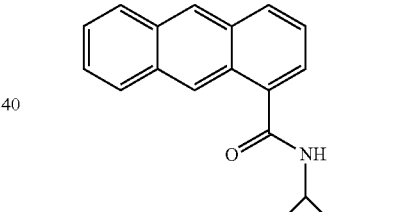
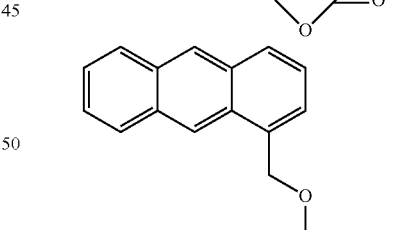
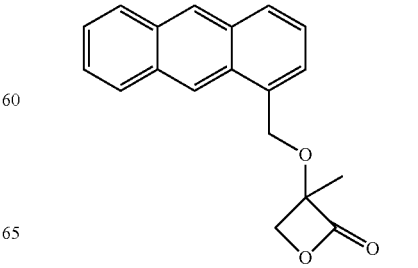

-continued

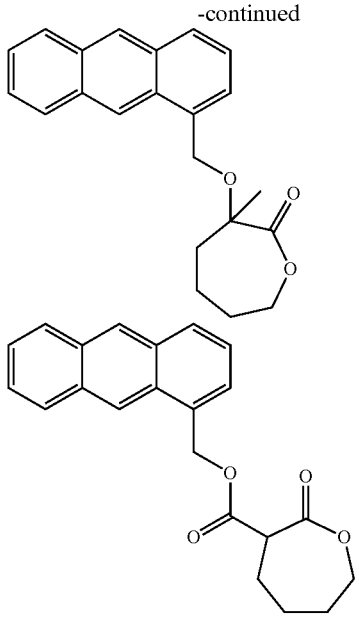

The compound where W is a group represented by any one of formulae (V1) to (V4) is described below.

In formulae (V1) to (V4), Z represents a single bond or a divalent linking group, and the divalent linking group of Z has the same meaning as X in formula (EI). Z is preferably a single bond or an alkylene group (e.g., methylene, ethylene, propylene, butylene, hexylene). In formulae (V1) and (V2), Z is preferably a single bond or a methylene group, and in formula (V4), Z is preferably a methylene group.

Each of Ra, Rb and Rc independently represents a hydrogen atom, an alkyl group, a cycloalkyl group or an alkenyl group.

Rd represents an alkyl group, a cycloalkyl group or an alkenyl group.

Incidentally, with respect to the group represented by formula (V1), each of Ra, Rb and Rc preferably represents an alkyl group, a cycloalkyl group or an alkenyl group, that is, a group having an acid-decomposable group capable of producing a carboxyl group after leaving of the group represented by —C(Ra)(Rb)(Rc) by the action of an acid.

Two groups out of Ra, Rb and Rc or two groups out of Ra, Rb and Rd may combine to form a ring structure composed of carbon atoms or may form a ring structure further containing a heteroatom in addition to the carbon atoms.

The ring structure formed preferably has a carbon number of 3 to 15, more preferably a carbon number of 3 to 8, and examples thereof include a cyclopropyl group, a cyclopentyl group, a cyclohexyl group, a cycloheptyl group, a 1-cyclohexenyl group, an adamantyl group, a 2-tetrahydrofuranyl group and a 2-tetrahydropyranyl group.

The alkyl group of Ra to Rd is preferably an alkyl group having a carbon number of 1 to 8, which may have a substituent, such as methyl group, ethyl group, propyl group, n-butyl group, sec-butyl group, hexyl group, 2-ethylhexyl group and octyl group.

The cycloalkyl group is preferably a cycloalkyl group having a carbon number of 3 to 8, which may have a substituent, such as cyclopropyl group, cyclopentyl group and cyclohexyl group.

The alkenyl group is preferably an alkenyl group having a carbon number of 2 to 6, which may have a substituent, such as vinyl group, propenyl group, allyl group, butenyl group, pentenyl group, hexenyl group and cyclohexenyl group.

Preferred examples of the further substituent on each of the groups described above include a hydroxyl group, a halogen atom (e.g., fluorine, chlorine, bromine, iodine), a nitro group, a cyano group, an amido group, a sulfonamido group, the alkyl group such as methyl group, ethyl group, propyl group, n-butyl group, sec-butyl group, hexyl group, 2-ethylhexyl group and octyl group, an alkoxy group such as methoxy group, ethoxy group, hydroxyethoxy group, propoxy group, hydroxypropoxy group and butoxy group, an alkoxycarbonyl group such as methoxycarbonyl group and ethoxycarbonyl group, an acyl group such as formyl group, acetyl group and benzoyl group, an acyloxy group such as acetoxy group and butyryloxy group, and a carboxy group.

Specific examples of the compound represented by formula (EI) where W is a group represented by any one of formulae (V1) to (V4) are illustrated below, but the present invention is not limited thereto.

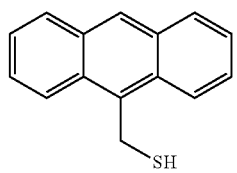

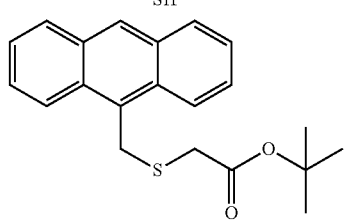

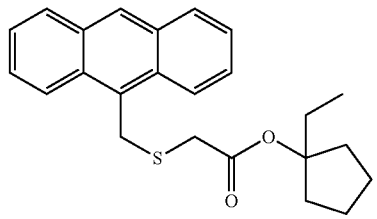

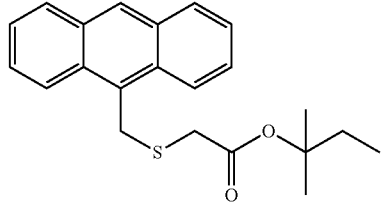

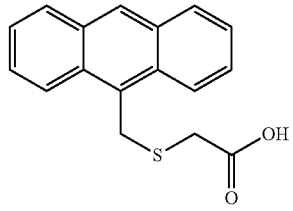

125
-continued
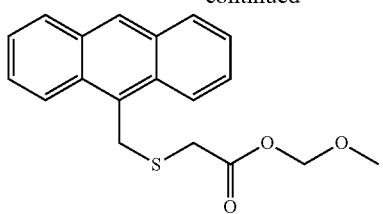
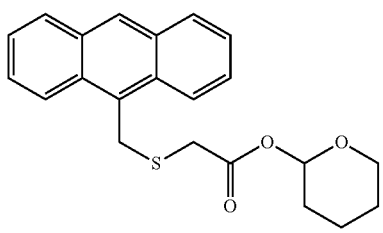
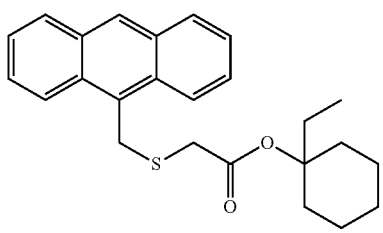
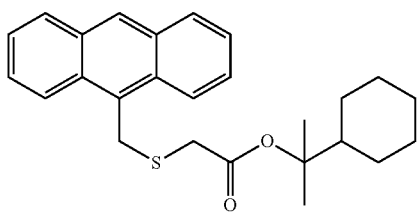
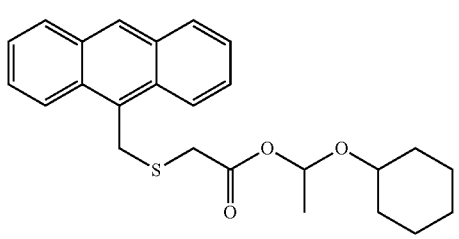
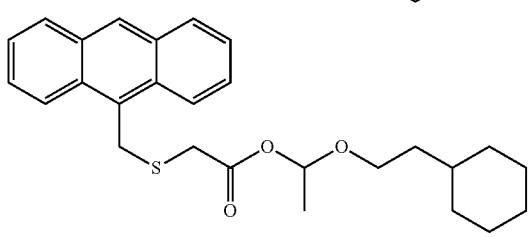
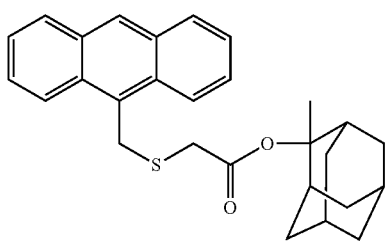
126
-continued
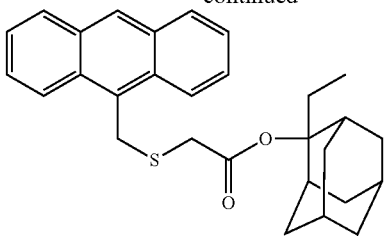
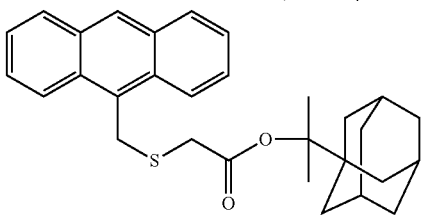
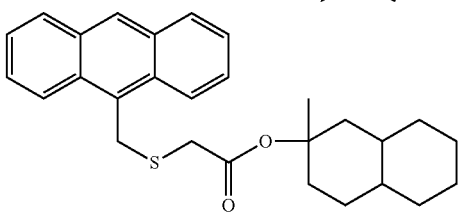
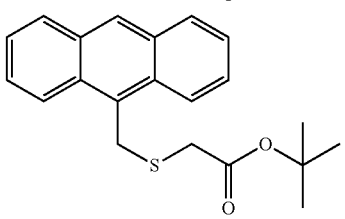
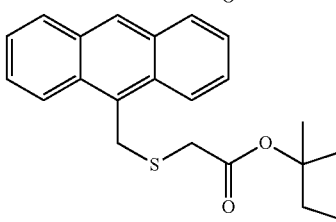
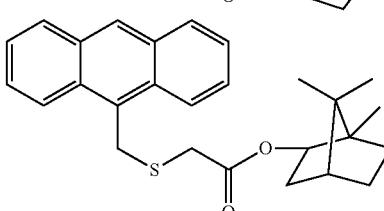
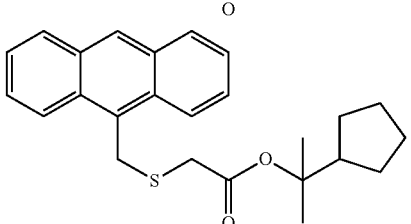
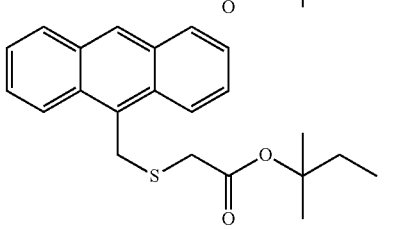

127
-continued
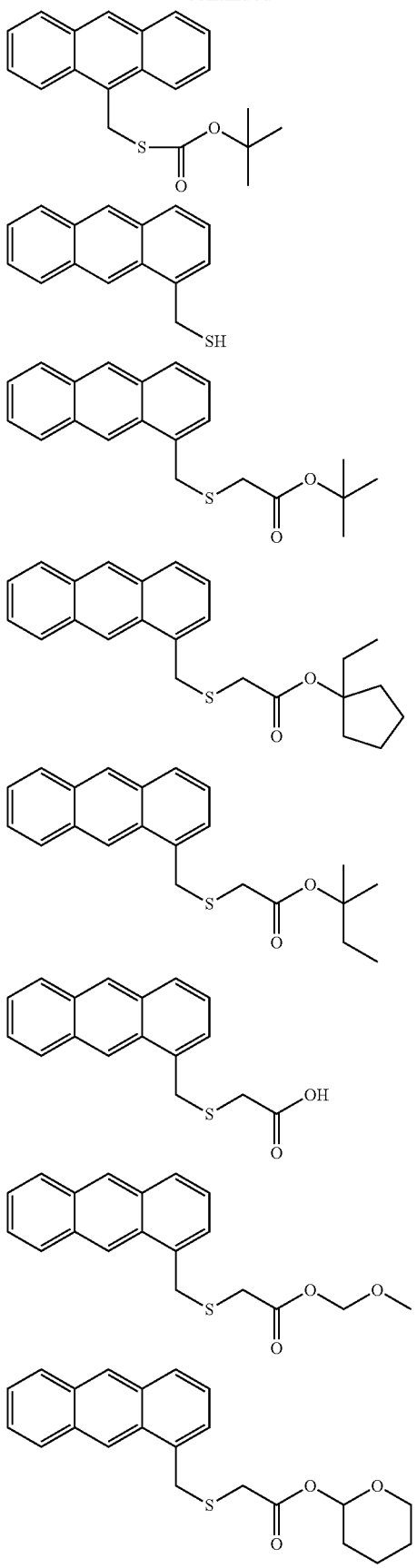
128
-continued
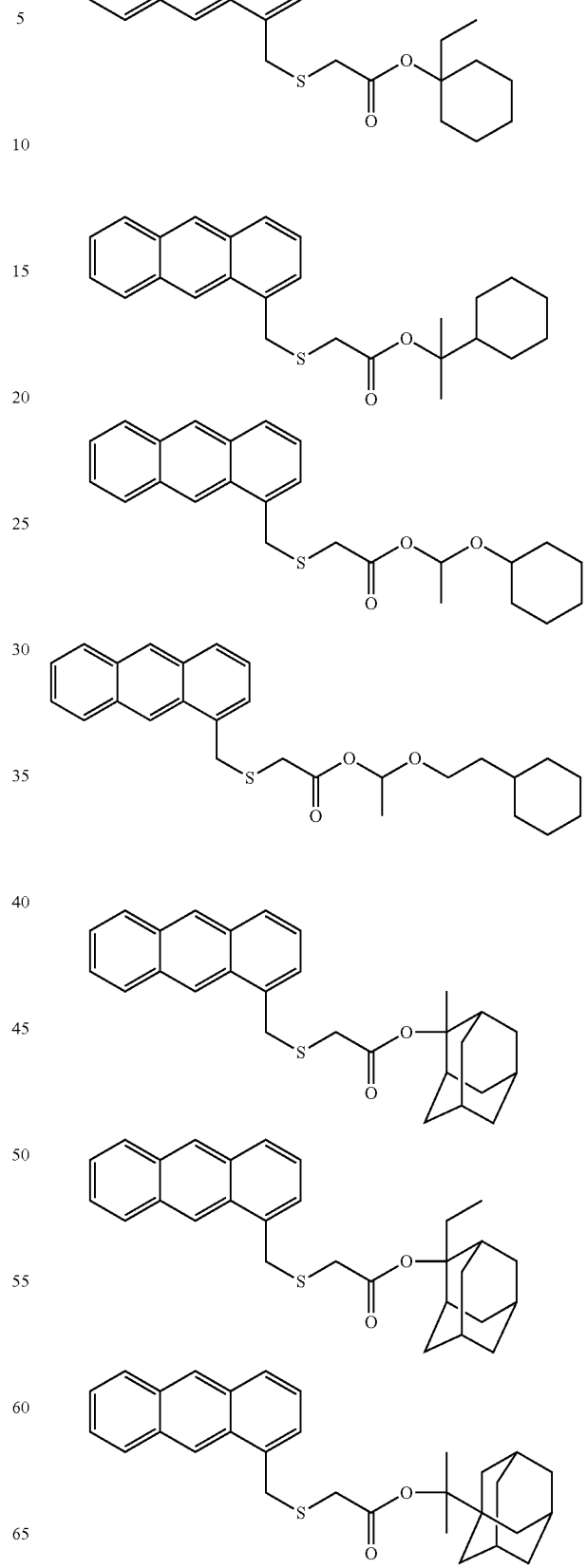

-continued

131
-continued

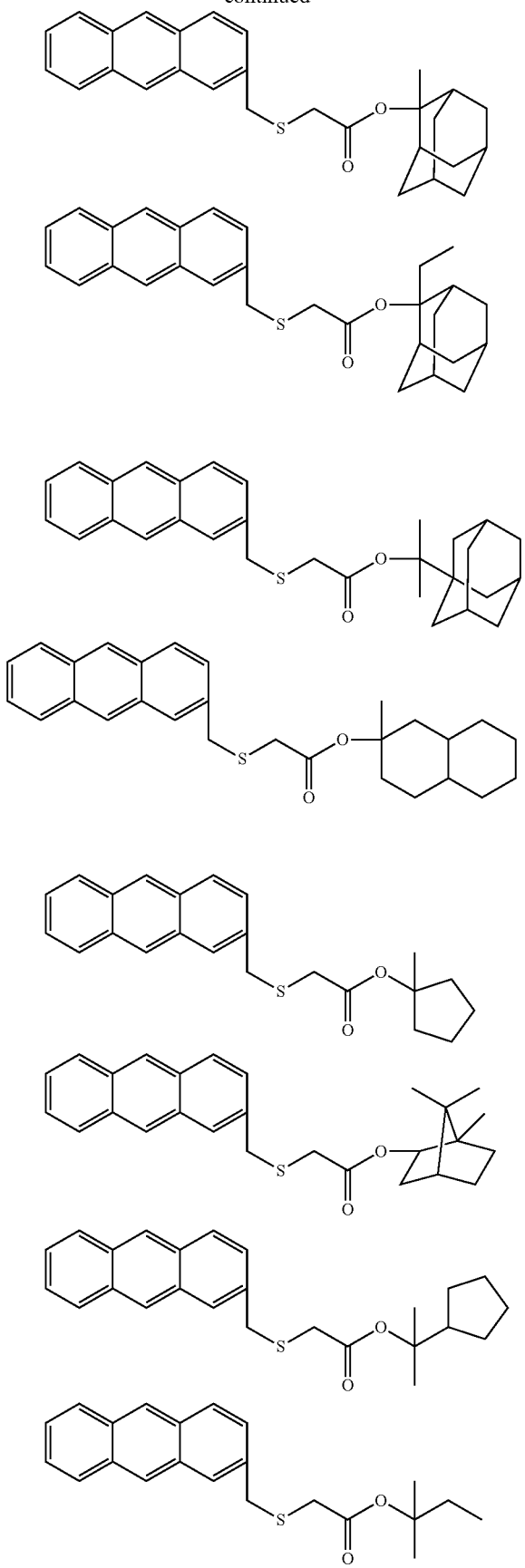

132
-continued

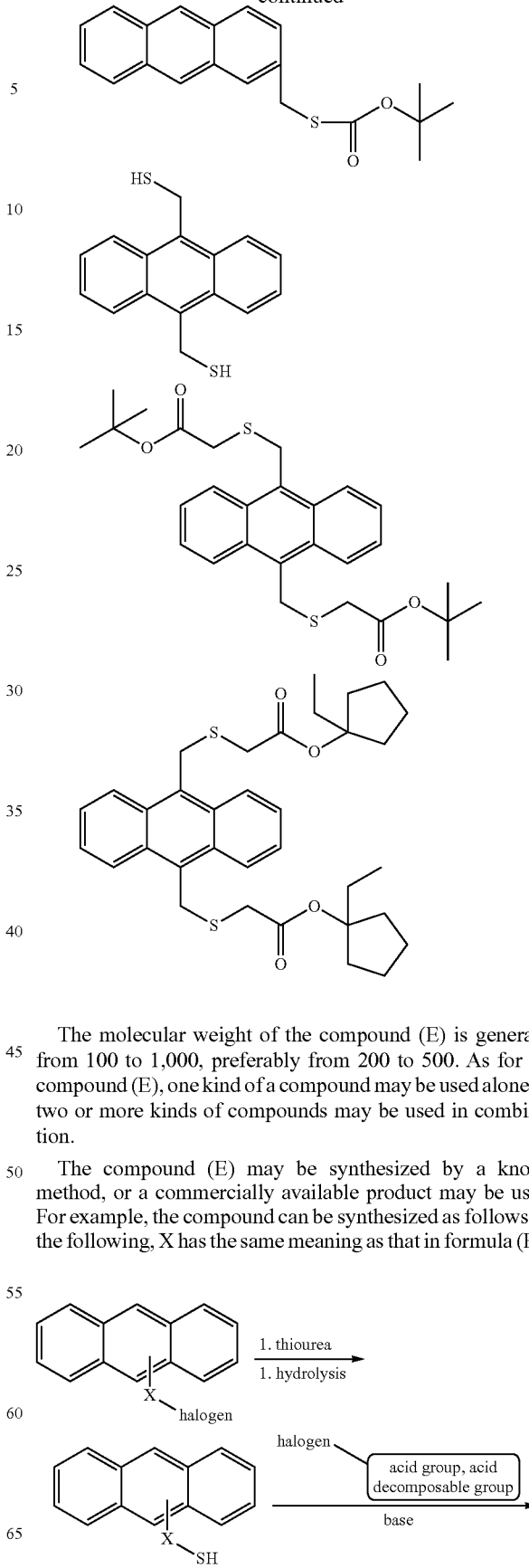

The molecular weight of the compound (E) is generally from 100 to 1,000, preferably from 200 to 500. As for the compound (E), one kind of a compound may be used alone, or two or more kinds of compounds may be used in combination.

The compound (E) may be synthesized by a known method, or a commercially available product may be used. For example, the compound can be synthesized as follows. In the following, X has the same meaning as that in formula (EI).

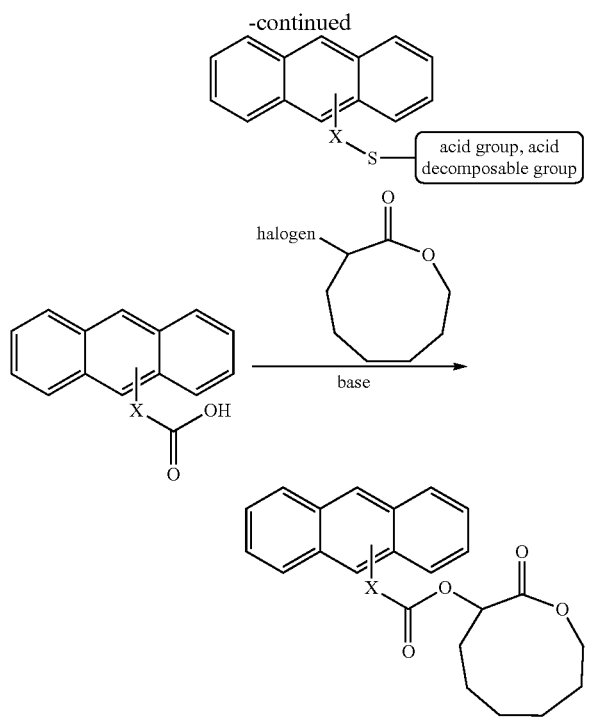

The actinic ray-sensitive or radiation-sensitive resin composition of the present invention may or may not contain the compound (E), but in the case of containing the compound (E), the content thereof is preferably from 0.1 to 30 mass %, more preferably from 1 to 20 mass %, based on the entire solid content of the actinic ray-sensitive or radiation-sensitive resin composition.

[6] Other Components

The actinic ray-sensitive or radiation-sensitive resin composition of the present invention may further contain a surfactant, a dissolution inhibiting compound, a dye, a plasticizer, a photosensitizer, a compound for accelerating the dissolution in a developer, a compound having a proton acceptor functional group, and a solvent.

(Surfactant)

The composition of the present invention preferably further contains a surfactant. The surfactant is preferably a fluorine-containing and/or silicon-containing surfactant.

Examples of the surfactant above include Megaface F176, and Megaface R08, produced by Dainippon Ink & Chemicals, Inc.; PF656, and PF6320, produced by OMNOVA; Troysol S-366, produced by Troy Chemical Corp.; Florad FC430, produced by Sumitomo 3M Inc.; and polysiloxane polymer KP-341, produced by Shin-Etsu Chemical Co., Ltd.

A surfactant other than the fluorine-containing and/or silicon-containing surfactant may also be used. Specific examples thereof include polyoxyethylene alkyl ethers and polyoxyethylene alkylaryl ethers.

In addition, known surfactants may be appropriately used. Examples of the surfactant which can be used include surfactants described in paragraph [0273] et seq. of U.S. Patent Application Publication No. 2008/0248425A1.

One kind of a surfactant may be used alone, or two or more kinds of surfactants may be used in combination.

The actinic ray-sensitive or radiation-sensitive resin composition of the present invention may or may not contain a surfactant, but in the case of containing a surfactant, the content thereof is preferably from 0.0001 to 2 mass %, more preferably from 0.001 to 1 mass %, based on the entire solid content of the composition.

(Dissolution Inhibiting Compound Having a Molecular Weight of 3,000 or Less and Being Capable of Decomposing by the Action of an Acid to Increase the Solubility in an Alkali Developer)

The dissolution inhibiting compound having a molecular weight of 3,000 or less and being capable of decomposing by the action of an acid to increase the solubility in an alkali developer (hereinafter, sometimes referred to as a "dissolution inhibiting compound") is preferably an alicyclic or aliphatic compound containing an acid-decomposable group, such as acid-decomposable group-containing cholic acid derivative described in Proceeding of SPIE, 2724, 355(1996), so as not to reduce the transparency at 220 nm or less. Examples of the acid-decomposable group are the same as those described above for the acid-decomposable unit.

In the case where the composition of the present invention is exposed to KrF excimer laser or irradiated with an electron beam, the dissolution inhibiting compound is preferably a compound containing a structure where a phenolic hydroxyl group of a phenol compound is substituted with an acid-decomposable group. The phenol compound is preferably a compound containing from 1 to 9, phenol structures, more preferably from 2 to 6, phenol structures.

The actinic ray-sensitive or radiation-sensitive resin composition of the present invention may or may not contain a dissolution inhibiting compound, but in the case of containing a dissolution inhibiting compound, the content thereof is preferably from 0.1 to 50 mass %, more preferably from 1 to 40 mass %, based on the entire solid content of the composition.

Specific examples of the dissolution inhibiting compound are illustrated below, but the present invention is not limited thereto.

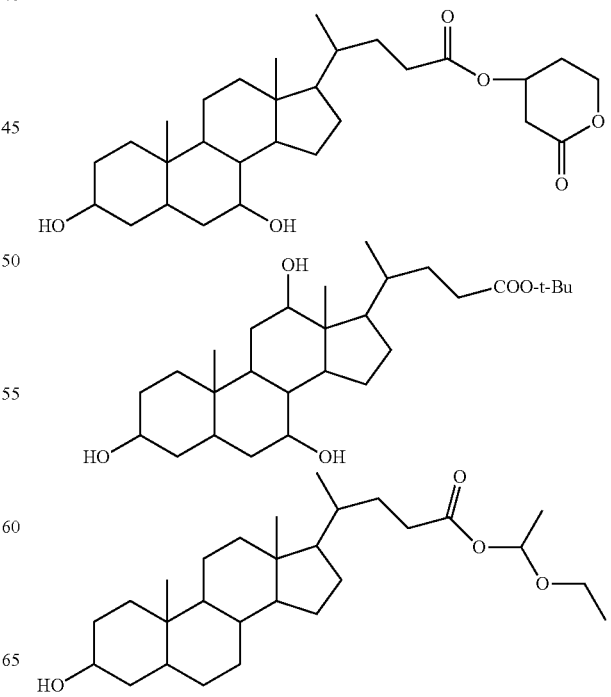

-continued

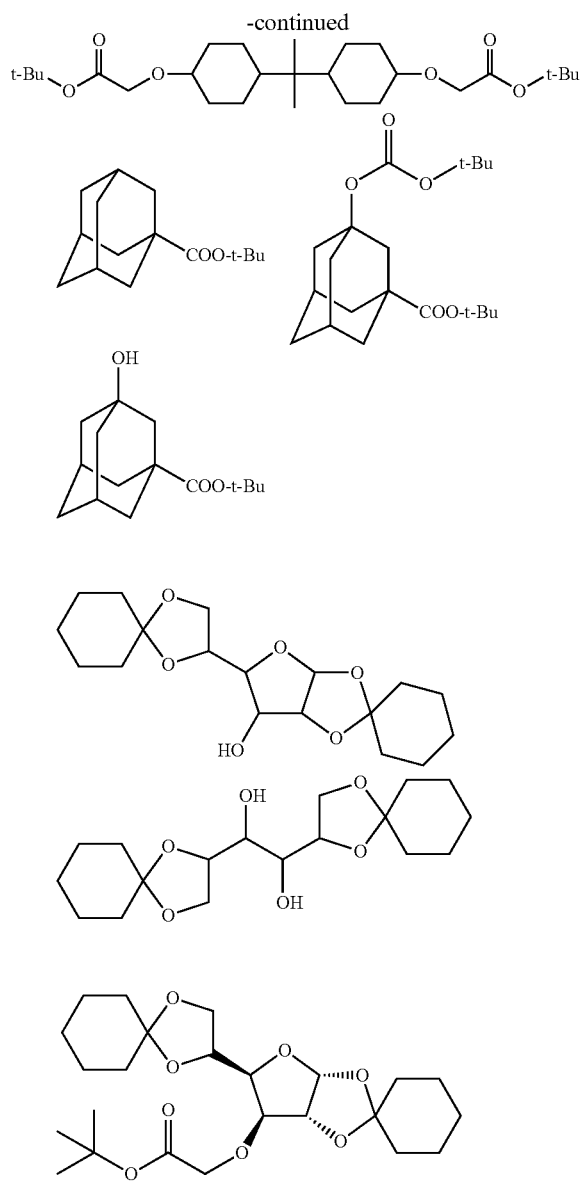

(Other Additives)

The composition of the present invention may further contain a dye, a plasticizer, a photosensitizer, a light absorber, a compound for accelerating dissolution in a developer (for example, a phenol compound having a molecular weight of 1,000 or less, or an alicyclic or aliphatic compound containing a carboxy group and having a molecular weight of 1,000 or less), and the like, if desired. Also, a compound having a proton acceptor functional group described, for example, in JP-A-2006-208781, and JP-A-2007-286574, may also be suitably used.

(Solvent)

The solvent which can be used at the preparation of the composition is not particularly limited as long as it can dissolve respective components, but examples thereof include an alkylene glycol monoalkyl ether carboxylate (e.g., propylene glycol monomethyl ether acetate), an alkylene glycol monoalkyl ether (e.g., propylene glycol monomethyl ether), an alkyl lactate (e.g., ethyl lactate, methyl lactate), a cyclic lactone (e.g., γ-butyrolactone; preferably having a carbon number of 4 to 10), a chain or cyclic ketone (e.g., 2-heptanone, cyclohexanone; preferably having a carbon number of 4 to 10), an alkylene carbonate (e.g., ethylene carbonate, propylene carbonate), an alkyl carboxylate (preferably an alkyl acetate such as butyl acetate), and an alkyl alkoxyacetate (preferably ethyl ethoxypropionate). Other usable solvents include solvents described in paragraph [0244] et seq. of U.S. Patent Application Publication No. 2008/0248425A1.

Among the solvents described above, an alkylene glycol monoalkyl ether carboxylate, an alkylene glycol monoalkyl ether and ethyl lactate are preferred.

One of these solvents may be used alone, or two or more thereof may be mixed and used. In the case of mixing and using two or more kinds of solvents, a solvent containing a hydroxyl group and a solvent containing no hydroxyl group are preferably mixed. The mass ratio between the solvent containing a hydroxyl group and the solvent containing no hydroxyl group is, for example, from 1/99 to 99/1, preferably from 10/90 to 90/10, more preferably from 20/80 to 60/40.

The solvent containing a hydroxyl group is preferably an alkylene glycol monoalkyl ether or an alkyl lactate, and the solvent containing no hydroxyl group is preferably an alkylene glycol monoalkyl ether carboxylate.

The amount of the solvent used is not particularly limited but is set such that the total solid content concentration of the composition becomes preferably from 0.5 to 50 mass %, more preferably from 1.0 to 45 mass %, still more preferably from 2.0 to 40 mass %, yet still more preferably from 2.0 to 30 mass %.

[7] Pattern Forming Method

The actinic ray-sensitive or radiation-sensitive resin composition of the present invention is typically used as follows. That is, the composition of the present invention is typically applied on a support such as substrate to form a film (resist film). The thickness of the film is preferably from 0.02 to 10.0 μm. The method for applying the composition on a substrate is preferably spin coating, and the spinning speed is preferably from 1,000 to 3,000 rpm.

For example, the composition is applied on such a substrate (e.g., silicon, silicon dioxide-coated silicon, silicon nitride, SiON, silicon/silicon dioxide-coated substrate, glass substrate, ITO substrate, TiN substrate, quartz/chromium oxide-coated substrate) as used in the production of a precision integrated circuit device, by an appropriate coating method such as spinner or coater. Thereafter, the coating is dried to obtain an actinic ray-sensitive or radiation-sensitive film (hereinafter, sometimes referred to as a "photosensitive film"). Incidentally, a known antireflection film may be previously provided by coating. Subsequently, the photosensitive film is irradiated with an actinic ray or radiation, then preferably baked (heating), and further subjected to development and rinsing. By performing the baking, a better pattern can be obtained. In view of sensitivity and stability, the baking temperature is preferably from 80 to 150° C., more preferably from 90 to 130° C.

Examples of the actinic ray or radiation include infrared light, visible light, ultraviolet light, far-ultraviolet light, extreme-ultraviolet ray (EUV light), X-ray and electron beam (EB). The actinic ray or radiation is preferably a light having a wavelength of, for example, 250 nm or less, more preferably 220 nm or less. Examples of such an actinic ray or radiation include KrF excimer laser (248 nm), ArF excimer laser (193 nm), F₂ excimer laser (157 nm), X-ray, extreme-ultraviolet ray and electron beam. In particular, KrF excimer laser, X-ray, extreme-ultraviolet ray and electron beam are preferred as the actinic ray or radiation.

In the development step, an alkali developer is usually used.

The alkali developer includes, for example, an alkaline aqueous solution containing an inorganic alkali compound such as sodium hydroxide, potassium hydroxide, sodium carbonate, sodium silicate, sodium metasilicate and aqueous ammonia, a primary amine such as ethylamine and n-propylamine, a secondary amine such as diethylamine and di-n-butylamine, a tertiary amine such as triethylamine and methyldiethylamine, an alcoholamine such as dimetylethanolamine and triethanolamine, a quaternary ammonium salt such as tetramethylammonium hydroxide and tetraethylammonium hydroxide, or a cyclic amine such as pyrrole and piperidine. Usually, a quaternary ammonium salt typified by an aqueous tetramethylammonium hydroxide solution (2.38 mass %) is used.

In the alkali developer, alcohols and/or a surfactant may be added each in an appropriate amount.

The concentration of the alkali developer is usually from 0.1 to 20 mass %. The pH of the alkali developer is usually from 10.0 to 15.0.

As for the rinsing solution, pure water is used, and an appropriate amount of a surfactant may be added to the pure water before use.

After the development or rinsing, a treatment of removing the developer or rinsing solution adhering on the pattern by a supercritical fluid may be performed.

For the film composed of the actinic ray-sensitive or radiation-sensitive resin composition of the present invention, the exposure may also be performed by filling a liquid (immersion medium) having a refractive index higher than that of air between the film and the lens at the irradiation with an actinic ray or radiation (immersion exposure). By this exposure, the resolution can be enhanced. The immersion medium used may be any liquid as long as it has a refractive index higher than that of air, but pure water is preferred.

The immersion liquid used in the immersion exposure is described below.

The immersion liquid is preferably a liquid being transparent to light at the exposure wavelength and having as small a temperature coefficient of refractive index as possible so as to minimize the distortion of an optical image projected on the resist film. Particularly, when the exposure light source is an ArF excimer laser (wavelength: 193 nm), water is preferably used in view of easy availability and easy handleability in addition to the above-described aspects.

Furthermore, a medium having a refractive index of 1.5 or more can also be used from the standpoint that the refractive index can be more enhanced. This medium may be either an aqueous solution or an organic solvent.

In the case of using water as the immersion liquid, an additive aimed at, for example, enhancing the refractive index may be added in a small ratio. Examples of the additive are detailed in Ekishin Lithography no Process to Zairyo (Process and Material of Immersion Lithography), Chapter 12, CMC Shuppan. On the other hand, the presence of a substance opaque to light at 193 nm or an impurity greatly differing in the refractive index from water incurs distortion of the optical image projected on the resist film and therefore, the water used is preferably distilled water. Pure water resulting from purification by means of an ion exchange filter or the like may also be used. The electrical resistance of pure water is preferably 18.3, MQcm or more, and TOC (total organic carbon) is preferably 20, ppb or less. Also, the water is preferably subjected to a deaeration treatment.

The lithography performance can be enhanced by elevating the refractive index of the immersion liquid. From such a standpoint, an additive capable of elevating the refractive index may be added to water, or heavy water ($D_2O$) may be used in place of water.

In the case of exposing the film formed from the composition of the present invention through an immersion medium, a hydrophobic resin (HR) may be further added to the actinic ray-sensitive or radiation-sensitive resin composition, if desired. In this case, the hydrophobic resin (HR) is unevenly distributed to the film surface layer and when the immersion medium is water, the film formed can be enhanced in the receding contact angle for water on the resist film surface as well as in the followability of the immersion liquid. The hydrophobic resin (HR) may be any resin as long as the receding contact angle on the surface can be enhance by its addition, but a resin containing at least either a fluorine atom or a silicon atom is preferred. The receding contact angle of the film is preferably from 60 to 90°, more preferably 70° or more. The hydrophobic resin (HR) is, as described above, unevenly distributed to the interface but unlike a surfactant, need not have necessarily a hydrophilic group in the molecule and may not contribute to uniform mixing of polar/nonpolar substances.

The receding contact angle is a contact angle measured when a contact line recedes on the liquid droplet-substrate interface, and this is generally known to be useful in simulating the mobility of a liquid droplet in the dynamic state. In a simple manner, the receding contact angle can be defined as a contact angle at the time of the liquid droplet interface receding when a liquid droplet ejected from a needle tip is landed on a substrate and then the liquid droplet is again suctioned into the needle. In general, the receding contact angle can be measured by a contact angle measuring method called an expansion/contraction method.

In the immersion exposure step, the immersion liquid must move on a wafer following the movement of an exposure head that is scanning the wafer at a high speed and forming an exposure pattern. Therefore, the contact angle of the immersion liquid with the resist film in a dynamic state is important, and the resist is required to have a performance of allowing a liquid droplet to follow the high-speed scanning of an exposure head with no remaining.

The fluorine atom or silicon atom in the hydrophobic resin (HR) may be present in the main chain of the resin or may be substituted on the side chain.

The hydrophobic resin (HR) is preferably a resin having, as the fluorine atom-containing partial structure, a fluorine atom-containing alkyl group, a fluorine atom-containing cycloalkyl group or a fluorine atom-containing aryl group.

The fluorine atom-containing alkyl group (preferably having a carbon number of 1 to 10, more preferably from 1 to 4) is a linear or branched alkyl group with at least one hydrogen atom being replaced by a fluorine atom and may further have a substituent other than the fluorine atom.

The fluorine atom-containing cycloalkyl group is a monocyclic or polycyclic cycloalkyl group with at least one hydrogen atom being replaced by a fluorine atom and may further have a substituent other than the fluorine atom.

The fluorine atom-containing aryl group is an aryl group (e.g., phenyl, naphthyl) with at least one hydrogen atom being replaced by a fluorine atom and may further have a substituent other than the fluorine atom.

The fluorine atom-containing alkyl group, fluorine atom-containing cycloalkyl group and fluorine atom-containing aryl group are preferably groups represented by the following formulae (F2) to (F4), but the present invention is not limited thereto.

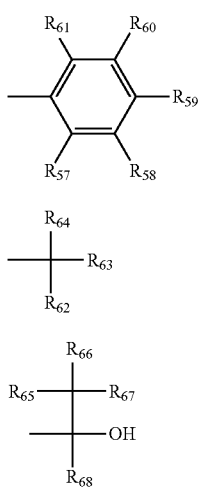

(F2)

(F3)

(F4)

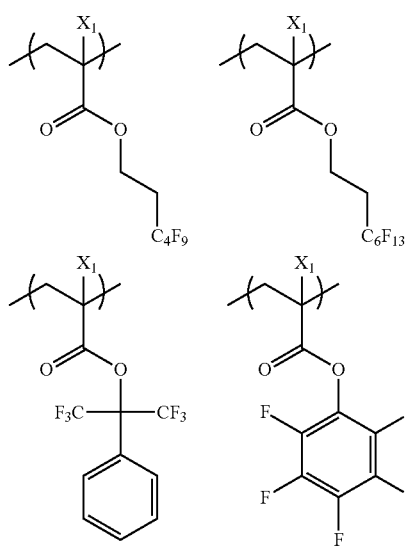

In formulae (F2) to (F4), each of $R_{57}$ to $R_{68}$ independently represents a hydrogen atom, a fluorine atom or an alkyl group (linear or branched), provided that at least one of $R_{57}$ to $R_{61}$, at least one of $R_{62}$ to $R_{64}$ and at least one of $R_{65}$ to $R_{68}$, are independently a fluorine atom or an alkyl group (preferably having a carbon number of 1 to 4) with at least one hydrogen atom being replaced by a fluorine atom.

It is preferred that $R_{57}$ to $R_{61}$ and $R_{65}$ to $R_{67}$ all are a fluorine atom. Each of $R_{62}$, $R_{63}$ and $R_{68}$ is preferably an alkyl group (preferably having a carbon number of 1 to 4) with at least one hydrogen atom being replaced by a fluorine atom, more preferably a perfluoroalkyl group having a carbon number of 1 to 4. $R_{62}$ and $R_{63}$ may combine with each other to form a ring.

Specific examples of the group represented by formula (F2) include a p-fluorophenyl group, a pentafluorophenyl group and a 3,5-di(trifluoromethyl)phenyl group.

Specific examples of the group represented by formula (F3) include a trifluoromethyl group, a pentafluoropropyl group, a pentafluoroethyl group, a heptafluorobutyl group, a hexafluoroisopropyl group, a heptafluoroisopropyl group, a hexafluoro(2-methyl)isopropyl group, a nonafluorobutyl group, an octafluoroisobutyl group, a nonafluorohexyl group, a nonafluoro-tert-butyl group, a perfluoroisopentyl group, a perfluorooctyl group, a perfluoro(trimethyl)hexyl group, a 2,2,3,3-tetrafluorocyclobutyl group and a perfluorocyclohexyl group. Among these, a hexafluoroisopropyl group, a heptafluoroisopropyl group, a hexafluoro(2-methyl)isopropyl group, an octafluoroisobutyl group, a nonafluoro-tert-butyl group and a perfluoroisopentyl group are preferred, and a hexafluoroisopropyl group and a heptafluoroisopropyl group are more preferred.

Specific examples of the group represented by formula (F4) include $-C(CF_3)_2OH$, $-C(C_2F_5)_2OH$, $-C(CF_3)(CH_3)OH$ and $-CH(CF_3)OH$, with $-C(CF_3)_2OH$ being preferred.

Specific examples of the repeating unit containing a fluorine atom are illustrated below, but the present invention is not limited thereto.

In specific examples, $X_1$ represents a hydrogen atom, $-CH_3$, $-F$ or $-CF_3$.

$X_2$ represents $-F$ or $-CF_3$.

Incidentally, specific examples also include fluorine atom-containing repeating units contained in Resins (HR-1) to (HR-58) illustrated later.

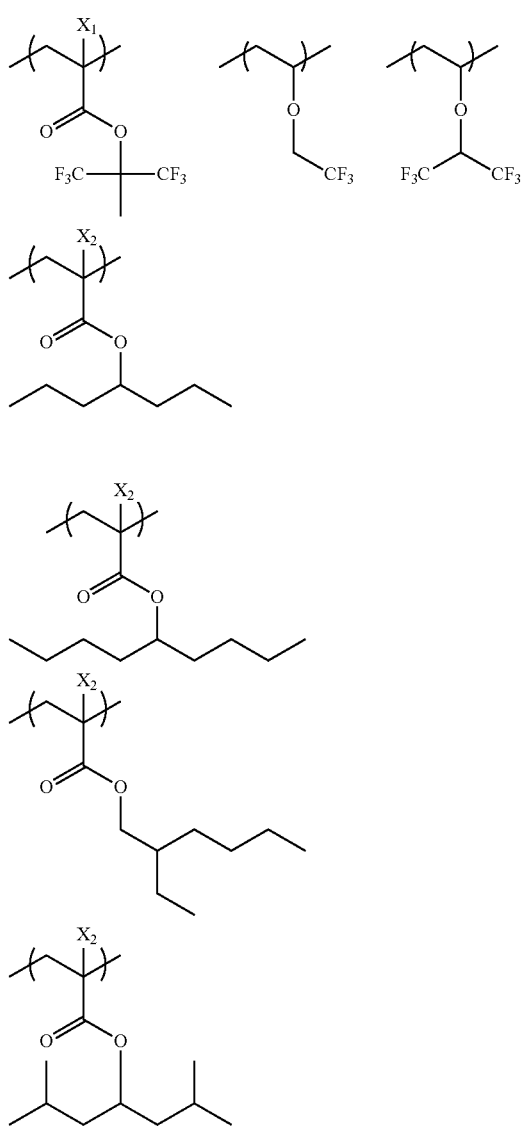

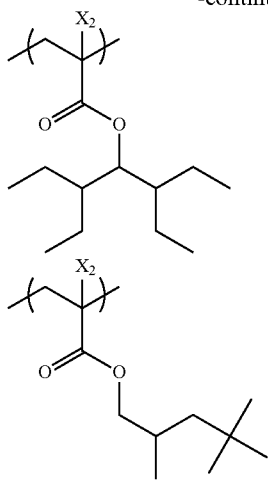

Furthermore, the hydrophobic resin (HR) may contain at least one group selected from the group consisting of the following (x) to (z):

(x) an alkali-soluble group, (y) a group capable of decomposing by the action of an alkali developer to increase the solubility in the alkali developer, and (z) a group capable of decomposing by the action of an acid.

Examples of the alkali-soluble group (x) include a phenolic hydroxyl group, a carboxylic acid group, a fluorinated alcohol group, a sulfonic acid group, a sulfonamide group, a sulfonylimide group, an (alkylsulfonyl)(alkylcarbonyl)methylene group, an (alkylsulfonyl)(alkylcarbonyl)imide group, a bis(alkylcarbonyl)methylene group, a bis(alkylcarbonyl)imide group, a bis(alkylsulfonyl)methylene group, a bis(alkylsulfonyl)imide group, a tris(alkylcarbonyl)methylene group and a tris(alkylsulfonyl)methylene group. Preferred alkali-soluble groups are a fluorinated alcohol group (preferably hexafluoroisopropanol), a sulfonimide group and a bis(alkylcarbonyl)methylene group.

Examples of the repeating unit having (x) an alkali-soluble group include a repeating unit where an alkali-soluble group is directly bonded to the resin main chain, such as repeating unit by an acrylic acid or a methacrylic acid, and a repeating unit where an alkali-soluble group is bonded to the resin main chain through a linking group, and an alkali-soluble group may also be introduced into the polymer chain terminal by using an alkali-soluble group-containing polymerization initiator or chain transfer agent at the polymerization. All of these cases are preferred.

The content of the repeating unit having (x) an alkali-soluble group is preferably from 1 to 50 mol %, more preferably from 3 to 35 mol %, still more preferably from 5 to 20 mol %, based on all repeating units in the hydrophobic resin (HR).

Specific examples of the repeating unit having (x) an alkali-soluble group are illustrated below, but the present invention is not limited thereto.

In the formulae, Rx represents hydrogen atom, $CH_3$, $CF_3$ or $CH_2OH$. Incidentally, specific examples also include alkali-soluble group (x)-containing repeating units contained in Resins (HR-1) to (HR-58) illustrated later.

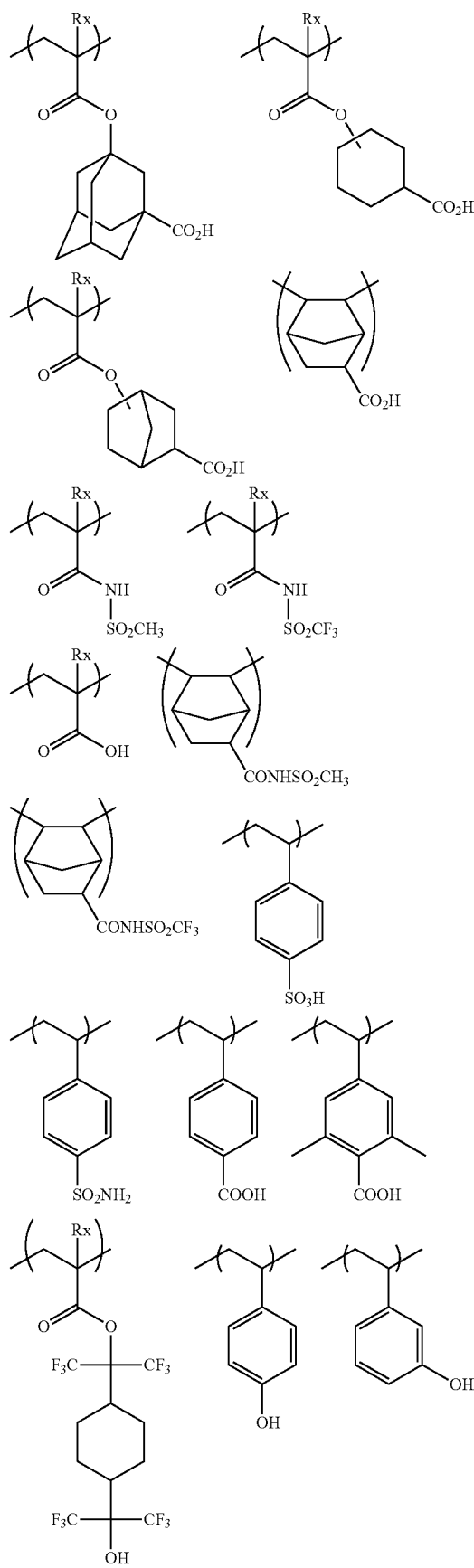

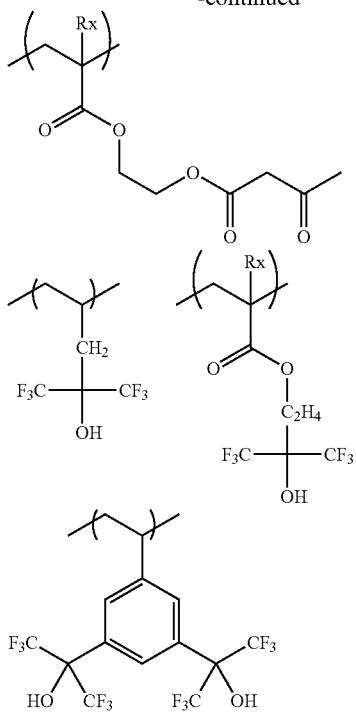

Examples of the group (y) capable of decomposing by the action of an alkali developer to increase the solubility in an alkali developer include a group having a lactone structure, an acid anhydride group and an acid imide group, and a group having a lactone structure is preferred.

As for the repeating unit having (y) a group capable of decomposing by the action of an alkali developer to increase the solubility in an alkali developer, both a repeating unit where (y) a group capable of decomposing by the action of an alkali developer to increase the solubility in an alkali developer is bonded to the main chain of the resin, such as repeating unit by an acrylic acid ester or a methacrylic acid ester, and a repeating unit where (y) a group capable of increasing the solubility in an alkali developer is introduced into the terminal of the resin by using a polymerization initiator or chain transfer agent containing the group at the polymerization, are preferred.

The content of the repeating unit having (y) a group capable of increasing the solubility in an alkali developer is preferably from 1 to 40 mol %, more preferably from 3 to 30 mol %, still more preferably from 5 to 15 mol %, based on all repeating units in the hydrophobic resin (HR).

Specific examples of the repeating unit having (y) a group capable of increasing the solubility in an alkali developer are the same as those of the repeating unit having a lactone structure described for the resin as the component (A).

Examples of the repeating unit having (z) a group capable of decomposing by the action of an acid in the hydrophobic resin (HR) are the same as those of the repeating unit having an acid-decomposable group described for the resin as the component (A). The content of the repeating unit having (z) a group capable of decomposing by the action of an acid in the hydrophobic resin (HR) is preferably from 1 to 80 mol %, more preferably from 10 to 80 mol %, still more preferably from 20 to 60 mol %, based on all repeating units in the hydrophobic resin (HR).

The hydrophobic resin (HR) may further contain a repeating unit represented by the following formula (III):

Formula (III)

In formula (III), $R_{c31}$ represents a hydrogen atom, an alkyl group, an alkyl group which may be substituted with a fluorine atom, a cyano group or a —$CH_2$—O-$Rac_2$, group, wherein $Rac_2$ represents a hydrogen atom, an alkyl group or an acyl group. $R_{c31}$, is preferably a hydrogen atom, a methyl group, a hydroxymethyl group or a trifluoromethyl group, more preferably a hydrogen atom or a methyl group.

$R_{c32}$ represents a group having an alkyl group, a cycloalkyl group, an alkenyl group, a cycloalkenyl group or an aryl group. These groups may be substituted with a silicon atom-containing group or a fluorine atom.

$L_{c3}$ represents a single bond or a divalent linking group.

The alkyl group of $R_{c32}$, in formula (III) is preferably a linear or branched alkyl group having a carbon number of 3 to 20.

The cycloalkyl group is preferably a cycloalkyl group having a carbon number of 3 to 20.

The alkenyl group is preferably an alkenyl group having a carbon number of 3 to 20.

The cycloalkenyl group is preferably a cycloalkenyl group having a carbon number of 3 to 20.

The aryl group is preferably an aryl group having a carbon number of 6 to 20, more preferably a phenyl group.

$R_{c32}$, is preferably an unsubstituted alkyl group or an alkyl group substituted with a fluorine atom.

The divalent linking group of $L_{c3}$, is preferably an ester bond, an alkylene group (preferably having a carbon number of 1 to 5), an ether bond, a phenylene group, or a divalent linking group formed by combining two or more of these groups.

It is also preferred that the hydrophobic resin (HR) further contains a repeating unit represented by the following formula (CII-AB):

Formula (CII-AB)

In formula (CII-AB), each of $R_{c11}'$ and $R_{c12}'$ independently represents a hydrogen atom, a cyano group, a halogen atom or an alkyl group.

$Z_c'$ represents an atomic group necessary for forming an alicyclic structure including bonded two carbon atoms (C—C).

Specific examples of the repeating units represented by formulae (III) and (CII-AB) are illustrated below, but the present invention is not limited thereto. In the formulae, Ra represents H, $CH_3$, $CH_2OH$, $CF_3$ or CN.

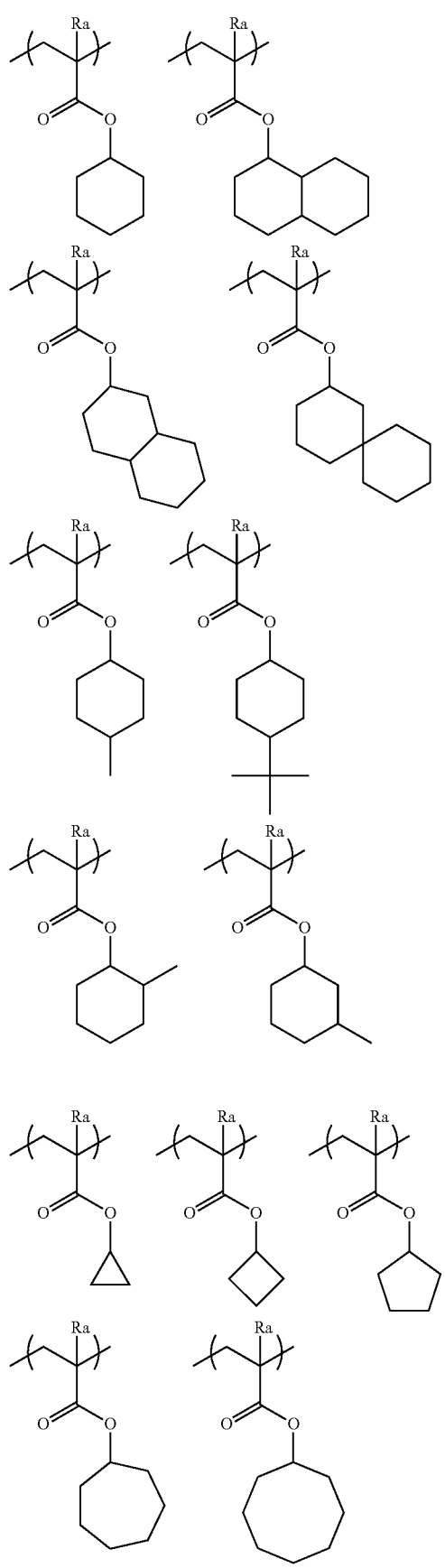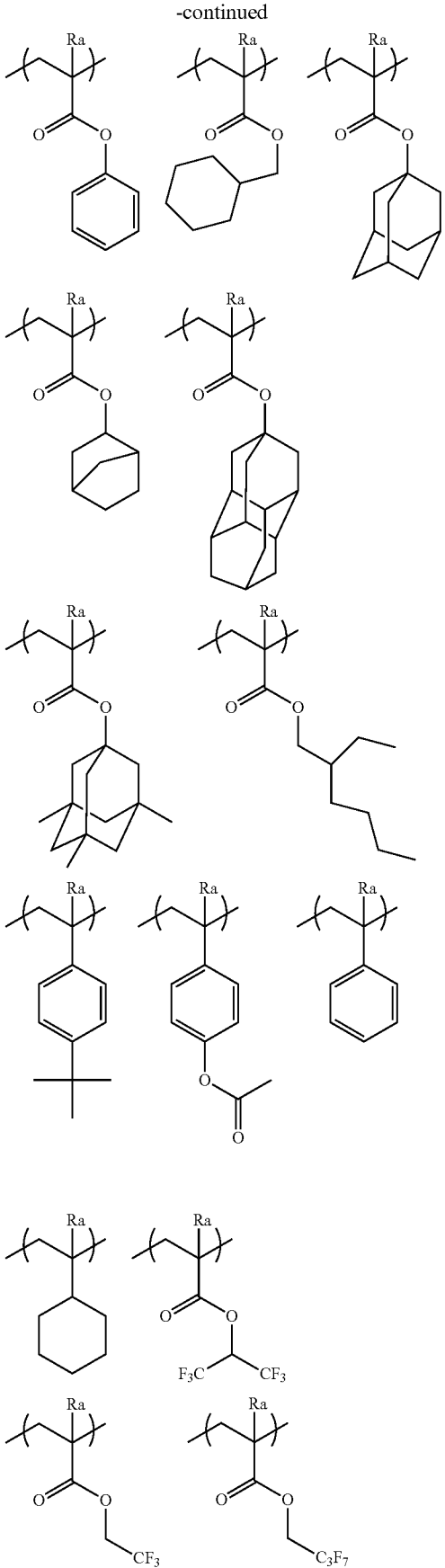

-continued

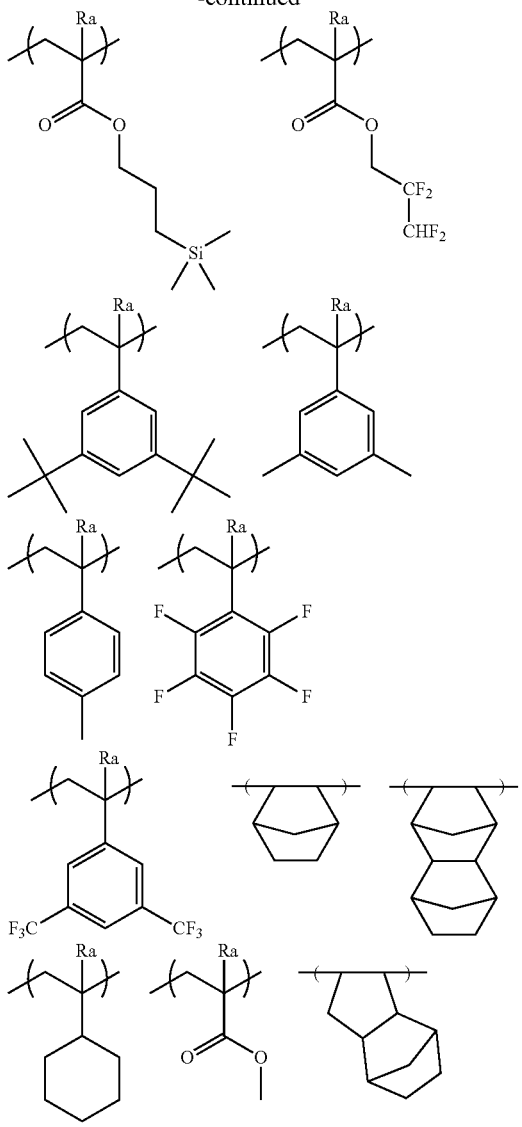

In the case where the hydrophobic resin (HR) contains a fluorine atom, the fluorine atom content is preferably from 5 to 80 mass %, more preferably from 10 to 80 mass %, based on the weight average molecular weight of the hydrophobic resin (HR). Also, the fluorine atom-containing repeating unit preferably accounts for from 10 to 100 mol %, more preferably from 30 to 100 mol %, based on all repeating units in the hydrophobic resin (HR).

The weight average molecular weight of the hydrophobic resin (HR) is, in terms of standard polystyrene, preferably from 1,000 to 100,000, more preferably from 1,000 to 50,000, still more preferably from 2,000 to 15,000.

As for the hydrophobic resin (HR), one kind of a resin may be used alone, or a plurality of kinds of resins may be used in combination.

The content of the hydrophobic resin (HR) in the composition is preferably from 0.01 to 10 mass %, more preferably from 0.05 to 8 mass %, still more preferably from 0.1 to 5 mass %, based on the entire solid content of the composition of the present invention.

In the hydrophobic resin (HR), similarly to the resin as the component (A), it is of course preferred that the content of impurities such as metal is small, and in addition, the amount of residual monomers or oligomer components is also preferably as close to 0, as possible and specifically, is preferably from 0 to 10 mass %, more preferably from 0 to 5 mass %, still more preferably from 0 to 1 mass %. When these conditions are satisfied, a resist composition free from an in-liquid extraneous substance or a change with aging of sensitivity or the like can be obtained. Furthermore, in view of resolution, resist profile, side wall of resist pattern, roughness and the like, the molecular weight distribution (Mw/Mn, sometimes referred to as "dispersity") is preferably from 1 to 5, more preferably from 1 to 3, still more preferably from 1 to 2.

As for the hydrophobic resin (HR), various commercially available products may be used or the resin may be synthesized and purified by a conventional method (for example, radical polymerization). For details of the synthesis and purification method, please refer to, for example, "Kobunshi Gosei (Polymer Synthesis)" of Dai 5-Han Jikken Kagaku Koza 26, Kobunshi Kagaku (Experimental Chemistry Course 26, Polymer Chemistry, 5th Edition), Chapter 2, Maruzen.

Specific examples of the hydrophobic resin (HR) include silicon atom-containing resins described in paragraphs 0172 to 0253 of U.S. Patent Application Publication No. 2008/0305432A1 and fluorine atom-containing resins illustrated below.

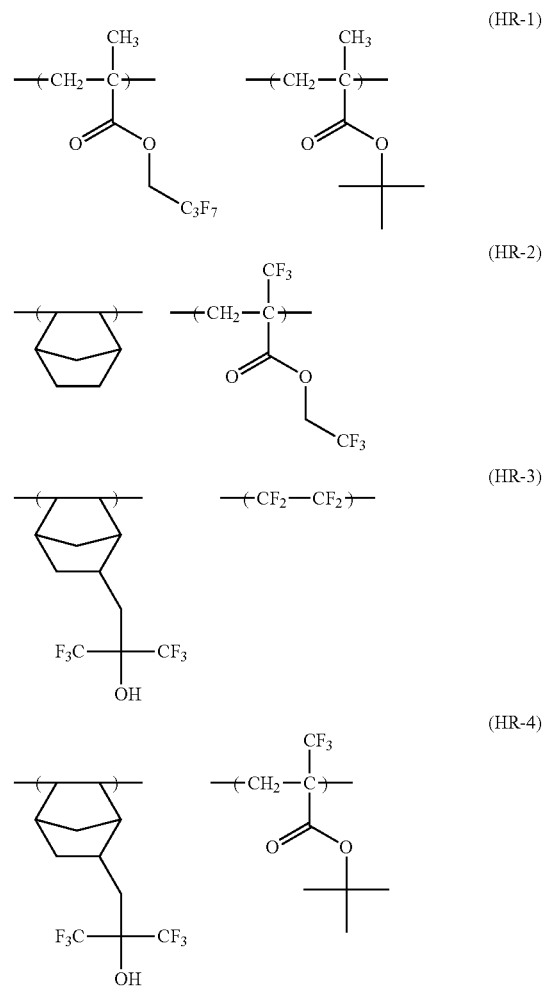

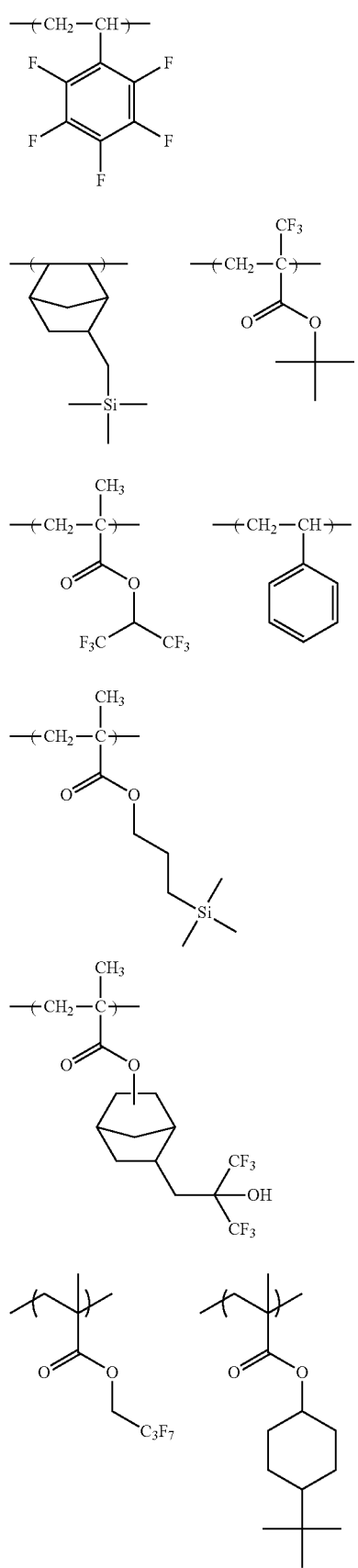
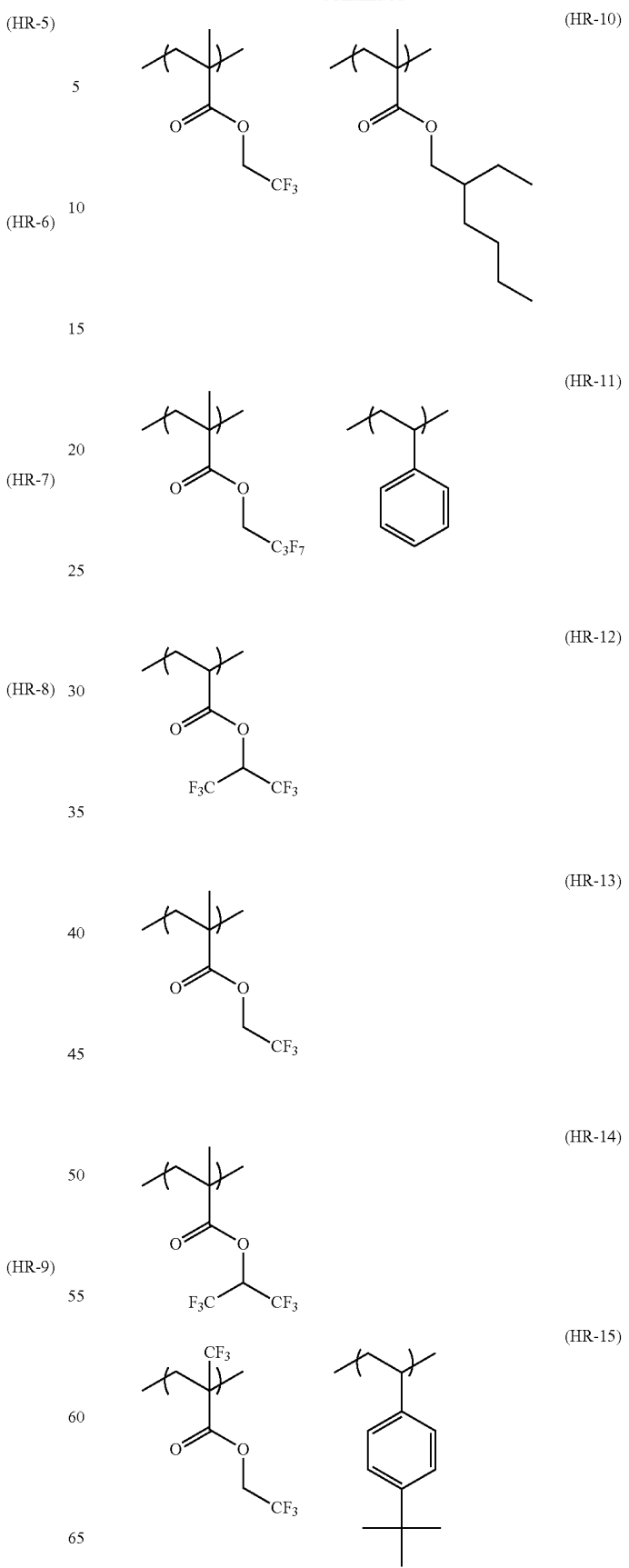

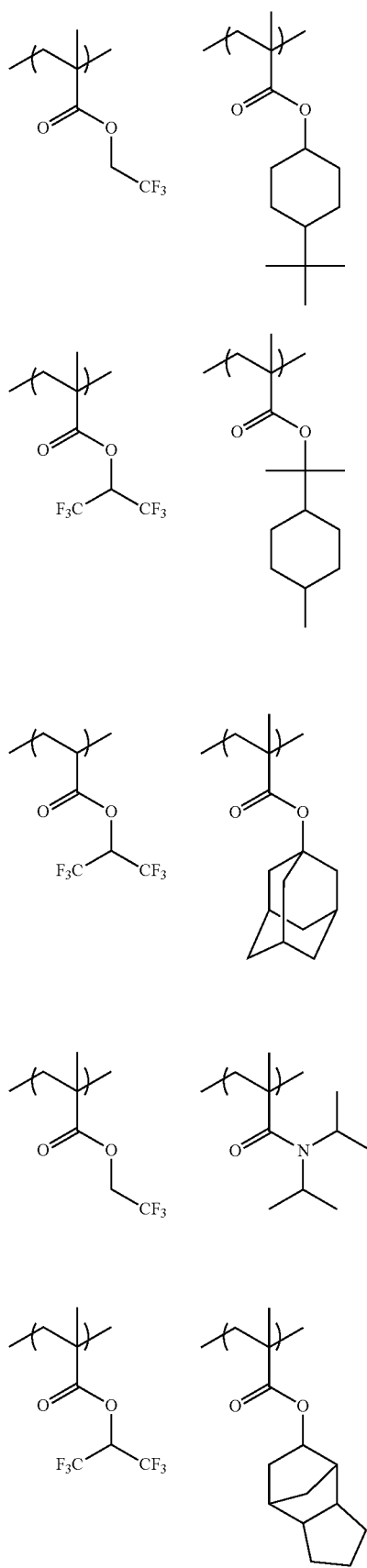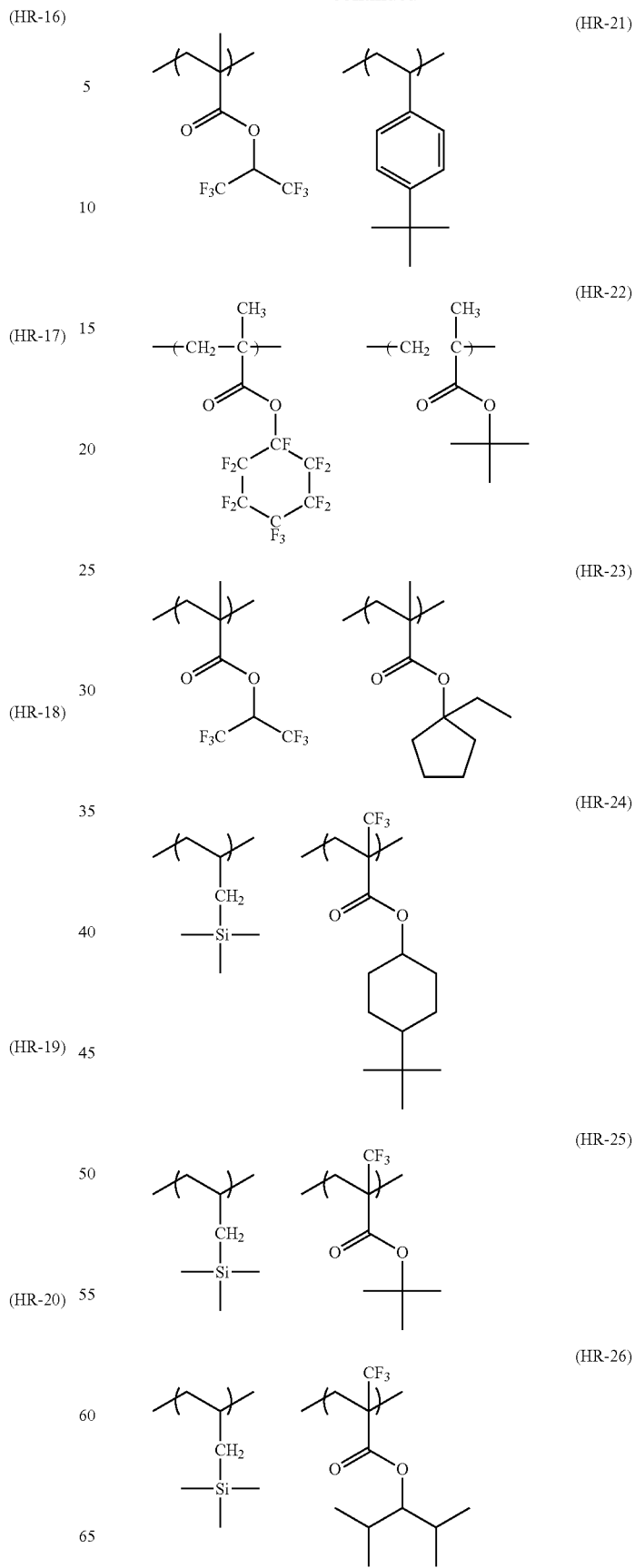

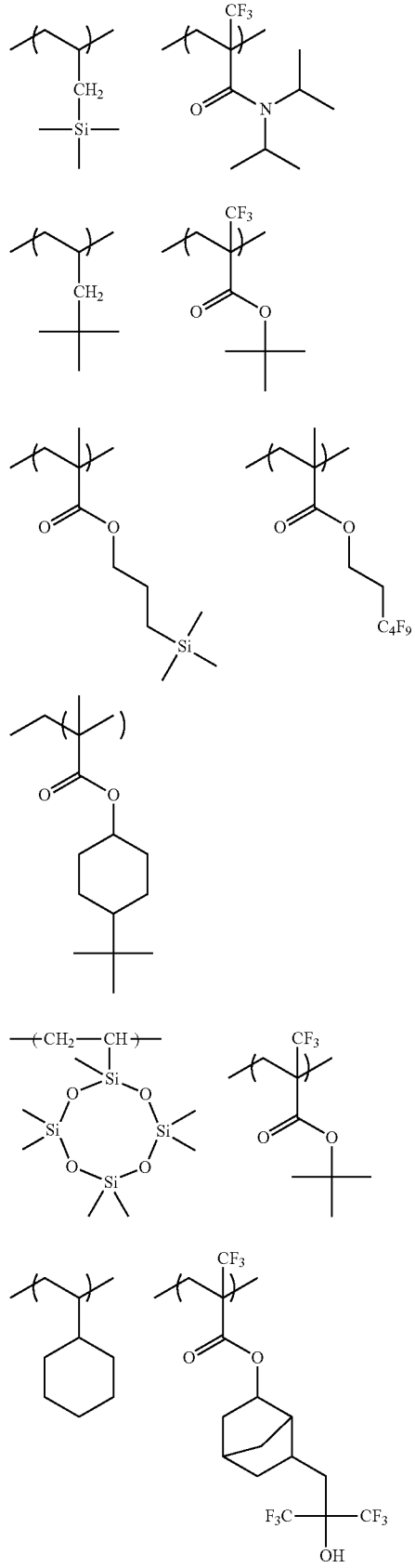
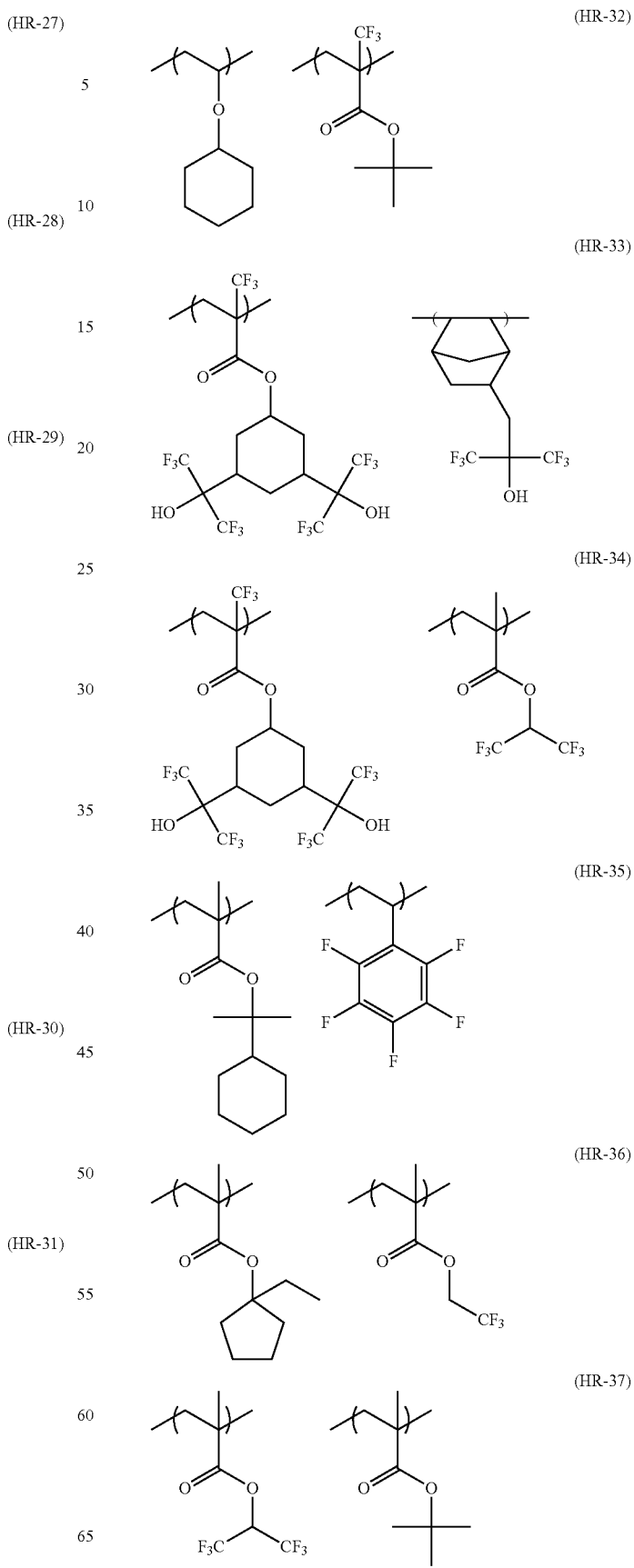

(HR-38)
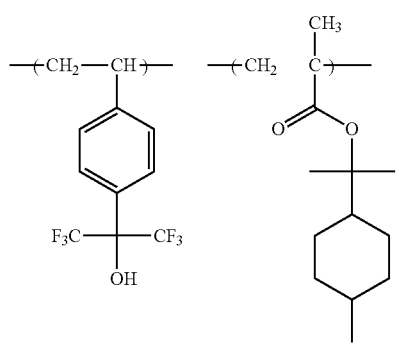
(HR-39)
(HR-40)
(HR-41)
(HR-42)
(HR-43)
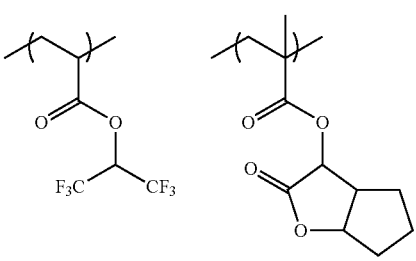
(HR-44)
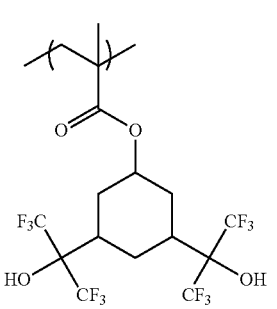
(HR-45)
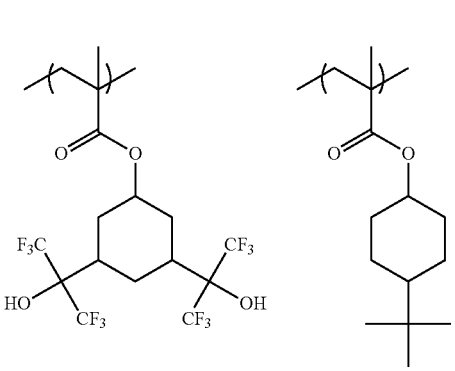
(HR-46)
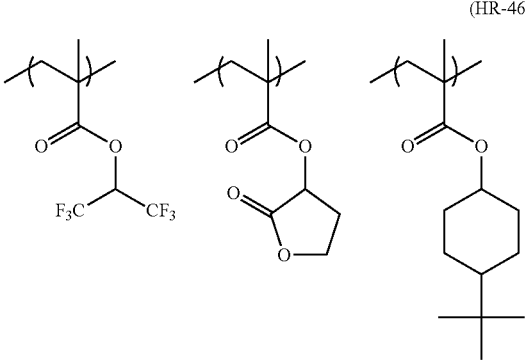
(HR-47)
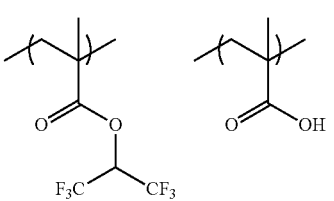

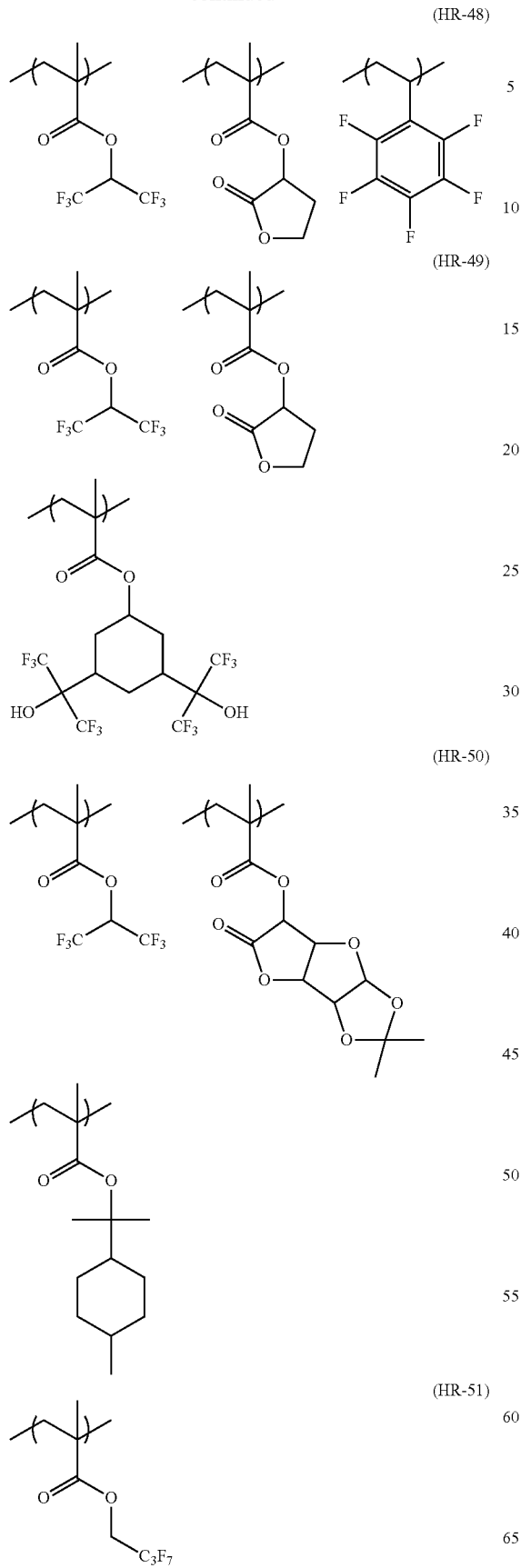
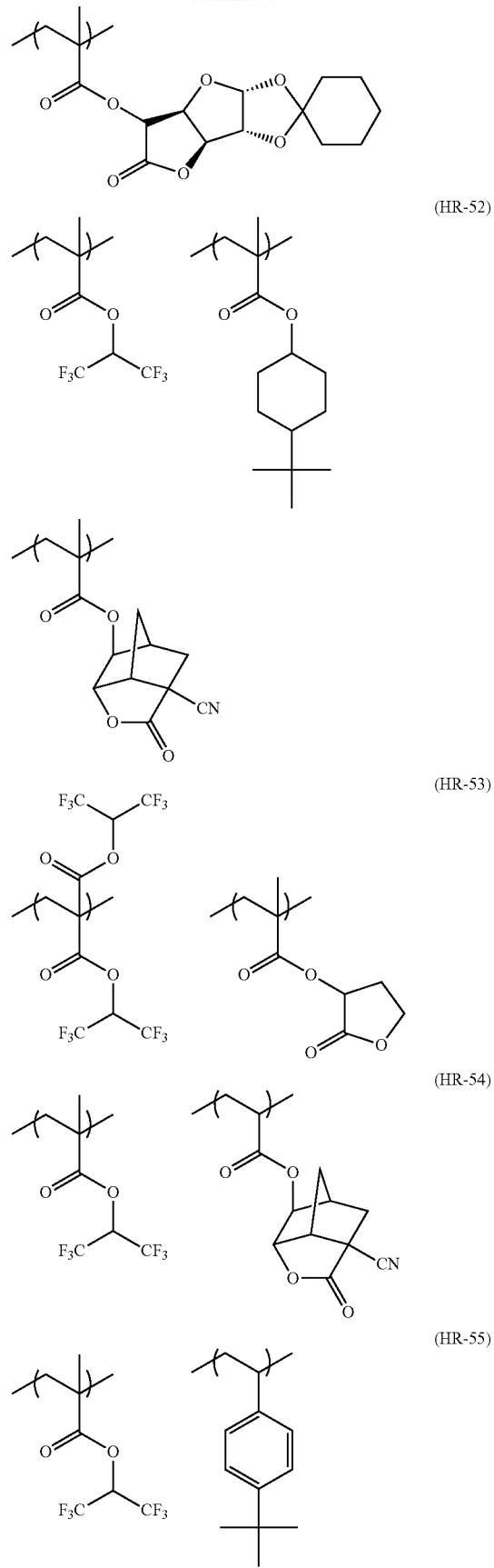

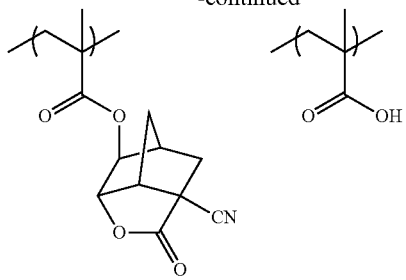

(HR-56)

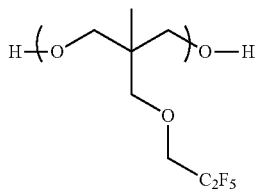

(HR-57)

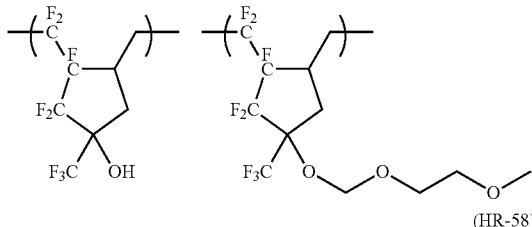

(HR-58)

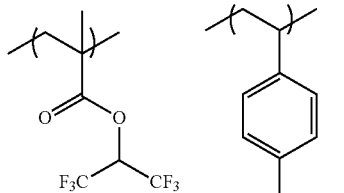

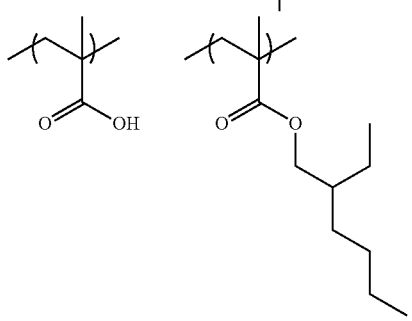

In order to prevent the film from directly contacting with the immersion liquid, a film sparingly soluble in an immersion liquid (hereinafter, the film is sometimes referred to as a "topcoat") may be provided between the film formed from the composition of the present invention and the immersion liquid.

The performance required of the topcoat, the use method thereof and the like are described in Ekishin Lithography no Process to Zairyo (Process and Materials of Immersion Lithography), Chapter 7, CMC Shuppan.

In view of transparency to light at 193 nm, the topcoat is preferably a polymer not abundantly containing an aromatic group, and specific examples thereof include a hydrocarbon polymer, an acrylic acid ester polymer, a polymethacrylic acid, a polyacrylic acid, a polyvinyl ether, a silicon-containing polymer and a fluorine-containing polymer. The above-described hydrophobic resin (HR) is suitable also as the topcoat. Furthermore, a commercially available topcoat material can also be appropriately used. If impurities are dissolved out into the immersion liquid from the topcoat, the optical lens is contaminated. In this viewpoint, the amount of residual monomer components of the polymer contained in the topcoat is preferably smaller.

On peeling off the topcoat, a developer may be used or a releasing agent may be separately used. The releasing agent is preferably a solvent less permeating the film From the standpoint that the peeling step can be performed simultaneously with the development step of the film, the topcoat is preferably peelable with an alkali developer and in view of peeling the topcoat with an alkali developer, the topcoat is preferably acidic, but in view of non-intermixing with the film, the topcoat may be neutral or alkaline.

With no difference in the refractive index between the topcoat and the immersion liquid, the resolution is enhanced. In the case of using water as the immersion liquid at the exposure to ArF excimer laser (wavelength: 193 nm), the refractive index of the topcoat for ArF immersion exposure is preferably close to the refractive index of the immersion liquid. From the standpoint of making the refractive index close to that of the immersion liquid, the topcoat preferably contains a fluorine atom. Also, in view of transparency and refractive index, the topcoat is preferably a thin film.

The topcoat is preferably unmixable with the film and further unmixable with the immersion liquid. From this standpoint, when the immersion liquid is water, the solvent used for the topcoat is preferably a medium that is sparingly soluble in the solvent used for the composition of the present invention and at the same time, insoluble in water. In the case where the immersion liquid is an organic solvent, the topcoat may be either water-soluble or water-insoluble.

For details of the process when preparing an imprint mold by using the composition of the present invention, please refer to, for example, Japanese Patent 4,109,085, JP-A-2008-162101, and Yoshihiko Hirai (compiler), Nanoimprint no Kiso to Gijutsu Kaihatsu•Oyo Tenkai-Nanoimprint no Kiban Gijutsu to Saishin no Gijutsu Tenkai (Basic and Technology Expansion•Application Development of Nanoimprint-Fundamental Technology of Nanoimprint and Latest Technology Expansion), Frontier Shuppan.

EXAMPLES

The present invention is described in greater detail below by referring to Examples, but the contents of the present invention are not limited thereto.

<Additive>

Compounds (D-1) to (D-7) described above were used as the additive (D) for use in the present invention. Also, for comparison, Comparative Compounds (X-1) to (X-3) were used.

(X-1)

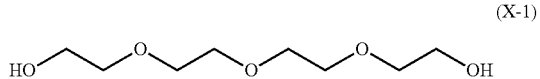

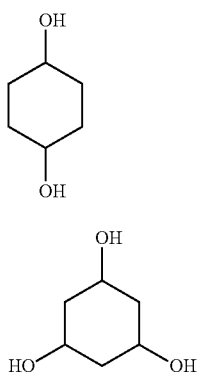
(X-2)
(X-3)
<Acid-Decomposable Resin>
<Synthesis of Acid-Decomposable Resin>
Acid-Decomposable Resins (A-1) to (A-10) shown below were synthesized as follows and used.
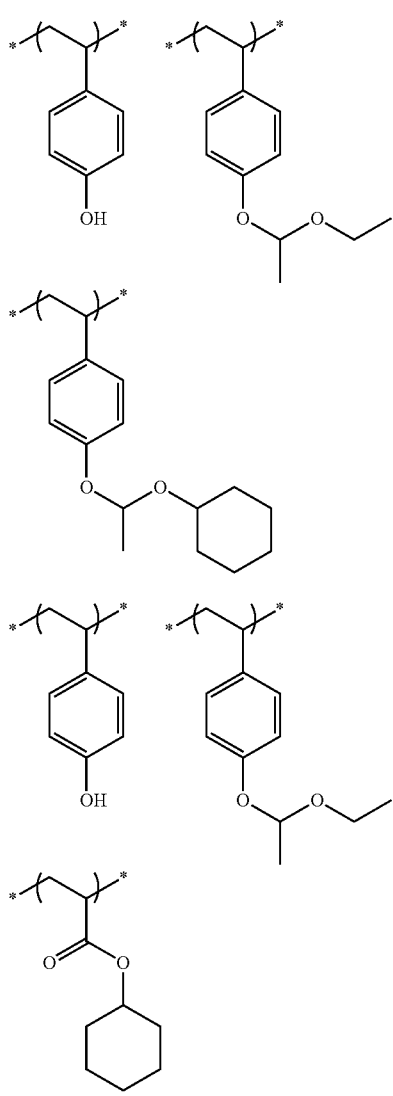
(A-1)
(A-2)
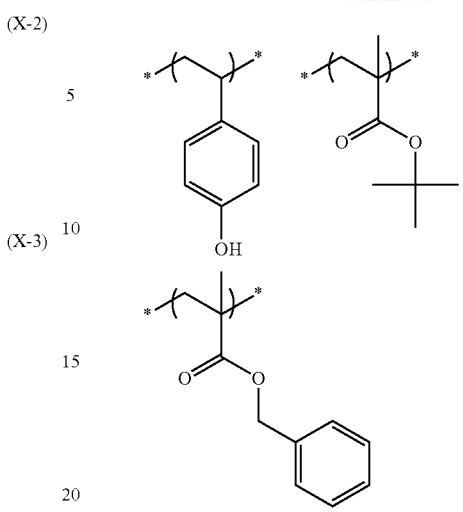
(A-3)
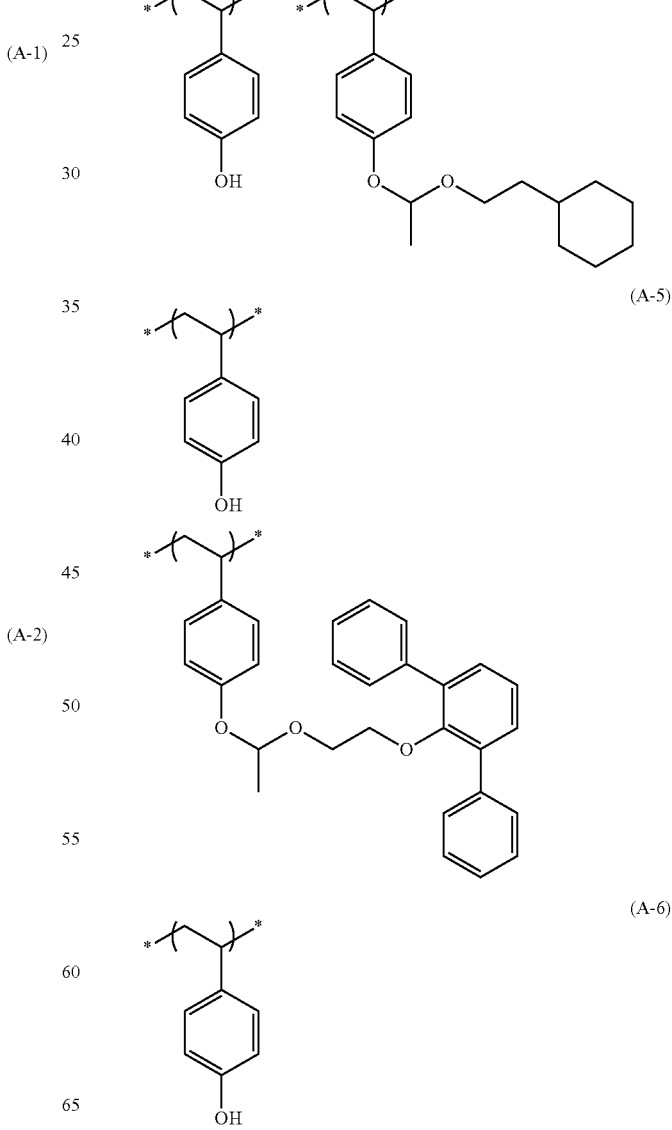
(A-4)
(A-5)
(A-6)

-continued
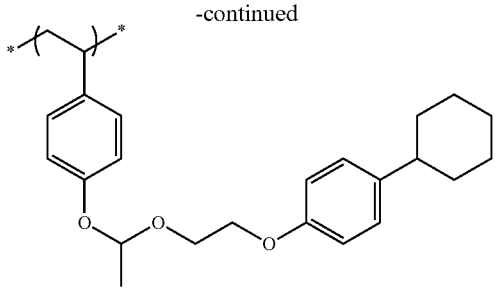
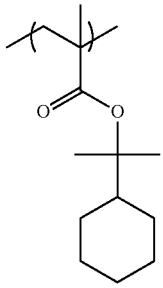
(A-7)
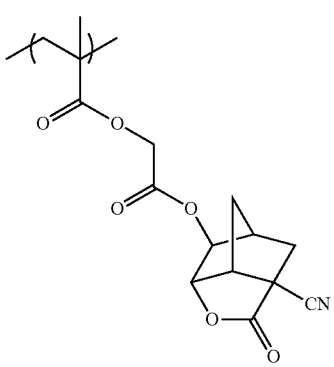
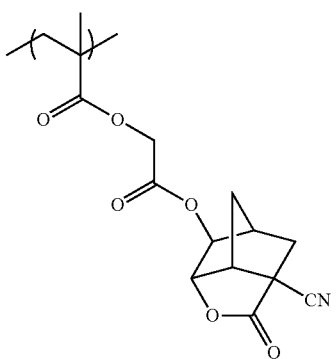
(A-9)
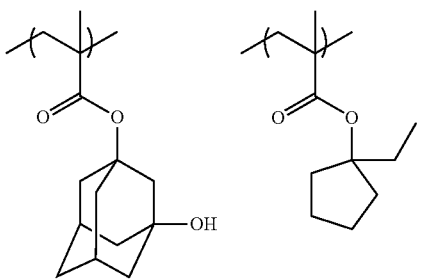
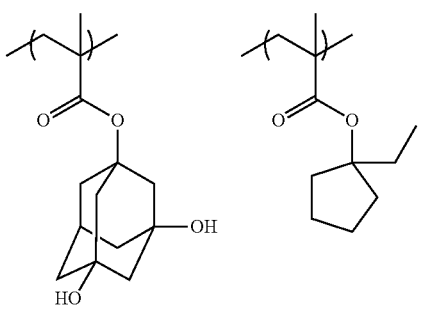
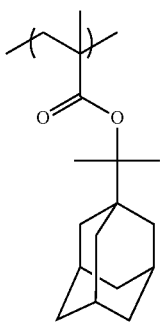
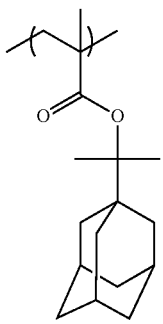
(A-8)
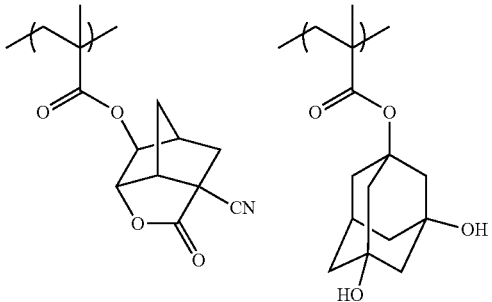
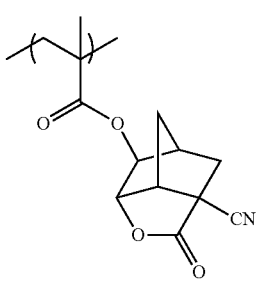
(A-10)

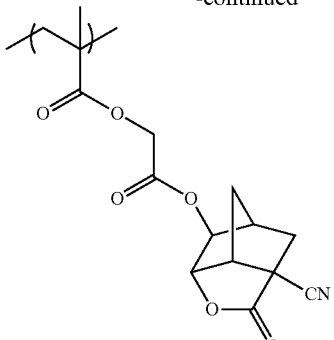

TABLE 1

| Resin | Compositional Ratio | Weight Average Molecular Weight (Mw) | Dispersity (Mw/Mn) |
|---|---|---|---|
| (A-1) | 72/24/4 | 18,900 | 1.15 |
| (A-2) | 70/20/10 | 17,500 | 1.50 |
| (A-3) | 60/30/10 | 14,000 | 1.50 |
| (A-4) | 70/30 | 11,000 | 1.16 |
| (A-5) | 80/20 | 17,000 | 1.20 |
| (A-6) | 75/25 | 17,500 | 1.17 |
| (A-7) | 45/10/32.5/12.5 | 9,200 | 1.55 |
| (A-8) | 40/10/40/10 | 9,500 | 1.45 |
| (A-9) | 40/10/40/10 | 9,300 | 1.50 |
| (A-10) | 20/20/10/35/15 | 9,200 | 1.47 |

Synthesis Example 2

Resins (A-4), (A-5) and (A-6)

Resins (A-4), (A-5) and (A-6) were synthesized in the same manner as Resin (A-1). These resins were subjected to the same evaluations as in Synthesis Example 1. The results obtained are shown in Table 1.

Synthesis Example 3

Synthesis of Resin (A-2)

176.3, Gram (1.0, mol) of p-tert-butoxystyrene and 16.2 g (0.105, mol) of cyclohexyl acrylate were dissolved in 250 mL of isopropanol and in a nitrogen stream, 2,2'-azobisisobutyronitrile was added to the solution. The resulting mixture was stirred at 75° C. over 6 hours and after cooling, the reaction solution was poured in 5,000 mL of an aqueous methanol solution to precipitate the reaction product. The precipitated solid was collected by filtration, washed with methanol and dried under reduced pressure. In this way, 172.5 g of poly(p-tert-butoxystyrene/cyclohexyl acrylate) was obtained as a white powder crystal.

With respect to the copolymer obtained, $^1$H-NMR and $^{13}$C-NMR measurements were performed and revealed that the constituent ratio between p-tert-butoxystyrene unit and cyclohexyl acrylate unit in this copolymer is 90:10. Also, the weight average molecular weight (Mw) in terms of polystyrene and the dispersity (Mw/Mn) of the copolymer were determined by GPC (solvent: THF), as a result, Mw was 20,600, and Mw/Mn was 1.55.

130.5, Gram of poly(p-tert-butoxystyrene/cyclohexyl acrylate) was suspended in isopropanol, and 30 mL of concentrated hydrochloric acid was added to the suspension. This mixture was stirred at 70 to 80° C. over 4 hours and after cooling, the reaction solution was poured in 1,500 mL of water to precipitate the reaction product. The precipitated solid was collected by filtration, washed with water and dried under reduced pressure. In this way, 85.5 g of poly(p-hydroxystyrene/cyclohexyl acrylate) was obtained as a white powder crystal.

With respect to the copolymer obtained, $^1$H-NMR and $^{13}$C-NMR measurements were performed and revealed that the constituent ratio between p-hydroxystyrene unit and cyclohexyl acrylate unit in this copolymer is 90:10. Also, the weight average molecular weight (Mw) in terms of polystyrene and the dispersity (Mw/Mn) of the copolymer were determined by GPC (solvent: THF), as a result, Mw was 14,800, and Mw/Mn was 1.50.

24.7, Gram of poly(p-hydroxystyrene/cyclohexyl acrylate) and 4.5 g of ethyl vinyl ether were dissolved in ethyl acetate, Synthesis Example 1

Synthesis of Resin (A-1)

50 Gram of poly(p-hydroxystyrene) (produced by Nippon Soda Co., Ltd., weight average molecular weight: 15,000) was dissolved in 240 g of propylene glycol monomethyl ether acetate (PGMEA, another name: 1-methoxy-2-acetoxypropane), and this solution was depressurized to 20 mmHg at 60° C. to remove by distillation about 40 g of PGMEA together with water remaining in the system. After cooling to 20° C., 6.1 g of ethyl vinyl ether, 4.0 g of cyclohexyl vinyl ether and 0.02 g of p-toluenesulfonic acid were added thereto, and the resulting mixture was stirred at room temperature over 1 hour. Thereafter, 0.02 g of triethylamine was added to effect neutralization and then, extraction was performed three times by using 240 g of ethyl acetate and 140 g of water. In this way, Resin (A-1) was obtained.

With respect to Resin (A-1), the molar ratio of respective repeating units was determined by $^1$H-NMR and $^{13}$C-NMR. Also, the weight average molecular weight (Mw) in terms of polystyrene and the dispersity (Mw/Mn) were determined by GPC (solvent: THF). The results obtained are shown in Table 1 below. In Table 1, the molar ratio of respective repeating units (corresponding to repeating units starting from the left) is shown in the column of "Compositional Ratio".

and a catalytic amount of pyridinium p-toluenesulfonate was added to the solution. This mixture was stirred at room temperature over 5 hours, and the reaction solution was poured in 3,000 mL of water to precipitate the reaction product. The precipitated solid was collected by filtration, washed with water and dried under reduced pressure. In this way, 26.1 g of Resin (A-2) was obtained as a white powder crystal.

Resin (A-2) was subjected to the same evaluations as in Synthesis Example 1. The results obtained are shown in Table 1.

Synthesis Example 4

Synthesis of Resin (A-3)

600, Gram of ethylene glycol monoethyl ether acetate was charged into a 2, L-volume flask and nitrogen-purged at a flow rate of 100, mL/min over 1, hour. Also, 105.4 g (0.65, mol) of 4-acetoxystyrene, 35.6 g (0.25, mol) of tert-butyl methacrylate, 17.6 g (0.10, mol) of benzyl methacrylate, and 2.30 g (0.01, mol) of a polymerization initiator (dimethyl-2,2'-azobis(2-methylpropionate); V-601, produced by Wako Pure Chemical Industries, Ltd.) were dissolved in 200 g of ethylene glycol monoethyl ether acetate. The resulting monomer mixture solution was subjected to nitrogen purging in the same manner as above.

A 2, L-volume flask enclosing 600 g of ethylene glycol monoethyl ether acetate was heated until the inner temperature reached 80° C., and 2.30 g (0.01, mol) of a polymerization initiator, V-601, was added thereto. The resulting mixture was stirred over 5, minutes and to this solution, the monomer mixture solution obtained above was added dropwise over 6 hours. After the dropwise addition, the resulting solution was further heated and stirred over 2 hours, and the reaction solution was then cooled to room temperature. After the cooling, the reaction solution was added dropwise to 3 L of hexane to precipitate a polymer, and the solid separated by filtration was dissolved in 500 g of acetone. This solution was again added dropwise to 3 L of hexane, and the obtained solid was separated by filtration and dried under reduced pressure. In this way, 151 g of poly(4-acetoxystyrene/tert-butyl methacrylate/benzyl acrylate) was obtained.

40.00 Gram of poly(4-acetoxystyrene/tert-butyl methacrylate/benzyl methacrylate) was dissolved in 200 mL of THF, and to this solution, 5 mL of an aqueous 2.38 mass % tetramethylammonium hydroxide solution was added. The resulting mixture was stirred at room temperature over 1 hour, and distilled water was added thereto to precipitate a polymer. The precipitate was washed with distilled water and dried under reduced pressure. The obtained polymer was dissolved in 100 mL of ethyl acetate, and hexane was added thereto to again precipitate a polymer. The polymer was dried under reduced pressure to obtain 35.5 g of Resin (A-3).

Resin (A-3) was subjected to the same evaluations as in Synthesis Example 1. The results obtained are shown in Table 1.

Synthesis Example 5

Resin (A-7)

In a nitrogen stream, 78.1 g of cyclohexanone was introduced into a three-neck flask and heated at 80° C., and monomers shown below and a polymerization initiator were added thereto. More specifically, a solution obtained by dissolving 18.3 g of Monomer (1), 3.15 g of Monomer (2), 7.88 g of Monomer (3), 4.37 g of Monomer (4), and 2.418 g of a polymerization initiator (dimethyl-2,2'-azobis(2-methylpropionate); V-601, produced by Wako Pure Chemical Industries, Ltd.) in 145.0 g of cyclohexanone was added dropwise over 6 hours. After the completion of dropwise addition, the reaction was further allowed to proceed at 80° C. over 2 hours, and the reaction solution was left to cool and then added dropwise to a heptane/ethyl acetate mixed solution (1290g/ 551 g) over 20 minutes to precipitate a solid. The solid precipitated was separated by filtration, washed and dried to obtain 35 g of Resin (A-7).

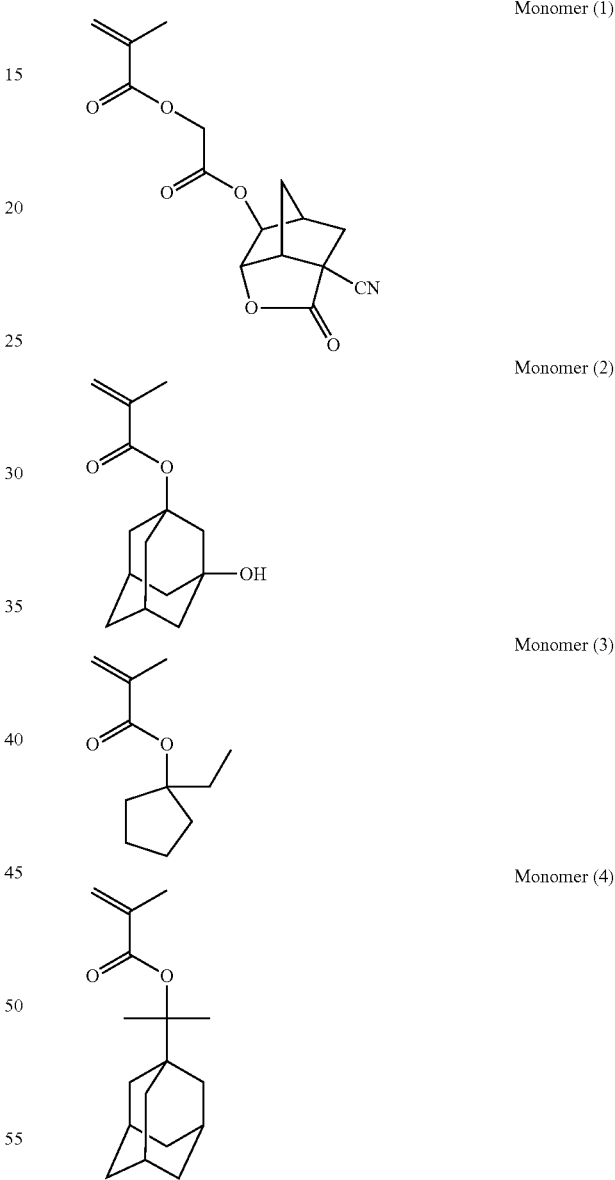

Resin (A-7) was subjected to the same evaluations as in Synthesis Example 1. The results obtained are shown in Table 1.

Synthesis Example 6

Resins (A-8), (A-9) and (A-10)

Resins (A-8), (A-9) and (A-10) were synthesized in the same manner as Resin (A-7), and these resins were subjected to the same evaluations as in Synthesis Example 1. The results obtained are shown in Table 1.

<Synthesis of Resin Having Repeating Unit Represented by Formula (I)>

As the resin having a repeating unit represented by formula (I), Acid-Decomposable Resins (A'-1) and (A'-2) described above were synthesized as follows and used.

Synthesis Example 7

Resin (A'-1)

Resin (A'-1) was synthesized in the same manner as Resin (A-3), and this resin was subjected to the same evaluations as in Synthesis Example 1. The results obtained are shown in Table 2.

Synthesis Example 8

Resin (A'-2)

Resin (A'-2) was synthesized in the same manner as Resin (A-7), and this resin was subjected to the same evaluations as in Synthesis Example 1. The results obtained are shown in Table 2.

TABLE 2

| Resin | Compositional Ratio | Weight Average Molecular Weight (Mw) | Dispersity (Mw/Mn) |
|---|---|---|---|
| (A'-1) | 65/25/10 | 18,900 | 1.45 |
| (A'-2) | 60/30/10 | 10,000 | 1.50 |

<Photoacid Generator>

As the photoacid generator, Compounds (B-1) to (B-7) shown below or a mixture thereof were used.

(B-1)

(B-2)

(B-3)

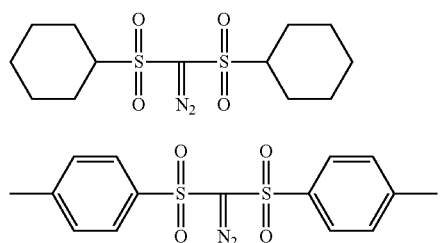

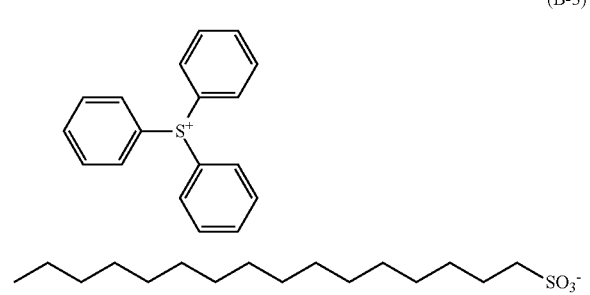

(B-4)

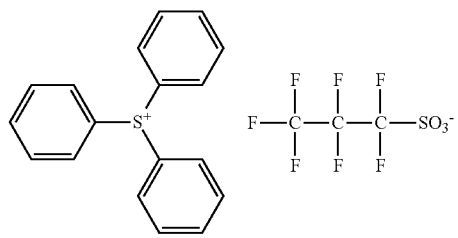

(B-5)

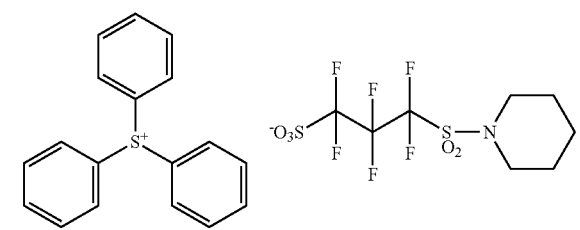

(B-6)

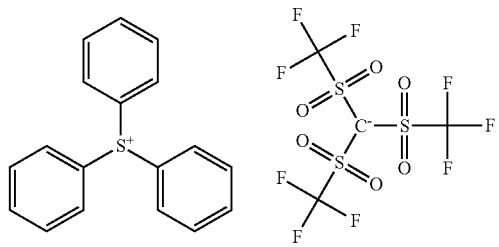

(B-7)

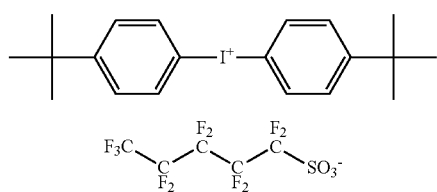

<Basic Compound>

As the basic compound, the following C-1 to C-4 or a mixture thereof were used.

C-1: Dicyclohexylmethylamine

C-2: 2,4,5-Triphenylimidazole

C-3: Tetra-(n-butyl)ammonium hydroxide

C-4: Compound shown below.

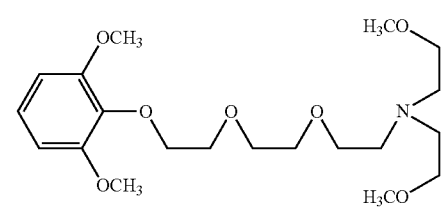 [SMILES: COCCN(CCOC)CCOCCOCCOc1c(OC)cccc1OC]

<Light-Absorbing Additive>

As the light-absorbing additive, E-1, and E-2, shown below were used.

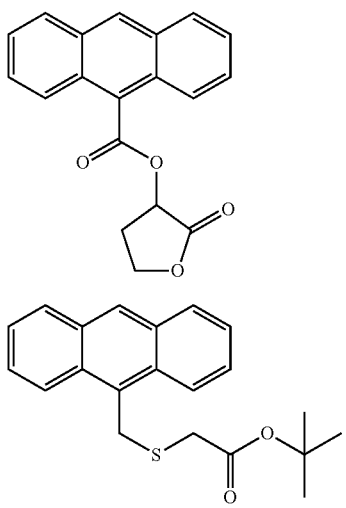

(E-1)

(E-2)

<Surfactant>

As the surfactant, the followings were used.

(W-1): Megaface F176(produced by Dainippon Ink & Chemicals, Inc.)

(W-2): PF6320(produced by OMNOVA)

<Solvent>

As the solvent, propylene glycol monomethyl ether acetate (PGMEA, another name: 1-methoxy-2-acetoxypropane), or a mixture of PGMEA and propylene glycol monomethyl ether (PGME, another name: 1-methoxy-2-propanol) or ethyl lactate was used.

<Dissolution Inhibiting Compound>

As the dissolution inhibiting compound, Compounds (Y-1) to (Y-3) shown below were used.

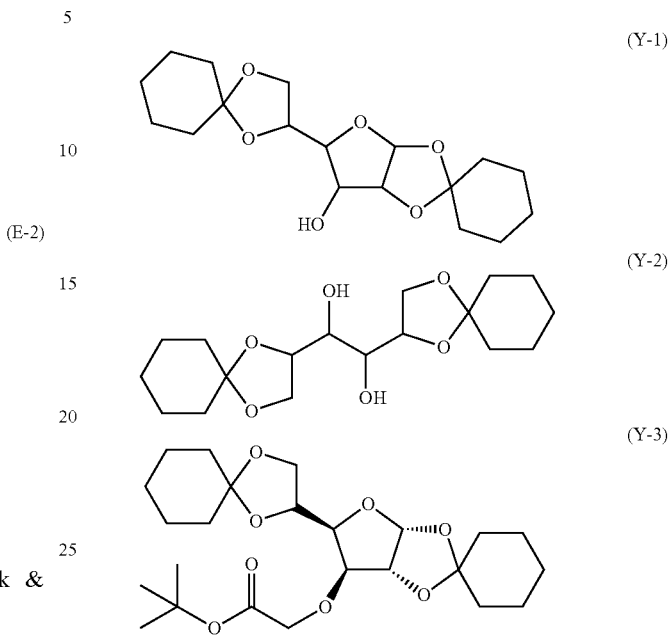

Resist solutions of Examples 1 to 10 and Comparative Examples 1 to 4 shown in Table 3, below were used in Examples 1A to 10A and Comparative Examples 1A to 4A, in Examples 1B to 10B and Comparative Examples 1B to 4B, and in Examples 1C to 10C and Comparative Examples 1C to 4C.

TABLE 3

| Example | Acid-Decomposable Resin (mass %) | Photoacid Generator (mass %) | Basic Compound (mass %) | Additive (mass %) | Light-Absorbing Additive (mass %) | Surfactant (mass %) | Dissolution Inhibiting Compound (mass %) | Solvent (mass %) | | |
|---|---|---|---|---|---|---|---|---|---|---|
| | | | | | | | | PGMEA | PGME | Ethyl Lactate |
| Example 1 | — | A'-1 (90.5) | B-1/B-4 (3.0/1.0) | C-1 (0.4) | D-1 (5.0) | — | W-2 (0.1) | — | 60 | 0 | 40 |
| Example 2 | A-2 (70.5) | A'-1 (20.0) | B-1/B-3 (3.0/1.0) | C-2 (0.4) | D-2 (5.0) | — | W-2 (0.1) | — | 60 | 40 | 0 |
| Example 3 | A-1 (90.5) | — | B-1/B-5 (1.0/3.0) | C-1 (0.4) | D-3 (5.0) | — | W-2 (0.1) | — | 60 | 40 | 0 |
| Example 4 | A-6 (90.5) | — | B-4/B-5 (3.0/1.0) | C-2 (0.4) | D-4 (5.0) | — | W-2 (0.1) | — | 60 | 40 | 0 |
| Example 5 | A-5 (90.5) | — | B-1/B-7 (1.0/3.0) | C-3 (0.4) | D-5 (5.0) | — | W-2 (0.1) | — | 60 | 40 | 0 |
| Example 6 | A-1/A-3 (40.5/50.0) | — | B-1/B-4 (1.0/3.0) | C-1/C-4 (0.3/0.1) | D-6 (5.0) | — | W-2 (0.1) | — | 60 | 40 | 0 |
| Example 7 | A-1 (90.5) | — | B-1/B-2 (3.0/1.0) | C-1 (0.4) | D-7 (5.0) | — | W-2 (0.1) | — | 100 | 0 | 0 |
| Example 8 | A-3 (88.5) | — | B-6 (4.0) | C-1 (0.4) | D-1/D-2 (2.5/2.5) | — | W-2 (0.1) | Y-1 (2.0) | 60 | 0 | 40 |
| Example 9 | A-4 (83.5) | — | B-1/B-4 (1.0/3.0) | C-2 (0.4) | D-2 (5.0) | E-1 (5.0) | W-2 (0.1) | Y-2 (2.0) | 60 | 0 | 40 |
| Example 10 | A-5 (83.5) | — | B-1/B-4 (3.0/1.0) | C-1 (0.4) | D-1 (5.0) | E-2 (5.0) | W-2 (0.1) | Y-3 (2.0) | 60 | 0 | 40 |
| Comparative Example 1 | A-2 (95.5) | — | B-1/B-4 (1.0/3.0) | C-1 (0.4) | — | — | W-1 (0.1) | — | 60 | 0 | 40 |
| Comparative Example 2 | A-2 (90.5) | — | B-1/B-4 (1.0/3.0) | C-1 (0.4) | X-1 (5.0) | — | W-2 (0.1) | — | 60 | 0 | 40 |
| Comparative Example 3 | A-2 (90.5) | — | B-1/B-4 (1.0/3.0) | C-1 (0.4) | X-2 (5.0) | — | W-2 (0.1) | — | 60 | 0 | 40 |
| Comparative Example 4 | A-2 (90.5) | — | B-1/B-4 (1.0/3.0) | C-1 (0.4) | X-3 (5.0) | — | W-2 (0.1) | — | 60 | 0 | 40 |

Example A

KrF (Preparation of Resist Solution)

Examples 1A to 10A and Comparative Examples 1A to 4A

The components shown in Table 3 were dissolved in the solvent shown in the same Table to prepare a solution having a solid content concentration of 7.0 mass %, and this solution was filtered through a polytetrafluoroethylene filter having a pore size of 0.1 μm, whereby positive resist solutions were obtained.

(Evaluation of Resist)

The positive resist solution obtained above was applied on a hexamethyldisilazane-treated $SiO_2$(F.T.=2,500Å) substrate by using a spin coater and baked at 100° C. for 60 seconds to obtain a resist film having an average thickness of 0.20 μm.

This resist film was subjected to pattern exposure using a KrF excimer laser scanner (PAS5500/850C, manufactured by ASML, wavelength: 248 nm, NA=0.70, Sigma=0.70). Here, a binary mask was used as the reticle.

The resist film after exposure was baked at 120° C. for 60 seconds, and the baked film was dipped in an aqueous 2.38 mass % tetramethylammonium hydroxide (TMAH) solution for 60 seconds. After this development, the film was rinsed with pure water for 30 seconds and dried to form a line pattern.

[Sensitivity ($E_{opt}$)]

The obtained pattern was observed through a scanning electron microscope (S-8840, manufactured by Hitachi, Ltd.), and the exposure dose at which a line having a line width of 170 nm was resolved when using a mask of line size=170 nm and line:space=1:1, was taken as Sensitivity ($E_{opt}$). As this value is smaller, the sensitivity is higher and better.

[Exposure Dose Dependency; Exposure Latitude (EL)]

The relationship between exposure dose and line width when changing the exposure dose was measured in the same manner as above. Based on the values obtained, the exposure dose giving a line width of the target value 170 nm±10% (that is, 153 nm and 187 nm) was determined, and the exposure latitude (EL) defined by the following formula was calculated. As this value is larger, the exposure dose dependency is smaller and the resolution is higher.

[EL(%)]=[(exposure dose giving a line width of 153 nm)−(exposure dose giving a line width of 187 nm)]/$E_{opt}$

[Roughness Characteristics; Line Width Roughness (LWR)]

The above-described line having a line width of 170 nm was observed using a scanning electron microscope (S-8840, manufactured by Hitachi Ltd.), and the distance between the actual edge and the reference line where the edge should be present was measured at 50 points at regular intervals within the range of 20 μm in the longitudinal direction of the line. The standard deviation of the distance was determined, and 3σ was computed. This 3σ was taken as "LWR". As LWR is smaller, the roughness characteristics are better.

[Focus Latitude (DOF)]

The relationship between out-of-focus and line width was examined at a fixed exposure dose giving $E_{opt}$, above, and the maximum value and the minimum value of the focus at which a line width of the target value 170 nm±10% (that is, from 153 nm to 187 nm) can be obtained were determined. The difference between the maximum value and the minimum value was calculated, and this difference was taken as "Focus Latitude (DOF)". As this value is larger, the focus latitude (DOF) is better.

[Scum and Pattern Profile]

The cross-section of the above-described line having a line width of 170 nm was observed using a scanning electron microscope (S-4500, manufactured by Hitachi, Ltd.), and the scum and pattern profile were evaluated according to the following 5-stage criteria. Here, trailing at the interface with substrate is attributable to scum. In the following ratings, a rating of 5 is most excellent.

5: The cross-sectional shape was rectangular, the effect of standing wave was not observed, and trailing at the interface with substrate was not observed (for example, FIG. 1).

4: The cross-sectional shape was almost rectangular, the effect of standing wave was not observed, and trailing at the interface with substrate was not observed.

Figure 2:
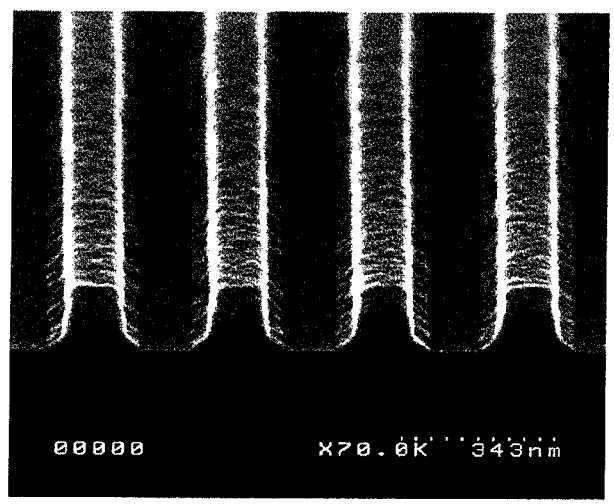
FIG. 2 is a cross-sectional photographic view of a pattern observed through a scanning electron microscope, showing one example of the pattern profile receiving a rating of 3, in Evaluation of Scum and Pattern Profile in Examples.

3: The cross-sectional shape was almost rectangular, the effect of standing wave was partially observed, and trailing at the interface with substrate was observed (for example, FIG. 2).

2: The cross-sectional shape was tapered, the effect of standing wave was partially observed, and trailing at the interface with substrate was observed.

Figure 3:
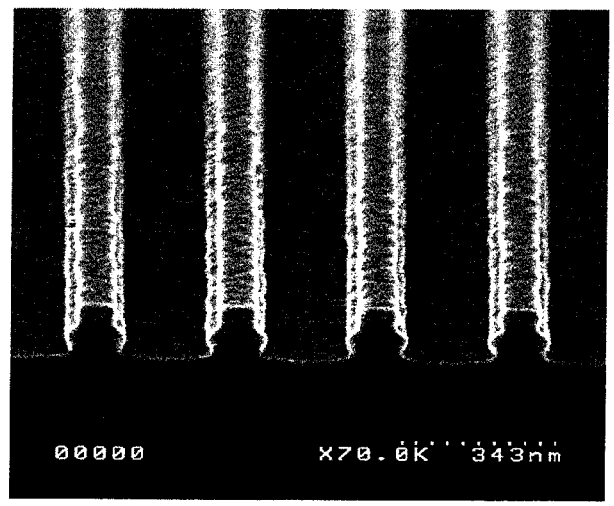
FIG. 3 is a cross-sectional photographic view of a pattern observed through a scanning electron microscope, showing one example of the pattern profile receiving a rating of 1, in Evaluation of Scum and Pattern Profile in Examples.

1: The cross-sectional shape was tapered, the effect of standing wave was observed, and trailing at the interface with substrate was observed (for example, FIG. 3).

The results of these evaluations are shown in Table 4 below.

TABLE 4

| Example | $E_{opt}$ (mJ/cm$^2$) | EL (%) | LWR (nm) | DOF (μm) | Scum and Pattern Profile |
|---|---|---|---|---|---|
| Example 1A | 15 | 23 | 5 | 0.8 | 5 |
| Example 2A | 16 | 22 | 6 | 0.7 | 5 |
| Example 3A | 16 | 21 | 5 | 0.8 | 5 |
| Example 4A | 15 | 21 | 6 | 0.7 | 5 |
| Example 5A | 17 | 18 | 6 | 0.7 | 5 |
| Example 6A | 16 | 19 | 7 | 0.8 | 4 |
| Example 7A | 16 | 19 | 7 | 0.7 | 4 |
| Example 8A | 15 | 20 | 4 | 0.7 | 5 |
| Example 9A | 16 | 21 | 5 | 0.7 | 5 |
| Example 10A | 16 | 20 | 5 | 0.7 | 5 |
| Comparative Example 1A | 26 | 14 | 9 | 0.5 | 1 |
| Comparative Example 2A | 27 | 14 | 9 | 0.5 | 1 |
| Comparative Example 3A | 28 | 13 | 12 | 0.3 | 1 |
| Comparative Example 4A | 28 | 14 | 12 | 0.4 | 1 |

As seen in Table 4, the composition of the present invention is excellent in the sensitivity, exposure dose dependency, roughness characteristics, focus latitude and scum/pattern profile as compared with the compositions of Comparative Examples 1 to 4 where the additive (D) for use in the present invention is not contained.

Example B

EB (Preparation of Resist Solution)

Examples 1B to 10B and Comparative Examples 1B to 4B

The components shown in Table 3 were dissolved in the solvent shown in the same Table to prepare a solution having a solid content concentration of 8.0 mass %, and this solution was filtered through a polytetrafluoroethylene filter having a pore size of 0.1 μm, whereby positive resist solutions were obtained.

(Evaluation of Resist)

The positive resist solution obtained above was applied on a hexamethyldisilazane-treated silicon substrate by using a spin coater and baked at 100° C. for 90 seconds to obtain a resist film having an average thickness of 0.30 μm.

This resist film was subjected to electron beam irradiation using an electron beam lithography apparatus [HL750, manufactured by Hitachi, Ltd., accelerating voltage=50 keV] and then baked at 110° C. for 60 seconds, and the baked film was dipped in an aqueous 2.38 mass % TMAH solution for 60 seconds. After this development, the film was rinsed with pure water for 30 seconds and dried to form a line pattern.

[Sensitivity ($E_{opt}$)]

The obtained pattern was observed through a scanning electron microscope (S-9260, manufactured by Hitachi, Ltd.), and the irradiation dose when resolving a line (line:space=1:1) having a line width of 150 nm was taken as the sensitivity ($E_{opt}$). As this value is smaller, the sensitivity is higher and better.

[Resolution]

The minimum value of the line width of a resolvable line when resolving a pattern of line:space=1:1 at an irradiation dose giving $E_{opt}$ above was determined by using a scanning electron microscope (S-9260, manufactured by Hitachi, Ltd.), and this minimum value was taken as "Resolution". As this value is smaller, the resolution is higher and better.

[Roughness Characteristics; LWR]

The above-described line having a line width of 150 nm was observed using a scanning electron microscope (S-9260, manufactured by Hitachi Ltd.), and the distance between the actual edge and the reference line where the edge should be present was measured at 50 points at regular intervals within the range of 2 μm in the longitudinal direction of the line. The standard deviation of the distance was determined, and 3σ was computed. This 3σ was taken as "LWR". As LWR is smaller, the roughness characteristics are better.

[Scum and Pattern Profile]

The cross-section of the above-described line having a line width of 150 nm was observed using a scanning electron microscope (S-4800, manufactured by Hitachi, Ltd.), and the scum and pattern profile were evaluated according to the following 5-stage criteria. Here, trailing at the interface with substrate is attributable to scum. In the following ratings, a rating of 5 is most excellent.

5: The cross-sectional shape was rectangular, the effect of standing wave was not observed, and trailing at the interface with substrate was not observed.

4: The cross-sectional shape was almost rectangular, the effect of standing wave was not observed, and trailing at the interface with substrate was not observed.

3: The cross-sectional shape was almost rectangular, the effect of standing wave was partially observed, and trailing at the interface with substrate was observed.

2: The cross-sectional shape was tapered, the effect of standing wave was partially observed, and trailing at the interface with substrate was observed.

1: The cross-sectional shape was tapered, the effect of standing wave was observed, and trailing at the interface with substrate was observed.

The results of these evaluations are shown in Table 5 below.

TABLE 5

| Example | Sensitivity (μC/cm²) | Resolution (nm) | LWR (nm) | Scum and Pattern Profile |
|---|---|---|---|---|
| Example 1B | 5 | 30 | 3 | 5 |
| Example 2B | 7 | 30 | 3 | 5 |
| Example 3B | 8 | 35 | 3 | 5 |
| Example 4B | 10 | 35 | 3 | 5 |
| Example 5B | 5 | 30 | 4 | 5 |
| Example 6B | 7 | 35 | 3 | 4 |
| Example 7B | 13 | 30 | 3 | 4 |
| Example 8B | 7 | 30 | 3 | 5 |
| Example 9B | 6 | 30 | 3 | 5 |
| Example 10B | 7 | 30 | 4 | 5 |
| Comparative Example 1B | 50 | 100 | 10 | 1 |
| Comparative Example 2B | 50 | 105 | 9 | 1 |
| Comparative Example 3B | 40 | 90 | 10 | 1 |
| Comparative Example 4B | 45 | 100 | 10 | 1 |

As seen in Table 5, the composition of the present invention is excellent in the sensitivity, resolution, roughness characteristics and scum/pattern profile as compared with the compositions of Comparative Examples 1 to 4 where the additive (D) for use in the present invention is not contained.

Example C

EUV (Preparation of Resist Solution)

Examples 1C to 10C and Comparative Examples 1C to 4C

The components shown in Table 3 were dissolved in the solvent shown in the same Table to prepare a solution having a solid content concentration of 5.0 mass %, and this solution was filtered through a polytetrafluoroethylene filter having a pore size of 0.1 μm, whereby positive resist solutions were obtained.

(Evaluation of Resist)

The positive resist solution obtained above was applied on a hexamethyldisilazane-treated silicon substrate by using a spin coater and baked at 100° C. for 90 seconds to obtain a resist film having an average thickness of 0.10 μm.

This resist film was subjected to EUV light irradiation using an EUV exposure apparatus (EUVES, manufactured by Litho Tech Japan Co., Ltd., wavelength=13 nm) and then baked at 110° C. for 60 seconds, and the baked film was developed by dipping it in an aqueous 2.38 mass % TMAH solution for 60 seconds.

[Sensitivity and Resolution (Dissolution Contrast)]

The above-described EUV light irradiation was performed while changing the exposure dose in steps of 0.5 mJ/cm² in the range of 0 to 20.0, mJ/cm², and the dissolution rate of the resist film in a developer at each exposure dose was measured. In this way, a dissolution rate curve showing the relationship between exposure dose and dissolution rate was obtained.

In this dissolution rate curve, the exposure dose when the dissolution rate is saturated is taken as "Sensitivity". As this value is smaller, the sensitivity is higher and better.

Also, the γ value was determined from the gradient in the straight line part of the dissolution rate curve. A larger γ value indicates higher dissolution contrast.

The results of these evaluations are shown in Table 6 below.

TABLE 6

| Example | Sensitivity (mJ/cm$^2$) | γ |
| --- | --- | --- |
| Example 1C | 3.2 | 7.0 |
| Example 2C | 3.0 | 7.1 |
| Example 3C | 3.3 | 6.8 |
| Example 4C | 3.5 | 7.2 |
| Example 5C | 3.5 | 7.1 |
| Example 6C | 3.4 | 7.0 |
| Example 7C | 3.8 | 7.0 |
| Example 8C | 3.7 | 6.9 |
| Example 9C | 4.0 | 6.5 |
| Example 10C | 4.2 | 6.3 |
| Comparative Example 1C | 11.0 | 3.0 |
| Comparative Example 2C | 12.0 | 3.0 |
| Comparative Example 3C | 13.0 | 3.2 |
| Comparative Example 4C | 13.0 | 3.1 |

As seen in Table 6, the composition of the present invention is excellent in the sensitivity and resolution (dissolution contrast) as compared with the compositions of Comparative Examples 1 to 4 where the additive (D) for use in the present invention is not contained.

Example D

ArF (Preparation of Resist Solution)

Examples 11 to 19 and Comparative Examples 5 to 8

The components shown in Table 7 were dissolved in the solvent shown in the same Table to prepare a solution having a solid content concentration of 5.0 mass %, and this solution was filtered through a polyethylene filter having a pore size of 0.03 μm, whereby positive resist solutions were obtained.

(Evaluation of Resist)

A coating agent, ARC29A (produced by Nissan Chemical Industries, Ltd.), for organic antireflection film was applied on a silicon wafer and baked at 205° C. for 60 seconds to form an antireflection film having a thickness of 78 nm.

The positive resist composition obtained above was applied on the antireflection film and baked at 130° C. for 60 seconds to obtain a resist film having an average thickness of 0.12 μm.

This resist film was subjected to pattern exposure using an ArF excimer laser scanner (PAS5500/1100, manufactured by ASML, NA=0.75). The reticle used here was a 6% halftone mask of line size=75 nm and line:space=1:1.

The resist film after exposure was baked at 90° C. for 60 seconds, and the baked film was dipped in an aqueous 2.38 mass % TMAH solution for 30 seconds. After this development, the film was rinsed with pure water and spin-dried to form a line pattern.

[Sensitivity ($E_{opt}$)]

The obtained pattern was observed through a scanning electron microscope (S-9260, manufactured by Hitachi, Ltd.), and the exposure dose at which a line having a line width of 75 nm was resolved when using a mask of line size=75 nm and line:space=1:1, was taken as Sensitivity ($E_{opt}$). As this value is smaller, the sensitivity is higher and better.

[Exposure Dose Dependency; Exposure Latitude (EL)]

The relationship between exposure dose and line width when changing the exposure dose was measured in the same manner as above. Based on the values obtained, the exposure dose giving a line width of the target value 75 nm±10% (that is, 67.5 nm and 82.5 nm) was determined, and the exposure latitude (EL) defined by the following formula was calculated. As this value is larger, the exposure dose dependency is smaller and the resolution is higher.

[EL(%)]=[(exposure dose giving a line width of 67.5 nm)−(exposure dose giving a line width of 82.5 nm)]/$E_{opt}$

TABLE 7

| Example | Acid-Decomposable Resin (mass %) | Photoacid Generator (mass %) | Basic Compound (mass %) | Additive (mass %) | Light-Absorbing Additive (mass %) | Surfactant (mass %) | Solvent (mass %) PGMEA | PGME | Ethyl Lactate |
| --- | --- | --- | --- | --- | --- | --- | --- | --- | --- |
| Example 11 | A-7 (50.5) | A'-2 (40.0) | B-4 (4.0) | C-1 (0.4) | D-1 (5.0) | — | W-2 (0.1) | 60 | 0 | 40 |
| Example 12 | A-8 (70.5) | A'-2 (20.0) | B-1/B-4 (3.0/1.0) | C-2 (0.4) | D-2 (5.0) | — | W-2 (0.1) | 60 | 40 | 0 |
| Example 13 | A-9 (90.5) | — | B-4 (4.0) | C-3 (0.4) | D-3 (5.0) | — | W-2 (0.1) | 60 | 40 | 0 |
| Example 14 | A-10 (90.5) | — | B-5 (4.0) | C-4 (0.4) | D-4 (5.0) | — | W-2 (0.1) | 60 | 40 | 0 |
| Example 15 | A-9 (90.5) | — | B-6 (4.0) | C-1/C-4 (0.2/0.2) | D-5 (5.0) | — | W-2 (0.1) | 60 | 40 | 0 |
| Example 16 | A-10 (90.5) | — | B-1/B-2 (1.0/3.0) | C-1 (0.4) | D-1 (5.0) | — | W-2 (0.1) | 60 | 40 | 0 |
| Example 17 | A-7 (85.5) | — | B-4 (4.0) | C-1/C-2 (0.3/0.1) | D-6 (5.0) | E-1 (5.0) | W-2 (0.1) | 60 | 0 | 40 |
| Example 18 | A-7/A-8 (40.5/45.0) | — | B-1/B-7 (3.0/1.0) | C-2/C-4 (0.2/0.2) | D-7 (5.0) | E-2 (5.0) | W-2 (0.1) | 60 | 40 | 0 |
| Example 19 | A-9 (85.5) | — | B-4 (4.0) | C-3/C-4 (0.3/0.1) | D-1/D-2 (2.5/2.5) | E-1 (5.0) | W-2 (0.1) | 60 | 40 | 0 |
| Comparative Example 5 | A-7 (95.5) | — | B-4 (4.0) | C-1 (0.4) | — | — | W-2 (0.1) | 60 | 0 | 40 |
| Comparative Example 6 | A-7 (90.5) | — | B-4 (4.0) | C-2 (0.4) | X-1 (5.0) | — | W-2 (0.1) | 60 | 0 | 40 |
| Comparative Example 7 | A-10 (90.5) | — | B-5 (4.0) | C-3 (0.4) | X-2 (5.0) | — | W-2 (0.1) | 60 | 0 | 40 |
| Comparative Example 8 | A-10 (90.5) | — | B-5 (4.0) | C-4 (0.4) | X-3 (5.0) | — | W-1 (0.1) | 60 | 0 | 40 |

[Roughness Characteristics; LWR]

The above-described line having a line width of 75 nm was observed using a scanning electron microscope (S-9260, manufactured by Hitachi Ltd.), and 3σ was computed in the same manner as in Example B and taken as "LWR".

[Scum and Pattern Profile]

The cross-section of the above-described line having a line width of 75 nm was observed using a scanning electron microscope (S-4800, manufactured by Hitachi, Ltd.), and the scum and pattern profile were evaluated in the same manner as in Example B.

The results of these evaluations are shown in Table 8 below.

TABLE 8

| Example | $E_{opt}$ (mJ/cm$^2$) | EL (%) | LWR (nm) | Scum and Pattern Profile |
|---|---|---|---|---|
| Example 11 | 23 | 15 | 3 | 5 |
| Example 12 | 23 | 14 | 3 | 5 |
| Example 13 | 24 | 14 | 4 | 5 |
| Example 14 | 25 | 14 | 3 | 5 |
| Example 15 | 26 | 14 | 5 | 4 |
| Example 16 | 25 | 13 | 5 | 4 |
| Example 17 | 24 | 16 | 3 | 5 |
| Example 18 | 25 | 16 | 4 | 5 |
| Example 19 | 24 | 15 | 4 | 5 |
| Comparative Example 5 | 40 | 7 | 9 | 1 |
| Comparative Example 6 | 41 | 6 | 9 | 1 |
| Comparative Example 7 | 39 | 9 | 10 | 1 |
| Comparative Example 8 | 39 | 7 | 10 | 1 |

As seen in Table 8, the composition of the present invention is excellent in the sensitivity, exposure dose dependency, roughness characteristics, and scum/pattern profile as compared with the compositions of Comparative Examples 5 to 8 where the additive (D) for use in the present invention is not contained.

Example E

ArF Immersion Exposure (Preparation of Resist Solution)

Example 20

A positive resist solution was prepared in the same manner as in Example 11 except for further adding 0.10 g of a polymer shown below and adjusting the content of the polymer to 0.5 mass % based on the entire solid content.

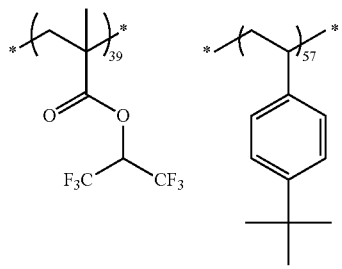

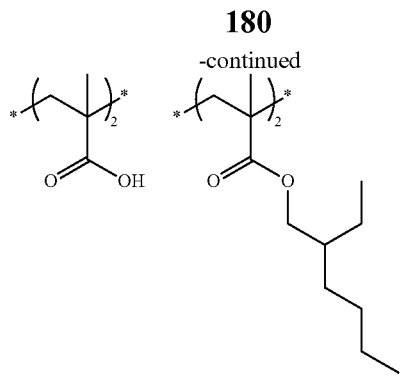

Weight average molecular weight: 4500, dispersity: 1.4.

Example 21

A positive resist solution was prepared in the same manner as in Example 11 except for further adding 0.10 g of a polymer shown below and adjusting the content of the polymer to 0.4 mass % based on the entire solid content.

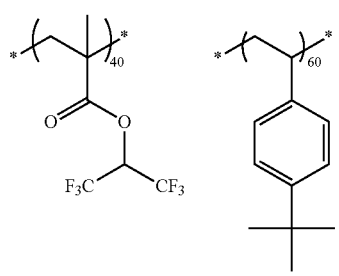

Weight average molecular weight: 4300, dispersity: 1.4.

(Evaluation of Resist)

Resist films were formed in the same manner as in Example D except for using the resists solutions of Examples 20 and 21.

This resist film was subjected to pattern exposure using an ArF excimer laser immersion stepper (XT1700i, manufactured by ASML, NA=1.20). The immersion liquid used here was pure water. Thereafter, a line pattern was formed in the same manner as in Example D, and the sensitivity, exposure latitude, LWR and scum/pattern profile were evaluated in the same manner as in Example D.

As a result, it was confirmed that in both of Examples 20 and 21, the same excellent results as in Example 11 are obtained. That is, the compositions of these Examples were revealed to be suitably usable for the pattern formation by ArF immersion exposure.

Industrial Applicability

According to the present invention, an actinic ray-sensitive or radiation-sensitive resin composition excellent in the sensitivity, exposure dose dependency, resolution, roughness characteristics, focus latitude and pattern profile and succeeded in reducing scum, and a resist film and a pattern forming method each using the composition can be provided.

This application is based on Japanese patent application JP 2010-053844, filed on Mar. 10, 2010, the entire content of which is hereby incorporated by reference, the same as if set forth at length.

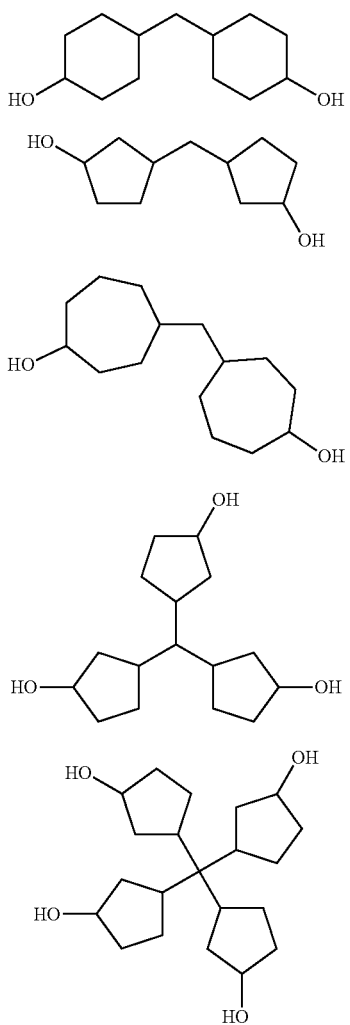
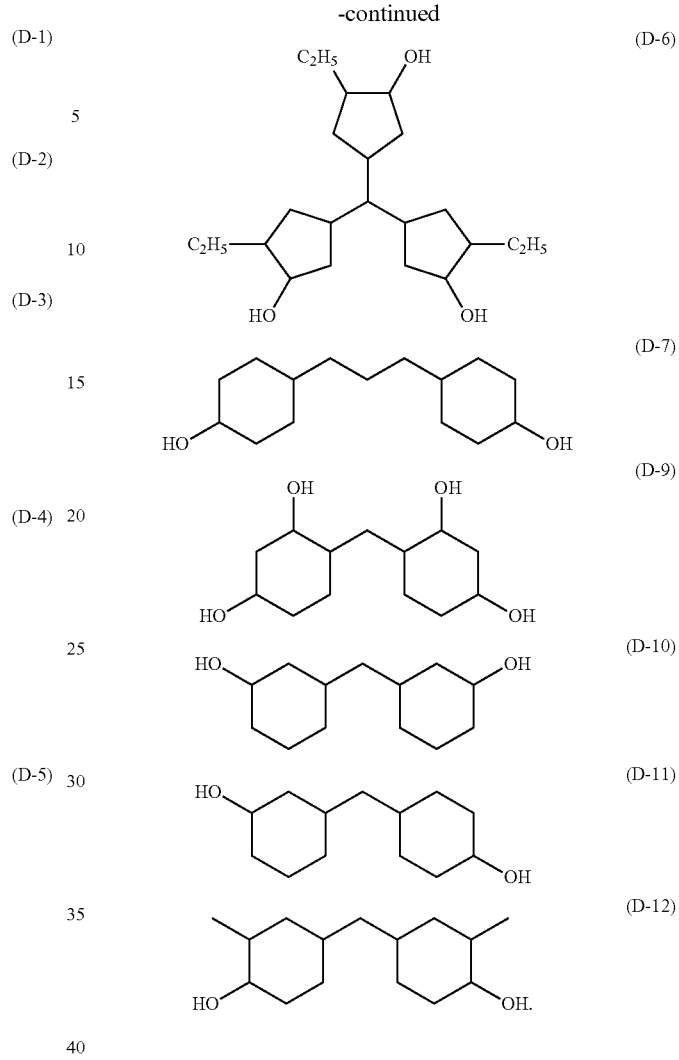

The invention claimed is:

1. An actinic ray-sensitive or radiation-sensitive resin composition, comprising:

(A) a resin capable of decomposing by an action of an acid to increase the solubility of the resin (A) in an alkali developer, the resin (A) containing a phenolic hydroxyl group and a repeating unit having an aromatic group;
(B) a compound capable of generating an acid upon irradiation with an actinic ray or radiation;
(C) a basic compound; and
(D) a compound represented by formula (D1):

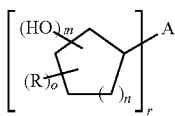

Formula (D1)

wherein A represents an r-valent hydrocarbon group having a carbon number of 1;
R represents a hydrocarbon group and when a plurality of R's are present, the plurality of R's may be the same or different;
n represents an integer of 1 to 3;
m represents 1 or 2;
r represents an integer of 2 to 4; and
o represents an integer of 0 to 2.

2. The actinic ray-sensitive or radiation-sensitive resin composition according to claim 1,
wherein, in formula (D1), A represents an r-valent saturated hydrocarbon group having a carbon number of 1.

3. The actinic ray-sensitive or radiation-sensitive resin composition according to claim 1,
wherein, in formula (D1), R represents an alkyl group and o is 0 or 1.

4. The actinic ray-sensitive or radiation-sensitive resin composition according to claim 1,
wherein, in formula (D1), n is 1 or 2.

5. The actinic ray-sensitive or radiation-sensitive resin composition according to claim 1,
wherein, in formula (D1), m is 1.

6. The actinic ray-sensitive or radiation-sensitive resin composition according to claim 1,
wherein, in formula (D1), r is 2.

7. The actinic ray-sensitive or radiation-sensitive resin composition according to claim 1,
wherein the content of the compound represented by formula (D1) is from 0.1 to 10 mass % based on the entire solids content of the composition.

8. The actinic ray-sensitive or radiation-sensitive resin composition according to claim 1,
wherein the compound (B) contains a sulfonium salt or an iodonium salt.

9. The actinic ray-sensitive or radiation-sensitive resin composition according to claim 1, which further comprises:
an additive having absorption in far-ultraviolet region.

10. The actinic ray-sensitive or radiation-sensitive resin composition according to claim 1,
wherein the resin (A) contains a repeating unit having absorption in far-ultraviolet region.

11. A resist film, which is formed from the actinic ray-sensitive or radiation-sensitive resin composition according to claim 1.

12. A pattern forming method, comprising: steps of exposing and developing the resist film according to claim 11.

13. The pattern forming method according to claim 12, wherein the exposure in the step of exposing the resist film is an immersion exposure.

14. The actinic ray-sensitive or radiation-sensitive resin composition according to claim 1,
wherein the resin (A) contains hydroxystyrene as a repeating unit.

15. The actinic ray-sensitive or radiation-sensitive resin composition according to claim 1,
wherein the resin (A) contains a repeating unit represented by the following formula (IA):

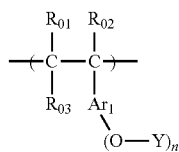

Formula (IA)

in the formula, each of $R_{01}$ and $R_{02}$ independently represents a hydrogen atom, an alkyl group, a cycloalkyl group, a halogen atom, a cyano group or an alkoxycarbonyl group;
$R_{03}$ represents a hydrogen atom, an alkyl group, a cycloalkyl group, a halogen atom, a cyano group or an alkoxycarbonyl group or combines with $Ar_1$ to form a ring structure;
$Ar_1$ represents an (n+1)-valent aromatic ring group, provided that in the case of combining with $R_{03}$ to form a ring structure, $Ar_1$ represents an (n+2)-valent aromatic ring group;
each of n Y's independently represents a hydrogen atom or a group capable of leaving by the action of an acid, provided that at least one of n Y's represents a group capable of leaving by the action of an acid, and
n represents an integer of 1 to 4.

16. An actinic ray-sensitive or radiation-sensitive resin composition, comprising:
(A) a resin capable of decomposing by an action of an acid to increase the solubility of the resin (A) in an alkali developer, the resin (A) containing a phenolic hydroxyl group and a repeating unit having an aromatic group;
(B) a compound capable of generating an acid upon irradiation with an actinic ray or radiation;
(C) a basic compound; and
(D) a compound represented by formula (D1):

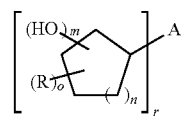

Formula (D1)

wherein A represents an r-valent hydrocarbon group;
R represents a hydrocarbon group and when a plurality of R's are present, the plurality of R's may be the same or different;
n represents an integer of 1 to 3;
m represents 1 or 2;
r represents an integer of 2 to 4;
o represents an integer of 0 to 2; and
wherein the compound (D) is a compound represented by any of the following formulae: